US010074744B2

(12) United States Patent
Numabe et al.

(10) Patent No.: US 10,074,744 B2
(45) **Date of Patent: *Sep. 11, 2018**

(54) SEMICONDUCTOR DEVICE

(71) Applicant: Renesas Electronics Corporation, Koutou-ku, Tokyo (JP)

(72) Inventors: Hideo Numabe, Kanagawa (JP); Nobuyuki Shirai, Kanagawa (JP); Hirokazu Kato, Kanagawa (JP); Tomoaki Uno, Kanagawa (JP); Kazuyuki Umezu, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,771

(22) Filed: Jun. 16, 2017

(65) Prior Publication Data

US 2017/0288053 A1 Oct. 5, 2017

Related U.S. Application Data

(63) Continuation of application No. 14/406,991, filed as application No. PCT/JP2014/052287 on Jan. 31, 2014, now Pat. No. 9,711,637.

(51) Int. Cl.

| | |
|---|---|
| ***H01L 29/78*** | (2006.01) |
| ***H01L 29/40*** | (2006.01) |
| ***H01L 29/423*** | (2006.01) |
| ***H01L 29/08*** | (2006.01) |
| ***H01L 29/06*** | (2006.01) |
| ***H01L 29/417*** | (2006.01) |

(Continued)

(52) U.S. Cl.

CPC ........ *H01L 29/7813* (2013.01); *H01L 23/535* (2013.01); *H01L 29/0696* (2013.01);

(Continued)

(58) Field of Classification Search

CPC ........... H01L 29/41741; H01L 29/4238; H01L 29/407; H01L 29/7813; H01L 23/535

See application file for complete search history.

(56) References Cited

U.S. PATENT DOCUMENTS 5,998,833 A 12/1999 Baliga
9,711,637 B2 * 7/2017 Numabe ............. H01L 29/7813

(Continued)

FOREIGN PATENT DOCUMENTS

JP 63-296282 A 12/1988
JP 2002-083963 A 3/2002

(Continued)

OTHER PUBLICATIONS

Office Action, dated Aug. 29, 2017, for Japanese Patent Application No. 2014-551475.

*Primary Examiner* — Whitney T Moore
*Assistant Examiner* — Changhyun Yi
(74) *Attorney, Agent, or Firm* — Shapiro, Gabor and Rosenberger, PLLC

(57) ABSTRACT

A control electrode GE1 is formed in a lower portion of a trench TR1 formed in a semiconductor substrate SUB, and a gate electrode GE2 is formed in an upper portion inside the trench TR1. An insulating film G1 is formed between the control electrode GE1 and a side wall and a bottom surface of the trench TR1, an insulating film G2 is formed between the side wall of the trench TR1 and the gate electrode GE2, and an insulating film G3 is formed between the control electrode GE1 and the gate electrode GE2. A region adjacent to the trench TR1 includes an $n^+$-type semiconductor region NR for a source, a p-type semiconductor region PR for a channel formation, and a semiconductor region for a drain. A wiring connected to the control electrode GE1 is not connected to a wiring connected to the gate electrode GE2, and is not connected to a wiring connected to the $n^+$-type semiconductor region NR for a source.

10 Claims, 68 Drawing Sheets

(51) Int. Cl.
*H01L 29/10* (2006.01)
*H01L 23/535* (2006.01)

(52) U.S. Cl.
CPC ...... *H01L 29/0865* (2013.01); *H01L 29/0882* (2013.01); *H01L 29/1033* (2013.01); *H01L 29/407* (2013.01); *H01L 29/41741* (2013.01); *H01L 29/4236* (2013.01); *H01L 2224/05554* (2013.01); *H01L 2224/0603* (2013.01); *H01L 2224/40245* (2013.01); *H01L 2224/45144* (2013.01); *H01L 2224/48137* (2013.01); *H01L 2224/48247* (2013.01); *H01L 2224/49171* (2013.01); *H01L 2924/181* (2013.01)

(56) References Cited

U.S. PATENT DOCUMENTS

2002/0030237 A1 3/2002 Omura et al.
2004/0012049 A1 1/2004 Shirai et al.
2005/0145936 A1* 7/2005 Polzl .................... H01L 29/402 257/341
2005/0167742 A1 8/2005 Challa et al.
2006/0157779 A1 7/2006 Kachi et al.
2009/0026535 A1 1/2009 Matsuura et al.
2010/0123188 A1 5/2010 Venkatraman
2012/0025874 A1 2/2012 Saikaku et al.
2012/0061753 A1 3/2012 Nishiwaki

FOREIGN PATENT DOCUMENTS

JP 2004-055812 A 2/2004
JP 2006-202931 A 8/2006
JP 2007-529115 A 10/2007
JP 2009-032951 A 2/2009
JP 2012-049499 A 3/2012
JP 2012-059943 A 3/2012

* cited by examiner

CP
PDC
OP
H4
RG1
RG2
H3
PDS
OP
H1
PDG
OP
H2
X
Y

CP
OP(PDC)
OP(PDS)
H3
M1G(M1,M1G3)
M1C(M1,M1C3)
OP(PDG)
H4
M1C
(M1,M1C2)
RG2
M1S(M1)
M1G(M1,M1G1)
M1C(M1,M1C1)
H1
M1G
(M1,M1G2)
H2
X
Y

CP
RG1
H4
TR1 (TR1a)
TR1 (TR1a)
TR1 (TR1a)
RG2
TR2(TR2b)
H3
TR2(TR2a)
TR2(TR2a)
TR2(TR2a)
TR2(TR2a)
TR2(TR2a)
TR2(TR2b)
H1
TR2(TR2a)
TR1
TR1
TR1
H2
X
Y

CP3(CP)
OP
PDC
H4
H3
H1
RG1(RG1b)
RG1(RG1a)
PDS(PDS2)
PDS(PDS1)
OP
OP
PDG
OP
H2
X
Y

CP3(CP)
OP(PDC)
M1S
(M1,M1S2)
H4
M1C
(M1,M1C2)
M1S
(M1,M1S1)
OP(PDS)
OP(PDS)
H3
M1G(M1,M1G1)
M1G(M1,M1G3)
M1C(M1,M1C1)
M1C(M1,M1C3)
H1
M1G(M1,M1G4)
OP(PDG)
M1G
(M1,M1G2)
H2
M1G
(M1,M1G2)
X
Y

CP3(CP)
H1
H2
H3
H4
RG1 (RG1a)
RG1 (RG1b)
TR1 (TR1a)
TR2 (TR2a)
TR2 (TR2b)
TR2 (TR2c)
X
Y

OP
H4
RG3
CP4(CP)
PDC
H3
H1
RG1(RG1b)
RG1(RG1a)
PDS(PDS2)
PDS(PDS1)
OP
OP
PDG
OP
H2
X
Y

CP4(CP)
H4
RG1
(RG1b)
TR1
(TR1a)
TR1
(TR1a)
TR2
(TR2c)
RG1
(RG1a)
TR1
(TR1a)
TR1
(TR1a)
TR2(TR2b)
H3
TR2(TR2a)
TR2(TR2a)
TR2(TR2a)
TR2(TR2a)
TR2(TR2a)
TR2(TR2b)
H1
TR2(TR2a)
H2
TR1
(TR1a)
TR1
(TR1a)
TR2
(TR2c)
TR1
(TR1a)
TR1
(TR1a)
X
Y

OP
H4
RG3
CP5(CP)
PDC
H3
H1
RG1(RG1b)
RG1(RG1a)
PDS(PDS2)
PDS(PDS1)
OP
OP
PDG
OP
H2
X
Y

CP5(CP)
OP(PDC)
M1S (M1,M1S2)
H4
RG3
M1C (M1,M1C2)
M1S (M1,M1S1)
OP(PDS)
H3
M1G(M1,M1G3)
M1C(M1,M1C3)
M1G(M1,M1G5)
OP(PDG)
M1G (M1,M1G2)
H2
M1G (M1,M1G2)
OP(PDS)
M1G(M1,M1G1)
M1C(M1,M1C1)
H1
M1G(M1,M1G4)
M1C(M1,M1C4)
X
Y

CP5(CP)
H4
RG1
(RG1b)
TR1
(TR1a)
TR1
(TR1a)
TR2
(TR2c)
RG1
(RG1a)
TR1
(TR1a)
TR1
(TR1a)
TR2(TR2b)
H3
TR2(TR2a)
TR2(TR2a)
TR2(TR2a)
TR2(TR2a)
TR2(TR2a)
TR2(TR2b)
H1
TR2(TR2a)
H2
TR1
(TR1a)
TR1
(TR1a)
TR2
(TR2c)
TR1
(TR1a)
TR1
(TR1a)
X
Y

GE2
CT2
IL
PA
M1G4(M1G)
G2
G3
G1
EP1
EP
SUB
SB
BE
L
GE1
PR
TR2c(TR2)

CT3
IL
PA
M1C4(M1C)
G1
EP1
EP
SUB
SB
BE
M
GE1
PR
TR2c(TR2)

PA
IL
BE
P
CT2
TR2(TR2c)
M1G(M1G5)
G3
GE2
IL
SB
CT3
EP1
G1
M1C(M1C4)
GE1
IL
CT2
G3
M1G(M1G4)
GE2
IL
SUB
P

CP6(CP)
OP
PDC
RG5
H4
RG4
H3
H1
PDS(PDS4)
PDS(PDS1)
OP
OP
PDS(PDS3)
PDS(PDS2)
OP
OP
PDG
OP
RG1(RG1d)
RG1(RG1c)
H2
RG1(RG1b)
RG1(RG1a)
X
Y

H3
CP7(CP)
OP(PDC)
M1S
(M1S2)
OP(PDS)
M1C
M1G
M1C
H2
H4
M1S
(M1S1)
OP(PDS)
OP(PDG)
Y
X
H1

CP11
OP(PDS6)
OP(PDC)
H4
OP(PDG)
OP(PDS5)
OP(PDS2)
M1S(M1S2)
M1G
M1C
H3
OP(PDS1)
M1S(M1S1)
M1G
M1C
H1
H2
X
Y

CP12
OP(PDC)
H4
OP(PDG)
M1G
M1C
H3
M1G
M1C
H1
M1S(M1S3)
OP(PDS3)
H2
M1S(M1S2)
OP(PDS2)
M1S(M1S1)
OP(PDS1)
X
Y

SEMICONDUCTOR DEVICE

TECHNICAL FIELD

The present invention relates to a semiconductor device, and it can be suitably utilized for a semiconductor device having, for example, a trench-gate type power transistor.

BACKGROUND ART

A trench-gate type power MOSFET is a power transistor of a vertical structure having a channel formed in a thickness direction of a semiconductor substrate by providing a gate electrode in a trench grooved in a direction crossing a main surface of the semiconductor substrate through a gate insulating layer, providing a source region on a front layer portion of the main surface of the semiconductor substrate, and providing a drain region on a back surface side opposite to the main surface of the semiconductor substrate.

U.S. Pat. No. 5,998,833 (Patent Document 1), Japanese Patent Application Laid-Open Publication No. S63-296282 (Patent Document 2), and Japanese Patent Application Laid-Open Publication No. 2006-202931 (Patent Document 3) disclose a technique regarding the trench-gate type power MOSFET.

PRIOR ART DOCUMENTS

Patent Documents

Patent Document 1: U.S. Pat. No. 5,998,833

Patent Document 2: Japanese Patent Application Laid-Open Publication No. S63-296282

Patent Document 3: Japanese Patent Application Laid-Open Publication No. 2006-202931

SUMMARY OF THE INVENTION

Problems to be Solved by the Invention

Also in a semiconductor device having a trench-gate type power transistor, it is desired to improve a performance as much as possible.

The other preferred aims and novel characteristics will be apparent from the description of the present specification and the accompanying drawings.

Means for Solving the Problems

According to an embodiment, a semiconductor device is a semiconductor device having a trench-gate type field effect transistor configuring a power transistor in a transistor formation region on a main surface of a semiconductor substrate. And, the semiconductor device includes: a first trench formed in the transistor formation region of the semiconductor substrate; a first electrode formed in a lower portion inside the first trench; and a gate electrode for a trench-gate type field effect transistor formed in an upper portion inside the first trench. Further, the semiconductor device includes: a first insulating film formed between the first electrode and a side wall and a bottom surface of the first trench; a second insulating film formed between the gate electrode and the side wall of the first trench; and a third insulating film formed between the gate electrode and the first electrode. Still further, the semiconductor device includes: a semiconductor region for a source formed in a region adjacent to the first trench in the semiconductor substrate; a semiconductor region for channel formation positioned below the semiconductor region for the source; and a semiconductor region for a drain positioned below the semiconductor region for channel formation. The first electrode does not connect to the gate electrode through a conductor, and does not connect to the semiconductor region for the source through a conductor.

Means for Solving the Problems

According to one embodiment, a performance of a semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, the description of the same or similar portions is not repeated in principle unless particularly required in the following embodiments.

Also, in some drawings used in the embodiments, hatching is omitted even in a cross-sectional view so as to make the drawings easy to see. Also, hatching is used even when seen in a plan view so as to make the drawings easy to see.

First Embodiment

<Regarding Structure of Semiconductor Device>

Figure 1:
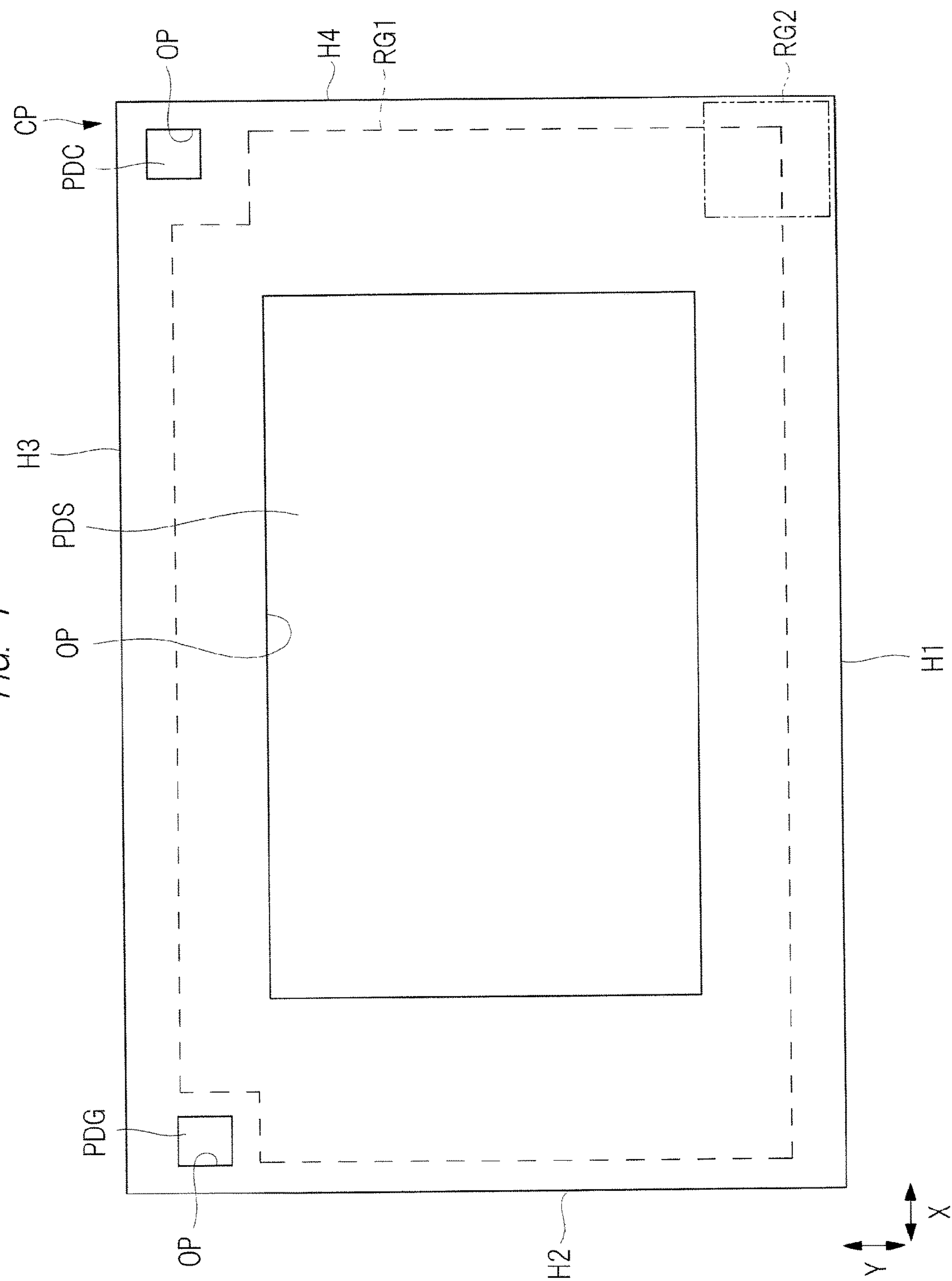
FIG. 1 is an overall plan view of a semiconductor device of an embodiment.
Figure 2:
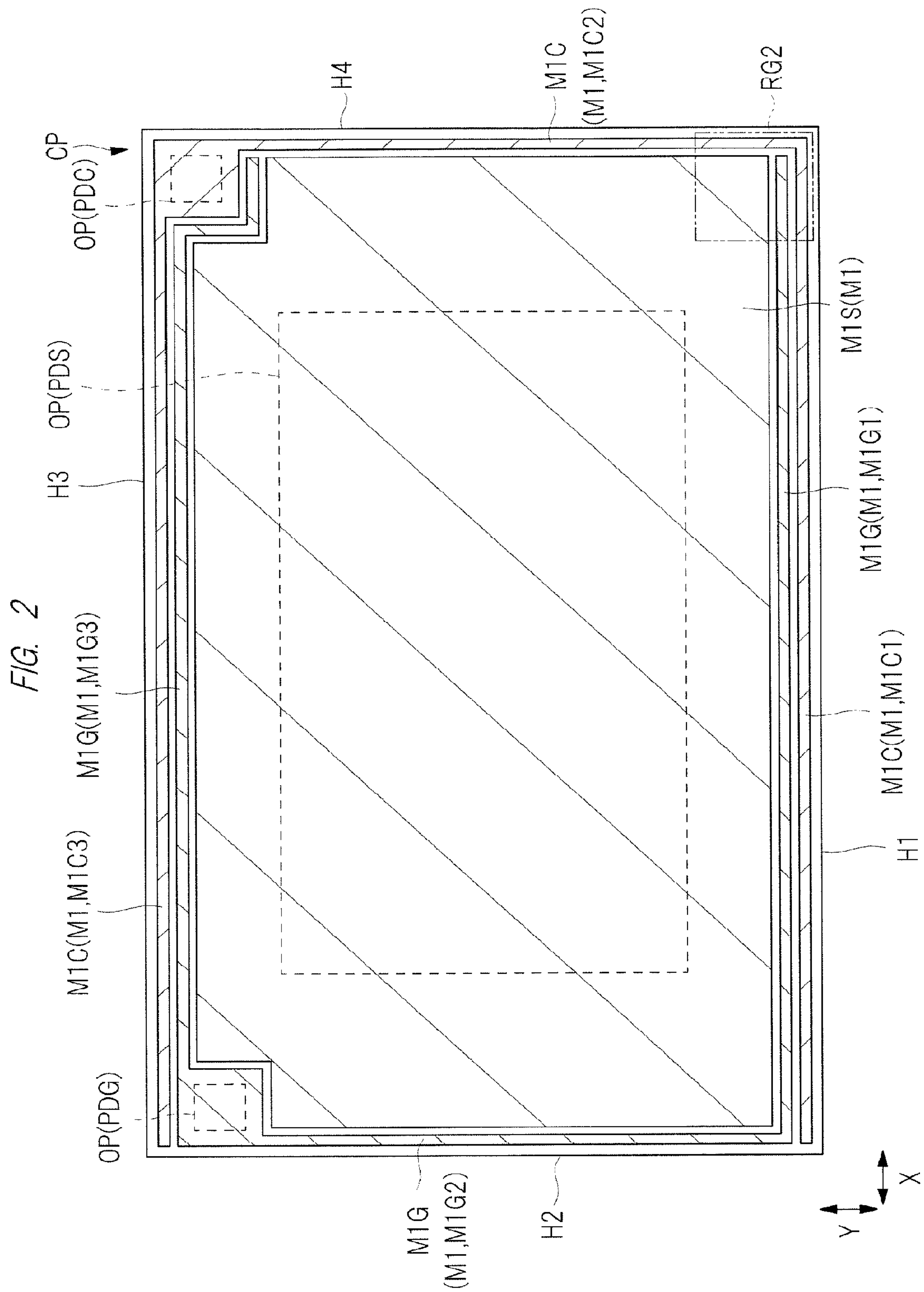
FIG. 2 is an overall plan view of a semiconductor device of an embodiment.
Figure 3:
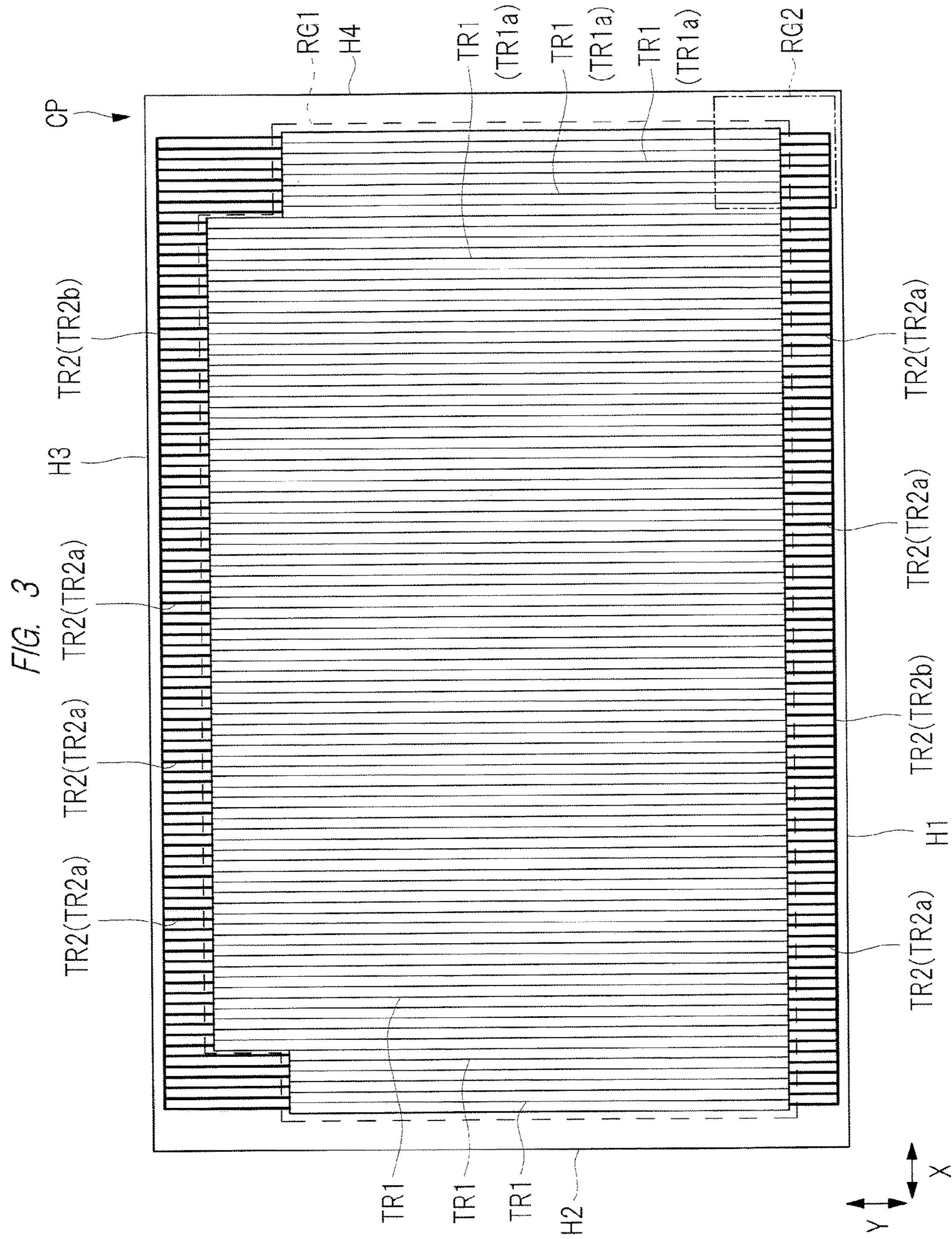
FIG. 3 is an overall plan view of a semiconductor device of an embodiment.
Figure 4:
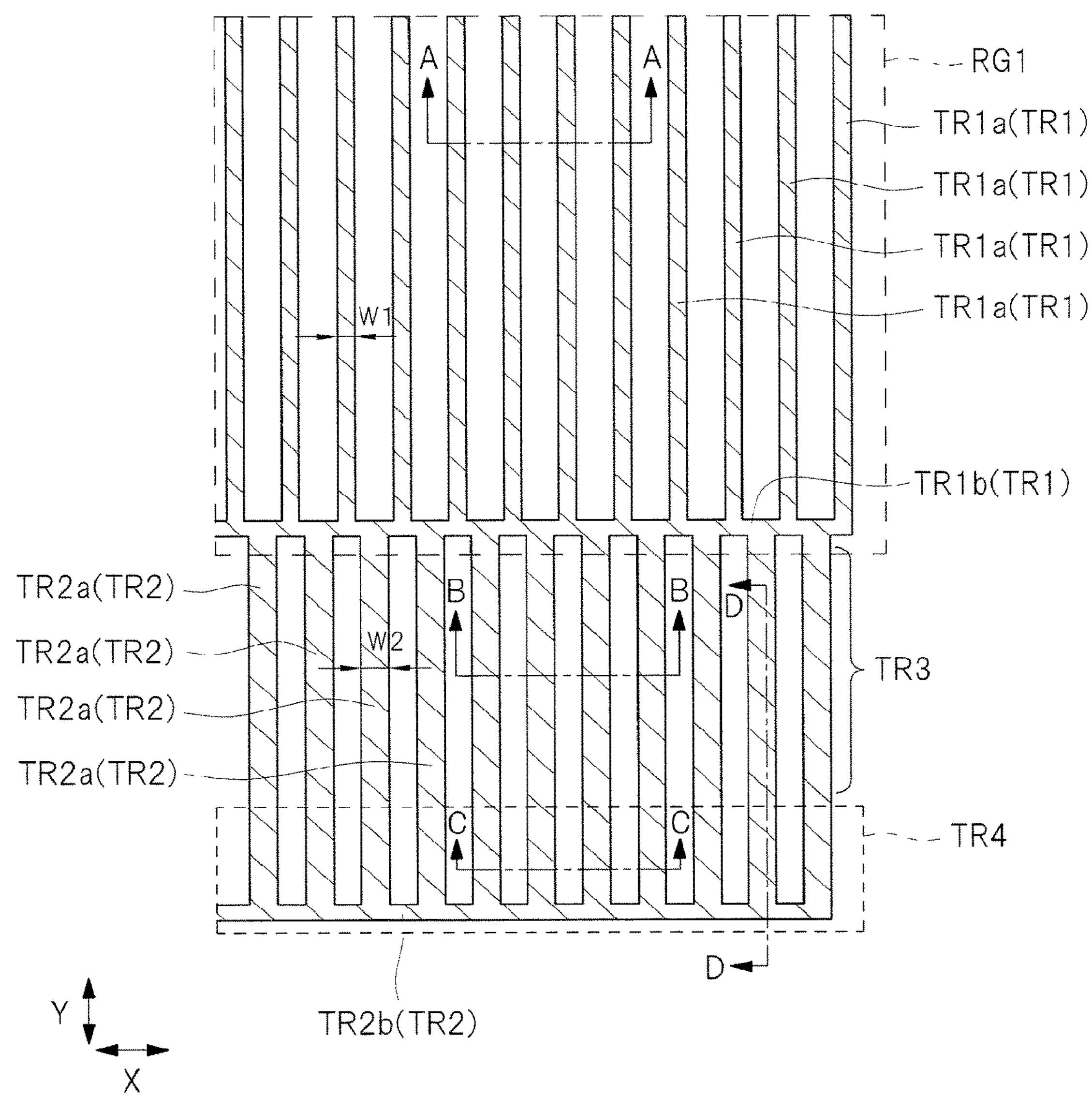
FIG. 4 is a plan view of a principal part of a semiconductor device of an embodiment.
Figure 5:
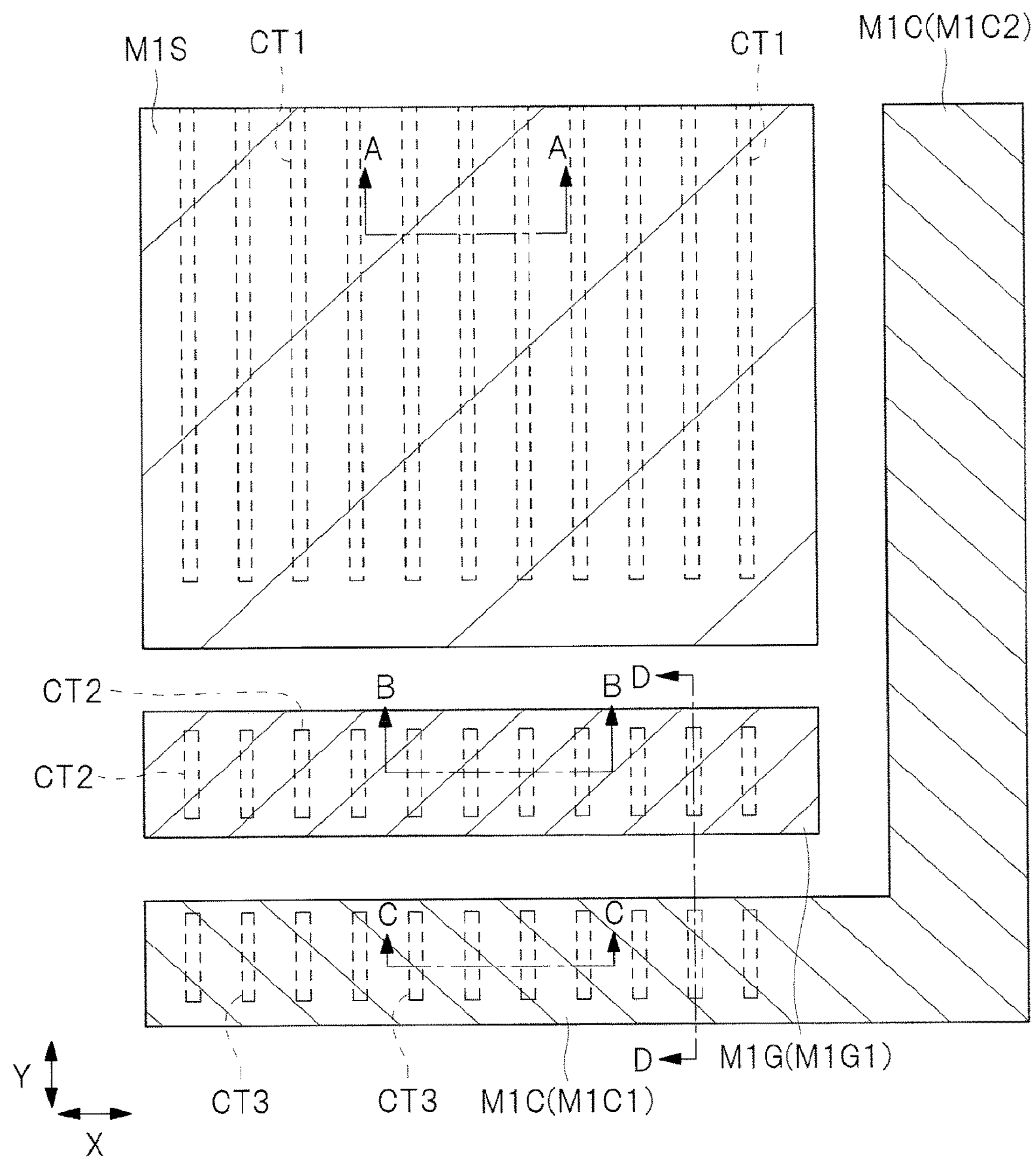
FIG. 5 is a plan view of a principal part of a semiconductor device of an embodiment.
Figure 6:
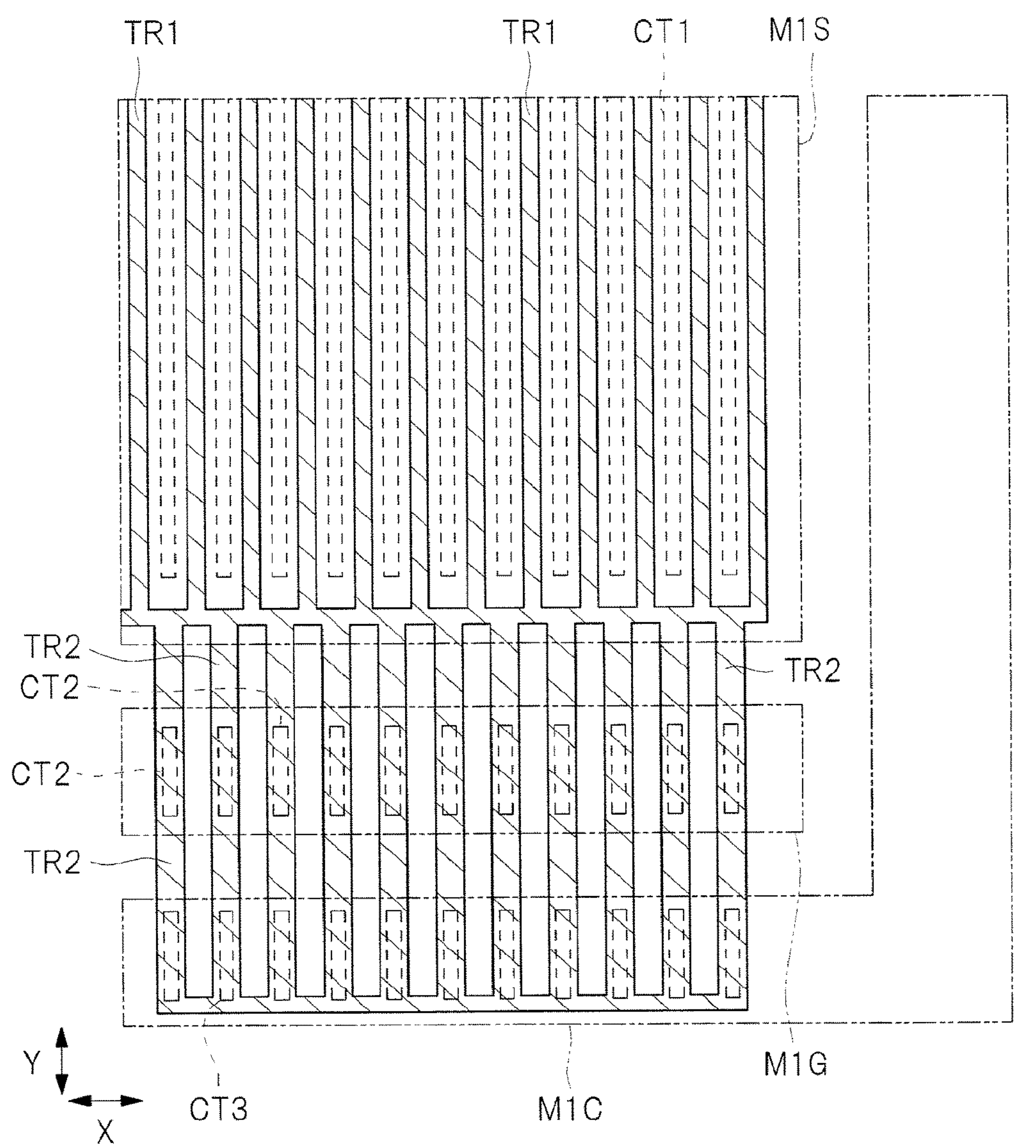
FIG. 6 is a plan view of a principal part of a semiconductor device of an embodiment.

A semiconductor device of the present embodiment will be described with reference to the drawings. FIG. 1 is an overall plan view of a semiconductor device (semiconductor chip) CP of the present embodiment, which illustrates an overall plan view of an upper surface side of the semiconductor device CP. Further, while FIGS. 2 and 3 are also overall plan views of the semiconductor device CP of the present embodiment, they illustrate layers different from a layer illustrated in FIG. 1. Each of FIGS. 4 to 6 is a plan view of a principal part of the semiconductor device CP of the present embodiment. While such diagrams as enlarging a region RG2 surrounded by a two-dot chain line illustrated in FIGS. 1 to 3 correspond to FIGS. 4 to 6, FIGS. 4 to 6 illustrate layers different from each other. Each of FIGS. 7 to 13 is a cross-sectional view of a principal part of the semiconductor device CP of the present embodiment.

Note that FIGS. 1 to 3 illustrate plan views in the same region as each other. However, FIG. 1 illustrates a top view of the semiconductor device CP, FIG. 2 illustrates a plan layout of a wiring M1 (that is, a wiring M1S for a source, a wiring M1G for a gate, and a wiring M1C for a control electrode), and FIG. 3 illustrates a plan layout of trenches TR1 and TR2. Further, FIG. 1 illustrates a transistor formation region RG1 by a dot-line, and FIG. 2 illustrates an opening OP by a broken line. In FIG. 2, note that a hatching is added to the wiring M1 (that is, the wiring M1S for a source, the wiring M1G for a gate, and the wiring M1C for a control electrode) in order to easily understand the drawing although FIG. 2 is a plan view. Further, FIG. 3 illustrates the trenches TR1 and TR2 by black lines so that the black line illustrating the trench TR2 is thicker than the black line illustrating the trench TR1. This is because a width of the trench TR2 is larger than a width of the trench TR1.

Further, while FIGS. 4 to 6 illustrate plan views in the same region as each other, they illustrate layers different from each other. That is, FIG. 4 illustrates a plan layout of the trenches TR1 and TR2, and the FIG. 5 illustrates a plan layout of the wiring M1 (that is, the wiring M1S for a source, the wiring M1G for a gate, and the wiring M1C for a control electrode) and contact holes CT1, CT2, and CT3 by broken lines. Further, FIG. 6 illustrates a plan layout obtained by overlapping FIG. 5 on FIG. 4 in order to easily understand plane positions of members illustrated in FIG. 4 and members illustrated in FIG. 5. Note that FIGS. 4 to 6 are plan views. However, in order to easily understand, a hatching is added to the trenches TR1 and TR2 in FIGS. 4 and 6, and a hatching is added to the wiring M1 (that is, the wiring M1S for a source, the wiring M1G for a gate, and the wiring M1C for a control electrode) in FIG. 5. Further, FIG. 4 illustrates the transistor formation region RG1 by a broken line, FIGS. 5 and 6 illustrate the contact holes CT1, CT2 and CT3 by a broken line, and FIG. 6 illustrates the wiring M1 (that is, the wiring M1S for a source, the wiring M1G for a gate, and the wiring M1C for a control electrode) by a two-dot chain line.

Figure 7:
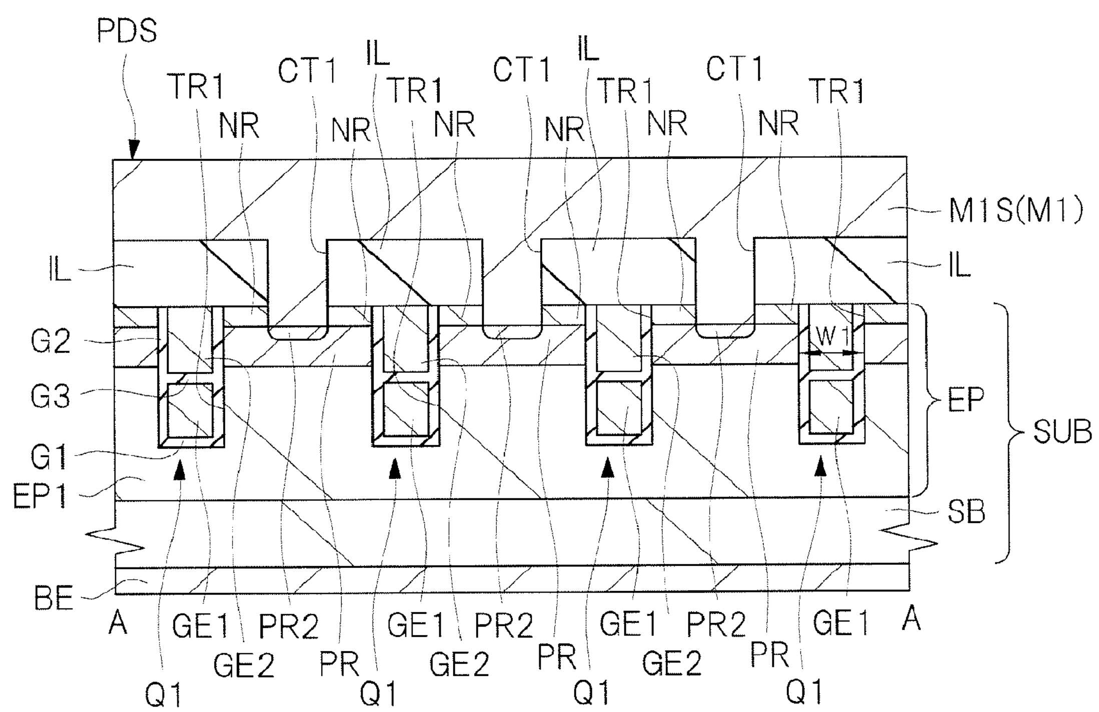
FIG. 7 is a cross-sectional view of a principal part of a semiconductor device of an embodiment.
Figure 8:
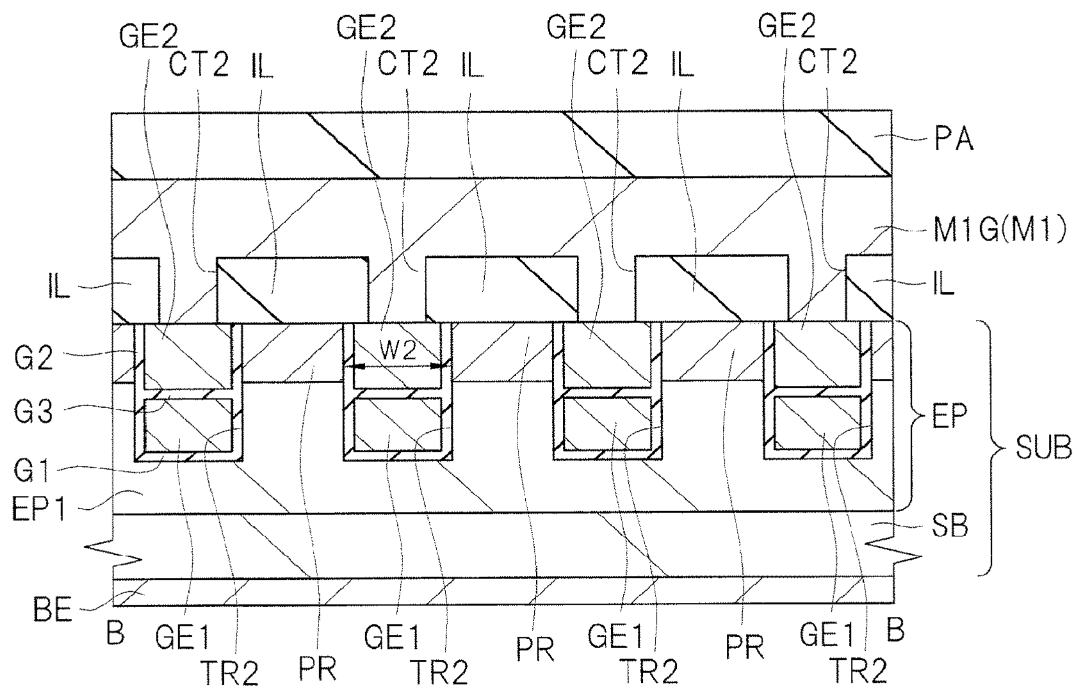
FIG. 8 is a cross-sectional view of a principal part of a semiconductor device of an embodiment.
Figure 9:
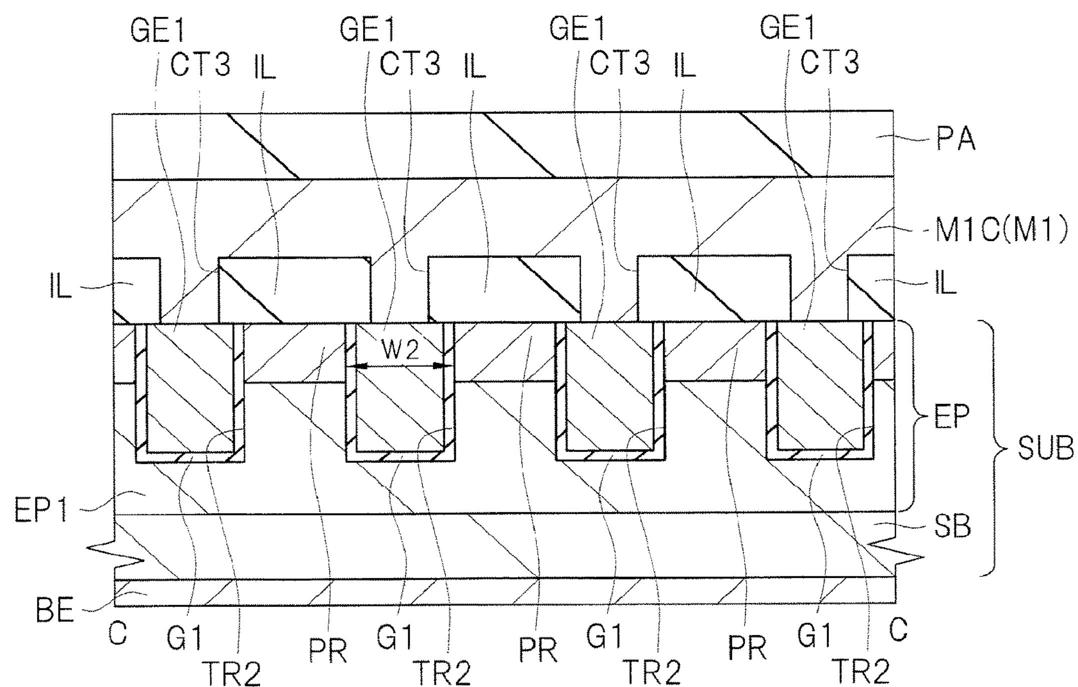
FIG. 9 is a cross-sectional view of a principal part of a semiconductor device of an embodiment.
Figure 10:
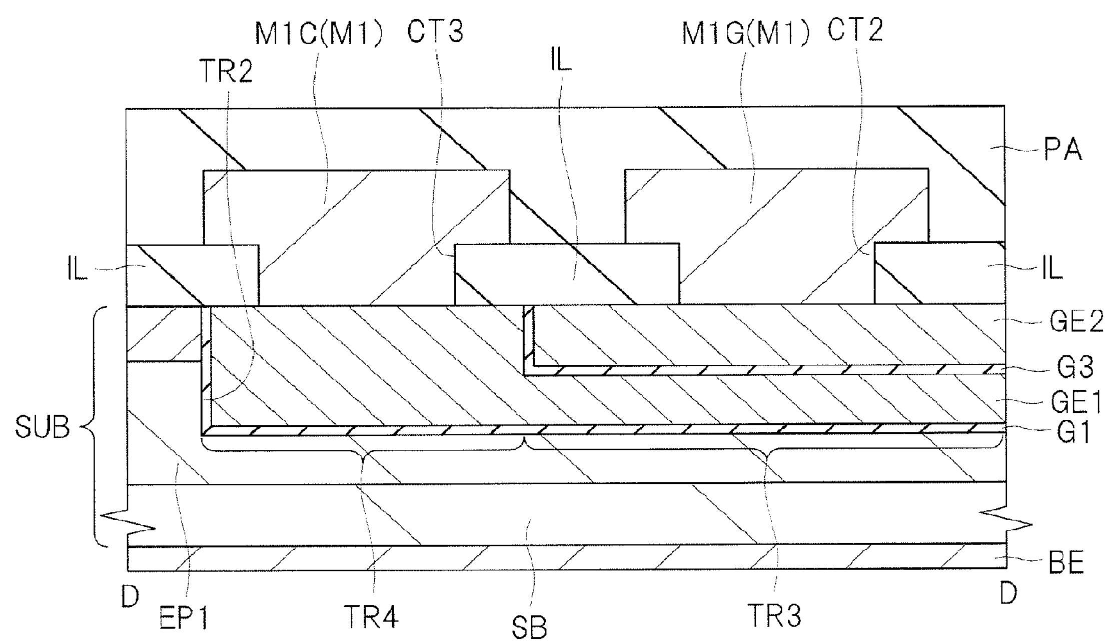
FIG. 10 is a cross-sectional view of a principal part of a semiconductor device of an embodiment.
Figure 11:
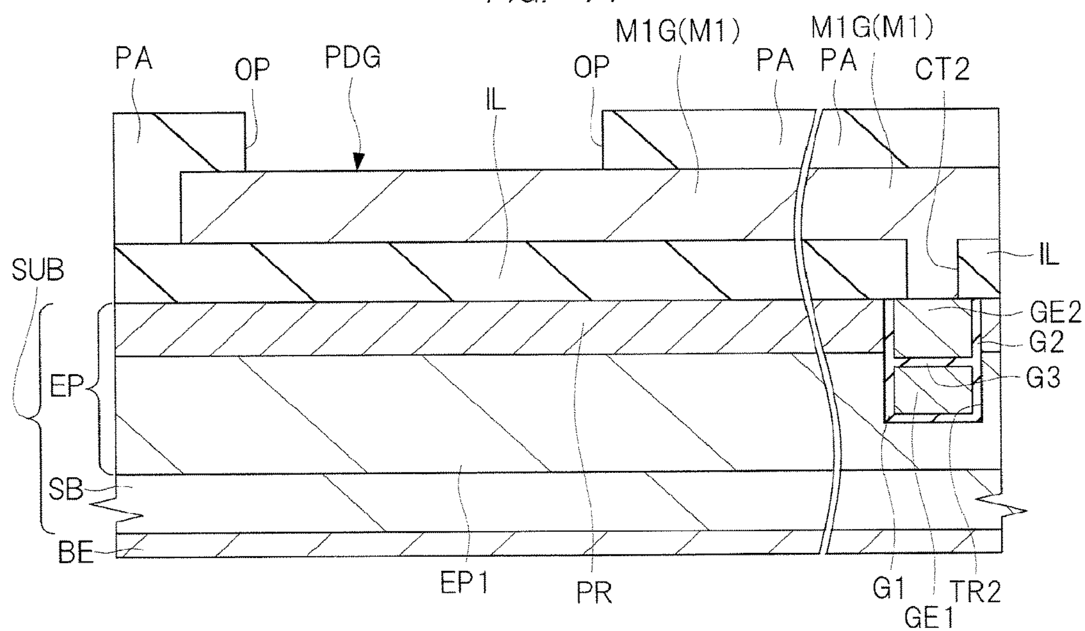
FIG. 11 is a cross-sectional view of a principal part of a semiconductor device of an embodiment.
Figure 12:
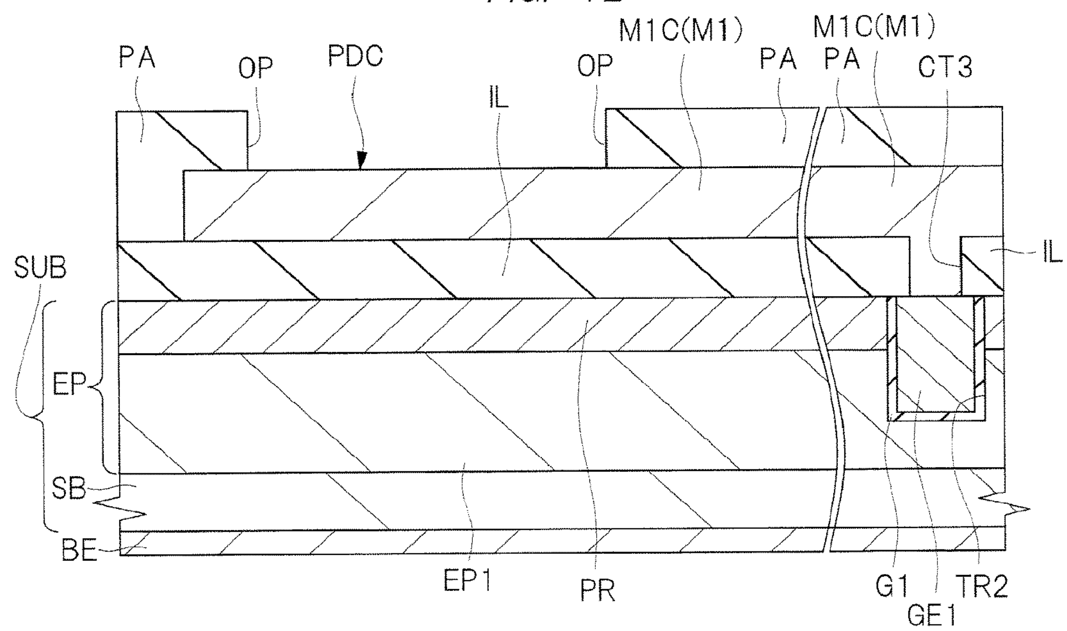
FIG. 12 is a cross-sectional view of a principal part of a semiconductor device of an embodiment.

Further, each cross-sectional view taken along a line A-A in FIGS. 4 and 5 almost corresponds to FIG. 7, each cross-sectional view taken along a line B-B in FIGS. 4 and 5 almost corresponds to FIG. 8, each cross-sectional view taken along a line C-C in FIG. 4 and FIG. 5 almost corresponds to FIG. 9, and each cross-sectional view taken along a line D-D in FIGS. 4 and 5 almost corresponds to FIG. 10. Further, FIG. 11 is a cross-sectional view taken along the wiring M1G for a gate, which illustrates a cross-sectional view crossing a pad PDG for a gate. Further, FIG. 12 is a cross-sectional view taken along the wiring M1C for a control electrode, which illustrates a cross-sectional view crossing the pad PDC for a control electrode. Further, FIG. 13 corresponds to an enlarged partial cross-sectional view of FIG. 7.

Further, while an X direction and a Y direction illustrated in plan views (FIGS. 1 to 6) are directions in parallel to the main surface of the semiconductor substrate SUB, they are directions crossing each other, preferably directions intersecting orthogonally to each other. The Y direction corresponds to an extension direction of the trench TR1 (TR1*a*) formed in the transistor formation region RG1.

As also illustrated in FIGS. 1 to 13, the semiconductor substrate SUB configuring the semiconductor device (semiconductor chip) CP includes: a substrate body (a semiconductor substrate, a semiconductor wafer) SB made of, for example, an $n^+$-type monocrystalline silicon to which arsenic (As) is introduced; and an epitaxial layer (a semiconductor layer) EP formed on the main surface of the substrate body SB and made of, for example, an $n^-$-type monocrystalline silicon. Therefore, the semiconductor substrate SUB is a so-called epitaxial wafer. The epitaxial layer EP is also regarded as a part of the semiconductor substrate SUB. The substrate body SB and the epitaxial layer EP are of the same conductivity type (here, n-type) as each other. However, an impurity concentration (n-type impurity concentration) of the substrate body SB is higher than an impurity concentration (n-type impurity concentration) of the epitaxial layer EP, and a resistivity (specific resistance) of the substrate body SB is lower than a resistivity (specific resistance) of the epitaxial layer EP. The epitaxial layer EP is formed on the main surface of the substrate body SB by an epitaxial growth method.

A trench-gate type MISFET configuring the power MISFET is formed in the transistor formation region (element formation region) RG1 of the main surface of the semiconductor substrate SUB. Here, the transistor formation region (element formation region) RG1 is a plane region having the trench-gate type MISFET configuring the power MISFET formed on the main surface of the semiconductor substrate SUB. A plurality of unit transistor cells Q1 are formed in the transistor formation region RG1 of the main surface of the semiconductor substrate SUB, and the plurality of unit transistor cells Q1 formed in the transistor formation region RG1 are connected in parallel to each other, so that one power MISFET is formed. Therefore, the transistor formation region RG1 can also be regarded as a region (power MISFET formation region) where the power MISFET is formed. Each unit transistor cell Q1 is formed of a trench-gate type MISFEET (MISFET having a trench type gate structure). The trench-gate type MISFET configuring each unit transistor cell Q1 is here an n channel type MISFET. Note that the trench-gate type MISFET is a MISFET having a trench type gate structure (a gate electrode structure embedded in a trench provided in a substrate).

The substrate body SB and the epitaxial layer EP ($n^-$-type epitaxial layer EP1) have a function serving as a drain region of the unit transistor cell Q1. That is, the substrate body SB and the epitaxial layer EP ($n^-$-type epitaxial layer EP1) functions as a drain region of the power MISFET. A back electrode for a drain electrode (a back drain electrode, a drain electrode) BE is formed on a whole back surface (that is, a back surface of the substrate body SB) of the semiconductor substrate SUB. The back electrode BE can be formed of, for example, a multilayer film made of a titanium (Ti) layer, a nickel (Ni) layer and a gold (Au) layer in this order from the back surface of the semiconductor substrate SUB.

Note that a main surface of the semiconductor substrate SUB which is on an opposite side to a side where the epitaxial layer EP is formed is assumed to be referred to as a back surface of the semiconductor substrate SUB. Further, a main surface of the substrate body SB which is on an opposite side to a side where the epitaxial layer EP is formed is assumed to be a back surface of the substrate body SB. Therefore, the back surface of the semiconductor substrate SUB is the same as the back surface of the substrate body SB.

Further, a p-type semiconductor region (a p-type semiconductor layer, a p-type base region) PR is formed in the epitaxial layer EP of the transistor formation region RG1, and the p-type semiconductor region PR has a function serving as a channel formation region of the unit transistor cell Q1. That is, the p-type semiconductor region PR is a p-type semiconductor region for forming the channel (for a channel formation region).

Further, in the epitaxial layer EP of the transistor formation region RG1, an $n^+$-type semiconductor region ($n^+$-type source region) NR is formed above the p-type semiconductor region PR, and the $n^+$-type semiconductor region NR has a function serving as a source region of the unit transistor cell Q1. That is, the $n^+$-type semiconductor region NR is an n-type semiconductor region for a source (for a source region). The p-type semiconductor region PR exists below the $n^+$-type semiconductor region NR.

In the semiconductor substrate SUB, the trenches TR1 and TR2 extending from the main surface of the semiconductor substrate SUB are formed in a thickness direction of the semiconductor substrate SUB. The trench TR1 of the trenches TR1 and TR2 functions as a trench for embedding a gate electrode (GE2) and a control electrode (GE1) of the trench-gate type MISFET, and the trench TR2 thereof is a trench provided for connecting the gate electrode (GE2) and the control electrode (GE1) of the trench-gate type MISFET to the wiring M1G for a gate and the wiring M1C for a control electrode, respectively. The trench TR1 is provided in the transistor formation region RG1 on the main surface of the semiconductor substrate SUB, and has the control electrode GE1 and the gate electrode GE2 embedded therein, the gate electrode GE2 embedded in the trench TR1 can function as a gate electrode for the trench-gate type MISFET, and the control electrode GE1 embedded in the trench TR1 can function as a control electrode for the trench-gate type MISFET. That is, the gate electrode GE2 embedded in the trench TR1 controls formation of the channel region in the p-type semiconductor region PR, and controls ON/OFF of the trench-gate type MISFET. Further, the control electrode GE1 embedded in the trench TR1 controls the semiconductor region for a drain (here, the $n^-$-type epitaxial layer EP1), and controls a conduction resistance of the semiconductor region for a drain and a parasitic capacitance of the trench-gate type MISFET. The control electrode GE1 can also be regarded as a gate electrode. However, ON/OFF of the channel (that is, ON/OFF of the trench-gate type MISFET) is controlled by the gate electrode GE2.

The trench TR2 is connected to the trench TR1, and extends on the main surface of the semiconductor substrate SUB so as to reach an outside of the transistor formation region RG1, and has the control electrode GE1 and the gate electrode GE 2 embedded therein. Therefore, the gate electrode GE2 embedded in the trench TR2 is formed integrally with the gate electrode GE2 embedded in the trench TR1 so as to be connected thereto, and the control electrode GE1 embedded in the trench TR2 is formed integrally with the control electrode GE1 embedded in the trench TR1 so as to be connected thereto. However, the gate electrode GE2 embedded in the trench TR2 does not function as a gate electrode of the trench-gate type MISFET, and the control electrode GE1 embedded in the trench TR2 does not function as a control electrode of the trench-gate type MISFET. The trench TR2 is provided in order to connect a via portion (a via portion for a gate) of the wiring M1G for a gate to the gate electrode GE2 in the trench TR2 and connect a via portion (a via portion for a control electrode) of the wiring M1C for a control electrode to the control electrode GE1 in the trench TR2.

A plane layout of the trench TR1 is as follows. Note that, while an X direction and a Y direction are directions in parallel to the main surface of the semiconductor substrate SUB, they are directions crossing each other, preferably directions intersecting orthogonally to each other.

As illustrated in FIGS. 3 and 4, in the transistor formation region RG1, a plurality of trench TR1 (TR1*a*) extending in the Y direction are arranged in the X direction at a predetermined interval (pitch). Further, in the transistor formation region RG1, each one end portion (Y-directional one end portion) of the plurality of trenches TR1 (TR1*a*) extending in the Y direction is connected to a different one end portion by the trench TR1 (TR1*b*) extending in the X direction, and the other end portion (Y-directional other end portion) thereof is connected to a different other end portion by the trench TR1 (TR1*b*) extending in the X direction. Here, the trench TR1 extending in the Y direction and being arranged in the X direction at a predetermined interval (pitch) is referred to as "trench TR1*a*" with a reference symbol TR1*a*. Further, the trench TR1 extending in the X direction which connects the end portion (Y-directional end portion) of the plurality of trenches TR1*a* extending in the Y direction to a different end portion is referred to as "trench TR1*b*" with a reference symbol TR1*b*. Therefore, the plurality of trenches TR1*a* extending in the Y direction are arranged in the X direction at the predetermined interval (pitch), and the end portions (Y-directional end portions) of the plurality of trenches TR1*a* are connected to each other by the trench TR1*b* extending in the X direction. The trench TR1*a* and the trench TR1*b* are connected to each other. Therefore, the gate electrode GE2 embedded in the trench TR1*b* is formed integrally with the gate electrode GE2 embedded in the trench TR1*a* so as to be connected thereto, and the control electrode GE1 embedded in the trench TR1*b* is formed integrally with the control electrode GE1 embedded in the trench TR1*a* so as to be connected thereto. Note that the gate electrode GE2 and the control electrode GE1 embedded in the trench TR1*a* function as a gate electrode and a control electrode of the trench-gate type MISFET. However, the gate electrode GE2 and the control electrode GE1 embedded in the trench TR1*b* may not function as a gate electrode and a control electrode of the trench-gate type MISFET in some cases.

The contact hole CT1 for a source is arranged between the trenches TR1*a* adjacent to each other in the X direction, and extends in the Y direction between the trenches TR1*a* adjacent to each other in the X direction.

The trench TR2 is formed in a region (an adjacent region in the Y direction) adjacent to the transistor formation region RG1, and the plurality of trenches TR2 (TR2*a*) extending in the Y direction and being connected to the trench TR1*b* extending in the X direction are arranged in the X direction at the predetermined interval (pitch). Further, one end portion (Y-directional one end portion) of each of the plurality of trenches TR2 (TR2*a*) extending in the Y direction is connected to the trench TRb1 extending in the X direction, and the other end portion (the Y-directional other end portion) thereof is connected to the trench TR2 (TR2*b*) extending in the X direction. Here, the trench TR2 extending in the Y direction and being arranged in the X direction at the predetermined interval (pitch) is referred to as "trench TR2*a*" with a reference symbol TR2*a*. Further, the trench TR2 extending in the X direction which connects the end portions (the end portions opposite to the end portions connected to the trench TR1*b*) of the plurality of trenches TR2*a* extending in the Y direction is referred to as "trench TR2*b*" with a reference symbol TR2*b*. Therefore, the plurality of trenches TR2*a* extending in the Y direction are arranged in the X direction at the predetermined interval (pitch), and each one end portion (Y-directional end portion) of the plurality of trenches TR2*a* is connected to the trench TR1*b* extending in the X direction, and the other end portions (Y-directional end portions) of the plurality of trenches TR2*a* are connected to each other by the trench TR2*b* extending in the X direction. Each trench TR2*a* extends in the Y direction from a position thereof connected to the trench TR1*b* toward the outside of the transistor formation region RG1. The trench TR2*a* and the trench TR2*b* are connected to each other. Therefore, the gate electrode GE2 embedded in the trench TR2*b* is formed integrally with the gate electrode GE2 embedded in the trench TR2*a* so as to be connected thereto, and the control electrode GE1 embedded in the trench TR2*b* is formed integrally with the control electrode GE1 embedded in the trench TR2*a* so as to be connected thereto.

In the transistor formation region RG1, the trench TR1 is formed so as to penetrate through (pass through) the $n^+$-type semiconductor region NR and the p-type semiconductor region PR from an upper surface of the $n^+$-type semiconductor region NR, and to terminate in the epitaxial layer EP (that is, the $n^-$-type epitaxial layer EP1) below the p-type semiconductor region PR. Here, a region of the epitaxial layer EP which is lower than the p-type semiconductor region PR and is maintained in an $n^-$-type state is referred to as "$n^-$-type epitaxial layer EP1". The $n^-$-type epitaxial layer EP1 exists below the p-type semiconductor region PR. The $n^-$-type epitaxial layer EP1 of the epitaxial layer EP has a function serving as a drain region of the unit transistor cell Q1.

That is, the p-type semiconductor region PR is formed in the epitaxial layer EP so as to be adjacent to the trench TR1, the $n^+$-type semiconductor region NR is formed on the p-type semiconductor region PR in the epitaxial layer EP so as to be adjacent to the trench TR1, and the $n^-$-type epitaxial layer EP (that is, the $n^-$-type epitaxial layer EP1) is positioned below the p-type semiconductor region PR. Therefore, the $n^+$-type semiconductor region NR is formed on a surface layer of the epitaxial layer EP between the adjacent trenches TR1, the p-type semiconductor region PR is formed below this $n^+$-type semiconductor region NR, and the $n^-$-type epitaxial layer EP (that is, the $n^-$-type epitaxial layer EP1) is positioned below this p-type semiconductor region PR.

Therefore, each trench TR1 is formed so as to penetrate from the main surface of the semiconductor substrate SUB (that is, a main surface of the epitaxial layer EP) through the semiconductor region for a source (here, the $n^+$-type semiconductor region NR) and the semiconductor region for a channel (here, the p-type semiconductor region PR), and to terminate in the semiconductor region for a drain (here, the $n^-$-type epitaxial layer EP1). Therefore, while a bottom surface of the trench TR1 is deeper than a bottom surface of the $n^+$-type semiconductor region NR (that is, a boundary surface between the $n^+$-type semiconductor region NR and the p-type semiconductor region PR) and is deeper than a bottom surface of the p-type semiconductor region PR, the bottom surface of the trench TR1 does not reach the substrate body SB and is positioned in the middle of the $n^-$-type epitaxial layer EP1 (in the middle thereof in a depth direction).

Note that the term "depth" or "depth position" corresponds to a distance from the main surface of the semiconductor substrate SUB (that is, the main surface of the epitaxial layer EP) (a distance in a direction perpendicular to the main surface of the semiconductor substrate SUB). And, a side closer to the main surface of the semiconductor substrate SUB (that is, the main surface of the epitaxial layer EP) is defined as a shallow side, and a side farther from the main surface of the semiconductor substrate SUB (that is, the main surface of the epitaxial layer EP) (in other words, a side closer to the back surface of the semiconductor substrate SUB) is defined as a deep side.

Figure 13:
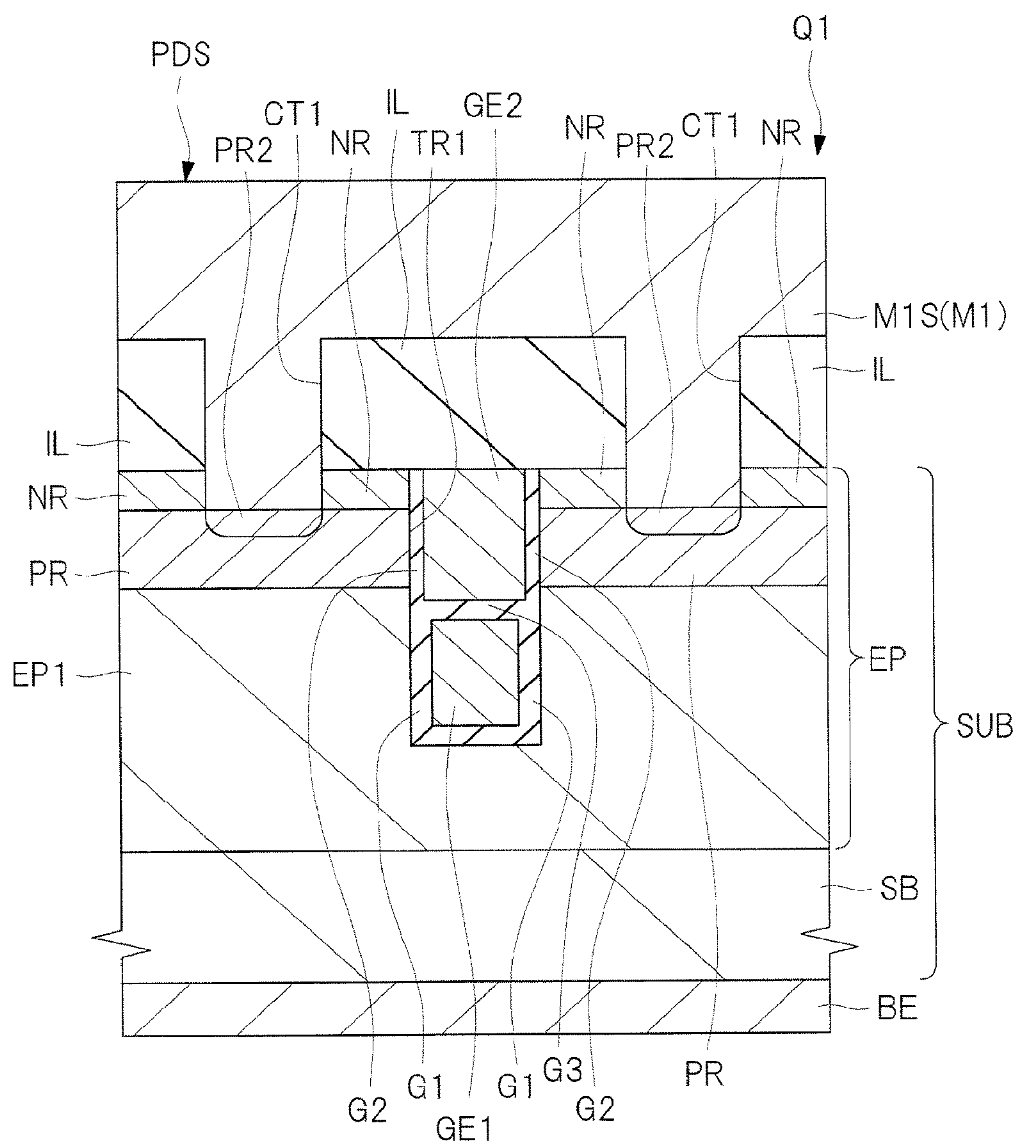
FIG. 13 is a cross-sectional view of a principal part of a semiconductor device of an embodiment.

A control electrode GE1 is formed in a lower portion inside the trench TR1 through an insulating film (an insulating layer, a gate insulating film) G1 for a gate insulating film, and a gate electrode GE2 is formed in an upper portion inside the trench TR1 through an insulating film (an insulating layer, a gate insulating film) G2 for a gate insulating film (see FIGS. 7 and 13). Inside the trench TR1, the insulating film G2 is interposed between a side wall of the trench TR1 and the gate electrode GE2, and the insulating film G1 is interposed between the control electrode GE1 and a side wall and a bottom surface of the trench TR1. It is preferred to form the insulating film G1 to be thicker than the insulating film G2. Further, inside the trench TR1, the gate electrode GE2 exists above the control electrode GE1, and the control electrode GE1 exists below the gate electrode GE2. However, the control electrode GE1 and the gate electrode GE2 are not in contact with each other, and an insulating film (insulating layer) G3 is interposed between the control electrode GE1 and the gate electrode GE2. All of the insulating film G1, the insulating film G2, and the insulating film G3 are made of, for example, silicon oxide. The insulating film G1, the insulating film G2, and the insulating film G3 may be a different film from each other or an integrated film. Both of the control electrode GE1 and the gate electrode GE2 are made of a conductor, and are made of, for example, low-resistance polycrystalline silicon (doped polysilicon).

Therefore, the transistor formation region RG1 has such a state that a multilayer structure of the control electrode GE1 and the gate electrode GE2 provided on the control electrode GE1 through the insulating film G3 is embedded inside the trench TR1 through the insulating film G1 and the insulating film G2.

Since the insulating film G3 is interposed between the control electrode GE1 and the gate electrode GE2, the control electrode GE1 and the gate electrode GE2 are not short-circuited, and they are insulated from each other. Therefore, the control electrode GE1 and the gate electrode GE2 can be controlled independently of each other, and the same potential as or a different potential from each other can be applied to the control electrode GE1 and the gate electrode GE2.

A depth position of an upper surface of the gate electrode GE2 formed inside the trench TR1 is shallower than a bottom surface of the $n^+$-type semiconductor region NR for a source (that is, a boundary surface between the $n^+$-type semiconductor region NR and the p-type semiconductor region PR). That is, the upper surface of the gate electrode GE2 formed inside the trench TR1 is located at a position higher than the bottom surface of the $n^+$-type semiconductor region NR. Therefore, as viewed in the thickness direction of the semiconductor substrate SUB, the gate electrode GE2 formed inside the trench TR1 partially overlaps with the $n^+$-type semiconductor region NR for a source. Further, a depth position of a bottom surface of the gate electrode GE2 formed inside the trench TR1 is positioned to be equal to a bottom surface of the p-type semiconductor region PR or deeper than the bottom surface of the p-type semiconductor region PR, and is positioned in the middle of the thickness of the semiconductor region for a drain (here, the $n^-$-type epitaxial layer EP1). Further, both of a depth position of an upper surface of the control electrode GE1 formed inside the trench TR1 and a depth position of a bottom surface thereof are positioned in the middle of the thickness of the semiconductor region for a drain (here, the $n^-$-type epitaxial layer EP1). Therefore, as viewed in the thickness direction of the semiconductor substrate SUB, while the control electrode GE1 formed inside the trench TR1 overlaps with the semiconductor region for a drain (here, the $n^-$-type epitaxial layer EP1), it does not overlap with the $n^+$-type semiconductor region NR for a source and the p-type semiconductor region PR for a channel.

Therefore, a side surface of the gate electrode GE2 inside the trench TR1 faces the $n^+$-type semiconductor region NR and the p-type semiconductor region PR through the insulating film G2. Specifically, an upper portion of the side surface of the gate electrode GE2 inside the trench TR1 faces the $n^+$-type semiconductor region NR through the insulating film G2, an intermediate portion of the side surface of the gate electrode GE2 inside the trench TR1 faces the p-type semiconductor region PR through the insulating film G2, and a lower portion of the side surface of the gate electrode GE2 inside the trench TR1 faces the semiconductor region for a drain (here, the $n^-$-type epitaxial layer EP1) through the insulating film G2. On the other hand, a side surface and a bottom surface of the control electrode GE1 inside the trench TR1 do not face the $n^+$-type semiconductor region NR and the p-type semiconductor region PR but face the semiconductor region for a drain (here, the type epitaxial layer EP1) through the insulating film G1.

The gate electrode GE2 formed inside the trench TR1 functions as a gate electrode of the unit transistor cell Q1, and the insulating film G2 between the gate electrode GE2 formed inside the trench TR1 and the side wall of the trench TR1 functions as a gate insulating film of the unit transistor cell Q1. Therefore, the insulating film G2 between the gate electrode GE2 formed inside the trench TR1 and the side wall of the trench TR1 can be regarded as a gate insulating film of the gate electrode GE2. The channel is formed in the p-type semiconductor region PR facing the side surface of the gate electrode GE2 through the insulating film G2. That is, a channel current of the unit transistor cell Q1 flows in the thickness direction of the semiconductor substrate SUB along the side wall (side surface) of the trench TR1. Further, the insulating film G1 formed between the control electrode GE1 formed inside the trench TR1 and the side wall of the trench TR1 can also be regarded as a gate insulating film of the control electrode GE1.

The trench TR2 is connected to the trench TR1, and can be formed in the same step as that of the trench TR1. It is preferred to form a width W2 of the trench TR2 to be larger than a width W1 of the trench TR1 (that is, W2>W1). Particularly, it is preferred to form the width (X-directional width) W2 of the trench TR2*a* extending in the Y direction to be larger than the width (X-directional width) W1 of the trench TR1*a* extending in the Y direction (that is, W2>W1). In this manner, the width W1 of the trench TR1 (TR1*a*) can be small, and the width W2 of the trench TR2 (TR2*a*) can be large. By forming the width W1 of the trench TR1 (TR1*a*) to be small, the number of unit transistor cells Q1 which can be formed in the transistor formation region RG1 can be increased, and the ON resistance of the power MISFET can be reduced. Further, by forming the width W1 of the trench TR1 (TR1*a*) to be small, an area of the transistor formation region RG1 can be reduced if the ON resistance is not changed, and therefore, a size (area) of the semiconductor device can be reduced. Further, by forming the width W2 of the trench TR2 (TR2*a*) to be large, the via portion (the via portion for a gate) of the wiring M1G for a gate can be easily connected to the gate electrode GE2 inside the trench TR2, and the via portion (the via portion for a control electrode) of the wiring M1C for a control electrode can be easily connected to the control electrode GE1 inside the trench TR2.

Further, a depth position of a bottom surface of the trench TR2 and a depth position of a bottom surface of the trench TR1 can be almost equal to each other. However, in such a case that the width (W2) of the trench TR2 and the width (W1) of the trench TR1 are different from each other, the depth position of the bottom surface of the trench TR2 and the depth position of the bottom surface of the trench TR1 may be different from each other. For example, when the width (W2) of the trench TR2 is larger than the width (W1) of the trench TR1, the depth position of the bottom surface of the trench TR2 can be deeper than the depth position of the bottom surface of the trench TR1.

In the epitaxial layer EP, while the n-type semiconductor region for a source (here, the $n^+$-type semiconductor region NR) is formed at a position adjacent to the trench TR1 (particularly, the trench TR1*a*), the n-type semiconductor region for a source (here, the $n^+$-type semiconductor region NR) is not formed at a position adjacent to the trench TR2. This is because the gate electrode GE2 and the control electrode GE1 embedded inside the trench TR1 (particularly, the trench TR1*a*) function as a gate electrode and a control electrode of the trench-gate type MISFET while the gate electrode GE2 and the control electrode GE1 embedded inside the trench TR2 do not function as a gate electrode and a control electrode of the trench-gate type MISFET. However, in the epitaxial layer EP, the p-type semiconductor region PR can be formed in a region adjacent to the trench TR2.

The trench TR2 has a region (TR3) in which the control electrode GE1 and the gate electrode GE2 are embedded as similar to the trench TR1 and a region (TR4) in which the gate electrode GE2 is not embedded but the control electrode GE1 is embedded (see FIGS. 8 to 10). Here, the region of the trench TR2 in which the control electrode GE1 and the gate electrode GE2 are embedded as similar to the trench TR1 is referred to as "multilayer region TR3" with a reference symbol TR3, and the region thereof in which the gate electrode GE2 is not embedded but the control electrode GE1 is embedded is referred to as "single-layer region TR4" with a reference symbol TR4. In FIG. 4, the trench TR2 inside a region surrounded by a dotted line with the reference symbol TR4 is the single-layer region TR4, and a region of the trench TR2 except for the single-layer region TR4 is the multilayer region TR3. The trench TR2 illustrated in a cross-sectional view of FIG. 8 is the trench TR2 of the multilayer region TR3, and the trench TR2 illustrated in a cross-sectional view of FIG. 9 is the trench TR2 of the single-layer region TR4. Note that each trench TR2*a* extending in the Y direction has the multilayer region TR3 and the single-layer region TR4 as illustrated in FIG. 10.

In the multilayer region TR3, a structure embedded inside the trench TR2 is basically the same as a structure embedded inside the trench TR1. That is, in the multilayer region TR3, the control electrode GE1 is formed in the lower portion inside the trench TR2 through the insulating film G1, and the gate electrode GE2 is formed in the upper portion inside the trench TR2 through the insulating film G2. Inside the trench TR2 of the multilayer region TR3, the insulating film G2 is interposed between a side wall of the trench TR2 and the gate electrode GE2, and the insulating film G1 is interposed between the control electrode GE1 and a side wall and a bottom surface of the trench TR2. Further, inside the trench TR2 of the multilayer region TR3, a gate electrode GE2 exists above the control electrode GE1, and the control electrode GE1 exists below the gate electrode GE2. However, the control electrode GE1 and the gate electrode GE2 are not in contact with each other, and an insulating film G3 is interposed between the control electrode GE1 and the gate electrode GE2. Therefore, the inside of the trench TR2 of the multilayer region TR3 has such a multilayer structure embedded therein through the insulating film G1 and the insulating film G2 as being formed of the control electrode GE1 and the gate electrode GE2 provided on the control electrode GE1 through the insulating film G3.

In the single-layer region TR4, the structure embedded inside the trench TR2 is different from the structure embedded inside the trench TR1. That is, inside the trench TR2 of the single-layer region TR4, while the control electrode GE1 is formed through the insulating film G1, the gate electrode GE2 and the insulating film G2 are not formed (see FIGS. 9 and 10). Inside the trench TR2 of the single-layer region TR4, the insulating film G1 is interposed between the control electrode GE1 and the side wall and the bottom surface of the trench TR2. Therefore, inside the trench TR2 of the single-layer region TR4, the control electrode GE1 is embedded through the insulating film G1. The control electrode GE1 inside the trench TR2 of the single-layer region TR4 is formed integrally with the control electrode GE1 inside the trench TR2 of the multilayer region TR3 so as to be connected thereto. Therefore, the control electrode GE1 inside the trench TR2 of the single-layer region TR4, the control electrode GE1 inside the trench TR2 of the multilayer region TR3, and the control electrode GE1 inside the trench TR1 are formed integrally with each other so as to be connected to each other. Further, the gate electrode GE2 inside the trench TR2 of the multilayer region TR3 and the gate electrode GE2 inside the trench TR1 are formed integrally with each other so as to be connected to each other.

An insulating film IL is formed on the main surface of the semiconductor substrate SUB (that is, the main surface of the epitaxial layer EP) so as to cover the control electrode GE1 and the gate electrode GE2. The insulating film IL is an interlayer insulating film, and is formed of, for example, a silicon oxide film.

Contact holes (openings, holes, through-holes, connection holes) CT1, CT2 and CT3 are formed in the insulating film IL. The contact hole CT1 of these holes is a contact hole for leading the source (that is, a contact hole for a source), the contact hole CT2 is a contact hole for leading the gate electrode GE2 (that is, a contact hole for a gate), and the contact hole CT3 is a contact hole for leading the control electrode GE1 (that is, a contact hole for a control electrode).

A wiring M1 formed of a conductive film (conductor) is formed on the insulating film IL. The wiring M1 includes the wiring M1S for a source, the wiring M1G for a gate, and the wiring M1C for a control electrode.

The wiring M1S for a source, the wiring M1G for a gate, and the wiring M1C for a control electrode are separated from each other so as not to be connected to each other. That is, the wiring M1C for a control electrode is not connected to the wiring M1S for a source through a conductor, and is not connected to the wiring M1G for a gate through a conductor. Further, the wiring M1G for a gate is not connected to the wiring M1S for a source through a conductor and is not connected to the wiring M1C for a control electrode through a conductor. Further, the wiring M1S for a source is not connected to the wiring M1G for a gate through a conductor and is not connected to the wiring M1C for a control electrode through a conductor.

The wiring M1.3 for a source is formed on the insulating film IL, and a part of the wiring M1S for a source is filled inside the contact hole CT1 for a source. The part of the wiring M1S for a source which is filled inside the contact hole CT1 for a source is assumed to be referred to as "a via portion of the wiring M1S for a source" or "a via portion for a source".

The wiring M1G for a gate is formed on the insulating film IL, and a part of the wiring M1G for a gate is filled inside the contact hole CT2 for a gate. The part of the wiring M1G for a gate which is filled inside the contact hole CT2 for a gate is assumed to be referred to as "a via portion of the wiring M1G for a gate" or "a via portion for a gate".

The wiring M1C for a control electrode is formed on the insulating film IL, and a part of the wiring M1C for a control electrode is filled inside the contact hole CT3 for a control electrode. The part of the wiring M1C for a control electrode which is filled inside the contact hole CT3 for a control electrode is assumed to be referred to as "a via portion of the wiring M1C for a control electrode" or "a via portion for a control electrode".

Here, the explanation has been made for such a case that the via portion for a source is formed integrally with the wiring M1S for a source, the via portion for a gate is formed integrally with the wiring M1G for a gate, and the via portion for a control electrode is formed integrally with the wiring M1C for a control electrode. As another aspect, the via portion for a source (the conductive portion filled inside the contact hole CT1) can be formed separately from the wiring M1S for a source (in a step different from a step of forming the wiring M1S for a source), the via portion for a gate (the conductive portion filled inside the contact hole CT2) can be formed separately from the wiring M1G for a gate (in a step different from a step of forming the wiring M1G for a gate), and the via portion for a control electrode (the conductive portion filled inside the contact hole CT3) is formed separately from the wiring M1C for a control electrode (at a step different from a step of forming the wiring M1C for a control electrode).

The wiring M1S for a source is formed on the whole transistor formation region RG1. The contact hole CT1 for a source is formed above the epitaxial layer EP between the trenches TR1 (TR1*a*) in the transistor formation region RG1 as seen when seen in a plan view, and penetrates through the insulating film IL and the $n^+$-type semiconductor region NR so that a bottom portion of the contact hole CT1 reaches the p-type semiconductor region PR. Therefore, the via portion for a source embedded inside the contact hole CT1 for a source also penetrates through the insulating film IL and the $n^+$-type semiconductor region NR so that a bottom portion of the via portion for a source reaches the p-type semiconductor region PR.

Since a lower side surface of the via portion for a source contacts with the $n^+$-type semiconductor region NR, the via portion for a source contacts with the $n^+$-type semiconductor region NR so as to be electrically connected to the $n^+$-type semiconductor region NR. Further, since the bottom surface of the via portion for a source contacts with the p-type semiconductor region PR, the via portion for a source contacts with the p-type semiconductor region PR so as to be electrically connected to the p-type semiconductor region PR.

Note that the via portion for a source can directly contact with the p-type semiconductor region PR. However, a $p^+$-type semiconductor region PR2 having a higher impurity concentration than that of the p-type semiconductor region PR can be provided at a position with which the bottom surface of the via portion for a source contacts, and then, the via portion for a source can be electrically connected to the p-type semiconductor region PR through this $p^+$-type semiconductor region PR2. FIG. 7 illustrates a case that this $p^+$-type semiconductor region PR2 is interposed between the via portion for a source and the p-type semiconductor region PR so that the via portion for a source is electrically connected to the p-type semiconductor region PR through the $p^+$-type semiconductor region PR2. By providing the $p^+$-type semiconductor region PR2, a contact resistance of the via portion for a source can be reduced. When the formation of the $p^+$-type semiconductor region PR2 is eliminated, the bottom surface of the via portion for a source contacts with the p-type semiconductor region PR.

Therefore, the via portion of the wiring M1S for a source, that is, the via portion for a source is electrically connected to both of the $n^+$-type semiconductor region NR and the p-type semiconductor region PR. Therefore, the wiring M1S for a source is electrically connected to both of the $n^+$-type semiconductor region NR and the p-type semiconductor region PR. That is, the $n^+$-type semiconductor region NR for a source and the p-type semiconductor region PR positioned below the $n^+$-type semiconductor region NR are electrically connected to the wiring M1S for a source through the via portion for a source. In the transistor formation region RG1, the contact hole CT1 for a source is formed between the trenches TR1*a* adjacent to each other in the X direction so as to extend in the Y direction. Therefore, a plurality of contact holes CT1 for a source are formed in the transistor formation region RG1, and source regions ($n^+$-type semiconductor regions NR) and p-type semiconductor regions (PR) for a channel of the plurality of unit transistor cells Q1 provided in the transistor formation region RG1 are electrically connected to a common wiring M1S for a source through the via portions for a source embedded inside the plurality of contact holes CT1.

The wiring M1G for a gate is formed not inside the transistor formation region RG1 but in periphery of the transistor formation region RG1 when seen when seen in a plan view. And, the wiring M1G for a gate overlaps with the trench TR2 when as seen when seen in a plan view. More specifically, a part of the wiring M1G for a gate which extends in the X direction overlaps with the trench TR2*a* extending in the Y direction when as seen when seen in a plan view, and the contact hole CT2 for a gate is arranged in an overlapping region of the wiring M1G for a gate with the trench TR2 (TR2*a*). The trench TR2 in a region where the contact hole CT2 for a gate is arranged configures the multilayer region TR3, and has the control electrode GE1 and the gate electrode GE2 embedded therein.

Therefore, the contact hole CT2 for a gate is formed above the trench TR2 of the multilayer region TR3 (at a position overlapping with the trench TR2 of the multilayer region TR3 when seen when seen in a plan view) in periphery of the transistor formation region RG1, and penetrates through the insulating film IL so that the bottom portion of the contact hole CT2 reaches the gate electrode GE2 inside the trench TR2 of the multilayer region TR3. Therefore, the via portion for a gate embedded inside the contact hole CT2 for a gate also penetrates through the insulating film IL so that the bottom portion of the via portion for a gate reaches the gate electrode GE2 inside the trench TR2 of the multilayer region TR3. Since the bottom surface of the via portion for a gate contacts with the gate electrode GE2 inside the trench TR2 of the multilayer region TR3, the via portion for a gate contacts with the gate electrode GE2 inside the trench TR2 of the multilayer region TR3 so as to be electrically connected to the gate electrode GE2. The gate electrode GE2 inside the trench TR1 of the multilayer region TR3 is formed integrally with the gate electrode GE2 inside the trench TR1 of the transistor formation region RG1. Therefore, the wiring M1G for a gate is connected to the gate electrode GE2 inside the trench TR2 of the multilayer region TR3 through the via portion for a gate embedded inside the contact hole CT2 for a gate so as to be electrically connected to the gate electrode GE2 inside the trench TR1 through the gate electrode GE2 inside the trench TR2.

The wiring M1C for a control electrode is formed not inside the transistor formation region RG1 but in periphery of the transistor formation region RG1 when seen when seen in a plan view. And, the wiring M1C for a control electrode overlaps with the trench TR2 when seen when seen in a plan view. More specifically, a portion of the wiring M1C for a control electrode which extends in the X direction overlaps with the trench TR2*a* extending in the Y direction when seen when seen in a plan view, and the contact hole CT3 for a control electrode is arranged in an overlapping region of the wiring M1C for a control electrode with the trench TR2 (TR2*a*). The trench TR2 in the region where the contact hole CT3 for a gate is arranged configures the single-layer region TR4, and has the control electrode GE1 embedded therein (the gate electrode GE2 is not embedded therein).

Therefore, the contact hole CT3 for a control electrode is formed above the trench TR2 of the single-layer region TR4 (at a position overlapping with the trench TR2 of the single-layer region TR4 when seen in a plan view) in periphery of the transistor formation region RG1, and penetrates through the insulating film IL so that a bottom portion of the contact hole CT3 reaches the control electrode GE1 inside the trench TR2 of the single-layer region TR4. Therefore, the via portion for a control electrode embedded inside the contact hole CT3 for a control electrode also penetrates through the insulating film IL so that a bottom portion of the via portion for a control electrode reaches the control electrode GE1 inside the trench TR2 in the single-layer region TR4. Since the bottom surface of the via portion for a control electrode contacts with the control electrode GE1 inside the trench TR2 of the single-layer region TR4, the via portion for a control electrode contacts with the control electrode GE1 inside the trench TR2 of the single-layer region TR4 so as to be electrically connected to the control electrode GE1. The control electrode GE1 inside the trench TR2 of the single-layer region TR4 is formed integrally with the control electrode GE1 inside the trench TR1 of the transistor formation region RG1. Therefore, the wiring M1C for a control electrode is connected to the control electrode GE1 inside the trench TR2 of the single-layer region TR4 through the via portion for a control electrode so as to be electrically connected to the control electrode GE1 inside the trench TR1 through the control electrode GE1 inside the trench TR2.

The wiring M1 (the wiring M1G for a gate, the wiring M1C for a control electrode, and the wiring M1S for a source) is covered with an insulating film PA for surface protection. That is, the insulating film PA is formed on the insulating film IL so as to cover the wiring M1 (the wiring M1G for a gate, the wiring M1C for a control electrode, and the wiring M1S for a source). The insulating film PA is the uppermost layer film (an insulating film) of the semiconductor device.

As illustrated in FIG. 1 and others, a plurality of openings OP are formed in the insulating film PA, and the wiring M1 is partially exposed from each opening OP. The wiring M1 exposed from the opening OP configures a bonding pad (a pad electrode).

That is, a bonding pad for a source (a pad PDS for a source) is formed of the wiring M1S for a source exposed from the opening OP (an opening OP among the openings OP for forming the bonding pad for a source) formed in the insulating film PA. Further, a bonding pad for a gate (a pad PDG for a gate) is formed of the wiring M1G for a gate exposed from the opening OP (an opening OP among the openings OP for forming the bonding pad for a gate) formed in the insulating film PA. Further, a bonding pad for a control electrode (a pad PDC for a control electrode) is formed of the wiring M1C for a control electrode exposed from the opening OP (an opening OP among the openings OP for forming the bonding pad for a control electrode) formed in the insulating film PA.

In a semiconductor device having such a configuration, an operation current of the trench-gate type MISFET formed in the transistor formation region RG1 flows between the epitaxial layer EP for a drain (that is, the $n^-$-type epitaxial layer EP1) and the $n^+$-type semiconductor region NR for a source along a side surface of the gate electrode GE2 (that is, the side surface of the trench TR1) in the thickness direction of the semiconductor substrate SUB. That is, a channel is formed along the thickness direction of the semiconductor substrate SUB. A region of the p-type semiconductor region PR which is adjacent to the gate electrode GE2 through the insulating film G2, that is, a region between the $n^+$-type semiconductor region NR and the $n^-$-type epitaxial layer EP1 along the trench TR1 configures a channel formation region (a channel layer).

Therefore, the trench-gate type MISFET formed in the transistor formation region RG1 is also a vertical MISFET (a vertical field effect transistor). Here, the vertical MISFET corresponds to a MISFET having a current between a source and a drain flowing in the thickness direction of the semiconductor substrate (SUB) (a direction substantially perpendicular to the main surface of the semiconductor substrate).

In order to flow the current in the trench-gate type MISFET, a voltage equal to or larger than $V_{th}$ (a turnover voltage of a channel, a threshold voltage) is applied from the pad PDG for a gate to the gate electrode GE2 through the wiring M1G for a gate. In this manner, the current can flow between the pad PDS for a source and a back electrode BE through the wiring M1S for a source, the source region (the $n^+$-type semiconductor region NR), the channel layer, the epitaxial layer EP (the drain region), and the substrate body SB. That is, by applying a predetermined voltage between the gate electrode GE2 and the wiring M1S for a source so that the gate electrode GE2 has a high potential, the channel is formed in the p-type semiconductor region PR facing the gate electrode GE2 through the insulating film G2, and the current flows between the drain region (the epitaxial layer EP and the substrate body SB) and the source region (the $n^+$-type semiconductor region NR) through the channel.

Further, a desired voltage can be applied from the pad PDC for a control electrode to the control electrode GE1 through the wiring M1C for a control electrode. The wiring M1S for a source, the wiring M1G for a gate, and the wiring M1C for a control electrode are separated from each other, and the wiring M1C for a control electrode are neither connected to the wiring M1S for a source nor the wiring M1G for a gate through a conductor. Therefore, the potential of the control electrode GE1 can be controlled independently of the source region (the $n^+$-type semiconductor region NR) and the gate electrode GE2. Therefore, the potential of the control electrode GE1 can be equal to a potential of the source region (the $n^+$-type semiconductor region NR), can be equal to a potential of the gate electrode GE2, or can be different from potentials of the source region (the $n^+$-type semiconductor region NR) and the gate electrode GE2.

<Regarding Step of Manufacturing Semiconductor Device>

One example of steps of manufacturing the semiconductor device of the present embodiment will be described with reference to FIGS. 14 to 39. Each of FIGS. 14 to 39 is a cross-sectional view of a principal part in the step of manufacturing the semiconductor device of the present embodiment. FIGS. 14, 16, 18, 20, 22, 24, 26, 28, 30, 32, 34, 36, and 38 of FIGS. 14 to 39 illustrate cross-sectional views corresponding to the above-described FIG. 7 (cross-sectional views at a position corresponding to a line A-A in FIG. 4). Further, FIGS. 15, 17, 19, 21, 23, 25, 27, 29, 31, 33, 35, 37, and 39 of FIGS. 14 to 39 illustrate cross-sectional views almost corresponding to the above-described FIG. 10 (cross-sectional views at a position corresponding to a line D-D in FIG. 4). Note that one suitable example of the steps of manufacturing the semiconductor device of the present embodiment will be described here. However, the steps are not limited to this example, and can be modified variously.

Figure 14:
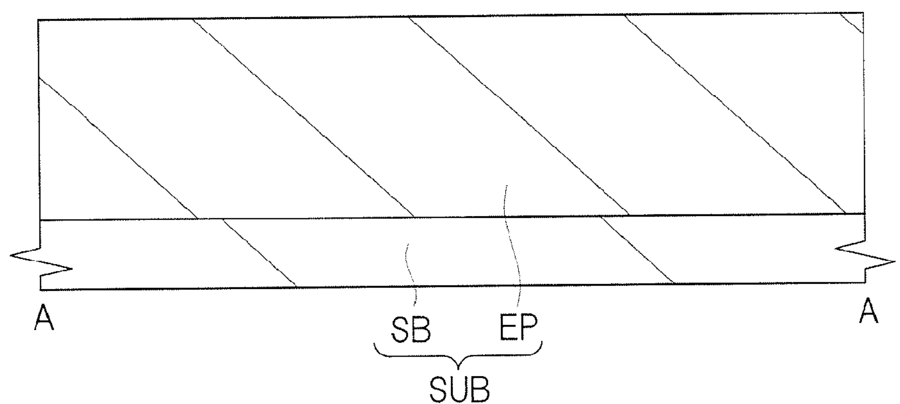
FIG. 14 is a cross-sectional view of a principal part in a step of manufacturing the semiconductor device of the embodiment.
Figure 15:
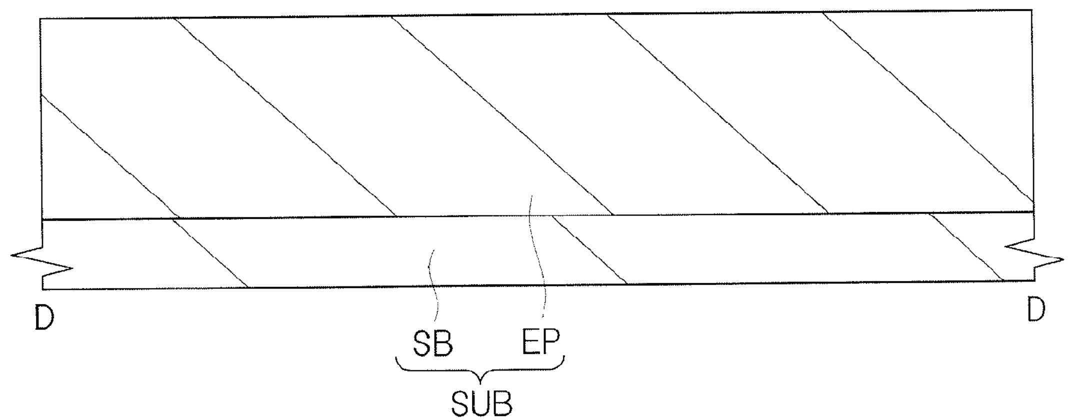
FIG. 15 is a cross-sectional view of a principal part in the step of manufacturing the semiconductor device, as the same as FIG. 14.

In order to manufacture the semiconductor device, a semiconductor substrate SUB is prepared first as illustrated in FIGS. 14 and 15, the semiconductor substrate SUB having, for example, a substrate body (a semiconductor substrate, a semiconductor wafer) SB made of an $n^+$-type monocrystalline silicon or others and an epitaxial layer (a semiconductor layer) EP made of an $n^-$-type monocrystalline silicon formed on a main surface of the substrate body SB. The semiconductor substrate SUB is a so-called epitaxial wafer. The semiconductor substrate SUB can be formed by forming, for example, the epitaxial layer EP on the main surface of the substrate body SB by an epitaxial growing method. The substrate body SB is a low-resistance substrate, and has a resistivity (specific resistance) of, for example, about 1 to 10 mΩcm. The epitaxial layer EP is a semiconductor layer, an impurity concentration (n-type impurity concentration) of the epitaxial layer EP is lower than an impurity concentration (n-type impurity concentration) of the substrate body SB, and a resistivity of the epitaxial layer EP is higher than a resistivity of the substrate body SB.

Figure 16:
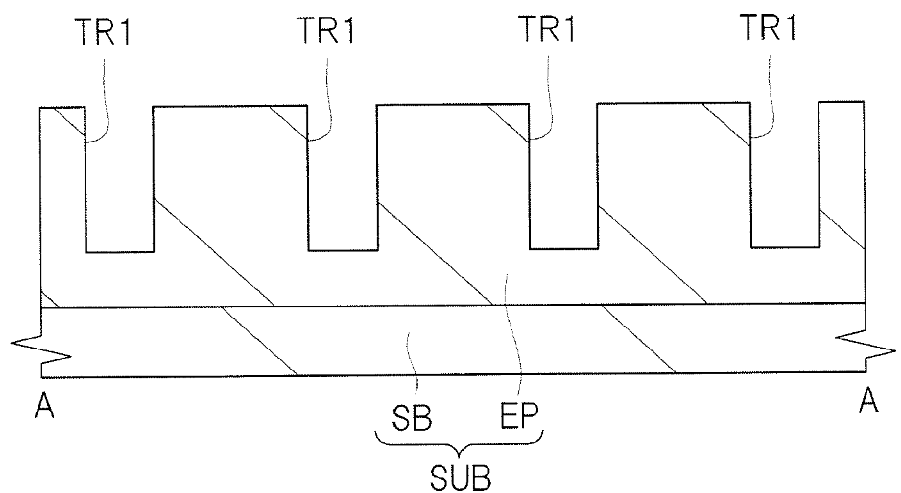
FIG. 16 is a cross-sectional view of a principal part in a step of manufacturing the semiconductor device, as continued from FIG. 14.
Figure 17:
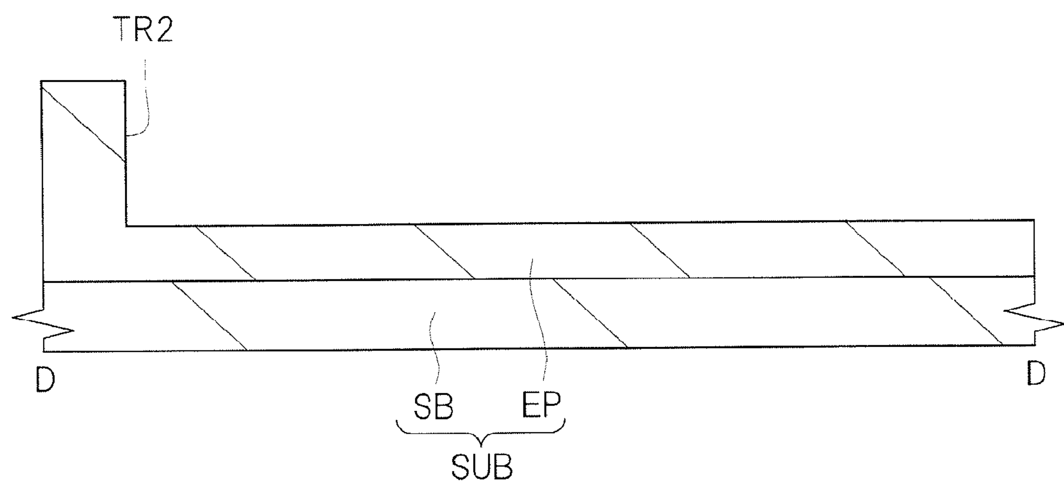
FIG. 17 is a cross-sectional view of a principal part in the step of manufacturing the semiconductor device, as the same as FIG. 16.

Next, as illustrated in FIGS. 16 and 17, trenches TR1 and TR2 are formed on the main surface of the semiconductor substrate SUB. The trench TR1 is a trench for embedding a gate electrode GE2 and a control electrode GE1 therein to form a trench-gate type MISFET, and the trench TR2 is a trench (a trench for a contact) for leading out the gate electrode GE2 and the control electrode GE1. That is, the trench TR2 has functions as both of a trench for leading the gate electrode GE2 directly upward (directly above the trench TR2) so as to be connected to a wiring (a wiring M1G for a gate) and a trench for leading the control electrode GE1 directly upward (directly above the trench TR2) so as to be connected to a wiring (a wiring M1C for a control electrode). The trench TR2 is connected to the trench TR1.

More specifically, the trenches TR1 and TR2 can be formed as, for example, follows.

First, an insulating film for a hard mask (not illustrated) is formed on the semiconductor substrate SUB (on a whole surface of the main surface). The insulating film for a hard mask is formed of, for example, a silicon nitride film, a silicon oxide film, or their multilayer film, and can be formed by, for example, a CVD (Chemical Vapor Deposition) method. Then, a photoresist pattern (not illustrated) is formed on the insulating film for a hard mask by using a photolithography technique, and then, the insulating film for a hard mask is etched (for example, dry-etched) to be patterned by using the photoresist pattern as an etching mask. Then, the photoresist pattern is removed. In this manner, the patterned insulating film for a hard mask has openings in formation-planning regions of the trenches TR1 and TR2. Then, the epitaxial layer EP is etched (for example, dry-etched) by using the patterned insulating film for a hard mask as an etching mask (a hard mask), so that the trenches TR1 and TR2 are formed in the epitaxial layer EP. Then, the insulating film for a hard mask is removed by etching (for example, wet-etching) or others. In this manner, as illustrated in FIGS. 16 and 17, the trenches TR1 and TR2 can be formed.

Further, as another aspect, the epitaxial layer EP is etched (for example, dry-etched) by using a photoresist pattern formed on the semiconductor substrate SUB by using a photolithography technique as an etching mask, so that the trenches TR1 and TR2 can be also formed.

The trenches TR1 and TR2 are formed in the same step (the same etching step). Therefore, a depth of the trench TR1 and a depth of the trench TR2 can be made substantially equal to each other. However, in such a case that the width of the trench TR1 and the width of the trench TR2 are different from each other, the depth of the trench TR1 and the depth of the trench TR2 can be different from each other. For example, when the width of the trench TR2 is larger than the width of the trench TR1, the depth of the trench TR2 can become deeper than the depth of the trench TR1.

The depths of the trenches TR1 and TR2 are such dimensions as being deeper than a bottom surface (a joined surface) of a p-type semiconductor region PR to be formed later and shallower than a bottom surface (an interface between the epitaxial layer EP and the substrate body SB) of the epitaxial layer EP. That is, the trenches TR1 and TR2 do not penetrate through the epitaxial layer EP so that the epitaxial layer EP remains below the trenches TR1 and TR2.

While the width of the trench TR2 can be made almost equal to the width of the trench TR1, is more preferably larger than the width of the trench TR1. Here, the width of the trench TR2 corresponds to a width (dimension) in a direction parallel to the main surface of the semiconductor substrate SUB (therefore, the main surface of the epitaxial layer EP) and perpendicular to an extension direction of the trench TR2. Further, the width of the trench TR1 corresponds to a width (dimension) in a direction parallel to the main surface of the semiconductor substrate SUB (therefore, the main surface of the epitaxial layer EP) and perpendicular to an extension direction of the trench TR1.

If the width of the trench TR1 is too large, there is a disadvantage to downsizing (reducing an area of) the semiconductor device. If the width of the trench TR2 is too small, it is difficult to form the contact holes on the trench TR2. Therefore, from such a viewpoint that the width of the trench TR2 is secured as much as the contact holes can be formed while the width of the trench TR1 is suppressed to a certain extent, it is more preferable that the width of the trench TR2 is larger than the width of the trench TR1.

Figure 18:
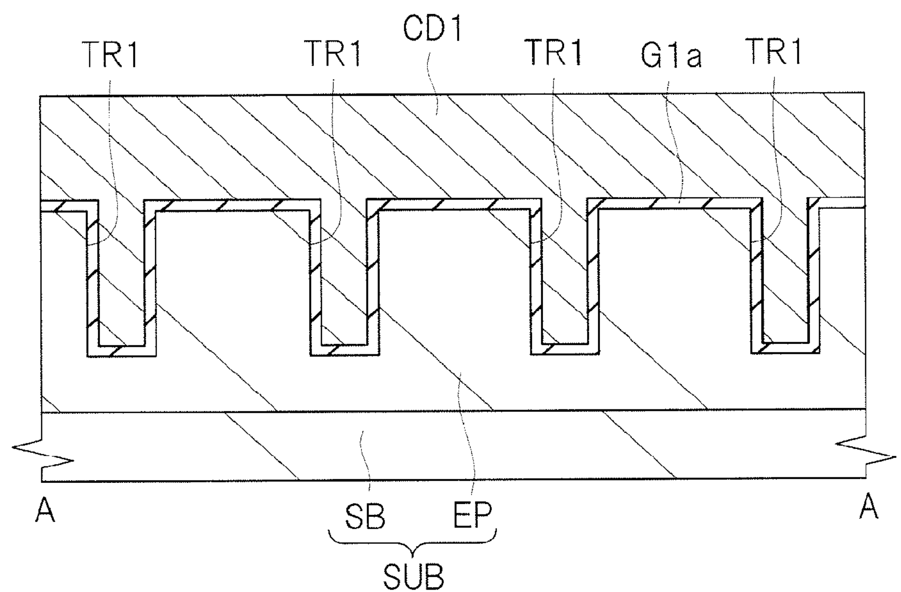
FIG. 18 is a cross-sectional view of a principal part in a step of manufacturing the semiconductor device, as continued from FIG. 16.
Figure 19:
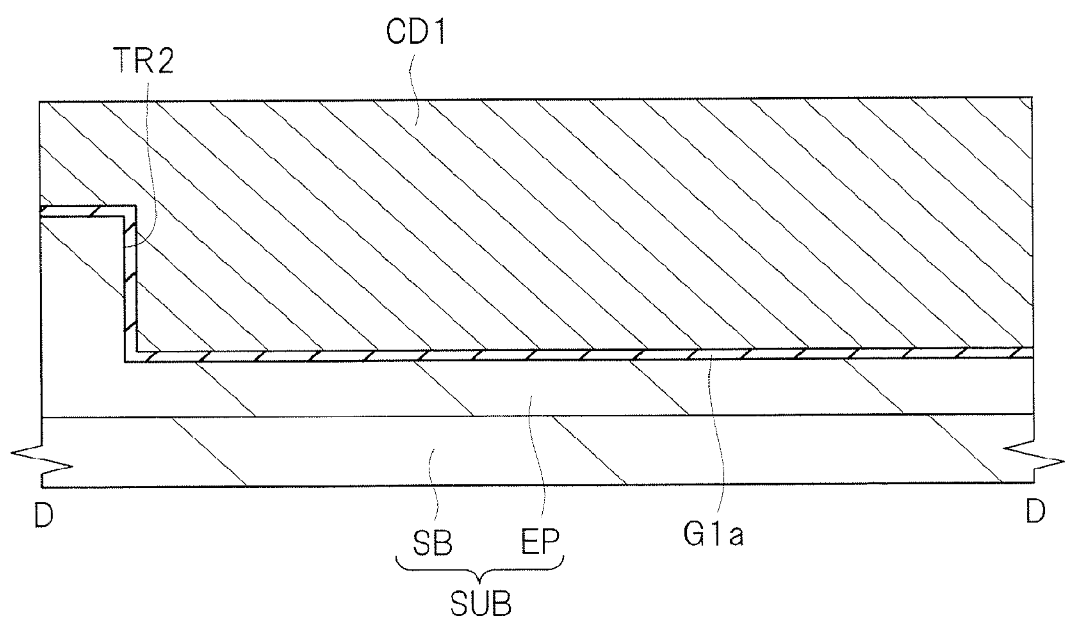
FIG. 19 is a cross-sectional view of a principal part in the step of manufacturing the semiconductor device, as the same as FIG. 18.

Next, as illustrated in FIGS. 18 and 19, an insulating film G1*a* formed of a silicon oxide film or others is formed on the main surface of the semiconductor substrate SUB including inner surfaces (side walls and bottom surfaces) of the trenches TR1 and TR2 by using, for example, a thermal oxidation method or others. At this stage, the insulating film G1*a* is formed on the inner surfaces (side walls and bottom surfaces) of the trenches TR1 and TR2 and an exposed upper surface of the epitaxial layer EP.

Next, a conductive film CD1 is formed on the main surface (a whole surface of the main surface) of the semiconductor substrate SUB, that is, on the insulating film G1*a* so as to fill the insides of the trenches TR1 and TR2. The conductive film CD1 is a conductive film for forming the control electrode GE1. The conductive film CD1 is formed of, for example, a low-resistance polycrystalline silicon film (a doped polysilicon film), and can be formed by using a CVD method or others. To the polycrystalline silicon film configuring the conductive film CD1, an impurity (preferably, an n-type impurity) is introduced.

Figure 20:
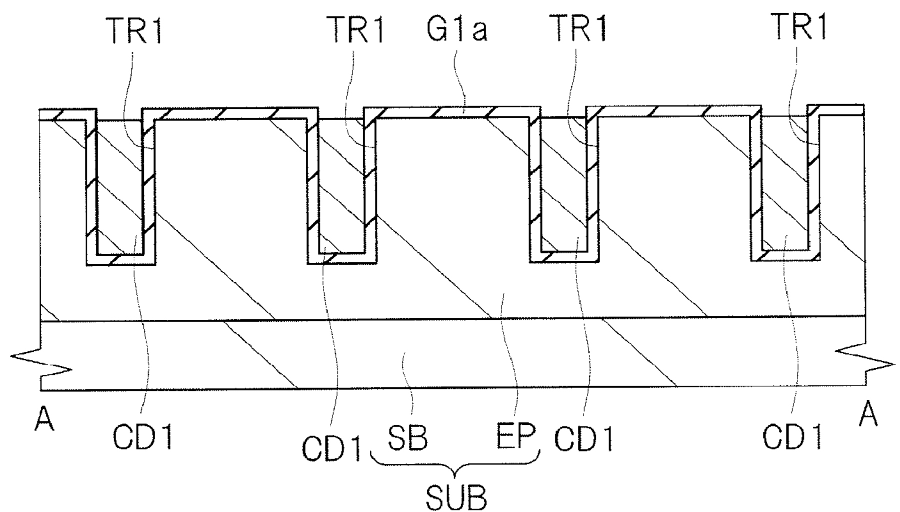
FIG. 20 is a cross-sectional view of a principal part in a step of manufacturing the semiconductor device, as continued from FIG. 18.
Figure 21:
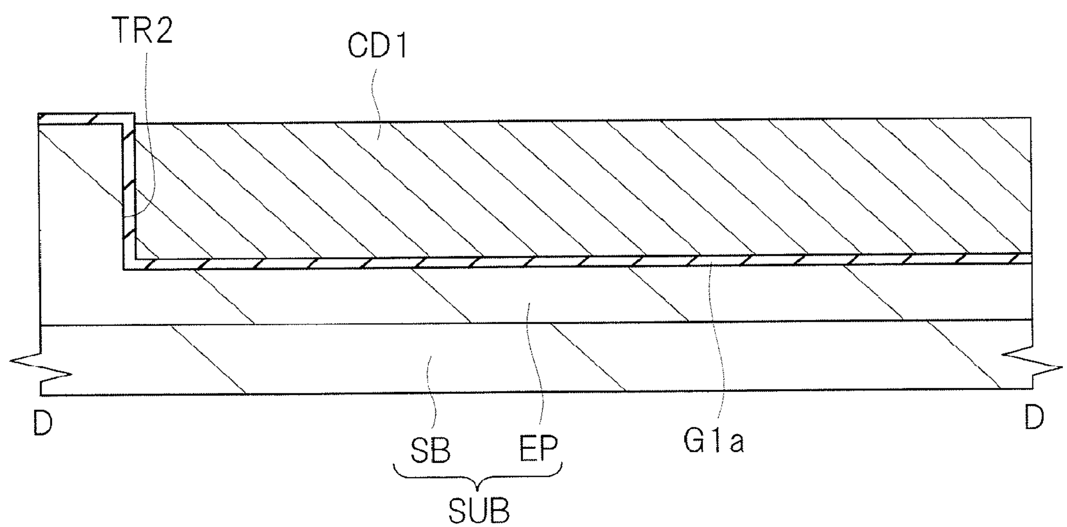
FIG. 21 is a cross-sectional view of a principal part in the step of manufacturing the semiconductor device, as the same as FIG. 20.

Next, as illustrated in FIGS. 20 and 21, a portion of the conductive film CD1 which is outside of the trenches TR1 and TR2 is removed by etching (etching back) the conductive film CD1, so that the conductive films CD1 is left in the trenches TR1 and TR2. At this stage, upper surfaces of the conductive film CD1 remaining inside the trenches TR1 and TR2 are at almost the same height position as that of the main surface of the semiconductor substrate SUB.

Figure 22:
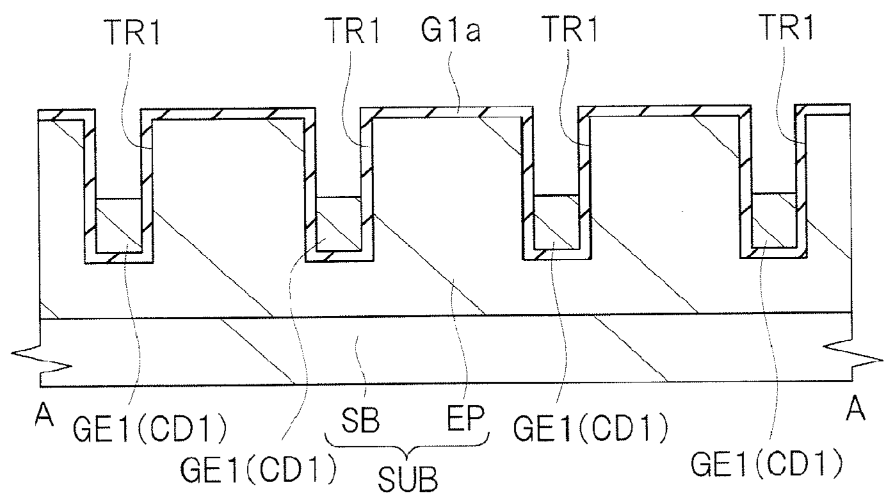
FIG. 22 is a cross-sectional view of a principal part in a step of manufacturing the semiconductor device, as continued from FIG. 20.
Figure 23:
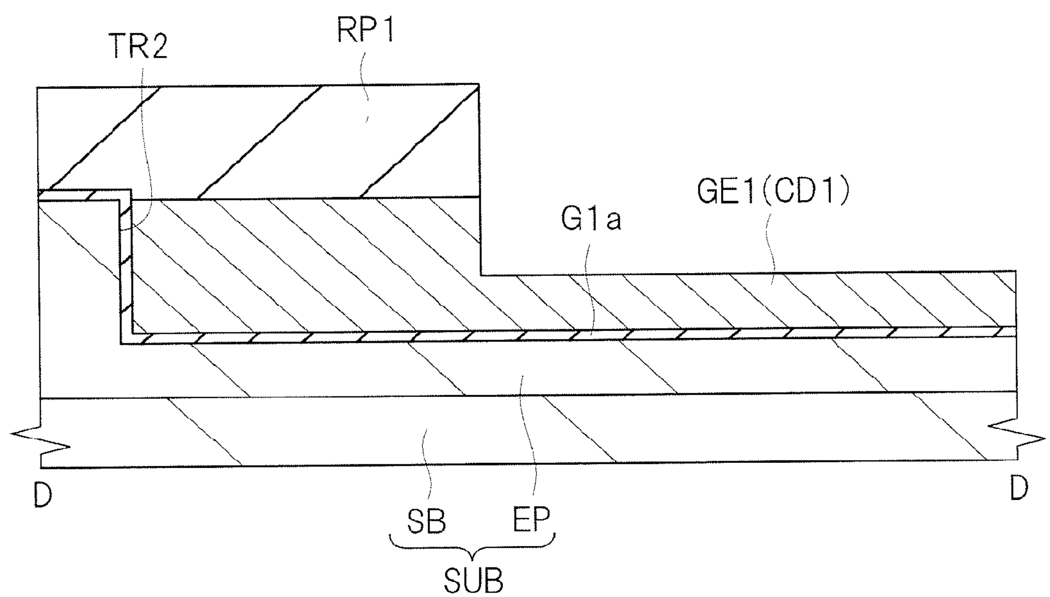
FIG. 23 is a cross-sectional view of a principal part in the step of manufacturing the semiconductor device, as the same as FIG. 22.

Next, as illustrated in FIGS. 22 and 23, a photoresist pattern RP1 is formed on the semiconductor substrate SUB by using a photolithography technique. The photoresist pattern RP1 is formed so as to cover a portion of the trench TR2 which is to be the single-layer region TR4. That is, a region surrounded by a dotted line attached with the reference symbol TR4 in the above-described FIG. 4 is covered with the photoresist pattern RP1. Therefore, when the photoresist pattern PR1 is formed, the portion of the trench TR2 which is to be the single-layer region TR4 is covered with the photoresist pattern RP1. However, other portion of the trench TR2 except for the portion thereof which is to be the single-layer region TR4 (therefore, the portion of the trench TR2 which is to be the multilayer region TR3) and the whole trench TR1 are not covered with the photoresist pattern RP1.

Next, the conductive film CD1 is etched (etched back) in a state that the photoresist pattern RP1 has been formed. At this time, the conductive film CD1 inside the trenches TR1 and TR2 is etched (etched back) in a region which is not covered with the photoresist pattern RP1. However, the conductive film CD1 is etched (etched back) so as not to remove the conductive film CD1 inside the trenches TR1 and TR2 over the whole thicknesses but to leave the conductive film CD1 so as to be down to the middles of the depths of the trenches TR1 and TR2. On the other hand, in the region covered with the photoresist pattern RP1, the conductive film CD1 inside the trench TR2 is left without being etched. FIGS. 22 and 23 illustrate this stage. The control electrode GE1 is formed of the conductive film CD1 left inside the trenches TR1 and TR2. That is, the conductive film CD1 left inside the trenches TR1 and TR2 becomes the control electrode GE1. Since the trench TR1 and the trench TR2 are connected to each other, the control electrode GE1 inside the trench TR1 and the control electrode GE1 inside the trench TR2 are formed integrally with each other so as to be connected to each other. Then, the photoresist pattern RP1 is removed.

Figure 24:
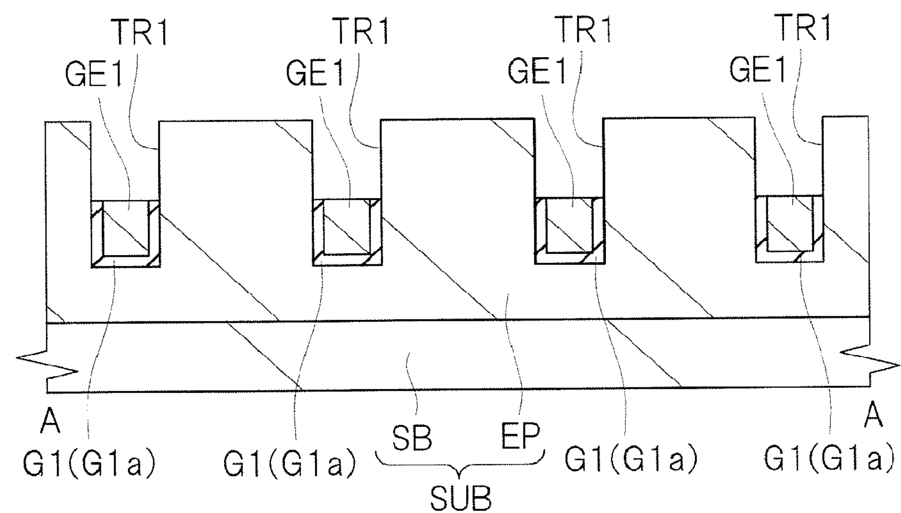
FIG. 24 is a cross-sectional view of a principal part in a step of manufacturing the semiconductor device, as continued from FIG. 22.
Figure 25:
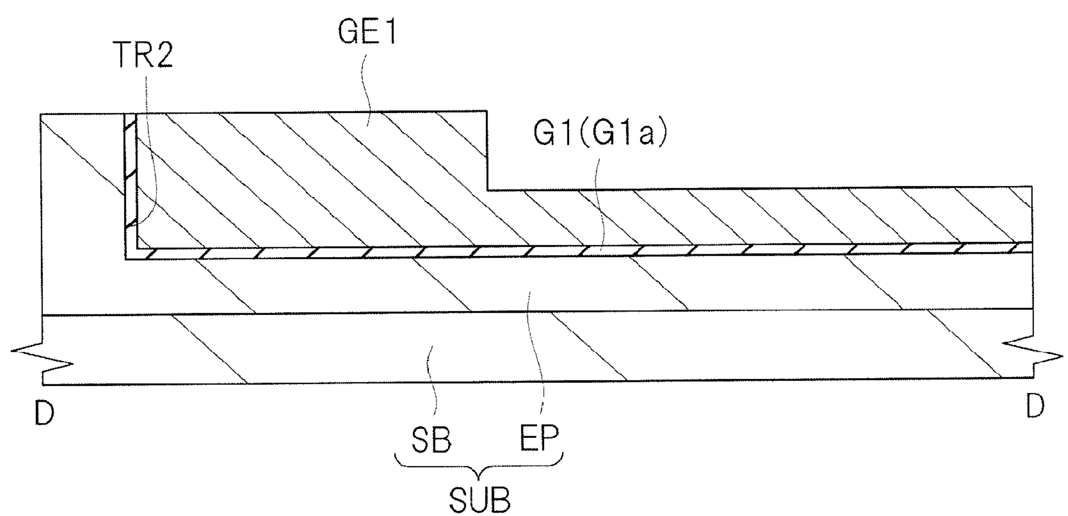
FIG. 25 is a cross-sectional view of a principal part in the step of manufacturing the semiconductor device, as the same as FIG. 24.

Next, as illustrated in FIGS. 24 and 25, the exposed insulating film G1*a* is removed by etching. At this time, a portion of the insulating film G1*a* which is not covered with the control electrode GE1 but is exposed is removed by etching. However, portions of the insulating film G1*a* which are interposed between the control electrode GE1 and the inner surfaces (side walls and bottom surfaces) of the trenches TR1 and TR2 are not removed but are left inside the trenches TR1 and TR2, and become the above-described insulating film G1. In this manner, the control electrode GE1 is embedded inside the trenches TR1 and TR2 through the insulating films G1. However, in the portion of the trench TR2 which is to be the single-layer region TR4, an upper surface of the control electrode GE1 is at almost the same height position as an upper surface of the epitaxial layer EP. However, in the trench TR1 and other portion of the trench TR2 except for the portion thereof which is to be the single-layer region TR4, the upper surface of the control electrode GE1 is positioned in the middles of the depths of the trenches TR1 and TR2.

Figure 26:
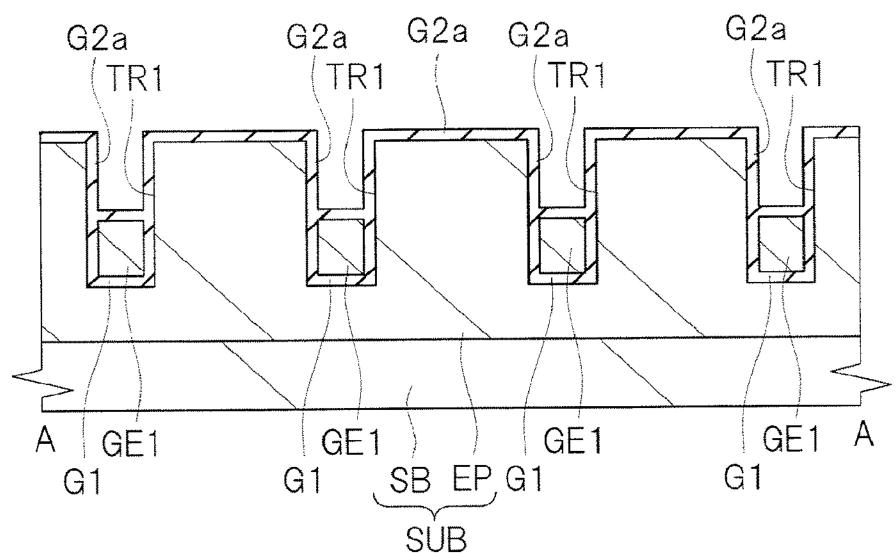
FIG. 26 is a cross-sectional view of a principal part in a step of manufacturing the semiconductor device, as continued from FIG. 24.
Figure 27:
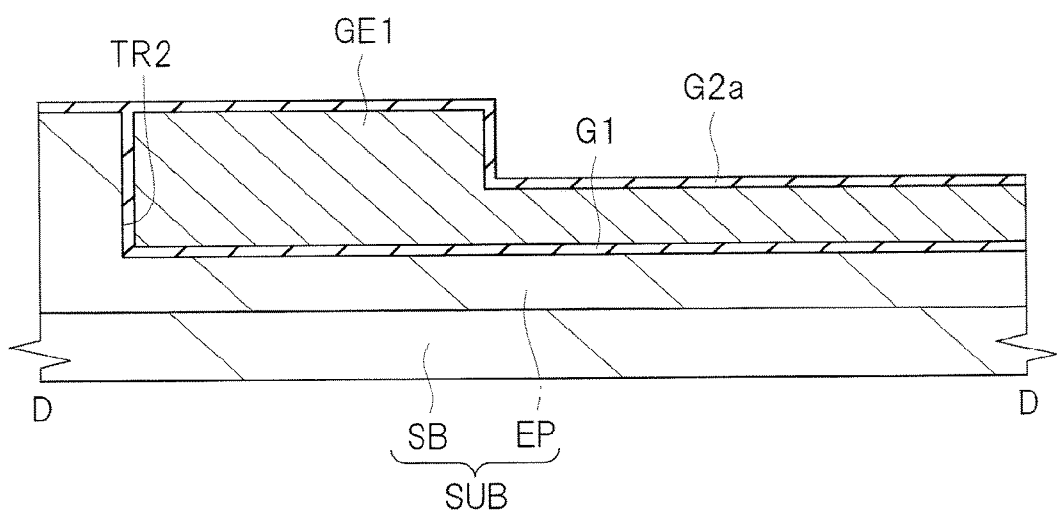
FIG. 27 is a cross-sectional view of a principal part in the step of manufacturing the semiconductor device, as the same as FIG. 26.

Next, as illustrated in FIGS. 26 and 27, an insulating film G2*a* formed of a silicon oxide film or others is formed on the main surface of the semiconductor substrate SUB including side walls of the trenches TR1 and TR2 and a surface (exposed surface) of the control electrode GE1 by using, for example, a thermal oxidation method or others. At this stage, the insulating film G2*a* is formed on side walls of the portions of the trenches TR1 and TR2 which are not covered with the control electrode GE1, the surface (exposed surface) of the control electrode GE1, and an exposed upper surface of the epitaxial layer EP. The insulating film 32*a* can also be formed by a CVD method.

It is more preferable to form the insulating film G2*a* to be thinner than the insulating film G1, so that a current driving ability of the trench-gate type MISFET can be improved, and the ON resistance of a power MISFET configured of the trench-gate type MISFET can be reduced.

Figure 28:
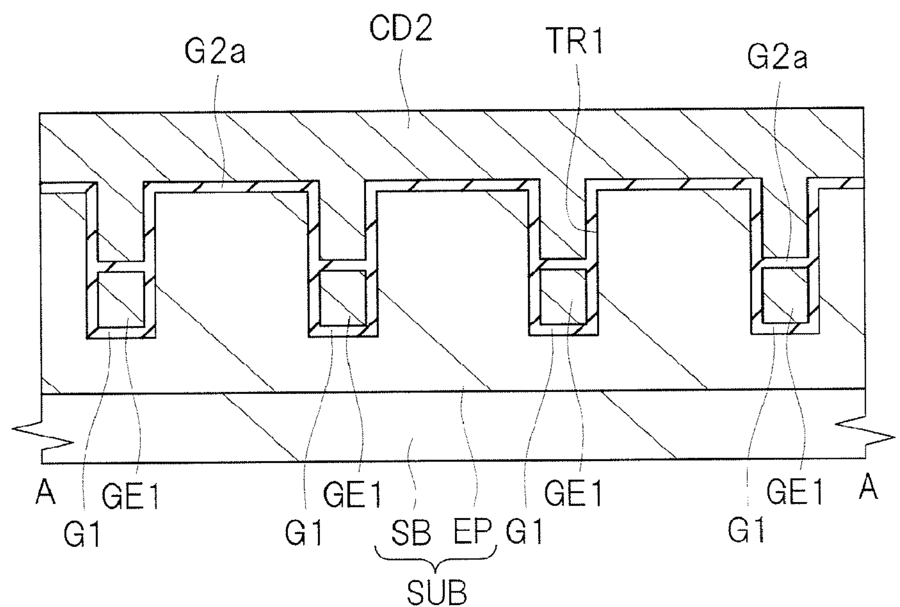
FIG. 28 is a cross-sectional view of a principal part in a step of manufacturing the semiconductor device, as continued from FIG. 26.
Figure 29:
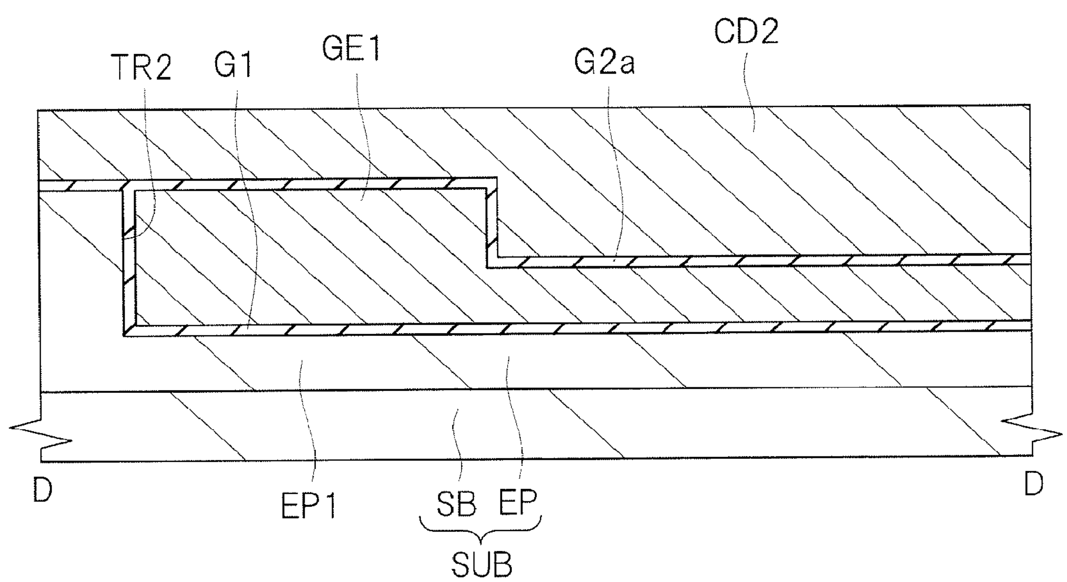
FIG. 29 is a cross-sectional view of a principal part in the step of manufacturing the semiconductor device, as the same as FIG. 28.

Next, as illustrated in FIGS. 28 and 29, a conductive film CD2 is formed on the main surface (a whole surface of the main surface) of the semiconductor substrate SUB, that is, on the insulating film G2*a* so as to fill the insides of the trenches TR1 and TR2. The conductive film CD2 is a conductive film for formation of the gate electrode GE2. The conductive film CD2 is formed of, for example, a low-resistance polycrystalline silicon film (a doped polysilicon film), and can be formed by using a CVD method or others. To the polycrystalline silicon film configuring the conductive film CD2, an impurity (preferably, an n-type impurity) is introduced.

Figure 30:
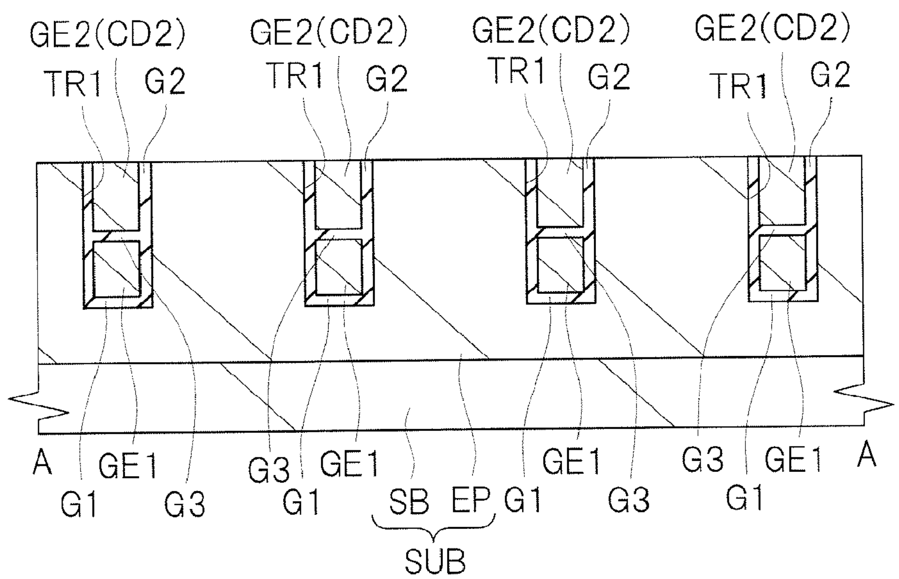
FIG. 30 is a cross-sectional view of a principal part in a step of manufacturing the semiconductor device, as continued from FIG. 28.
Figure 31:
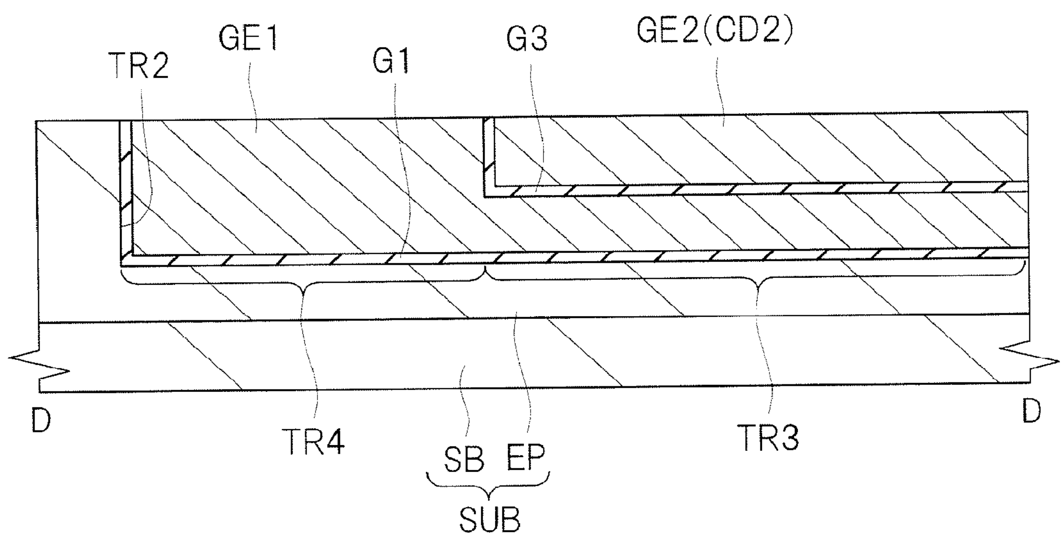
FIG. 31 is a cross-sectional view of a principal part in the step of manufacturing the semiconductor device, as the same as FIG. 30.

Next, by etching (etching back) the conductive film DC2, the conductive film CD2 which is outside of the trenches TR1 and TR2 is removed as illustrated in FIGS. 30 and 31, so that the conductive film CD2 is left inside the trenches TR1 and TR2. The gate electrode GE2 is formed of the conductive film CD2 left inside the trenches TR1 and TR2. That is, the conductive film CD2 left inside the trenches TR1 and TR2 becomes the gate electrode GE2. Since the trench TR1 and the trench TR2 are connected to each other, the gate electrode GE2 inside the trench TR1 and the gate electrode GE2 inside the trench TR2 are formed integrally with each other so as to be connected to each other. Inside the trench TR1 and the trench TR2, a portion of the insulating film G2*a* which is interposed between the gate electrode GE2 and side walls of the trenches TR1 and TR2 becomes the above-described insulating film G2, and a portion of the insulating film G2*a* which is interposed between the gate electrode GE2 and the control electrode GE1 becomes the above described insulating film G3.

Note that the control electrode GE1 is filled in the portion of the trench TR2 which is to be the single-layer region TR4 over the almost whole depth of the trench TR2, and therefore, the conductive film CD2 is not filled inside the trench TR2. Therefore, the gate electrode GE2 is not embedded. On the other hand, since the control electrode GE1 is embedded down to the middle of the depths of the trenches TR1 and TR2 in the whole trench TR1 and other portion of the trench TR2 except for the portion thereof which is to be the single-layer region TR4, the gate electrode GE2 is also embedded inside the trenches TR1 and TR2. Further, the insulating film G2*a* on the upper surface of the epitaxial layer EP (a portion of the insulating film G2*a* except for the insides of the trenches TR1 and TR2) is removed in an etch-back step of the conductive film CD2 in some cases.

Figure 32:
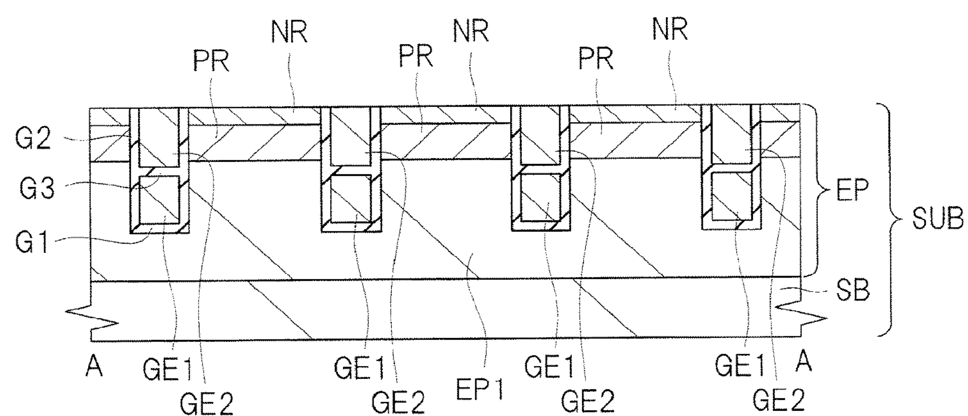
FIG. 32 is a cross-sectional view of a principal part in a step of manufacturing the semiconductor device, as continued from FIG. 30.
Figure 33:
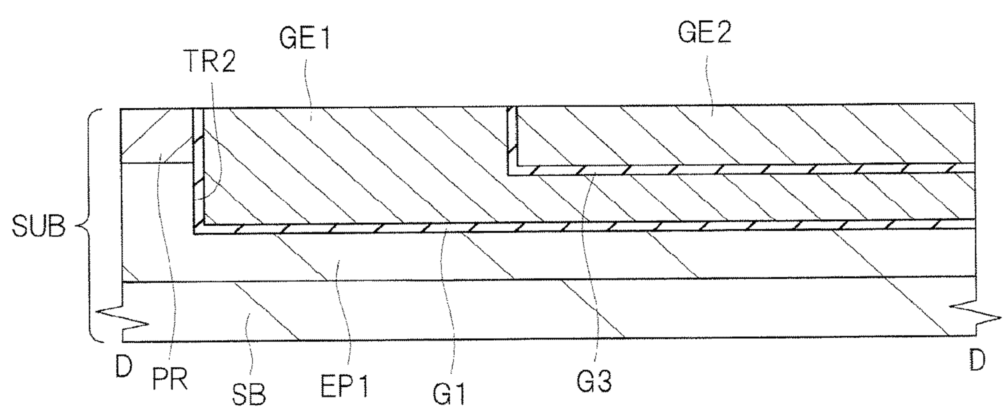
FIG. 33 is a cross-sectional view of a principal part in the step of manufacturing the semiconductor device, as the same as FIG. 32.

Next, as illustrated in FIGS. 32 and 33, a p-type semiconductor region PR is formed by ion implantation of a p-type impurity (for example, boron (B)) to the main surface of the semiconductor substrate SUB. The p-type semiconductor region PR is formed in the epitaxial layer EP so as to be formed in an upper portion of the epitaxial layer EP so as to leave the $n^-$-type epitaxial layer EP (that is, $n^-$-type epitaxial layer EP1) below the p-type semiconductor region PR. Further, at this stage, the p-type semiconductor region PR is formed from the upper surface of the epitaxial layer EP down to a predetermined depth thereof.

By ion-implanting an n-type impurity (for example, arsenic (As)) to the main surface of the semiconductor substrate SUB, an $n^+$-type semiconductor region NR is formed. At this time, such a photoresist pattern (not illustrated) as exposing a planning region where the $n^+$-type semiconductor region NR is to be formed and covering other region except for the planning region is formed by using a photolithography technique, and then, ion implantation is performed to the semiconductor substrate SUB by using this photoresist pattern as a mask (an ion-implantation blocking mask). In this manner, while the $n^+$-type semiconductor region NR is formed at a position adjacent to the trench TR1, it is not formed at a position adjacent to the trench TR2. While the $n^+$-type semiconductor region NR is formed from an upper surface of the epitaxial layer EP down to a predetermined depth thereof, it is formed so as to be shallower than the p-type semiconductor region PR. Therefore, the $n^+$-type semiconductor region NR is formed in the upper portion of the p-type semiconductor region PR.

Further, here, the explanation has been made for the case of the previous formation of the p-type semiconductor region PR followed by the formation of the $n^+$-type semiconductor region NR. However, as another aspect, the $n^+$-type semiconductor region NR can be formed previously, and then, the p-type semiconductor region PR can be formed.

Next, an activation annealing which is a heat treatment for activating the introduced impurity is performed if necessary.

Figure 34:
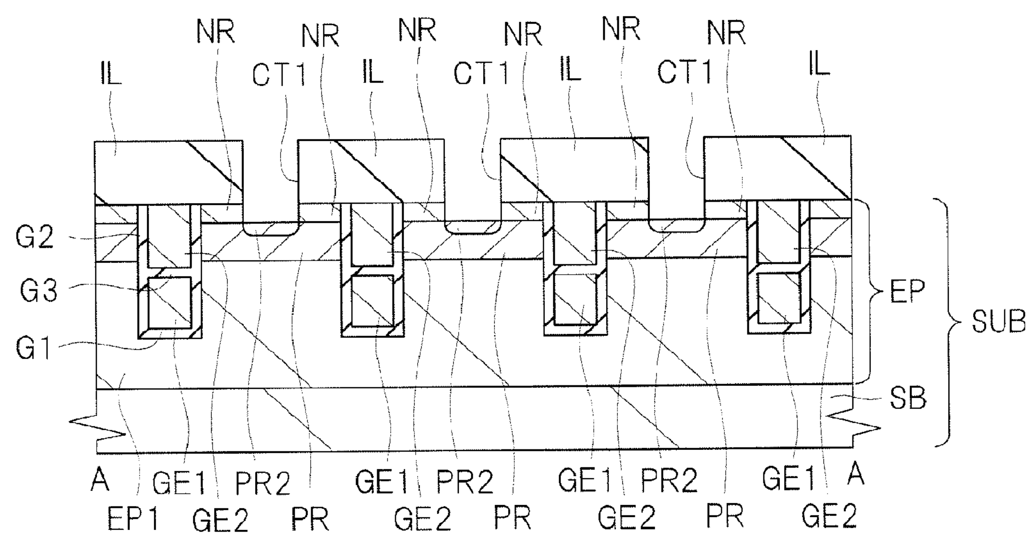
FIG. 34 is a cross-sectional view of a principal part in a step of manufacturing the semiconductor device, as continued from FIG. 32.
Figure 35:
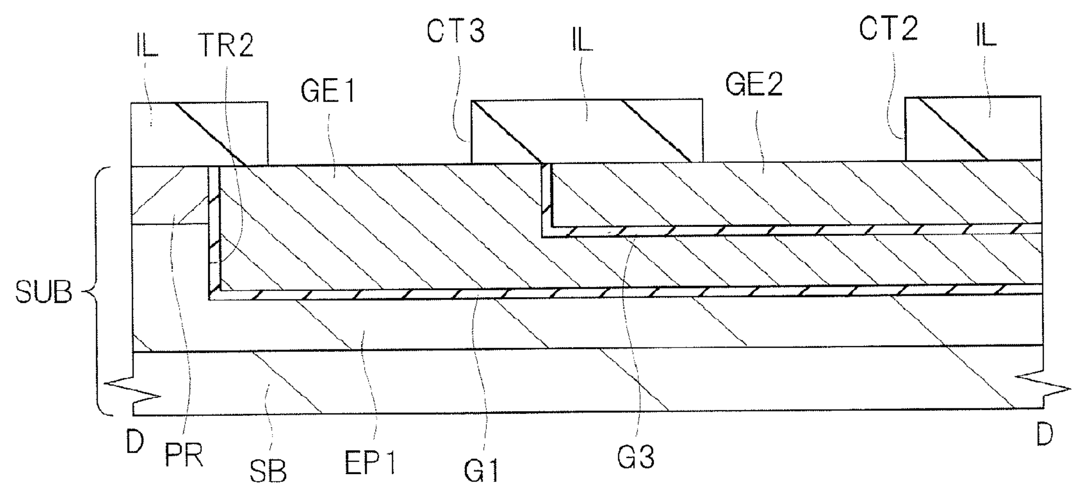
FIG. 35 is a cross-sectional view of a principal part in the step of manufacturing the semiconductor device, as the same as FIG. 34.

Next, as illustrated in FIGS. 34 and 35, an insulating film IL is formed as an interlayer insulating film on the main surface of the semiconductor substrate SUB so as to cover the gate electrode GE2 and the control electrode GE1. The insulating film IL is formed of, for example, a silicon oxide film. At this stage, the insulating film IL is formed on the whole main surface of the semiconductor substrate SUB.

Next, contact holes (openings, holes, through-holes, and connection holes) CT1, CT2, and CT3 are formed in the insulating film IL.

The contact holes CT1, CT2, and CT3 can be formed as, for example, follows. That is, the contact holes CT1, CT2, and CT3 are formed in the insulating film IL by forming a photoresist pattern (not illustrated) on the insulating film IL by using a photolithography method, and then, etching (for example, dry-etching) the insulating film IL by using this photoresist pattern as an etching mask. The contact hole CT1 is formed on the $n^+$-type semiconductor region NR adjacent to the trench TR1, the contact hole CT2 is formed on the gate electrode GE2 embedded inside the trench TR2 of the multilayer region TR3, and the contact hole CT3 is formed on the contact electrode GE1 embedded inside the trench TR2 of the single-layer region TR4. Then, by etching the $n^+$-type semiconductor region NR on the bottom portion of the contact hole CT1, the contact hole CT1 penetrates through the $n^+$-type semiconductor region NR, and reaches the p-type semiconductor region PR. In this manner, the contact hole CT1 penetrates through the insulating film IL and the $n^+$-type semiconductor region NR, and terminates at the p-type semiconductor region PR. Then, a $p^+$-type semiconductor region PR2 is formed by ion-implanting a p-type impurity to the p-type semiconductor region PR exposed at the bottom portion of the contact hole CT1. Note that the n-type impurity has been introduced into the gate electrode GE2 and the control electrode GE1 at a high concentration. Therefore, even if the p-type impurity is ion-implanted into the gate electrode GE2 and the control electrode GE1 exposed from the contact holes CT2 and CT3 in the ion implantation for forming the $p^+$-type semiconductor region PR2, the p-type semiconductor region is not formed in the gate electrode GE2 and the control electrode GE1 so that an n-type conductivity is maintained.

Figure 36:
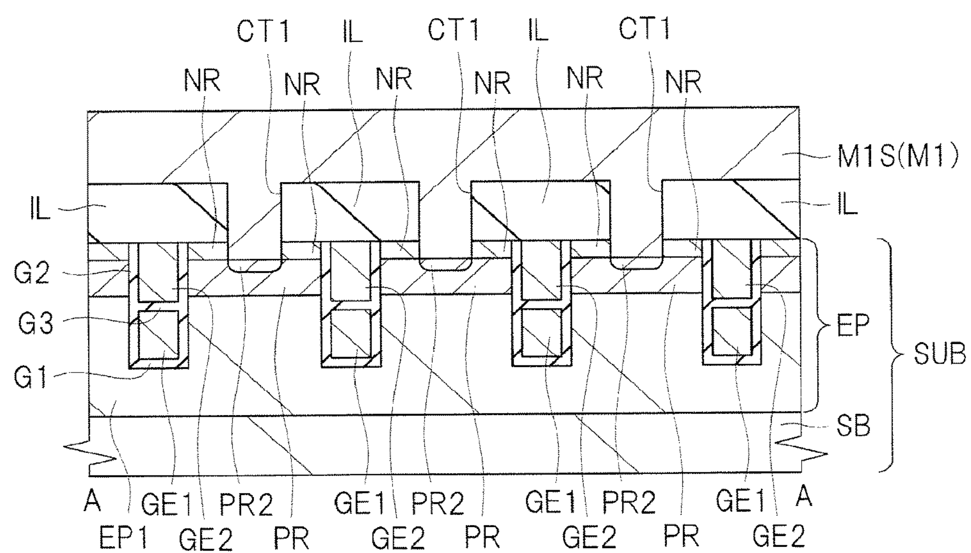
FIG. 36 is a cross-sectional view of a principal part in a step of manufacturing the semiconductor device, as continued from FIG. 34.
Figure 37:
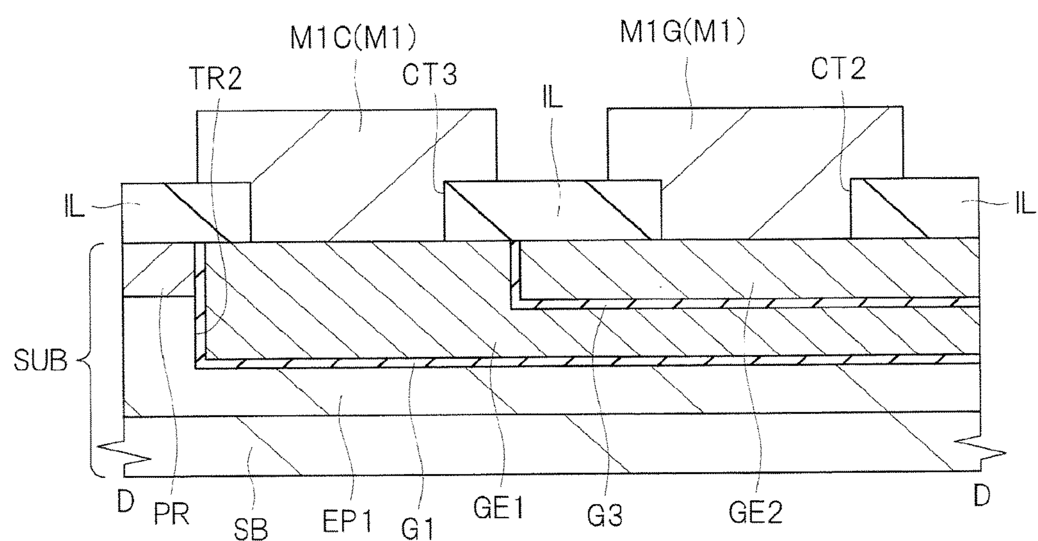
FIG. 37 is a cross-sectional view of a principal part in the step of manufacturing the semiconductor device, as the same as FIG. 36.

Next, as illustrated in FIGS. 36 and 37, a wiring M1 is formed on the insulating film IL. The wiring M1 can be formed as, for example, follows. First, a conductive film for formation of the wiring M1 is formed on the main surface of the semiconductor substrate SUB, that is, on the insulating film IL so as to fill the insides of the contact holes CT1, CT2 and CT3. Then, by patterning the conductive film for formation of the wiring M1 (for example, a metal film mainly formed of an aluminum film or an aluminum alloy film) by using a photography technique and a dry-etching technique, a wiring M1 formed of the patterned conductive film can be formed.

The wiring M1 includes a wiring M1S for a source, a wiring M1G for a gate, and a wiring M1C for a control electrode. A via portion for a source formed integrally with the wiring M1S for a source is embedded inside the contact hole CT1, and the p-type semiconductor region PR and the $n^+$-type semiconductor region NR are electrically connected to the wiring M1S for a source through the via portion for a source embedded inside the contact hole CT1. Further, a via portion for a gate formed integrally with the wiring M1G for a gate is embedded inside the contact hole CT2, and the gate electrode GE2 is electrically connected to the wiring M1G for a gate through the via portion for a gate embedded inside the contact hole CT2. Furthermore, a via portion for a control electrode formed integrally with the wiring M1C for a control electrode is embedded inside the control hole CT3, and the control electrode GE1 is electrically connected to the wiring M1C for a control electrode through the via portion for a control electrode embedded inside the contact hole CT3.

Figure 38:
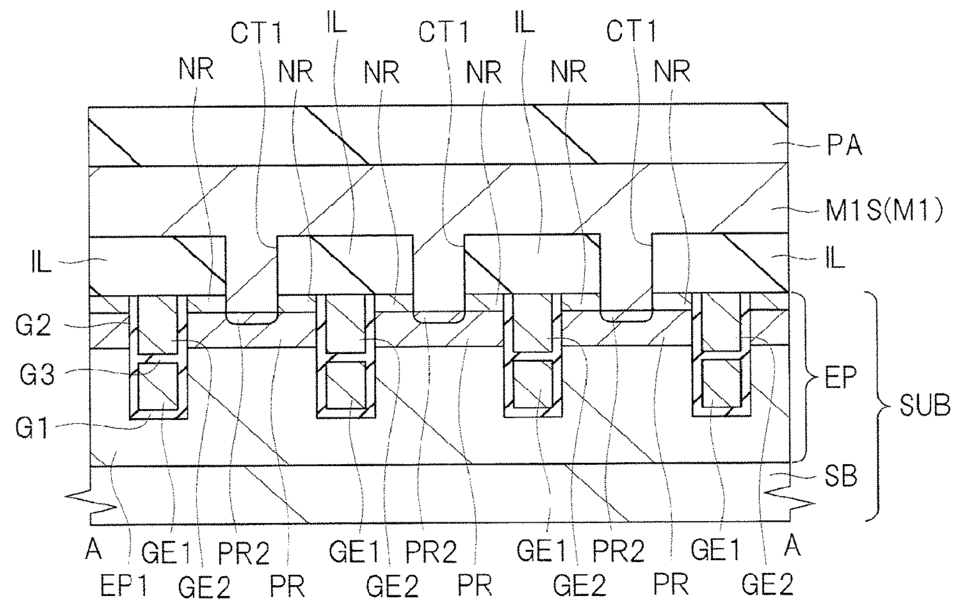
FIG. 38 is a cross-sectional view of a principal part in a step of manufacturing the semiconductor device, as continued from FIG. 36.
Figure 39:
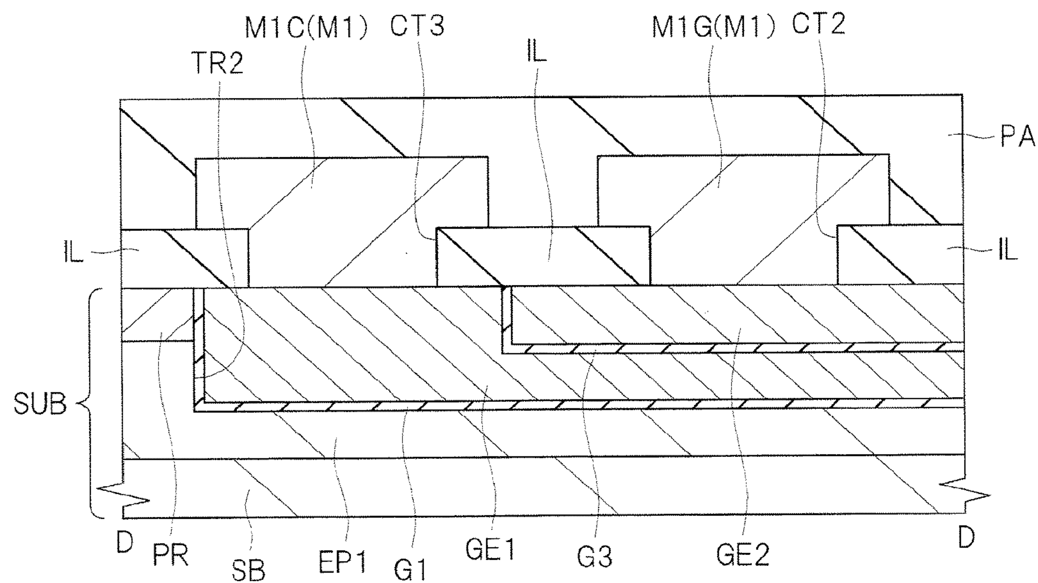
FIG. 39 is a cross-sectional view of a principal part in the step of manufacturing the semiconductor device, as the same as FIG. 38.

Next, as illustrated in FIGS. 38 and 39, an insulating film PA is formed on the main surface (a whole main surface) of the semiconductor substrate SUB, that is, on the insulating film IL so as to cover the wiring M1. The insulating film PA is made of, for example, polyimide-based resin or others, and is formed for surface protection.

Next, as illustrated in FIGS. 7 to 13, a bonding pad (pad electrode) is formed by forming such an opening OP as partially exposing the wiring M1 in the insulating film PA by using, for example, a photolithography technique and an etching technique. A pad PDS for a source (a bonding pad for a source) is formed of the wiring M1S for a source exposed from the opening OP of the insulating film PA. Further, a pad PDG for a gate (a bonding pad for a gate) is formed of the wiring M1G for a gate exposed from the opening OP of the insulating film PA, and a pad PDC for a control electrode (a bonding pad for a control electrode) is formed of the wiring M1C for a control electrode exposed form the opening OP of the insulating film PA.

Further, there is also a case where a metal layer (not illustrated) is further formed on a surface of the wiring M1 (that is, a surface of the bonding pad) which is exposed from the opening OP by a plating method or others in some cases. The metal layer is formed of, for example, a multilayer film including a copper (Cu) film, a nickel (Ni) film and a gold (Au) film formed in this order from bottom, a multilayer film including a titanium (Ti) film, a nickel (Ni) film and a gold (Au) film formed in this order from bottom, or others. By forming the metal layer, oxidation of a surface of the aluminum (the wiring M1) which is a base can be suppressed or prevented.

Next, the thickness of the semiconductor substrate SUB is thinned by cutting or polishing the back surface of the semiconductor substrate SUB (an opposite main surface of the semiconductor substrate SUB to the surface on the side where the epitaxial layer EP is formed, that is, an opposite back surface of the substrate body SB to the surface on the side where the epitaxial layer EP is formed). Then, a back electrode (a back drain electrode, a drain electrode) BE is formed by coating a whole back surface of the semiconductor substrate SUB (the whole back surface of the substrate body SB) with a metal layer by a vapor deposition method or others.

The back electrode BE is electrically connected to the drain of the trench-gate type MISFET, and can be functioned as a drain electrode (a back electrode for a drain). The substrate body SB and the epitaxial layer EP (the $n^-$-type epitaxial layer EP1) have a function as a drain region of a vertical MISFET having a trench type gate structure. The back electrode BE can be formed of, for example, a multilayer layer of a titanium (Ti) layer, a nickel (Ni) layer and a gold (Au) layer formed in this order from the back surface of the semiconductor substrate SUB.

Then, individual semiconductor chips (semiconductor devices) can be obtained from the semiconductor substrate SUB by dividing (separating, cutting) the semiconductor substrate SUB by dicing or others. As described above, the semiconductor device (the semiconductor chip) CP of the present embodiment is manufactured.

<Regarding Principal Feature and Effect>

The semiconductor device CP of the present embodiment is a semiconductor device having a trench-gate type field effect transistor configuring a power transistor in the transistor formation region RG1 of the main surface of the semiconductor substrate SUB.

The semiconductor device CP includes: the trench TR1 (first trench) formed in the transistor formation region RG1 of the semiconductor substrate SUB; the control electrode GE1 (first electrode) formed in a lower portion of the trench TR1; and the gate electrode GE2 formed in an upper portion of the trench TR1. The gate electrode GE2 is a gate electrode for a trench-gate type field effect transistor. Further, the semiconductor device CP includes: the insulating film G1 (first insulating film) formed between the control electrode GE1 and the side wall and the bottom surface of the trench TR1; the insulating film G2 (second insulating film) formed between the side wall of the trench TR1 and the gate electrode GE2; and the insulating film G3 (third insulating film) formed between the control electrode GE1 and the gate electrode GE2. Further, the semiconductor device CP includes: the $n^+$-type semiconductor region NR (the semiconductor region for a source) formed in a region of the semiconductor substrate SUB adjacent to the trench TR1; the p-type semiconductor region PR (the semiconductor region for channel formation) positioned below the $n^+$-type semiconductor region NR; and the semiconductor region for a drain (the $n^-$-type epitaxial layer EP1) positioned below the p-type semiconductor region PR. The $n^+$-type semiconductor region NR is the semiconductor region for a source, the p-type semiconductor region PR is the semiconductor region for channel formation, and the $n^-$-type epitaxial layer EP1 functions as the semiconductor region for a drain. Further, the semiconductor device CP includes: the insulating film IL formed on the main surface of the semiconductor substrate SUB; the wiring M1S for a source formed on the insulating film IL and electrically connected to the $n^+$-type semiconductor region NR; the wiring M1G for a gate formed on the insulating film IL and electrically connected to the gate electrode GE2; and the wiring M1C for a control electrode (first wiring) formed on the insulating film IL and electrically connected to the control electrode GE1. The insulating film IL is an interlayer insulating film.

One of principal features of the present embodiment is that the wiring M1C for a control electrode is not connected to the wiring M1S for a source through a conductor and is not connected to the wiring M1G for a gate through a conductor. That is, the wiring M1C for a control electrode is neither connected to the wiring M1S for a source nor the wiring M1G for a gate through a conductor.

The fact that the wiring M1C for a control electrode is neither connected to the wiring M1S for a source nor the wiring M1G for a gate through a conductor means that the control electrode GE1 is neither connected to the gate electrode GE2 nor the $n^+$-type semiconductor region NR (the semiconductor region for a source) through a conductor. Therefore, in the present embodiment, the control electrode GE1 is not connected to the gate electrode GE2 through a conductor, and is not connected to the $n^+$-type semiconductor region NR (the semiconductor region for a source) through a conductor. Note that the expression "A is connected to B through a conductor" or "A and B are connected to each other through a conductor" corresponds to the fact that a conduction path for the connection through a conductor is formed between A and B, and the expression "A is not connected to B through a conductor" or "A and B are not connected to each other through a conductor" corresponds to the fact that a conduction path for the connection through a conductor is not formed between A and B.

In the present embodiment, since the wiring M1C for a control electrode is neither connected to the wiring M1S for a source nor the wiring M1G for a gate through a conductor, a potential (voltage) of the control electrode GE1 can be controlled independently of the $n^+$-type semiconductor region NR (the semiconductor region for a source) and the gate electrode GE2. That is, a desired potential (voltage) can be supplied (applied) to the control electrode GE1 through the wiring M1C for a control electrode independently of a potential (voltage) supplied (applied) to the $n^+$-type semiconductor region NR (the semiconductor region for a source) through the wiring M1S for a source and a potential (voltage) supplied (applied) to the gate electrode GE2 through the wiring M1G for a gate.

Figure 40:
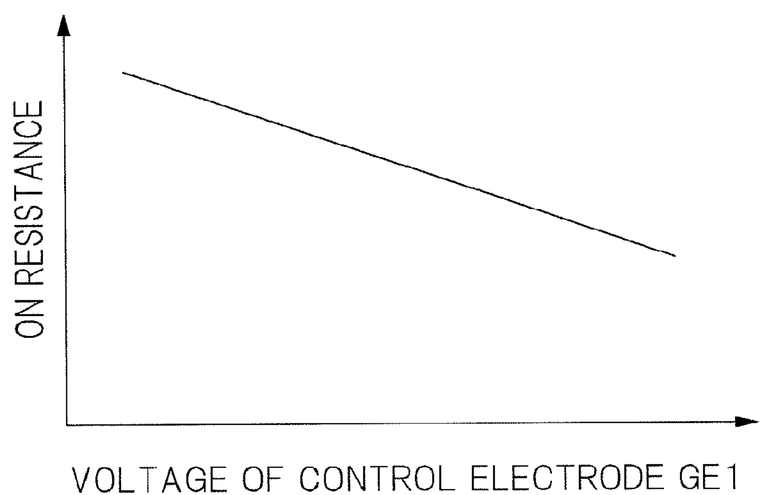
FIG. 40 is a graph illustrating correlation between a voltage of a control electrode and an ON resistance.
Figure 41:
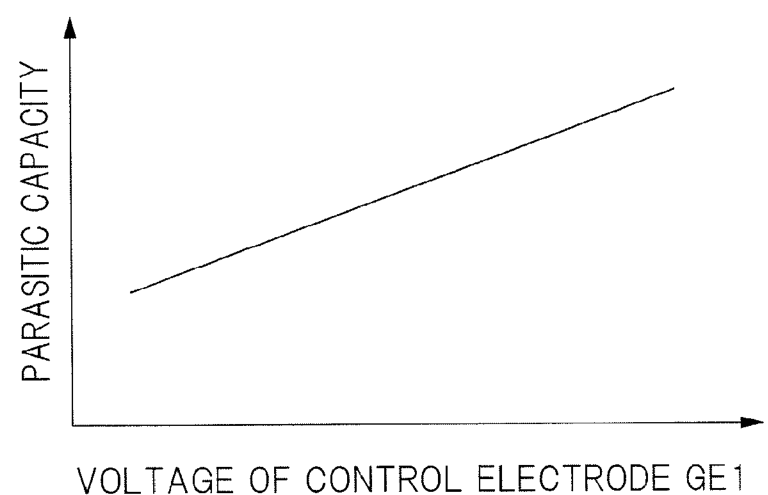
FIG. 41 is a graph illustrating correlation between a voltage of a control electrode and a parasitic capacity.
Figure 42:
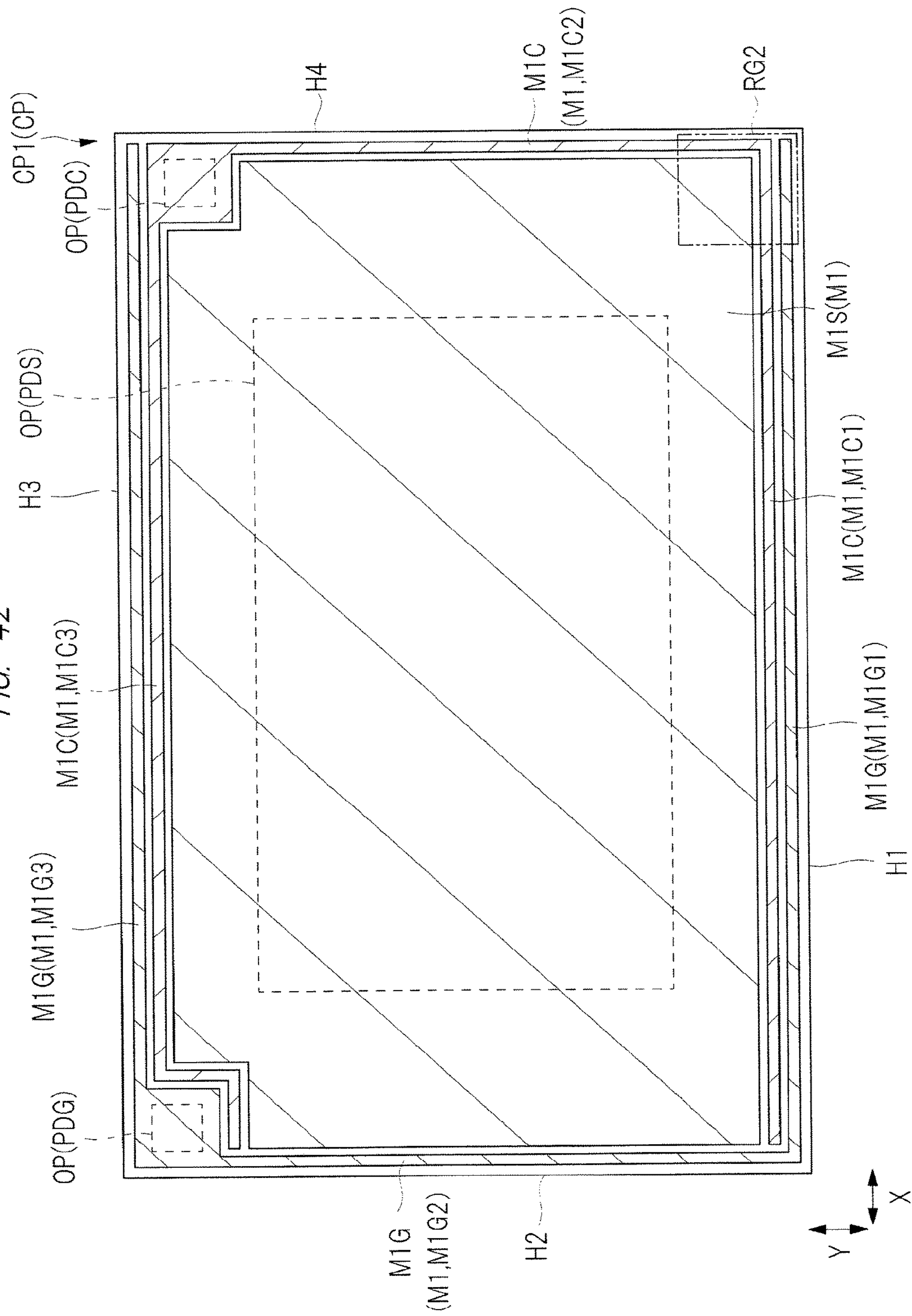
FIG. 42 is an overall plan view of a semiconductor device of a first modified example.

FIG. 40 is a graph illustrating correlation between a voltage of the control electrode GE1 and an ON resistance, and FIG. 41 is a graph illustrating correlation between a voltage of the control electrode GE1 and a parasitic capacitance. A horizontal axis of each graph of FIGS. 40 and 41 corresponds to the voltage (applied voltage) of the control electrode GE1, a vertical axis of the graph of FIG. 40 corresponds to an ON resistance of a trench-gate type field effect transistor, and a vertical axis of the graph of FIG. 41 corresponds to a parasitic capacitance of the trench-gate type field effect transistor. Note that each graph of FIGS. 40 and 41 illustrates a graph obtained by changing the potential of the control electrode GE1 when a ground potential (0 V) is applied to the source, a positive potential (for example, 12 V) is applied to the drain, and a positive potential (for example, 5 V) between the potential of the source and the potential of the drain is applied to the gate electrode GE2.

As also illustrated in the graph of FIG. 40, when the voltage (potential) of the control electrode GE1 is increased toward a positive side, that is, when the applied voltage of the control electrode GE1 is brought to a positive potential and the absolute value of the positive potential is increased, the ON resistance of the trench-gate type field effect transistor is decreased. This is because, since the semiconductor region for a drain (the $n^-$-type epitaxial layer EP1) is an n-type, the increase in the voltage (potential) of the control electrode GE1 toward the positive side accumulates a negative charge (that is, electron) in a portion of the semiconductor region for a drain (the $n^-$-type epitaxial layer EP1) which faces the control electrode GE1 through the insulating film G1 so as to decrease a conduction resistance of the semiconductor region for a drain (the $n^-$-type epitaxial layer EP1). However, when the voltage (potential) of the control electrode GE1 is increased toward a negative side, that is, when the applied voltage of the control electrode GE1 is brought to a negative potential and the absolute value of the negative potential is increased, the ON resistance of the trench-gate type field effect transistor is increased. That is, the voltage (potential) of the control electrode GE1 and the ON resistance of the trench-gate type field effect transistor have a negative correlation to each other.

On the other hand, as also illustrated in the graph of FIG. 41, when the voltage (potential) of the control electrode GE1 is increased toward the negative side, the parasitic capacitance of the trench-gate type field effect transistor is decreased. This is because, since the semiconductor region for a drain (the $n^-$-type epitaxial layer EP1) has the positive potential, the increase in the voltage (potential) of the control electrode GE1 toward the negative side increases a potential difference between the semiconductor region for a drain (the $n^-$-type epitaxial layer EP1) and the control electrode GE1 so as to expand a depletion layer, and therefore, decreases the parasitic capacitance between the gate electrode GE2 and the semiconductor region for a drain (the $n^-$-type epitaxial layer EP1). Further, this is because the increase in the voltage (potential) of the control electrode GE1 toward the negative side increases the potential difference between the semiconductor region for a drain (the $n^-$-type epitaxial layer EP1) and the control electrode GE1 so as to expand the depletion layer, and therefore, decreases the parasitic capacitance between the semiconductor region for a source (the $n^+$-type semiconductor region NR) and the semiconductor region for a drain ($n^-$-type epitaxial layer EP1). However, the increase in the voltage (potential) of the control electrode GE1 toward the positive side narrows the depletion layer, and therefore, increases the parasitic capacitance between the gate electrode GE2 and the semiconductor region for a drain (the $n^-$-type epitaxial layer EP1), and increases the parasitic capacitance between the semiconductor region for a source (the $n^+$-type semiconductor region NR) and the semiconductor region for a drain (the $n^-$-type epitaxial layer EP1). Therefore, the increase in the voltage (potential) of the control electrode GE1 toward the positive side increases the parasitic capacitance of the trench-gate type field effect transistor. That is, the voltage (potential) of the control electrode GE1 and the parasitic capacitance of the trench-gate type field effect transistor have a positive correlation to each other.

Here, such a case that the control electrode GE1 is connected to the wiring M1G for a gate without providing the wiring M1C for a control electrode and the pad PDC for a control electrode is considered as different from the present embodiment, and this case is called "first comparative example". In the case of the first comparative example, the control electrode GE1 and the gate electrode GE2 are connected to the common wiring M1G for a gate, and therefore, the same potential (voltage) is supplied to the control electrode GE1 and the gate electrode GE2 through the wiring M1G for a gate. That is, the case of the first comparative example has such a structure that the control electrode GE1 and the gate electrode GE2 have necessarily the same potential as each other.

Further, such a case that the control electrode GE1 is connected to the wiring M1S for a source without providing the wiring M1C for a control electrode and the pad PDC for a control electrode is considered as different from the present embodiment, and this case is called "second comparative example". In the case of the second comparative example, the control electrode GE1 and the $n^+$-type semiconductor region NR (the semiconductor region for a source) are connected to a common wiring M1S for a source, and therefore, the same potential (voltage) is supplied to the control electrode GE1 and the $n^+$-type semiconductor region NR (the semiconductor region for a source) through the wiring M1S for a source. That is, the second comparative example has such a structure that the control electrode GE1 and the $n^+$-type semiconductor region NR (the semiconductor region for a source) have necessarily the same potential as each other.

In the case of the first comparative example, the same potential as that of the gate electrode GE2 is also necessarily supplied to the control electrode GE1. Therefore, when the trench-gate type field effect transistor is turned ON by applying a positive potential (for example, 5 V) to the gate electrode GE2, the same positive potential (5 V) as that of the gate electrode GE2 is also supplied to the control electrode GE1, and the control electrode GE1 acts to decrease the conduction resistance of the semiconductor region for a drain (the $n^-$-type epitaxial layer EP1), and therefore, the ON resistance of the trench-gate type field effect transistor can be reduced. However, when the parasitic capacitance is focused on, the supply of the same positive potential (for example, 5 V) as that of the gate electrode GE2 to the control electrode GE1 causes the increase of the parasitic capacitance of the trench-gate type field effect transistor. That is, while the case of the first comparative example can decrease the ON resistance of the trench-gate type field effect transistor, it causes the increase in the parasitic capacitance of the trench-gate type field effect transistor.

On the other hand, in the case of the second comparative example, the same potential as that of the semiconductor region for a source (the $n^+$-type semiconductor region NR) is also necessarily supplied to the control electrode GE1. Therefore, the potential of the control electrode GE1 is automatically determined by a potential to be supplied to the semiconductor region for a source (the $n^+$-type semiconductor region NR). Therefore, when the trench-gate type field effect transistor is turned to ON state by applying a positive potential (for example, 5 V) to the gate electrode GE2, it is difficult to increase the potential of the control electrode GE1 toward the positive side to decrease the ON resistance.

On the other hand, in the present embodiment, the wiring M1C for a control electrode is neither connected to the wiring M1S for a source nor the wiring M1G for a gate through a conductor, and therefore, the potential of the control electrode GE1 can be controlled independently of the potential of the semiconductor region for a source (the $n^+$-type semiconductor region NR) and the potential of the gate electrode GE2. That is, in the present embodiment, a desired potential can be supplied (applied) to the control electrode GE1 through the wiring M1C for a control electrode without being restricted (limited) by the potential supplied to the semiconductor region for a source (the $n^+$-type semiconductor region NR) through the wiring M1S for a source or the potential supplied to the gate electrode GE2 through the wiring M1G for a gate. Therefore, in the present embodiment, the potential of the control electrode GE1 can have the same potential as the potential of the gate electrode GE2, can have a different potential from the potential of the gate electrode GE2, can have the same potential as the potential of the semiconductor region for a source ($n^+$-type semiconductor region NR), and can have a different potential from the potential of the semiconductor region for a source (the $n^+$ semiconductor region NR). That is, a potential appropriate for the control electrode GE1 can be supplied (applied) to the control electrode GE1 without being restricted (limited) by the potential supplied to the semiconductor region for a source (the $n^+$-type semiconductor region NR) or the potential to be supplied to the gate electrode GE2.

Therefore, for example, when a semiconductor device having a power transistor is actuated in such a situation that the ON resistance should be decreased as much as possible, the potential of the control electrode GE1 is brought to a positive potential so that the positive potential is made relatively large. In this manner, since the conduction resistance of the semiconductor region for a drain ($n^-$-type epitaxial layer EP1) can be decreased, the ON resistance can be decreased, and a loss caused by the ON resistance can be decreased. Further, when the semiconductor device having the power transistor is actuated in such a situation that it is desired to decrease the parasitic capacitance as much as possible, such as a high-frequency operation, the potential of the control electrode GE1 is brought to a small positive potential, to 0V, or to a negative potential. In this manner, the parasitic capacitance of the trench-gate type field effect transistor can be decreased, and therefore, a loss caused by the parasitic capacitance can be decreased.

Further, the power transistor embedded in the semiconductor device of the present embodiment can be used as, for example, a switching element. When the power transistor is used as the switching element, it is desired to achieve a high efficiency by decreasing the loss (power loss) as much as possible. However, the loss includes a switching loss and a conduction loss. The switching loss depends on the parasitic capacitance while the conduction loss depends on the ON resistance, and the decrease in the parasitic capacitance is effective for the decrease in the switching loss, and the decrease in the ON resistance is effective for the decrease in the conduction loss. Further, each ratio between the switching loss and the conduction loss in the whole loss (power loss) varies in accordance with an operation situation. For example, in comparison between a light load time and a heavy load time, the ratio occupied by the switching loss with respect to the whole loss (power loss) is larger in the light load time than in the heavy load time, while the ratio occupied by the conduction loss with respect to the whole loss (power loss) is larger in the heavy load time than in the light load time.

Therefore, by changing the potential of the control electrode GE1 between such a use situation that the contribution of the conduction loss is large and such a use situation that the contribution of the switching loss is large, the potential of the control electrode GE1 can be shifted toward the positive side more in such a use situation that the contribution of the conduction loss is large than such a use situation that the contribution of the switching loss is large. In this manner, the whole loss in such a use situation that the contribution of the conduction loss is large can be decreased by decreasing the ON resistance so as to decrease the conduction loss, while the whole loss in such a use situation that the contribution of the switching loss is large can be decreased by decreasing the parasitic capacitance. In this manner, the whole loss can be decreased even in both of such a use situation that the contribution of the conduction loss is large and such a use situation that the contribution of the switching loss is large, so that the high efficiency can be achieved.

Thus, in the present embodiment, the wiring M1C for a control electrode is neither connected to the wiring M1S for a source nor to the wiring M1G for a gate, and therefore, the potential of the control electrode GE1 can be controlled independently of the semiconductor region for a source (the $n^+$-type semiconductor region NR) and the gate electrode GE2. Therefore, the potential of the control electrode GE1 can be controlled in accordance with the operation situation of the power transistor formed of the trench-gate type field effect transistor, and therefore, the performance of the semiconductor device having the power transistor formed of the trench-gate type field effect transistor can be improved.

Further, in the present embodiment, the region of the semiconductor substrate SUB which is adjacent to the trench TR1 includes: the semiconductor region for a source (the $n^+$-type semiconductor region NR); the semiconductor region for channel formation (the p-type semiconductor region PR) positioned below the $n^+$-type semiconductor region NR; and the semiconductor region for a drain ($n^-$-type epitaxial layer EP1) positioned below the semiconductor region for channel formation (the p-type semiconductor region PR). It is preferred that a side surface of the gate electrode GE2 inside the trench TR1 faces the semiconductor region for a source (the $n^+$-type semiconductor region NR) and the semiconductor region for channel formation (the p-type semiconductor region PR) through the insulating film G2, so that the trench-gate type field effect transistor can be accurately controlled to be turned ON/OFF by the applied voltage to the gate electrode GE2. Further, it is preferred that the side surface and the bottom surface of the control electrode GE1 inside the trench TR1 face the semiconductor region for a drain (the $n^-$-type epitaxial layer EP1) through the insulating film G1. In this manner, the semiconductor region for a drain can be accurately controlled by the applied voltage to the control electrode GE1, and the ON resistance and the parasitic capacitance of the trench-gate type field effect transistor can be accurately controlled.

Further, the present embodiment includes: the wiring M1G for a gate electrically connected to the gate electrode GE2; and the wiring M1C for a control electrode electrically connected to the control electrode GE1, and therefore, it is required to electrically connect the wiring M1G for a gate to the gate electrode GE2 and electrically connect the wiring M1C for a control electrode to the control electrode GE1. Accordingly, the trench TR2 connected to the trench TR1 is provided, and this trench TR2 is used for connecting the wiring M1G for a gate to the gate electrode GE2 inside the trench TR2, and connecting the wiring M1C for a control electrode to the control electrode GE1 inside the trench TR2.

That is, the semiconductor device of the present embodiment includes the trench TR2 (second trench) formed in the semiconductor substrate SUB in the periphery of the transistor formation region RG1 and connected to the trench TR1 (first trench). And, the semiconductor device of the present embodiment includes: the contact hole CT2 for a gate formed in a portion of the insulating film IL (interlayer insulating film) which is in the region where the trench TR2 and the wiring M1G for a gate overlap with each other when seen in a plan view; and the contact hole CT3 (first contact hole) formed in a portion of the insulating film IL (interlayer insulating film) which is in the region where the trench TR2 and the wiring M1C (first wiring) for a control electrode overlap with each other when seen in a plan view. The trench TR2 includes: the multilayer region TR3 (first region) in which the control electrode GE1 and the gate electrode GE2 have been embedded; and the single-layer region TR4 (second region) in which the control electrode GE1 has been embedded but the gate electrode GE2 has not been embedded. The control electrode GE1 is formed in the lower portion inside the trench TR2 of the multilayer region TR3 through the insulating film G1, the gate electrode GE2 is formed in the upper portion inside the trench TR2 of the multilayer region TR3 through the insulating film G2, and the insulating film G3 is formed between the control electrode GE1 and the gate electrode GE2 inside the trench TR2 of the multilayer region TR3. The control electrode GE1 is formed inside the trench TR2 of the single-layer region TR4 through the insulating film G1. The contact hole CT2 for a gate is formed above the trench TR2 of the single-layer region TR3, and the wiring M1G for a gate is electrically connected to the gate electrode GE2 exposed from the contact hole CT2 for a gate, while the contact hole CT3 is formed above the trench TR2 of the single-layer region TR4, and the wiring M1C for a control electrode is electrically connected to the control electrode GE1 exposed from the contact hole CT3.

Thus, in the present embodiment, the trench TR2 is provided in the semiconductor substrate SUB, and the trench TR2 includes: the multilayer region TR3 in which the control electrode GE1 and the gate electrode GE2 have been embedded; and the single-layer region TR4 in which the control electrode GE1 has been embedded but the gate electrode GE2 has not been embedded. In this manner, the wiring M1G for a gate can be connected to the gate electrode GE2 inside the trench TR2 of the multilayer region TR3 through the contact hole CT2 for a gate, and the wiring M1C for a control electrode can be connected to the control electrode GE1 inside the trench TR2 of the single-layer region TR4 through the contact hole CT3. Therefore, the wiring M1G for a gate can be easily and accurately connected to the gate electrode GE2, and the wiring M1C for a control electrode can be easily and accurately connected to the control electrode GET.

Further, in the present embodiment, the wiring M1S for a source is formed on the insulating film IL in the transistor formation region RG1, the wiring M1G for a gate is formed on the insulating film IL in the periphery of the transistor formation region RG1, and the wiring M1C for a control electrode is formed on the insulating film IL in the periphery of the transistor formation region RG1. Further, the wiring M1S for a source is electrically connected to the semiconductor region for a source (the $n^+$-type semiconductor region NR) provided in the transistor formation region RG1 through the contact hole CT1 for a source formed in the insulating film IL. In this manner, the semiconductor region for a source (the $n^+$-type semiconductor region NR) provided in the transistor formation region RG1 can be easily and accurately connected to the wiring M1S for a source, and an area of the wiring M1S for a source can be increased. Therefore, since the source resistance can be decreased, the ON resistance of the trench-gate type field effect transistor can be decreased.

Further, the present embodiment includes the insulating film PA on the insulating film IL so as to cover the wiring M1S for a source, the wiring M1G for a gate, and the wiring M1C for a control electrode. And, by partially exposing the wiring M1S for a source from the opening OP (opening for a source) of the insulating film PA, the pad PDS for a source is formed. Further, by partially exposing the wiring M1G for a gate from the opening OP (the opening for a gate) of the insulating film PA, the pad PDG for a gate is formed. Further, by partially exposing the wiring M1C for a control electrode from the opening OP (first opening) of the insulating film PA, the pad PDC for a control electrode (first pad) is formed. In this manner, a desired source potential can be supplied from the pad PDS for a source through the wiring M1S for a source to the semiconductor region for a source (the $n^+$-type semiconductor region NR) provided in the transistor formation region RG1. Further, a desired gate potential can be supplied from the pad PDG for a gate through the wiring M1G for a gate and the gate electrode GE2 inside the trench TR2 to the gate electrode GE2 inside the trench TR1. Further, a desired potential can be supplied from the pad PDC for a control electrode through the wiring M1C for a control electrode and the control electrode GE1 inside the trench TR2 to the control electrode GE1 inside the trench TR1.

Furthermore, the present embodiment includes the back electrode BE (the back drain electrode) formed on a back surface of the semiconductor substrate SUB, and the back electrode BE is electrically connected to the semiconductor region for a drain (the $n^-$-type epitaxial layer EP1). In this manner, a desired drain potential can be supplied from the back electrode BE to the semiconductor region for a drain (the $n^-$-type epitaxial layer EP1).

Further, in the present embodiment, a portion of the gate electrode GE2 which is embedded inside the trench TR2 functions as a wiring portion (a gate wiring portion) for connecting the portion of the gate electrode GE2 which is embedded in the trench TR1 to the wiring M1G for a gate, a portion of the control electrode GE1 which is embedded inside the trench TR2 functions as a wiring portion for connecting the portion of the control electrode GE1 which is embedded inside the trench TR1 to wiring M1C for a control electrode. In this manner, the gate electrode GE2 inside the trench TR1 can be functioned as a gate electrode of the trench-gate type field effect transistor, and can be electrically connected to the wiring M1G for a gate through the gate electrode GE2 inside the trench TR2. Further, the control electrode GE1 inside the trench TR1 can be functioned as a control electrode of the trench-gate type field effect transistor, and can be electrically connected to the wiring M1C for a control electrode through the control electrode GE1 inside the trench TR2.

<Regarding Wiring Layout>

Next, a plane layout of the wiring M1 (including the wiring M1S for a source, the wiring M1G for a gate, and the wiring M1C for a control electrode) in the semiconductor device CP of the present embodiment will be further described.

As illustrated in the above-described FIGS. 1 to 3, a plane shape of the semiconductor device (semiconductor chip) CP is a quadrangle, preferably a rectangle (including a square). Four sides configuring a quadrangular (rectangular) plane shape of the semiconductor device CP are called sides "H1", "H2", "H3", and "H4". The side H1 and the side H3 face each other, while the side H2 and the side H4 face each other (more specifically, the side H1 and the side H3 are parallel to each other, while the side H2 and the side H4 are parallel to each other). Further, the side H1 crosses (more specifically, is orthogonal to) the side H2 and the side H4, the side H2 crosses (more specifically, is orthogonal to) the side H1 and the side H3, the side H3 crosses (more specifically, is orthogonal to) the side H2 and the side H4, and the side H4 crosses (more specifically, is orthogonal to) the side H1 and the side H3. Therefore, the four sides of the main surface of the semiconductor device CP correspond to the sides H1, H2, H3, and H4.

Here, each of the side H1 and the side H3 is a side extending along an X direction, and each of the side H2 and the side H4 is a side extending along a Y direction. Therefore, the side H1 and the side H3 face each other in the Y direction, while the side H2 and the side H4 face each other in the X direction.

As illustrated in the above-described FIG. 2, each of the wiring M1G for a gate and the wiring M1C for a control electrode extends along an outer periphery of the transistor formation region RG1. The transistor formation region RG1 is formed in an almost whole region of the main surface of the semiconductor device CP except for an outer peripheral region thereof. Therefore, each of the wiring M1G for a gate and the wiring M1C for a control electrode extends along the outer periphery of the semiconductor device CP. The wiring M1G for a gate extends along the sides H1, H2, and H3 of the four sides H1, H2, H3, and H4 configuring the outer periphery of the semiconductor device CP, and the wiring M1C for a control electrode extends along the sides H1, H4, and H3 thereof. In a portion closer to the side H2, the wiring M1G for a gate extends while the wiring M1C for a control electrode does not extend. In a portion closer to the side H4, the wiring M1C for a control electrode extends while the wiring M1G for a gate does not extend. On the main surface of the semiconductor device CP, the pad PDG for a gate is arranged in vicinity of a corner portion formed by the side H2 and the side H3, the pad PDC for a control electrode is arranged in vicinity of a corner portion formed by the side H3 and the side H4, and the pad PDS for a source is arranged in a central region on the main surface of the semiconductor device CP. A plane area of the pad PDS for a source is larger than each plane area of the pad PDG for a gate and the pad PDC for a control electrode.

Here, a portion of the wiring M1G for a gate extending along the side H1 in the X direction is called "wiring portion M1G1 for a gate", a portion thereof extending along the side H2 in the Y direction is called "wiring portion M1G2 for a gate", and a portion thereof extending along the side H3 in the X direction is called "wiring portion M1G3 for a gate". Further, a portion of the wiring M1C for a control electrode extending along the side H1 in the X direction is called "wiring portion M1C1 for a control electrode", a portion thereof extending along the side H4 in the Y direction is called "wiring portion M1C2 for a control electrode, and a portion thereof extending along the side H3 in the X direction is called "wiring portion M1C3 for a control electrode.

Therefore, the wiring portion M1G1 for a gate and the wiring portion M1C1 for a control electrode extend along the side H1 in the X direction so as to be next to each other, the wiring portion M1G3 for a gate and the wiring portion M1C3 for a control electrode extend along the side H3 in the X direction so as to be next to each other, the wiring portion M1G2 for a gate extends along the side H2 in the Y direction, and the wiring portion M1C2 for a control electrode extends along the side H4 in the Y direction. The wiring portion M1G1 for a gate, the wiring portion M1G2 for a gate, and the wiring portion M1G3 for a gate are formed integrally with each other so as to be connected to each other, and the wiring portion M1C1 for a control electrode, the wiring portion M1C2 for a control electrode, and the wiring portion M1C3 for a control electrode are formed integrally with each other so as to be connected to each other.

In a region where the wiring portion M1G1 for a gate and the wiring portion M1C1 for a control electrode extend along the side H1, a plurality of the trenches TR2 (TR2*a*) extending in the Y direction are arranged so as to be next to each other in the X direction (see FIGS. 2 and 4). Therefore, a plurality of trenches TR2 (TR2*a*) extending in the Y direction so as to cross the wiring portion M1G1 for a gate and the wiring portion M1C1 for a control electrode are arranged below the wiring portion M1G1 for a gate and the wiring portion M1C1 for a control electrode so as to be next to each other in the X direction. And, the contact hole CT2 for a gate is formed in a region where the wiring portion M1G1 for a gate overlaps with the trench TR2 (TR2*a*) extending in the Y direction when seen in a plan view, and the contact hole CT3 is formed in a region where the wiring portion M1C1 for a control electrode overlaps with the trench TR2 (TR2*a*) extending in the Y direction when seen in a plan view (see FIGS. 4 to 6). Therefore, in each trench TR2 (TR2*a*) extending in the Y direction in a region closer to the side H1, the wiring portion M1G1 for a gate can be connected to the gate electrode GE2 inside the trench TR2 through the contact hole CT2 for a gate, and the wiring portion M1C1 for a control electrode can be connected to the control electrode GE1 inside the trench TR2 through the contact hole CT3. In this manner, the wiring portion M1G1 for a gate can be electrically connected to the gate electrode GE2 inside the trench TR1 of the transistor formation region RG1 through the gate electrode GE2 inside the trench TR2, and the wiring portion M1C1 for a control electrode can be electrically connected to the control electrode GE1 inside the trench TR1 of the transistor formation region RG1 through the control electrode GE1 inside the trench TR2.

A portion closer to the side H3 is also similar to the portion closer to the side H1. That is, in a region where the wiring portion M1G3 for a gate and the wiring portion M1C3 for a control electrode extend along the side H3, a plurality of the trenches TR2 (TR2*a*) extending in the Y direction are arranged so as to be next to each other in the X direction. Therefore, the plurality of the trenches TR2 (TR2*a*) extending in the Y direction so as to cross the wiring M1G3 for a gate and the wiring portion M1C3 for a control electrode are arranged below the wiring portion M1G3 for a gate and the wiring M1C3 for a control electrode so as to be next to each other in the X direction. And, the contact hole CT2 is formed in a region where the wiring portion M1G3 for a gate overlaps with the trenches TR2 (TR2*a*) extending in the Y direction when seen in a plan view, and the contact hole CT3 is formed in a region where the wiring portion M1C3 for a control electrode overlaps with the trenches TR2 (TR2*a*) extending in the Y direction when seen in a plan view. Therefore, in each trench TR2 (TR2*a*) extending in the Y direction in the region closer to the side H3, the wring portion M1G3 for a gate electrode can be connected to the gate electrode GE2 inside the trench TR2 through the contact hole CT2 for a gate, and the wiring portion M1C3 for a control electrode can be connected to the control electrode GE1 inside the trench TR2 through the contact hole CT3. In this manner, the wiring portion M1G3 for a gate can be electrically connected to the gate electrode GE2 inside the trench TR1 of the transistor formation region RG1 through the gate electrode GE2 inside the trench TR2, and the wiring portion M1C3 for a control electrode can be electrically connected to the control electrode GE1 inside the trench TR1 of the transistor formation region RG1 through the control electrode GE1 inside the trench TR2.

The wring M1S for a source is formed in the almost whole region surrounded by the wiring M1G for a gate and the wiring M1C for a control electrode when seen in a plan view, and the transistor formation region RG1 and the region where the wiring M1S for a source is formed are almost coincident with each other when seen in a plan view. Therefore, when seen in a plan view, the wring M1G for a gate and the wiring M1C for a control electrode are formed in periphery of the wiring M1S for a source, and therefore, are formed in periphery of the transistor formation region RG1. Inside the transistor formation region RG1, a plurality of trenches TR1 (TR1*a*) extending in the Y direction are arranged so as to be next to each other in the X direction.

In the present embodiment, the wiring portion M1G1 for a gate and the wiring M1C1 for control electrode extend in the X direction along the side H1 so as to be next to each other. However, it is preferred to arrange the wiring M1C1 for control electrode between the wiring portion M1G1 for a gate and the side H1 when seen in a plan view (see FIG. 2). In other words, while the wiring portion M1G1 for a gate and the wiring M1C1 for a control electrode extend in the X direction along the side H1 so as to be next to each other, it is preferred to arrange the wiring portion M1G1 for a gate on an inner side (a portion closer to the transistor formation region RG1, that is, a portion farther from the side H1) and arrange the wiring M1C1 for control electrode on an outer side (a portion farther from the transistor formation region RG1, that is, a portion closer to the side H1). A portion closer to the side H3 is also similar to the portion closer to the side H1. That is, the wiring portion M1G3 for a gate and the wiring portion M1C3 for a control electrode extend in the X direction along the side H3 so as to be next to each other. However, it is preferred to arrange the wiring portion M1C3 for a control electrode between the wiring portion M1G3 for a gate and the side H3 when seen in a plan view (see FIG. 2). In other words, while the wiring portion M1G3 for a gate and the wiring portion M1C3 for a control electrode extend in the X direction along the side H3 so as to be next to each other, it is preferred to arrange the wiring portion M1G3 for a gate on an inner side (a portion closer to the transistor formation region RG1, that is, a portion farther from the side H3), and arrange the wiring portion M1C3 for a control electrode on an outer side (a portion farther from the transistor formation region RG1, that is, a portion closer to the side H3). A reason for the arrangement will be described with reference to FIGS. 42 to 47.

Figure 43:
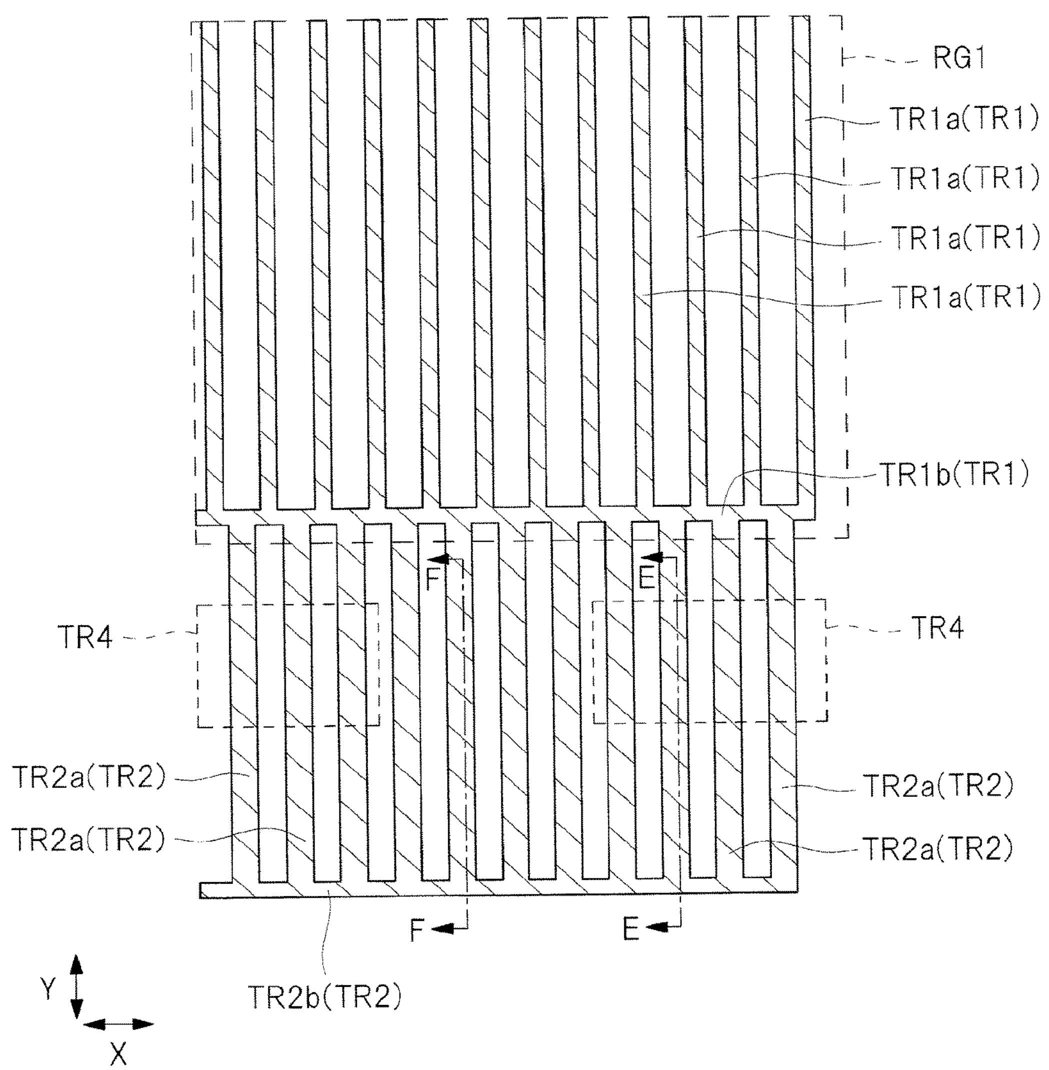
FIG. 43 is a plan view of a principal part of the semiconductor device of the first modified example.
Figure 44:
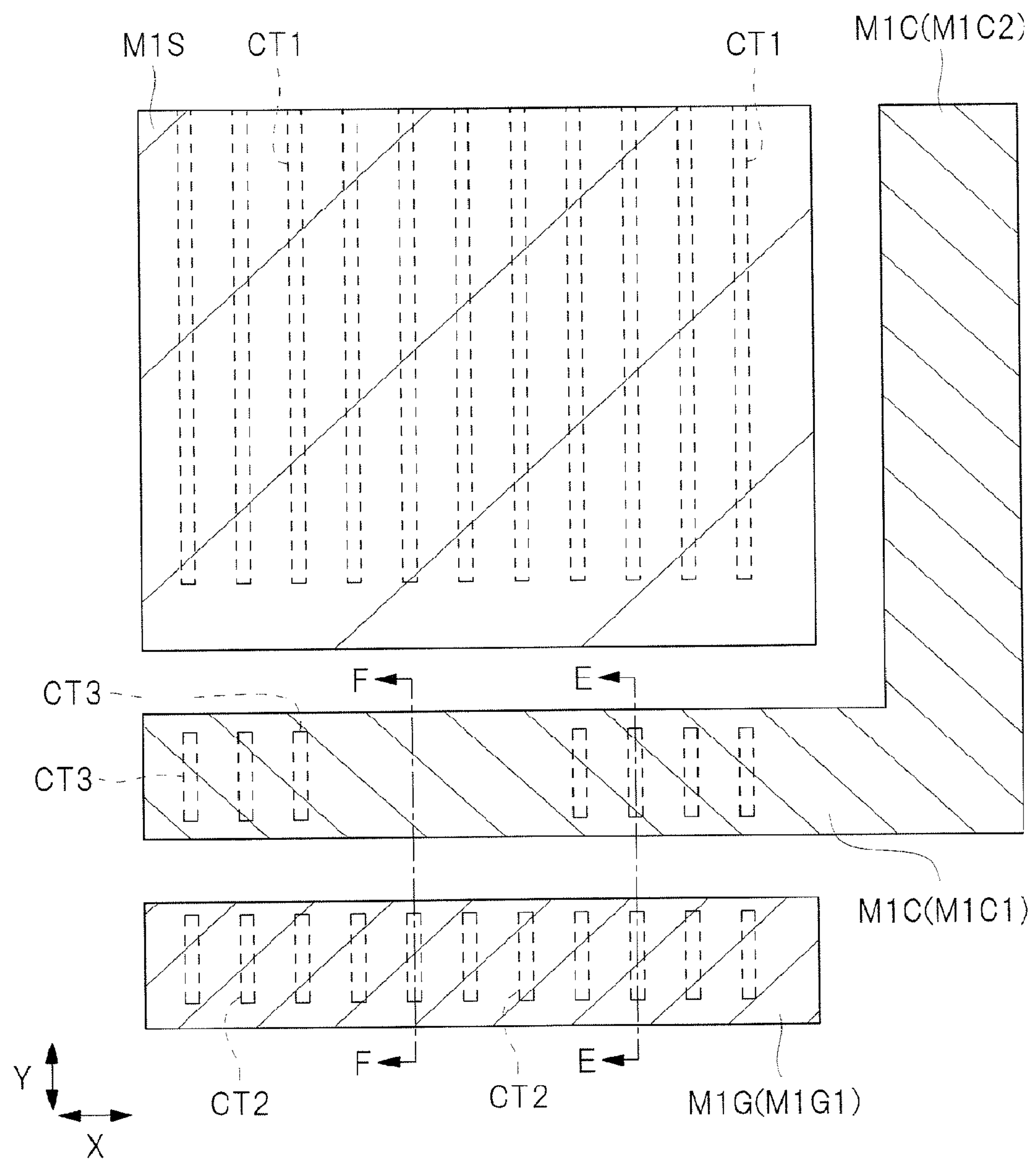
FIG. 44 is a plan view of a principal part of the semiconductor device of the first modified example.
Figure 45:
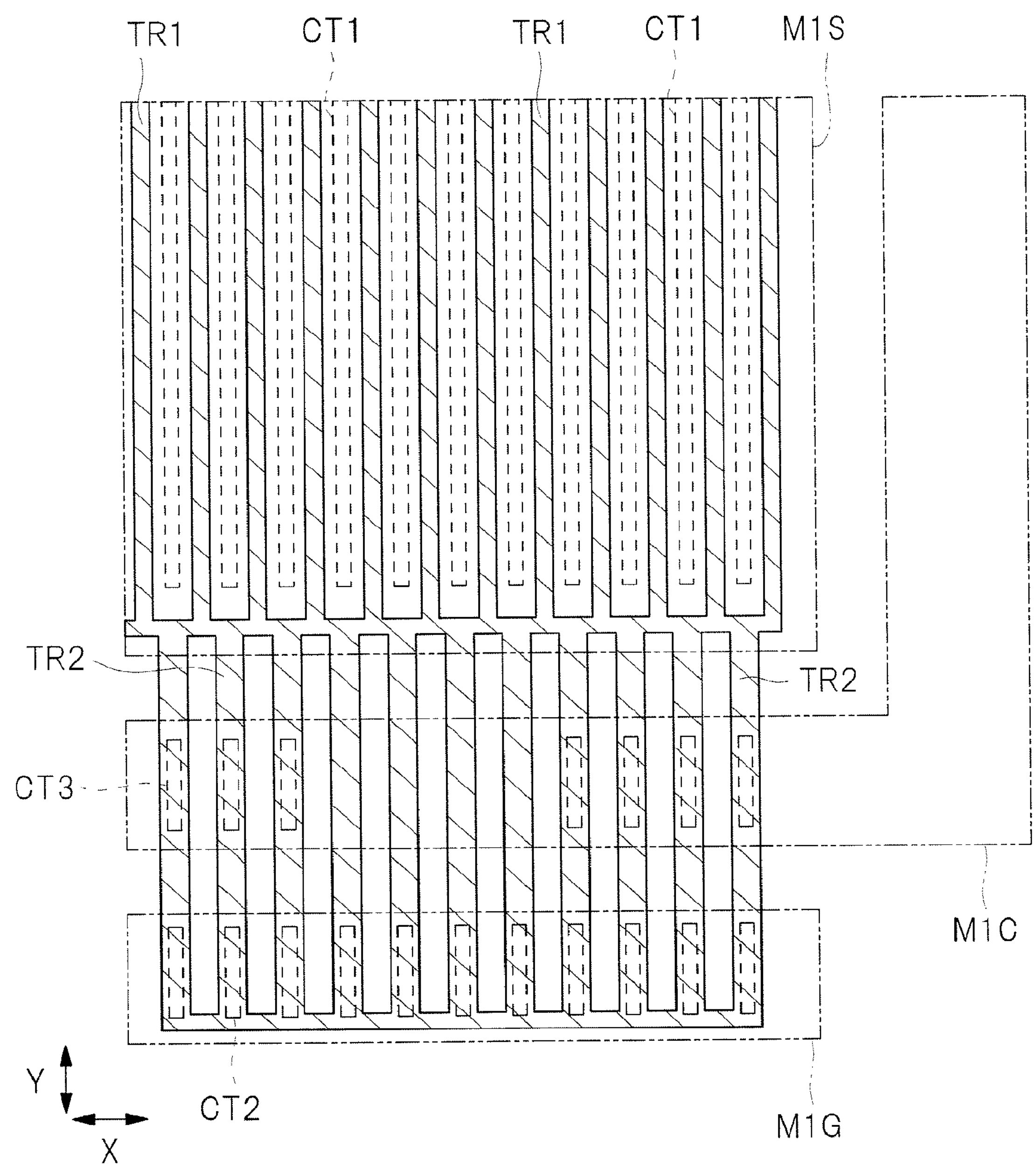
FIG. 45 is a plan view of a principal part of the semiconductor device of the first modified example.

FIGS. 42 to 47 are plan views or cross-sectional views illustrating a first modified example of the semiconductor device CP of the present embodiment. The semiconductor device CP of the first modified example illustrated in FIGS. 42 to 47 is called "semiconductor device CP1". Of FIGS. 42 to 47, FIG. 42 is an overall plan view corresponding to the above-described FIG. 2, FIG. 43 is a plan view of a principal part corresponding to the above-described FIG. 4, FIG. 44 is a plan view of a principal part corresponding to the above-described FIG. 5, FIG. 45 is a plan view of a principal part corresponding to the above-described FIG. 6, FIG. 46 almost corresponds to a cross-sectional view taken along a line E-E in FIG. 44, and FIG. 47 almost corresponds to a cross-sectional view taken along a line F-F in FIG. 44. Enlarged views of a region RG2 surrounded by a two-dot chain line illustrated in FIG. 42 correspond to FIGS. 43 to 45.

In the semiconductor device CP1 illustrated in FIGS. 42 to 47, the wiring portion M1G1 for a gate and the wiring M1C1 for a control electrode extend along the side H1 in the X direction so as to be next to each other. However, while the wiring portion M1C1 for a control electrode is arranged on an inner side (a portion closer to the transistor formation region RG1, that is, a portion farther from the side H1), the wiring portion M1G1 for a gate is arranged on an outer side (a portion farther from the transistor formation region RG1, that is, a portion closer to the side H1). Further, the wiring portion M1G3 for a gate and the wiring portion M1C3 for a control electrode extend in the X direction along the side H3 so as to be next to each other. However, while the wiring portion M1C3 for a control electrode is arranged on an inner side (a portion closer to the transistor formation region RG1, that is, a portion farther from the side H3), the wiring portion M1G3 for a gate is arranged on an outer side (a portion farther from the transistor formation region RG1, that is, a portion closer to the side H3). Regarding the configuration inside the transistor formation region RG1 and the wiring M1S for a source, the semiconductor device CP1 illustrated in FIGS. 42 to 47 is also similar to the semiconductor device CP illustrated in FIGS. 1 to 13.

As similar to the semiconductor device CP illustrated in FIGS. 1 to 13, also in the semiconductor device CP1 illustrated in FIGS. 42 to 47, a plurality of trenches TR2 extending in the Y direction are arranged in the X direction so as to be next to each other in a region where the wiring portion M1G1 for a gate and the wiring portion M1C1 for a control electrode extend along the side H1, and a plurality of trenches TR2 extending in the Y direction are arranged in the X direction so as to be next to each other in a region where the wiring portion M1G3 for a gate and the wiring portion M1C3 for a control electrode extend along the side H3.

In the semiconductor device CP illustrated in the above-described FIGS. 1 to 13, as seen also from the above-described FIG. 4, each of the plurality of trenches TR2 (that is, the trenches TR2*a*) extending in the Y direction and arranged so as to be next to each other in the X direction includes: the multilayer region TR3 in which the control electrode GE1 and the gate electrode GE2 have been embedded; and the single-layer region TR4 in which the gate electrode GE2 has not been embedded but the control electrode GE1 has been embedded. However, in the semiconductor device CP1 illustrated in FIGS. 42 to 47, as the plurality of trenches TR2 (that is, the trenches TR2*a*) extending in the Y direction and arranged so as to be next to each other in the X direction, it is required to mix the trench TR2*a* including both of the multilayer region TR3 and the single-layer region TR4 and the trench TR2*a* formed of only the multilayer region TR3 without including the single-layer region TR4. In FIG. 43, note that the trench TR2 inside a region surrounded by a dotted line with a reference symbol TR4 is formed of the single-layer region TR4, and the trench TR2 in other region is formed of the multilayer region TR3. Therefore, while the trench TR2 illustrated in the cross-sectional view of FIG. 46 includes both of the multilayer region TR3 and the single-layer region TR4, the trench TR2 illustrated in the cross-sectional view of FIG. 47 is formed of only the multilayer region TR3 without including the single-layer region TR4.

Figure 46:
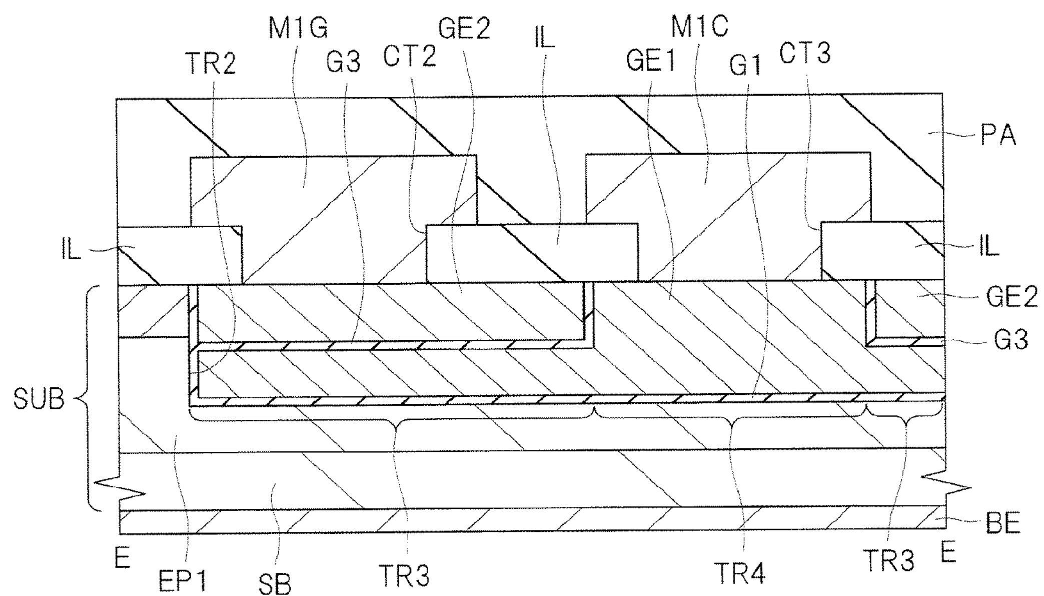
FIG. 46 is a cross-sectional view of a principal part of the semiconductor device of the first modified example.

It is assumed that all of the plurality of trenches TR2*a* illustrated in FIG. 43 have both of the multilayer region TR3 and the single-layer region TR4 as similar to the trench TR2 in FIG. 46. In this case, the gate electrode GE2 is not formed inside the trench tR2 of the single-layer region TR4, and therefore, the gate electrode GE2 inside the trench TR2 which is connected to the wiring portion M1G1 for a gate through the contact hole CT2 for a gate is not integrally connected to the gate electrode GE2 inside the trench TR1 of the transistor formation region RG1 but separated therefrom. This interrupts electrical connection of the wiring portion M1G1 for a gate to the gate electrode GE2 inside the trench TR1 of the transistor formation region RG1 through the gate electrode GE2 inside the trench TR2.

Figure 47:
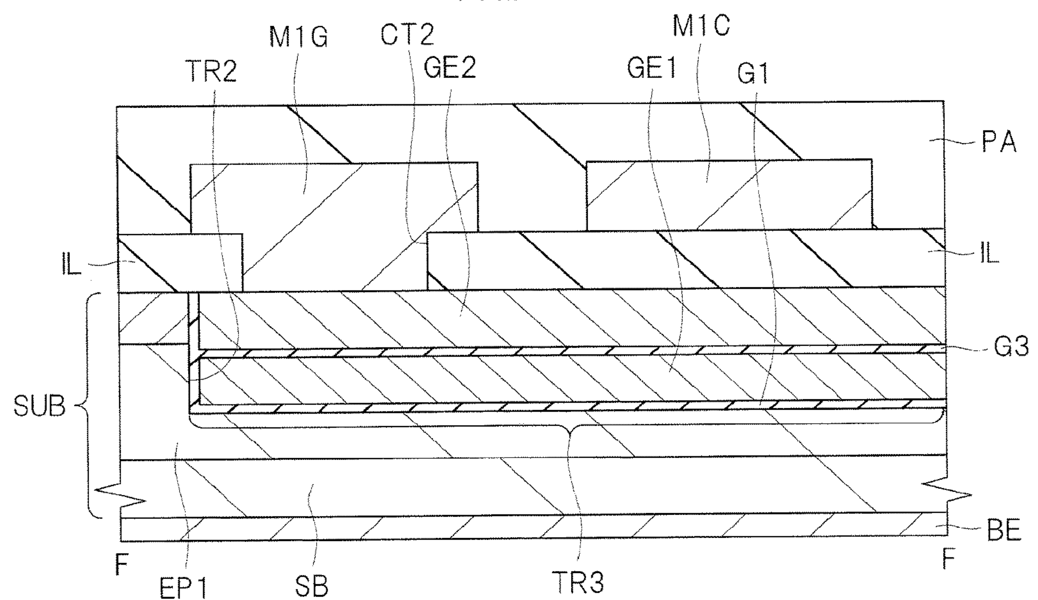
FIG. 47 is a cross-sectional view of a principal part of the semiconductor device of the first modified example.

Therefore, as the plurality of trenches TR2*a* illustrated in FIG. 43, the trench TR2*a* including both of the multilayer region TR3 and the single-layer region TR4 as similar to the trench TR2 in FIG. 46 and the trench TR2*a* formed of only the multilayer region TR4 without including the single-layer region TR4 as similar to the trench TR2 in FIG. 47 are mixed. In this manner, in the trench TR2*a* formed of only the multilayer region TR3 as similar to the trench TR2 in FIG. 47, the wiring portion M1G (M1G1) for a gate can be connected to the gate electrode GE2 through the contact hole CT2 for a gate, and the wiring M1G (M1G1) for a gate can be electrically connected to the gate electrode GE2 inside the trench TR1 of the transistor formation region RG1 through the gate electrode GE2 inside the trench TR2. Further, in the trench TR2*a* including both of the multilayer region TR3 and the single-layer region TR4 as similar to the trench TR2 illustrated in FIG. 46, the wiring M1C (M1C1) for a control electrode can be connected to the control electrode GE1 through the contact hole CT3, and the wiring M1C (M1C1) for a control electrode can be electrically connected to the control electrode GE1 inside the trench TR1 of the transistor formation region RG1 through the control electrode GE1 inside the trench TR2.

However, in the case of the semiconductor device CP1 illustrated in FIGS. 42 to 47, the trench TR2*a* formed of only the multilayer region TR3 without including the single-layer region TR4 as similar to the trench TR2 illustrated in FIG. 47 can function as a conduction path between the wiring M1G for a gate and the gate electrode GE2 inside the trench TR1 of the transistor formation region RG1, but cannot function as a conduction path between the wiring Mid for a control electrode and the control electrode GE1 inside the trench TR1. Further, in the case of the semiconductor device CP1 illustrated in FIGS. 42 to 47, the trench TR2*a* including both of the multilayer region TR3 and the single-layer region TR4 as similar to the trench TR2 illustrated in FIG. 46 can function as a conduction path between the wiring M1C for a control electrode and the control electrode GE1 inside the trench TR1 of the transistor formation region RG1, but cannot function as a conduction path between the wiring M1G for a gate and the gate electrode GE2 inside the trench TR1. Therefore, the semiconductor device CP1 is disadvantageous from a viewpoint of decreasing a resistance between the wiring M1G for a gate and the gate electrode GE2 inside the trench TR1 of the transistor formation region RG1 and from a viewpoint of decreasing a resistance between the wiring M1C for a control electrode and the control electrode GE1 inside the trench TR1 of the transistor formation region RG1.

On the other hand, in the semiconductor device CP illustrated in the above-described FIGS. 1 to 13, the wiring portion M1G1 for a gate and the wiring portion M1C1 for a control electrode extend in the X direction along the side H1 so as to be next to each other, and the wiring portion M1G1 for a gate is arranged on an inner side (a portion closer to the transistor formation region RG1) while the wiring portion M1C1 for a control electrode is arranged on an outer side (a portion farther from the transistor formation region RG1). The portion closer to the side H3 is also similar to the portion closer to the side H1. The wiring portion M1G3 for a gate and the wiring portion M1C3 for a control electrode extend in the X direction along the side H3 so as to be next to each other, and the wiring portion M1G3 for a gate is arranged on an inner side (a portion closer to the transistor formation region RG1) while the wiring portion M1C3 for a control electrode is arranged on an outer side (a portion farther from the transistor formation region RG1).

In this manner, even if all of the plurality of trenches TR2*a* illustrated in FIG. 4 have both of the multilayer region TR3 and the single-layer region TR4 as similar to the trench TR2 illustrated in FIG. 10, the gate electrode GE2 inside the trench TR2 connected to the wiring M1G (M1G1) for a gate through the contact hole CT2 for a gate is integrally connected to the gate electrode GE2 inside the trench TR1 of the transistor formation region RG1. Further, even if all of the plurality of trenches TR2*a* illustrated in FIG. 4 have both of the multilayer region TR3 and the single-layer region TR4 as similar to the trench TR2 illustrated in FIG. 10, the control electrode GE1 inside the trench TR2 connected to the wiring M1C (M1C1) for a control electrode through the contact hole CT3 is integrally connected to the control electrode GE1 inside the trench TR1 of the transistor formation region RG1. Therefore, each trench TR2*a* extending in the Y direction has both of the multilayer region TR3 and the single-layer region TR4. Therefore, in each trench TR2*a*, the wiring M1C (Midi) for a control electrode can be connected to the control electrode GE1 of the single-layer region TR4 through the contact hole CT3, and the wiring M1G (M1G1) for a gate can be connected to the gate electrode GE2 of the multilayer region TR3 through the contact hole CT2 for a gate. That is, each trench TR2*a* can be used for both of the conduction path between the wring M1C for a control electrode and the control electrode GE1 inside the trench TR1 of the transistor formation region RG1 and the conduction path between the wiring M1G for a gate and the gate electrode GE2 inside the trench TR1. Therefore, from a viewpoint of decreasing the resistance between the wiring M1G (M1G1) for a gate and the gate electrode GE2 inside the trench TR1 of the transistor formation region RG1 and from a viewpoint of decreasing the resistance between wiring M1C (M1C1) for a control electrode and the control electrode GE1 inside the trench TR1 of the transistor formation region RG1, the semiconductor device CP illustrated in the above-described FIGS. 1 to 13 is more advantageous than the semiconductor device CP1 illustrated in FIGS. 42 to 47. The portion closer to the side H3 is also similar to the portion closer to the side H1.

Therefore, the wiring portion M1G1 for a gate and the wiring M1C1 portion for a control electrode extend in the X direction along the side H1 so as to be next to each other as similar to the semiconductor device CP illustrated in the above-described FIGS. 1 to 13, and it is preferred to arrange the wring portion M1G1 for a gate on the inner side and arrange the wiring portion M1C1 for a control electrode on the outer side. The portion closer to the side H3 is also similar to the portion closer to the side H1. The wiring portion M1G3 for a gate and the wiring portion M1C3 for a control electrode extend in the X direction along the side H3 so as to be next to each other, and it is preferred to arrange the wiring portion M1G3 for a gate on the inner side and arrange the wiring portion M1C3 for a control electrode on the outer side. In this manner, the resistance between the wiring M1G for a gate and the gate electrode GE2 inside the trench TR1 of the transistor formation region RG1 and the resistance between the wiring M1C for a control electrode and the control electrode GE1 inside the trench TR1 of the transistor formation region RG1 can be further decreased. Therefore, the performance of the semiconductor device can be further improved.

Further, another expression of this technical idea can also be expressed as follows. That is, each of the wiring M1G for a gate and the wiring M1C for a control electrode extends along the outer periphery of the transistor formation region RG1, and the wiring M1G for a gate is arranged between the wiring M1C for a control electrode and the transistor formation region RG1 when seen in a plan view in a region where the wiring M1G for a gate and the wiring M1C for a control electrode extend along the outer periphery of the transistor formation region RG1 so as to be next to each other. In other words, each of the wiring M1G for a gate and the wiring M1C for a control electrode extends along the outer periphery of the transistor formation region RG1, and the wiring M1G for a gate is arranged on an inner side than the wiring M1C for a control electrode (a portion closer to the transistor formation region RG1) when seen in a plan view in a region where the wiring M1G for a gate and the wiring M1C for a control electrode extend along the outer periphery of the transistor formation region RG1 so as to be next to each other.

In the case of FIG. 2, note that the region where the wiring M1G for a gate and the wiring M1C for a control electrode extend along the outer periphery of the transistor formation region RG1 so as to be next to each other is of a region extending along the side H1 and a region extending along the side H3. That is, on the portion closer to the side H1, the wiring portion M1G1 for a gate and the wiring portion M1C1 for a control electrode extend along the outer periphery of the transistor formation region RG1 so as to be next to each other, and the wiring portion M1G1 for a gate is arranged on the inner side while the wiring portion M1C1 for a control electrode is arranged on the outer side. Further, on the portion closer to the side H3, the wiring portion M1G3 for a gate and the wiring portion M1C3 for a control electrode extend along the outer periphery of the transistor formation region RG1 so as to be next to each other, and the wiring M1G3 for a gate is arranged on the inner side while the wiring M1C3 for a control electrode is arranged on the outer side.

Next, a modified example of the present embodiment will be described.

Regarding Second Modified Example

Figure 48:
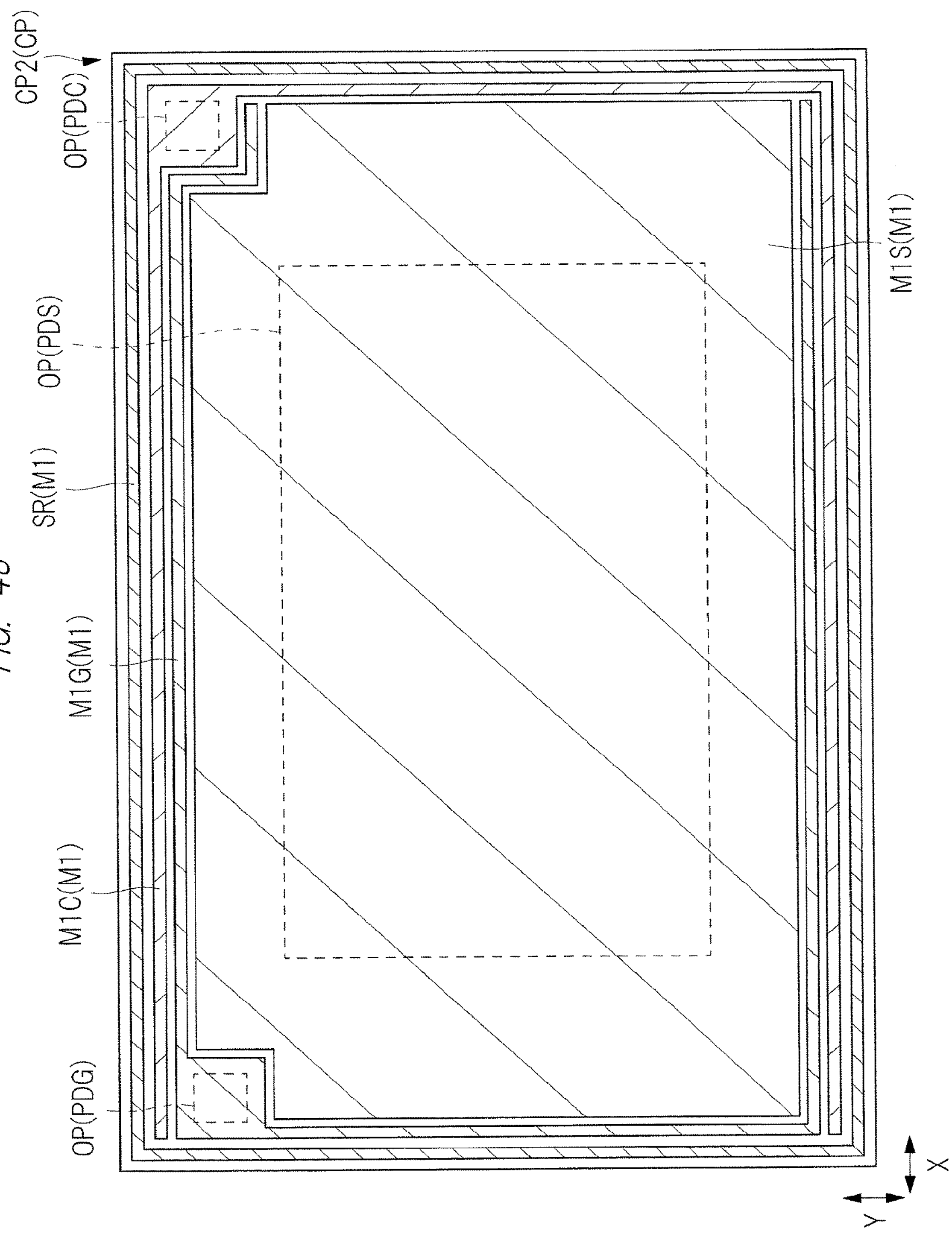
FIG. 48 is an overall plan view of a semiconductor device of a second modified example.

First, a second modified example will be described. FIG. 48 is a plan view illustrating a second modified example of the semiconductor device CP of the present embodiment, and illustrates an overall plan view corresponding to the above-described FIG. 2. The semiconductor device CP of the second modified example illustrated in FIG. 48 is called "semiconductor device CP2".

The semiconductor device CP2 illustrated in FIG. 48 is different from the semiconductor device CP illustrated in the above-described FIGS. 1 to 13 in that a seal ring (guard ring) SR is provided. Except for this provision, the semiconductor device CP2 illustrated in FIG. 48 has almost the same configuration of the semiconductor device CP illustrated in the above-described FIGS. 1 to 13, and therefore, the seal ring SR which is the different point will be described here.

In the semiconductor device CP2 illustrated in FIG. 48, a wiring M1 has not only the wiring M1S for a source, the wiring M1G for a gate, and the wiring M1C for a control electrode but also the seal ring SR. The seal ring SR is formed in the same layer and at the same step as those of the wiring M1S for a source, the wiring M1G for a gate, and the wiring M1C for a control electrode. The seal ring SR is formed on the outer peripheral portion of the semiconductor device CP2 so as to go around along the outer periphery of the semiconductor device CP2 when seen in a plan view. Therefore, the transistor formation region RG1, the wiring M1S for a source, the wiring M1G for a gate, and the wiring M1C for a control electrode are arranged in a region surrounded by the seal ring SR when seen in a plan view. In other words, when seen in a plan view, the seal ring SR is provided so as to surround the transistor formation region RG1, the wiring M1S for a source, the wiring M1G for a gate, and the wiring M1C for a control electrode.

Since the seal ring SR has been provided, even if a crack occurs in a cut surface by a dicing blade at a dicing step (cutting step) in the manufacturing steps of the semiconductor device, extension of the crack can be stopped by the seal ring SR. Further, entering of moisture from the cut surface (side surface) of the semiconductor device can be stopped by the seal ring SR. Therefore, by providing the seal ring SR, the reliability of the semiconductor device can be improved.

Note that illustration of the seal ring SR is omitted in the first modified example illustrated in the above-described FIGS. 42 to 47 and subsequent modified examples (third to seventh modified examples). However, the seal ring SR can be provided in the modified examples.

Regarding Third Modified Example

Figure 49:
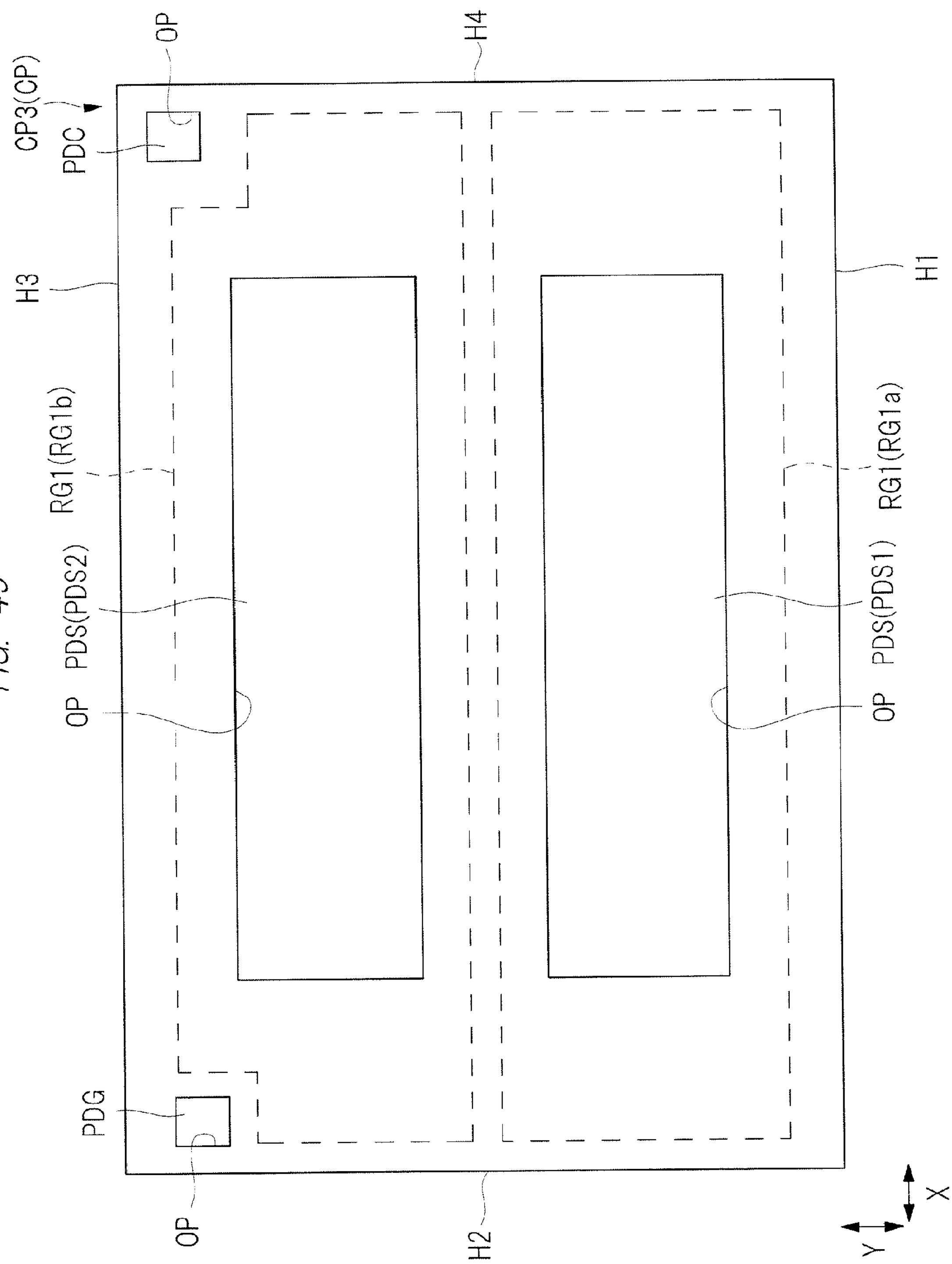
FIG. 49 is an overall plan view of a semiconductor device of a third modified example.
Figure 50:
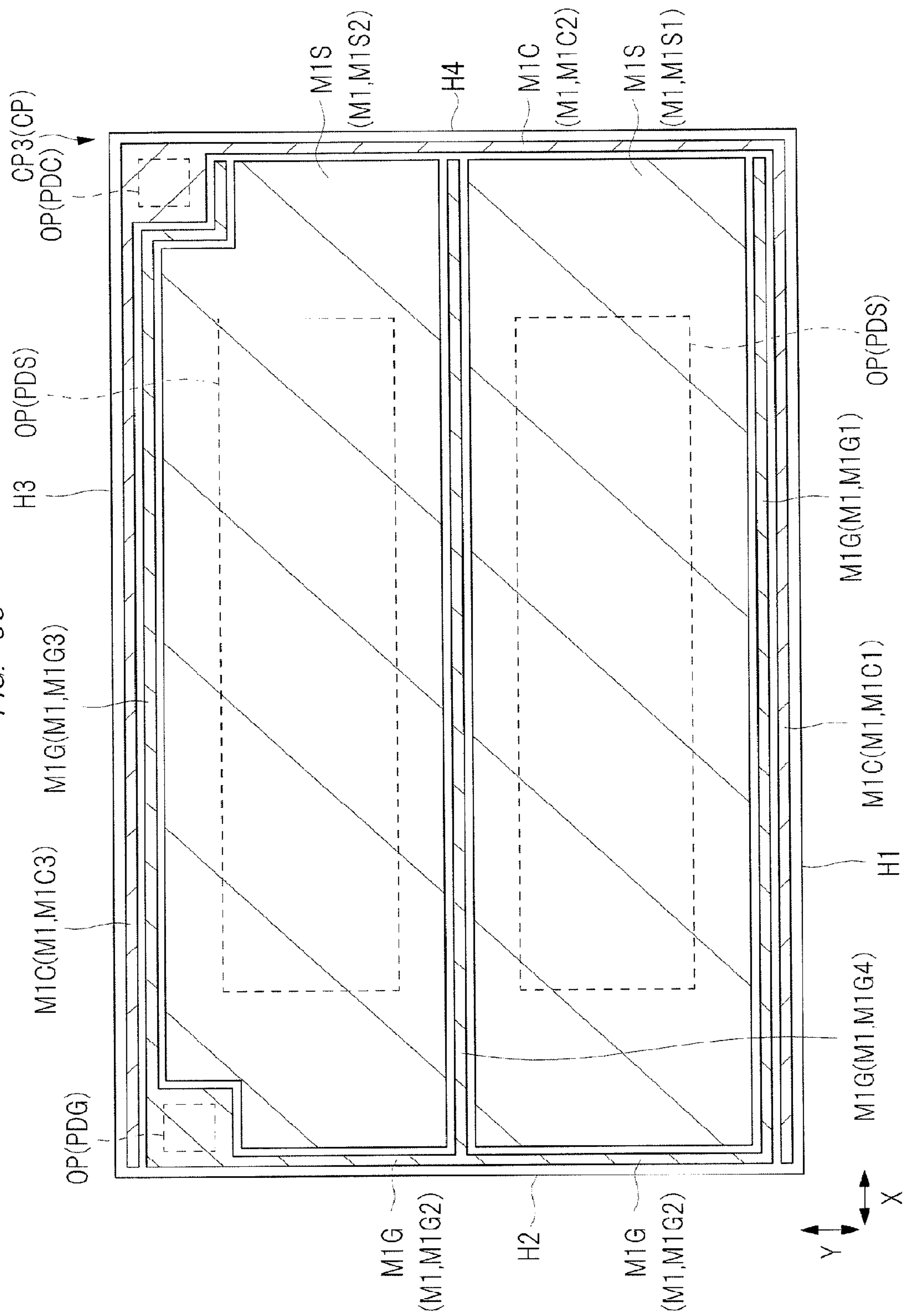
FIG. 50 is an overall plan view of the semiconductor device of the third modified example.
Figure 51:
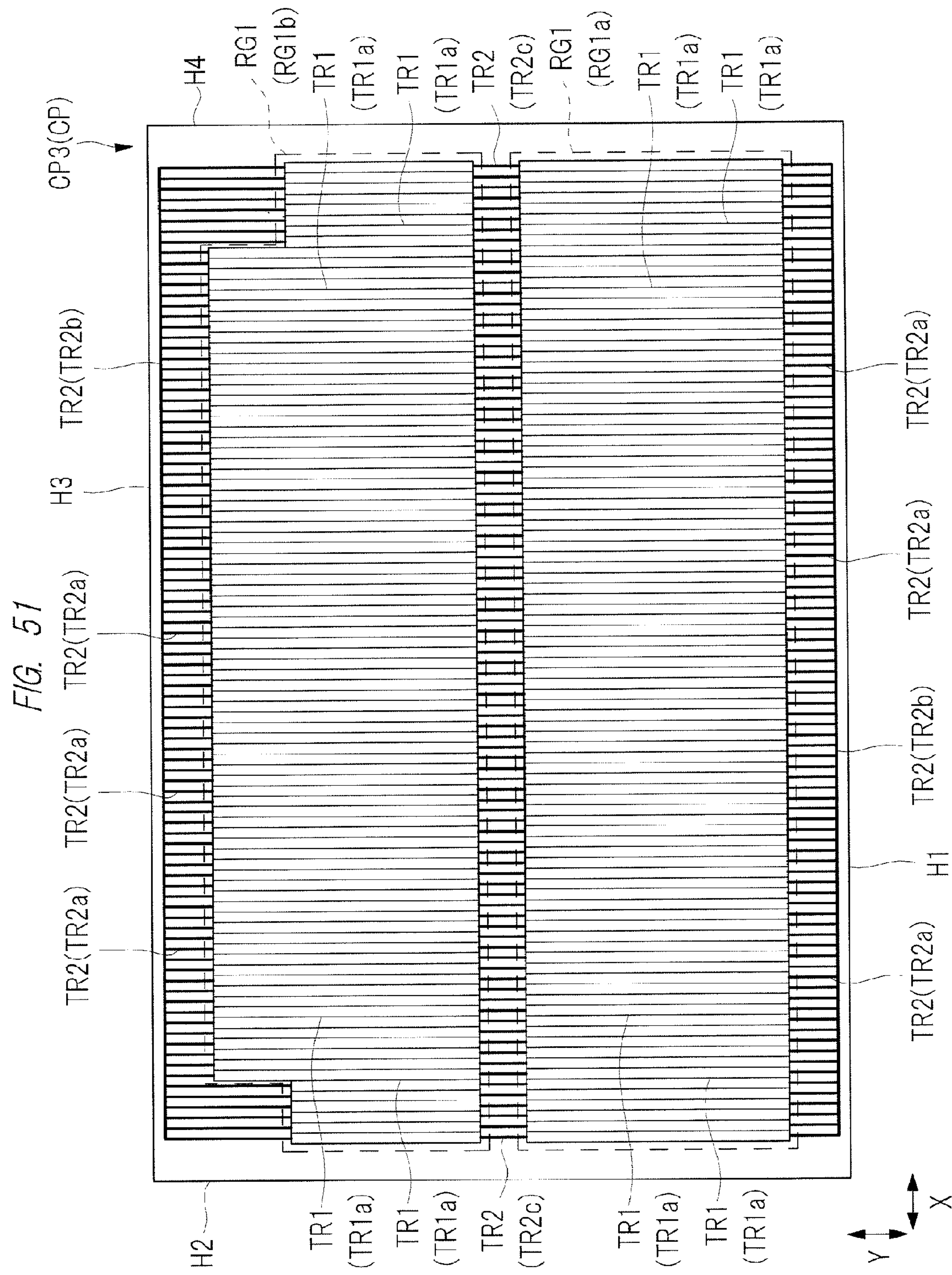
FIG. 51 is an overall plan view of the semiconductor device of the third modified example.
Figure 52:
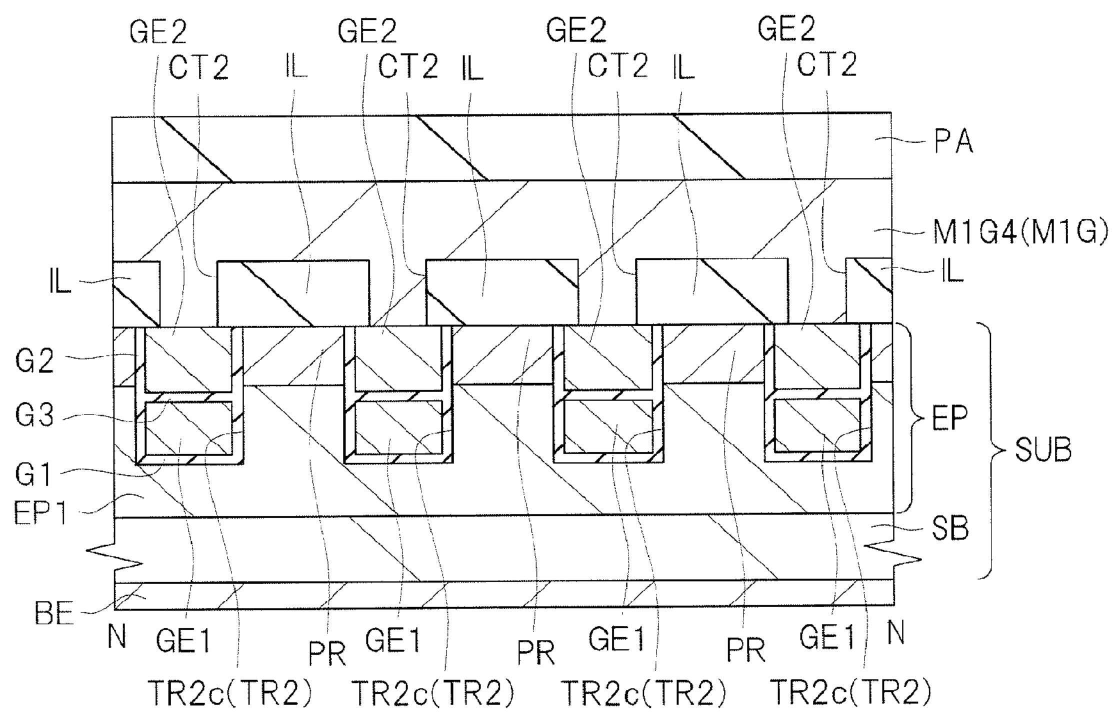
FIG. 52 is a cross-sectional view of a principal part of the semiconductor device of the third modified example.
Figure 59:
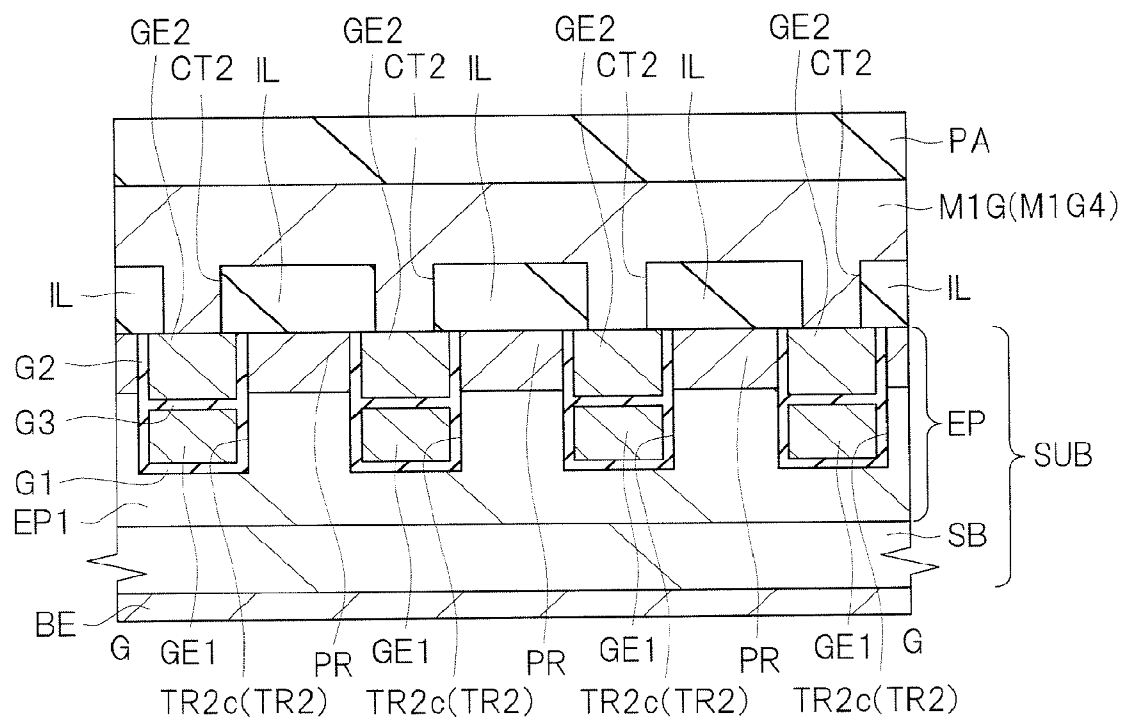
FIG. 59 is a cross-sectional view of a principal part of the semiconductor device of the fourth modified example.
Figure 60:
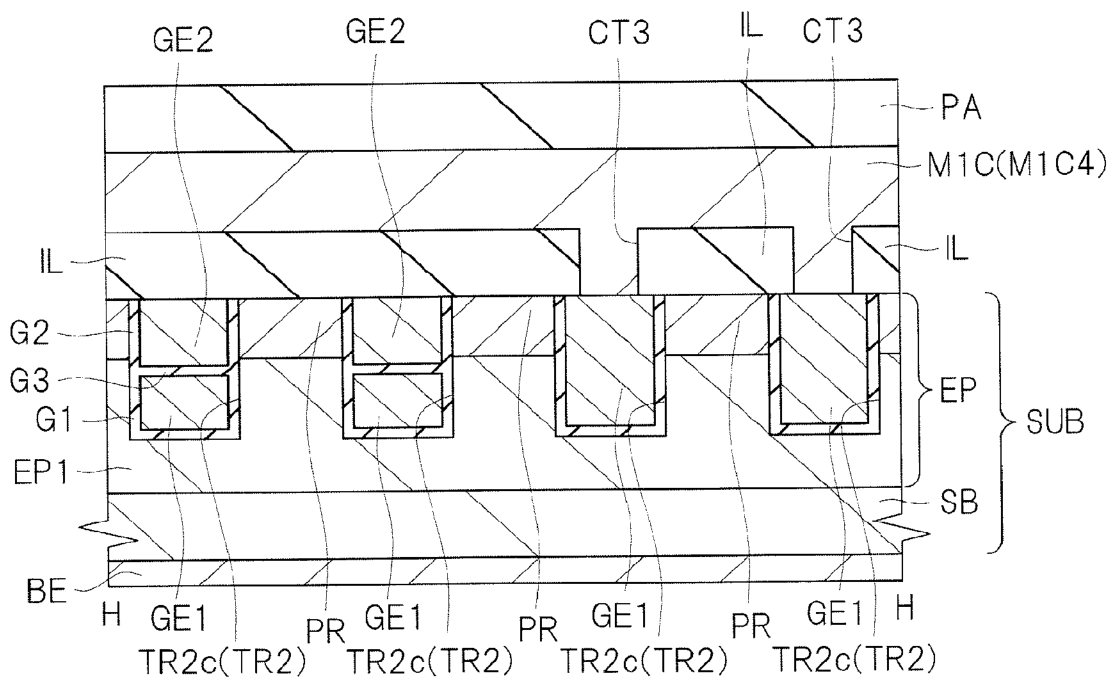
FIG. 60 is a cross-sectional view of a principal part of the semiconductor device of the fourth modified example.

Next, a third modified example will be described. Each of FIGS. 49 to 52 is a plan view or a cross-sectional view illustrating the third modified example of the semiconductor device CP of the present embodiment. The semiconductor device CP of the third modified example illustrated in FIGS. 49 to 52 is called "semiconductor device CP3". FIG. 49 of FIGS. 49 to 52 is an overall plan view corresponding to the above-described FIG. 1, FIG. 50 thereof is an overall plan view corresponding to the above-described FIG. 2, and FIG. 51 thereof is an overall plan view corresponding to the above-described FIG. 3. Further, FIG. 52 is a cross-sectional view of a principal part of the semiconductor device CP3, and illustrates a cross-sectional surface along a wiring portion M1G4 for a gate (a cross-sectional surface similar to a section illustrated in FIG. 59 described later).

The semiconductor device CP3 illustrated in FIGS. 49 to 52 corresponds to a case of addition of a wiring portion M1G4 for a gate of the wiring M1G for a gate to the semiconductor device CP illustrated in the above-described FIGS. 1 to 13.

That is, in the semiconductor device CP3 illustrated in FIGS. 49 to 52, the wiring M1G for a gate includes not only the wiring portion M1G1 for a gate extending along the side H1, the wiring portion M1G2 for a gate extending along the H2, the wiring portion M1G3 for a gate extending along the side H3 but also the wiring portion M1G4 for a gate. The semiconductor device CP3 illustrated in FIGS. 49 to 52 includes the following configuration in accordance with the inclusion of the wiring portion M1G4 for a gate in the wiring M1G for a gate.

In the semiconductor device CP3 illustrated in FIGS. 49 to 52, the transistor formation region RG1 is divided into a plurality of regions so as to be separated from each other in the Y direction, and the transistor formation region RG1 is here divided into a transistor formation region RG1*a* and a transistor formation region RG1*b* so that the transistor formation region RG1*a* and the transistor formation region RG1*b* are separated from each other in the Y direction. The transistor formation region RG1*a* of the transistor formation regions RG1*a* and RG1*b* is arranged on a portion closer to the side H1, and the transistor formation region RG1*b* thereof is arranged on a portion closer to the side H3.

It is required to arrange the wiring M1S for a source so as to be separated from the wiring M1C for a gate and the wiring M1C for a control electrode. Therefore, in the semiconductor device CP3 illustrated in FIGS. 49 to 52, the wiring M1S for a source is divided into two wirings M1S1 and M1S2 for a source so as to sandwich the wiring portion M1G4 for a gate therebetween, and the wiring M1S1 for a source and the wiring M1S2 for a source are separated from each other in the Y direction. The wiring M1S1 for a source is formed on the transistor formation region RG1*a* while the wiring M1S2 for a source is formed on the transistor formation region RG1*b*, and the wiring M1S1 for a source is almost coincident with the transistor formation region RG1*a* when seen in a plan view while the wiring M1S2 for a source is almost coincident with the transistor formation region RG1*b* when seen in a plan view.

In the semiconductor device CP3 illustrated in FIGS. 49 to 52, the wiring portion M1G4 for a gate extends in the X direction between the transistor formation region RG1*a* and the transistor formation region RG1*b* (therefore, between the wiring M1S1 for a source and the wiring M1S2 for a source) when seen in a plan view.

One end portion of the wiring portion M1G4 for a gate (an end portion thereof closer to the side H2) is integrally coupled to the wiring portion M1G2 for a gate. Therefore, the wiring portion M1G1 for a gate, the wiring portion M102 for a gate, the wiring portion M1G3 for a gate, and the wiring portion M1G4 for a gate are formed integrally with each other so as to be coupled to each other. Each of the wiring M1S1 for a source and the wiring M1S2 for a source is surrounded by the wiring M1G for a gate and the wiring M1C for a control electrode when seen in a plan view.

In a region between the transistor formation region RG1*a* and the transistor formation region RG1*b*, a plurality of trenches TR2 extending in the Y direction are arranged in the X direction so as to be next to each other. Here, in the region between the transistor formation region RG1*a* and the transistor formation region RG1*b*, each of trenches TR2 extending in the Y direction and arranged at a predetermined interval (pitch) in the X direction is called "trench TR2*c*" attached with a reference symbol TR2*c*. The trench TR2*c* is basically equal to the trench TR2*a*, and the trench TR2*a* arranged between the transistor formation region RG1*a* and the transistor formation region RG1*b* corresponds to the trench TR2*c*. The trench TR2*c* formed in the region between the transistor formation region RG1*a* and the transistor formation region RG1*b* is connected to the trench TR1 formed in the transistor formation region RG1*a* and to the trench TR1 formed in the transistor formation region RG1*b*.

Therefore, in the semiconductor device CP3 illustrated in FIGS. 49 to 52, a plurality of trenches TR2 (TR2*c*) extending in the Y direction so as to cross the wiring portion 141G4 for a gate are arranged so as to be next to each other in the X direction below the wiring portion M1G4 for a gate extending in the X direction.

In the region between the transistor formation region RG1*a* and the transistor formation region RG1*b*, the trench TR2 (TR2*c*) extending in the Y direction is configured of the multilayer region TR3 where both of the control electrode GE1 and the gate electrode GE2 are formed. And, a contact hole CT2 for a gate is provided in a region where the wiring portion M1G4 for a gate overlaps with trench TR2 (TR2*c*) extending in the Y direction when seen in a plan view, and the wiring portion M1G4 for a gate is connected to the gate electrode GE2 inside the trench TR2 (TR2*c*) through the contact hole CT2 for a gate. Therefore, the wiring portion M1G4 for a gate is electrically connected to the gate electrode GE2 inside the trenches TR1 of the transistor formation regions RG1*a*, RG1*b* through the gate electrode GE2 inside the trench TR2 (TR2*c*).

In the insulating film PA, an opening OP is provided to each of the wirings M1S1 and M1S2 for a source. And, a pad PDS1 for a source is formed by the wiring M1S1 for a source exposed from the opening OP provided to the wiring M1S1 for a source, and a pad PDS2 for a source is formed by the wiring M1S2 for a source exposed from the opening OP provided to the wiring M1S2 for a source. Therefore, in the semiconductor device CP3 illustrated in FIGS. 49 to 52, the pad PDS1 for a source and the pad PDS2 for a source are formed as the pad PDS for a source. The wiring portion M1G4 for a gate of the wiring M1G for a gate extends in the X direction between the pad PDS1 for a source and the pad PDS2 for a source when seen in a plan view.

When the semiconductor device CP3 is seen as a single body, the wiring M1S1 for a source and the wiring M1S2 for a source are separated from each other. However, in a semiconductor package obtained by packaging the semiconductor device CP3, a common potential (voltage) is applied to the wiring M1S1 for a source and the wiring M1S2 for a source. That is, in the semiconductor package obtained by packaging the semiconductor device CP3, the wiring M1S1 for a source and the wiring M1S2 for a source are electrically connected to each other through a conductor (an electrically-conductive connection member). For example, in a case of a semiconductor device PKG described later, either one of a metal plate MP1 or a metal plate MP2 described later is connected to both of the pad PDS1 for a source and the pad PDS2 for a source, and therefore, the wiring M1S1 for a source and the wiring M1S2 for a source are electrically connected to each other through the connected metal plate (MP1 or MP2). Further, in case of a semiconductor device PKG1 described later, a metal plate MP3 described later is connected to both of the pad PDS1 for a source and the pad PDS2 for a source, and therefore, the wiring M1S1 for a source and the wiring M1S2 for a source are electrically connected to each other through the connected metal plate MP3. This point is also the same as those in cases of subsequent modified examples (the fourth to the seventh modified examples).

Other configuration of the semiconductor device CP3 illustrated in FIGS. 49 to 52 is basically the same as that of the semiconductor device CP illustrated in the above-described FIGS. 1 to 13, and therefore, explanation thereof is omitted here.

In the case of the semiconductor device CP3 illustrated in FIGS. 49 to 52, in addition to the effect obtained by the semiconductor device CP illustrated in the above-described FIGS. 1 to 13, the following effect can be further obtained.

That is, in the semiconductor device CP3 illustrated in FIGS. 49 to 52, the wiring M1G for a gate further includes the wiring M1G4 portion for a gate, so that the gate resistance can be decreased. Therefore, from a viewpoint of decreasing the gate resistance as much as possible, the semiconductor device CP3 is further advantageous. Accordingly, the performance of the semiconductor device can be further improved.

Regarding Fourth Modified Example

Figure 53:
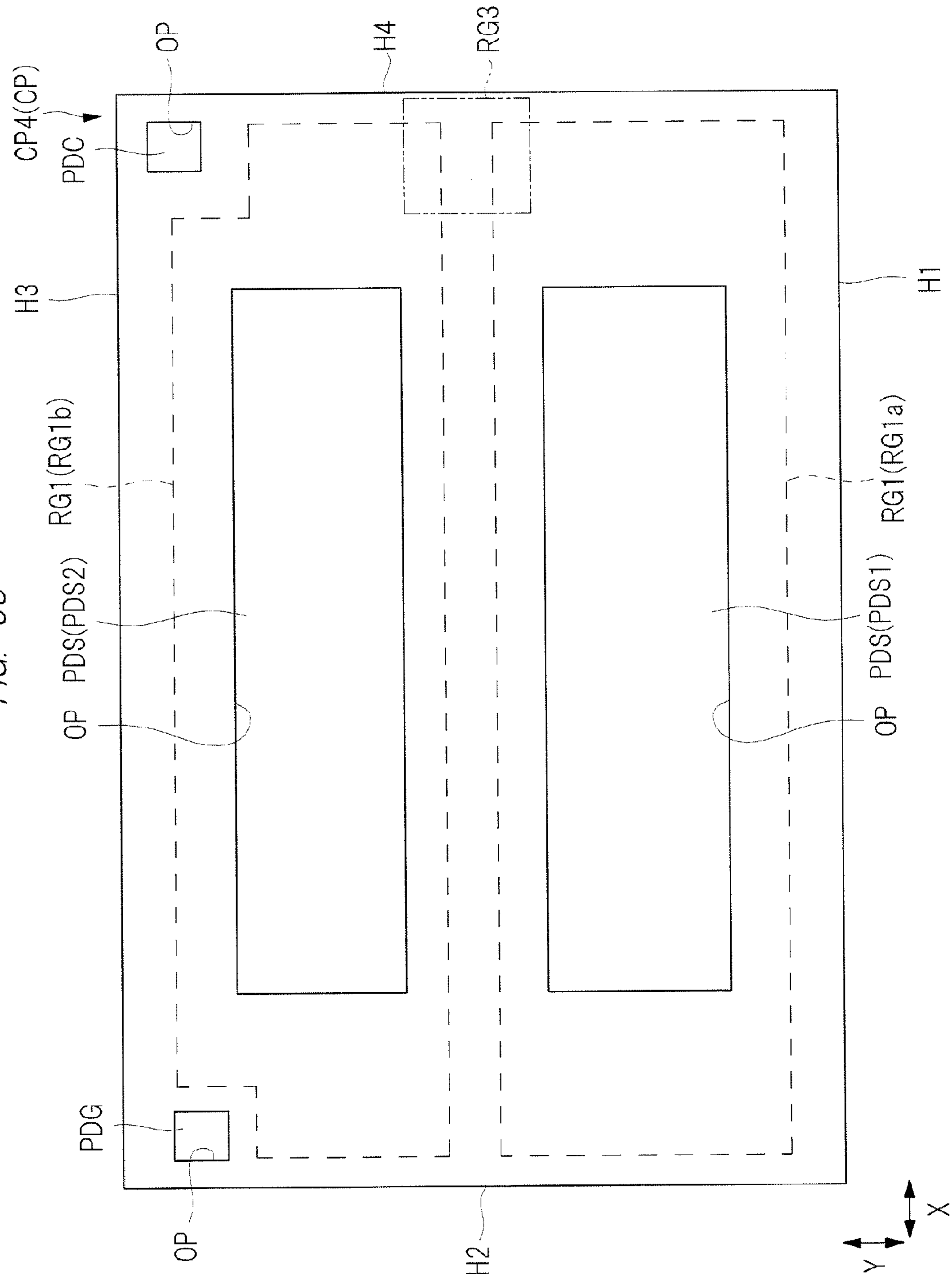
FIG. 53 is an overall plan view of a semiconductor device of a fourth modified example.

Next, a fourth modified example will be described. Each of FIGS. 53 to 62 is a plan view or a cross-sectional view illustrating the fourth modified example of the semiconductor device CP of the present embodiment. The semiconductor device CP of the fourth modified example illustrated in FIGS. 53 to 62 is called "semiconductor device CP4". FIG. 53 of FIGS. 53 to 62 is an overall plan view corresponding to the above-described FIG. 1, FIG. 54 thereof is an overall plan view corresponding to the above-described FIG. 2, FIG. 55 thereof is an overall plan view corresponding to the above-described FIG. 3, FIG. 56 thereof is a plan view of a principal part corresponding to the above-described FIG. 4, FIG. 57 thereof is a plan view of a principal part corresponding to the above-described FIG. 5, and FIG. 58 thereof is a plan view of a principal part corresponding to the above-described FIG. 6. Note that enlarged views of a region RG3 surrounded by two-dot chain lines illustrated in FIGS. 53 and 54 correspond to FIGS. 56 to 58. Further, FIG. 59 almost corresponds to cross-sectional views taken along a line G-G in FIGS. 56 and 57, FIG. 60 almost corresponds to cross-sectional views taken along a line H-H in FIGS. 56 and 57, FIG. 61 almost corresponds to cross-sectional views taken along a line J-J in FIGS. 56 and 57, and FIG. 62 almost corresponds to cross-sectional views taken along a line K-K in FIGS. 56 and 57.

The semiconductor device CP4 illustrated in FIGS. 53 to 62 corresponds to a case of addition of the wiring portion M1C 4 for a control electrode of the wiring M1C for a control electrode to the semiconductor device CP3 illustrated in the above-described FIGS. 49 to 52.

That is, in the semiconductor device CP4 illustrated in FIGS. 53 to 62, the wiring M1C for a control electrode includes not only the wring portion M1C1 for a control electrode extending along the side H1, the wiring portion M1C2 for a control electrode extending along the side H4, and the wiring portion M1C3 for a control electrode extending along the side H3 but also a wiring portion M1C4 for a control electrode. In a point that the wiring M1G for a gate includes not only the wiring portions M1G1, M1G2, and M1G3 for a gate but also the wiring portion M1G4 for a gate, the semiconductor device CP4 illustrated in FIGS. 53 to 62 is also the same as the semiconductor device CP3 illustrated in the above-described FIGS. 49 to 52.

The semiconductor device CP4 illustrated in FIGS. 53 to 62 includes the following configuration in accordance with the inclusion of the wiring portion M1G4 for a gate in the wiring M1G for a gate and inclusion of the wiring portion M1C4 for a control electrode in the wiring M1C for a control electrode.

In the semiconductor device CP4 illustrated in FIGS. 53 to 62, the transistor formation region RG1 is divided into a plurality of regions so as to be separated from each other in the Y direction, and the transistor formation region RG1 is here divided into a transistor formation region RG1*a* and a transistor formation region RG1*b* so that the transistor formation region RG1*a* and the transistor formation region RG1*b* are separated from each other in the Y direction. This point is the same as that of the above-described semiconductor device CP3.

It is required to arrange the wiring M1S for a source so as to be separated from the wiring M1G for a gate and the wiring M1C for a control electrode. Therefore, in the semiconductor device CP4 illustrated in FIGS. 53 to 62, the wiring M1S for a source is divided into two wirings M1S1 and M1S2 for a source so that the two wirings sandwich the wiring portion M1G4 for a gate and the wiring M1C4 portion for a control electrode therebetween, and the wiring M1S1 for a source and the wiring M1S2 for a source are separated from each other in the Y direction. The wiring M1S1 for a source is formed on the transistor formation region RG1*a* while the wiring M1S2 for a source is formed on the transistor formation region RG1*b*, and the wiring M1S1 for a source is almost coincident with the transistor formation region RG1*a* when seen in a plan view while the wiring M1S2 for a source is almost coincident with the transistor formation region RG1*b* when seen in a plan view. This point is the same as that of the above-described semiconductor device CP3.

In the semiconductor device CP4 illustrated in FIGS. 53 to 62, each of the wiring portion M1G4 for a gate and the wiring portion M1C4 for a control electrode extends in the X direction between the transistor formation region RG1*a* and the transistor formation region RG1*b* (therefore, between the wiring M1S1 for a source and the wiring M1S2 for a source) when seen in a plan view. That is, the wiring portion M1G4 for a gate extending in the X direction and the wiring portion M1C4 for a control electrode extending in the X direction are adjacent to each other in the Y direction between the transistor formation region RG1*a* and the transistor formation region RG1*b* (therefore, between the wiring M1S1 for a source and the wiring M1S2 for a source) when seen in a plan view. That is, the wiring portion M104 for a gate and the wiring portion M1C4 for a control electrode extend in the X direction so as to be next to each other in a region between the transistor formation region RG1*a* and the transistor formation region RG1*b* (therefore, the region between the wiring M1S1 for a source and the wiring M1S2 for a source) when seen in a plan view.

One end portion of the wiring portion M1G4 for a gate (an end portion thereof closer to the side H2) is integrally coupled to the wiring portion M1G2 for a gate, and one end portion of the wiring portion M1C4 for a control electrode (an end portion closer to the side H4) is integrally coupled to the wiring portion M1C2 for a control electrode. Therefore, the wiring portion M1G1 for a gate, the wiring portion M1G2 for a gate, the wiring portion M1G3 for a gate, and the wiring portion M1G4 for a gate are integrally formed to be coupled to each other. Further, the wiring portion M1C1 for a control electrode, the wiring portion M1C2 for a control electrode, the wiring portion M1C3 for a control electrode, and the wiring portion M1C4 for a control electrode are integrally formed to be coupled to each other. Each of the wiring M1S1 for a source and the wiring M1S2 for a source is surrounded by the wiring M1G for a gate and the wiring M1C for a control electrode when seen in a plan view.

Figure 54:
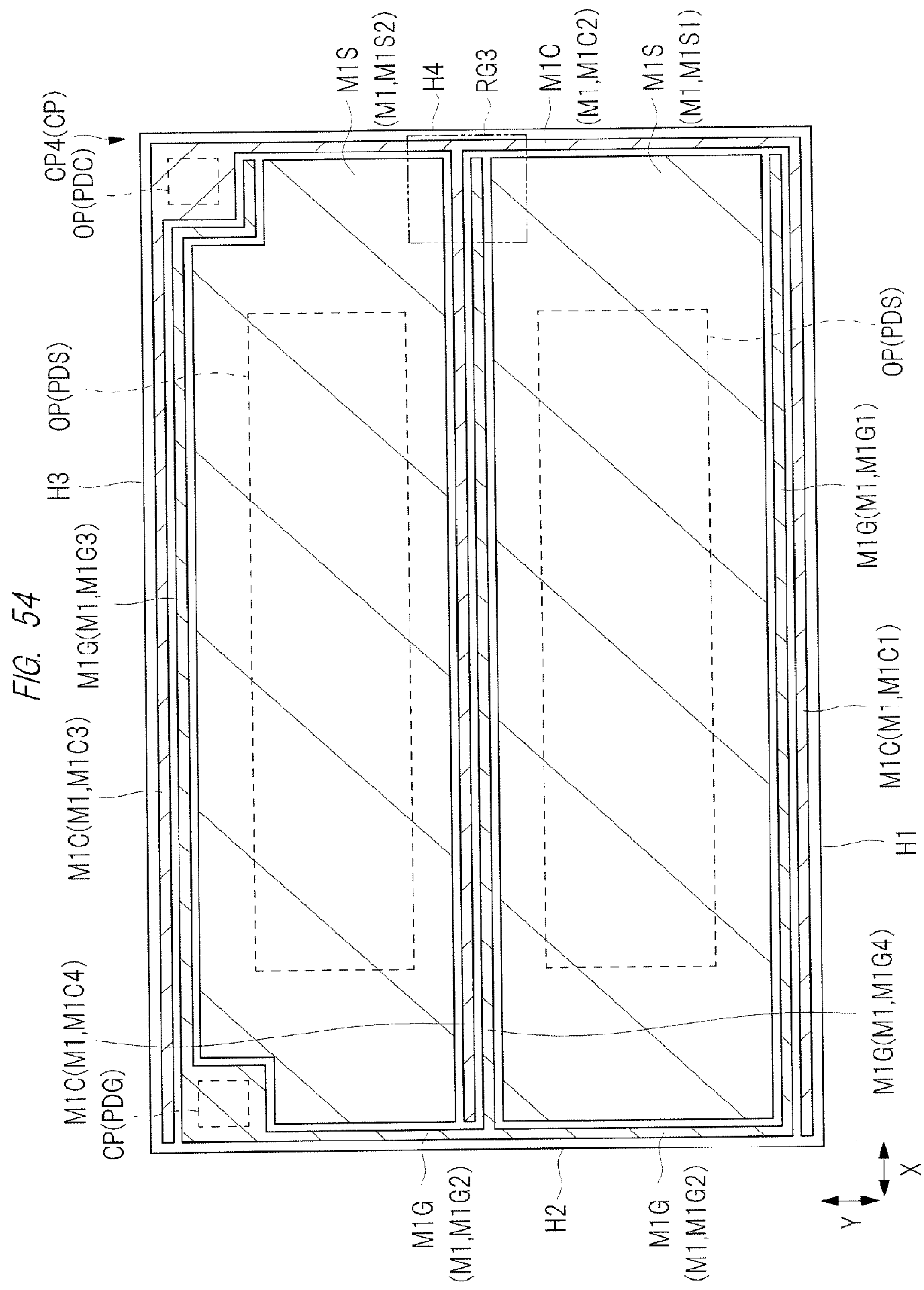
FIG. 54 is an overall plan view of the semiconductor device of the fourth modified example.
Figure 55:
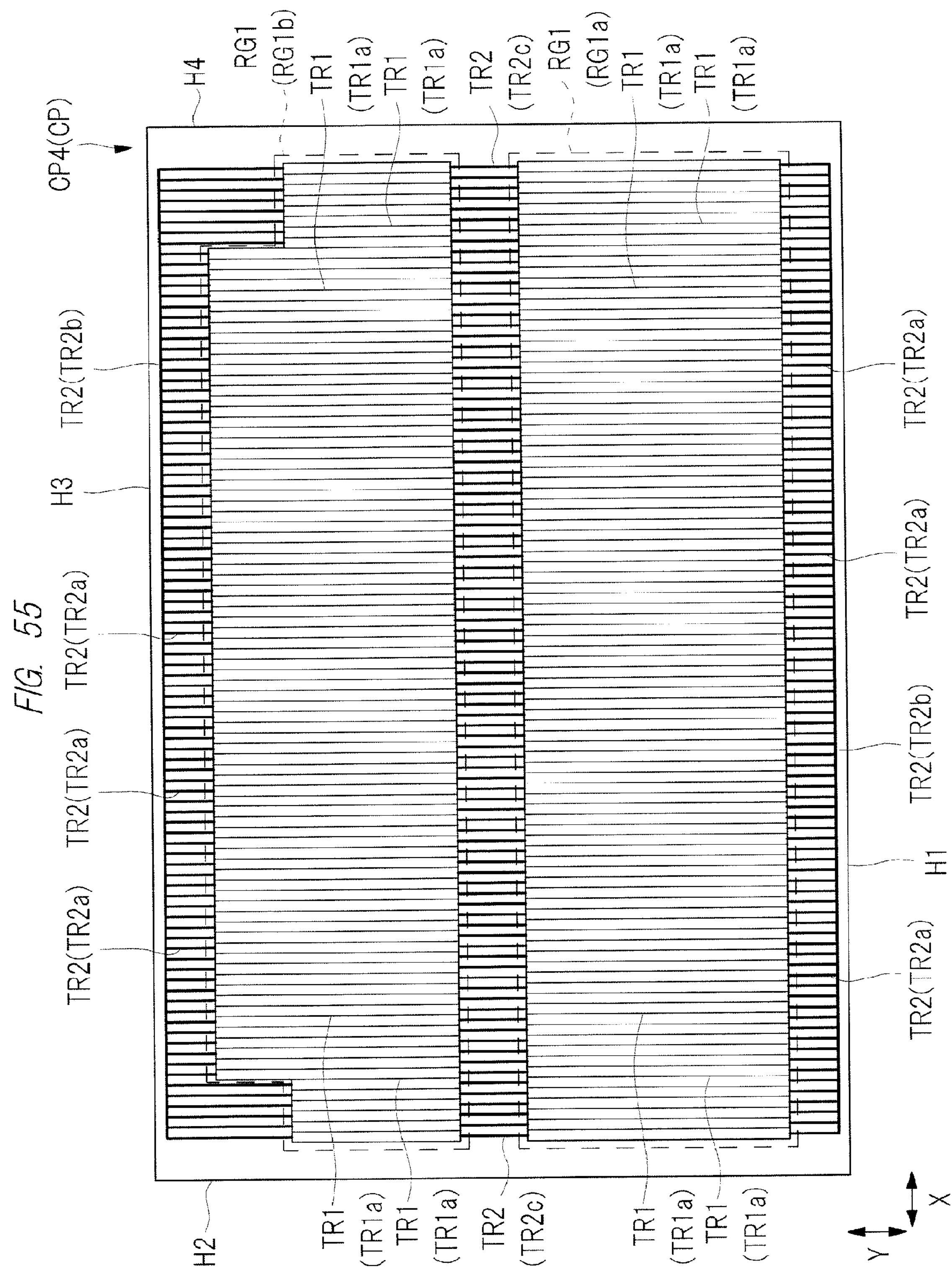
FIG. 55 is an overall plan view of the semiconductor device of the fourth modified example.

Note that FIG. 54 illustrates a case that the wiring portion M1G4 for a gate is arranged on a portion closer to the wiring M1S1 for a source, and the wiring portion M1C4 for a control electrode is arranged on a portion closer to the wiring M1S2 for a source. However, as another aspect, the wiring portion M1C4 for a control electrode can be arranged on the portion closer to the wiring M1S1 for a source, and the wiring portion M1G4 for a gate can be arranged on the portion closer to the wiring M1S2 for a source.

In the insulating film PA, an opening OP is provided to each of the wirings M1S1 and M1S2 for a source, and a pad PDS1 for a source is formed by the wiring M1S1 for a source exposed from the opening OP provided to the wiring M1S1 for a source while a pad PDS2 for a source is formed by the wiring M1S2 for a source exposed from the opening OP provided to the wiring M1S2 for a source. This point is the same as that of the above-described semiconductor device CP3.

In the region between the transistor formation region RG1*a* and the transistor formation region RG1*b*, a plurality of trenches TR2 (TR2*c*) extending in the Y direction are arranged so as to be next to each other in the X direction, and this point is the same as that of the above-described semiconductor device CP3. The trench TR2*c* is connected to the trench TR1 formed in the transistor formation region RG1*a* and the trench TR1 formed in the transistor formation region RG1*b*.

Therefore, in the semiconductor device CP4 illustrated in FIGS. 53 to 62, the plurality of trenches TR2 (TR2*c*) extending in the Y direction so as to cross the wiring portion M1G4 for a gate and the wiring portion M1C4 for a control electrode are arranged so as to be next to each other in the X direction below the wiring portion M1G4 for a gate and the wiring portion M1C4 for a control electrode extending in the X direction.

Figure 56:
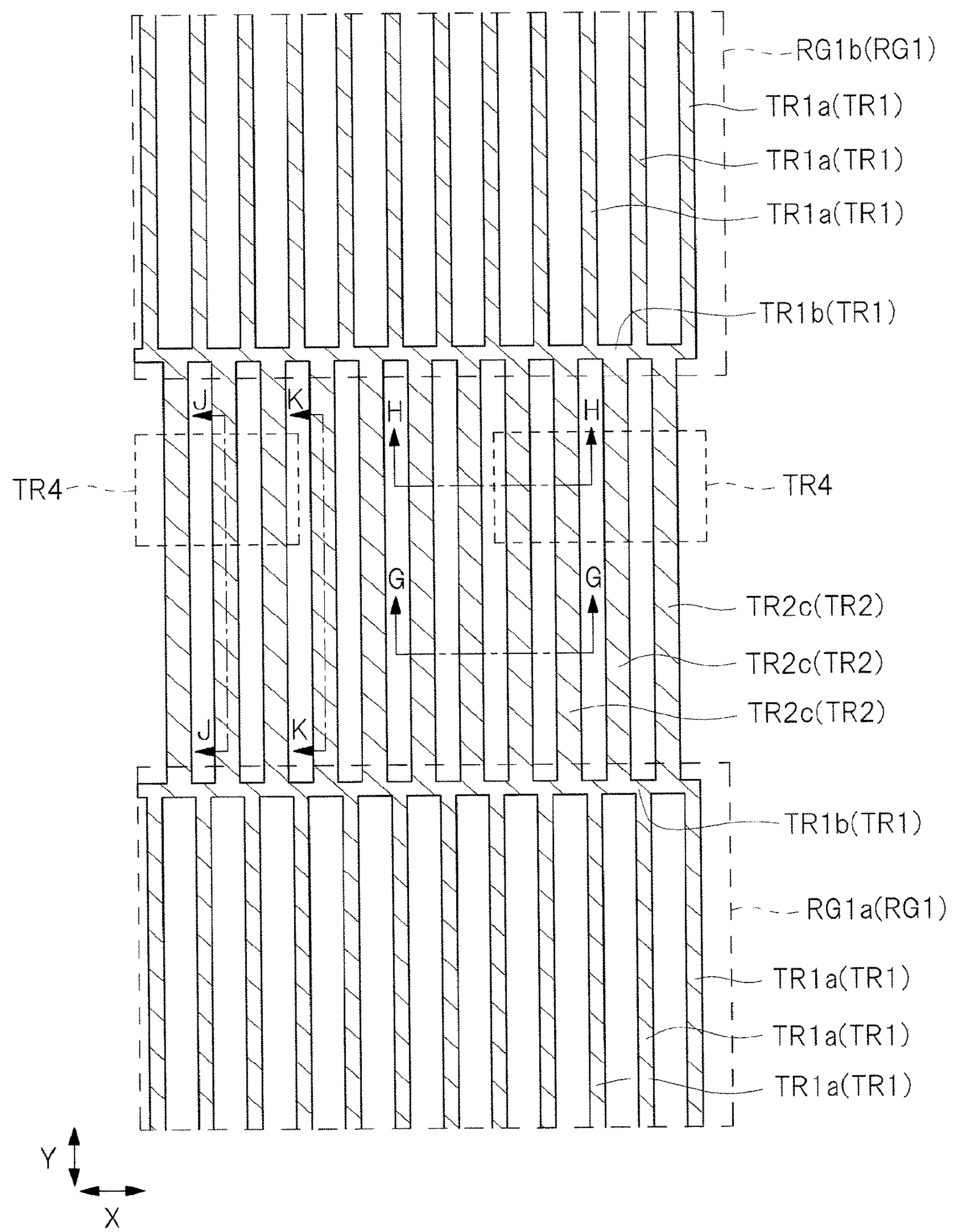
FIG. 56 is a plan view of a principal part of the semiconductor device of the fourth modified example.
Figure 57:
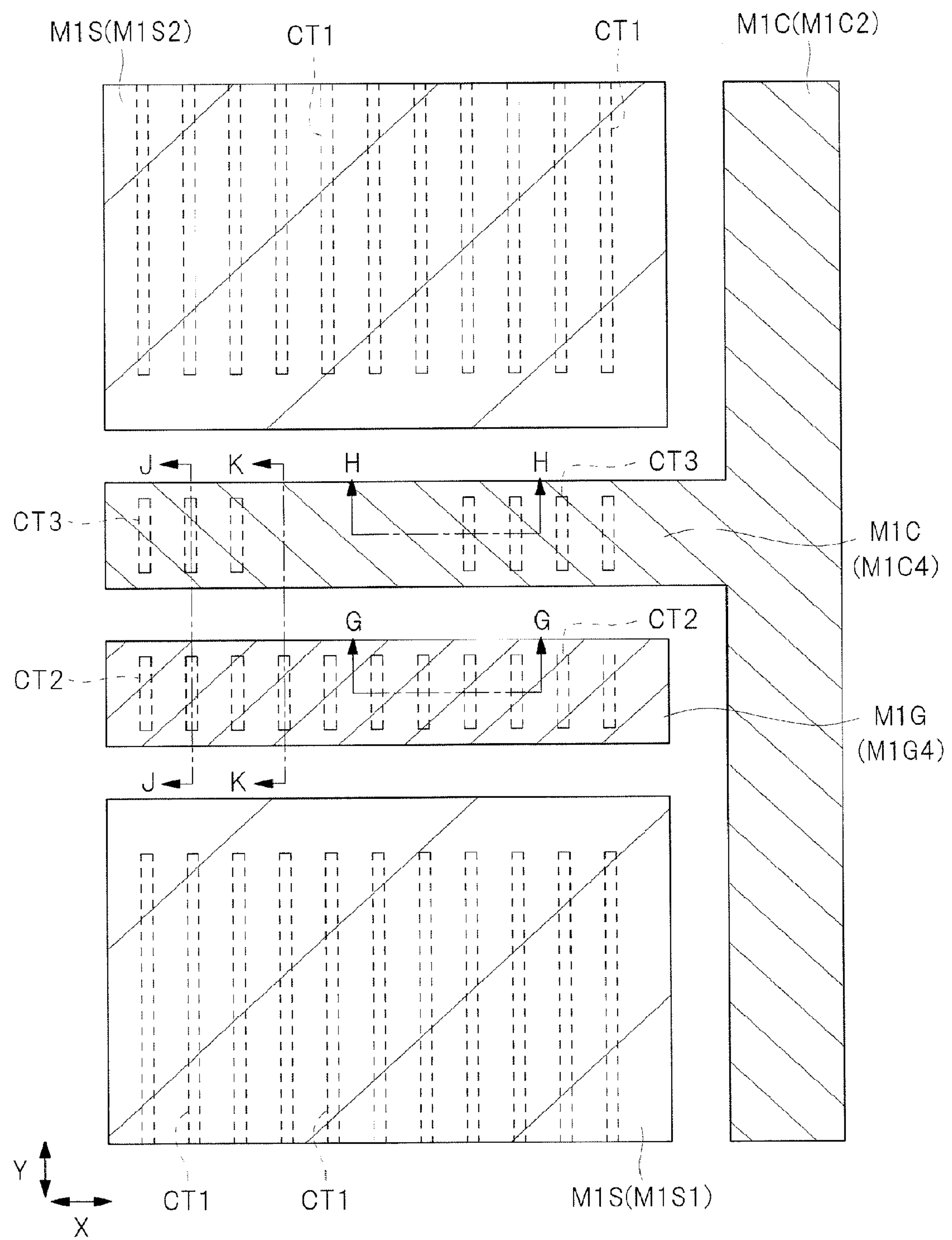
FIG. 57 is a plan view of a principal part of the semiconductor device of the fourth modified example.
Figure 58:
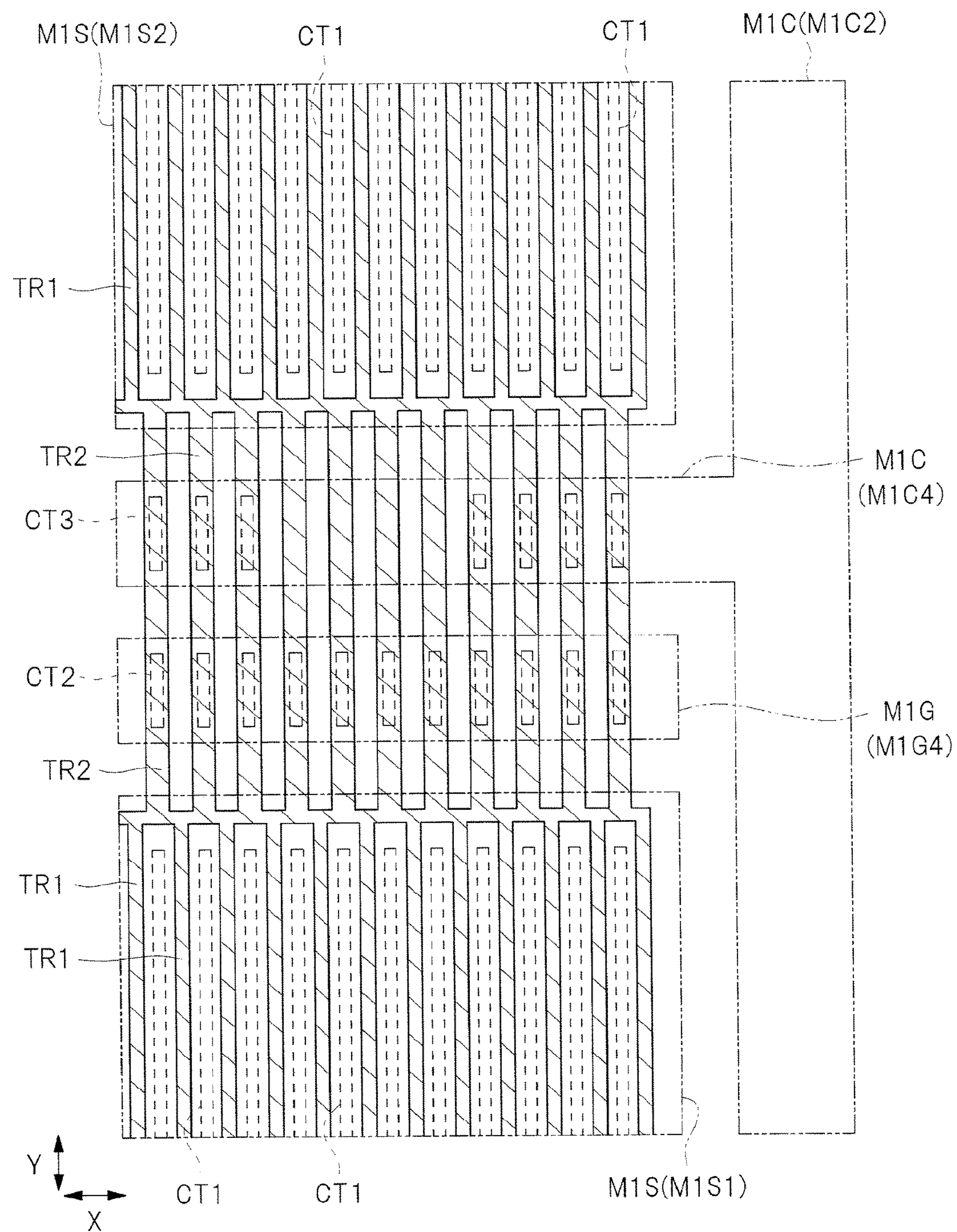
FIG. 58 is a plan view of a principal part of the semiconductor device of the fourth modified example.
Figure 61:
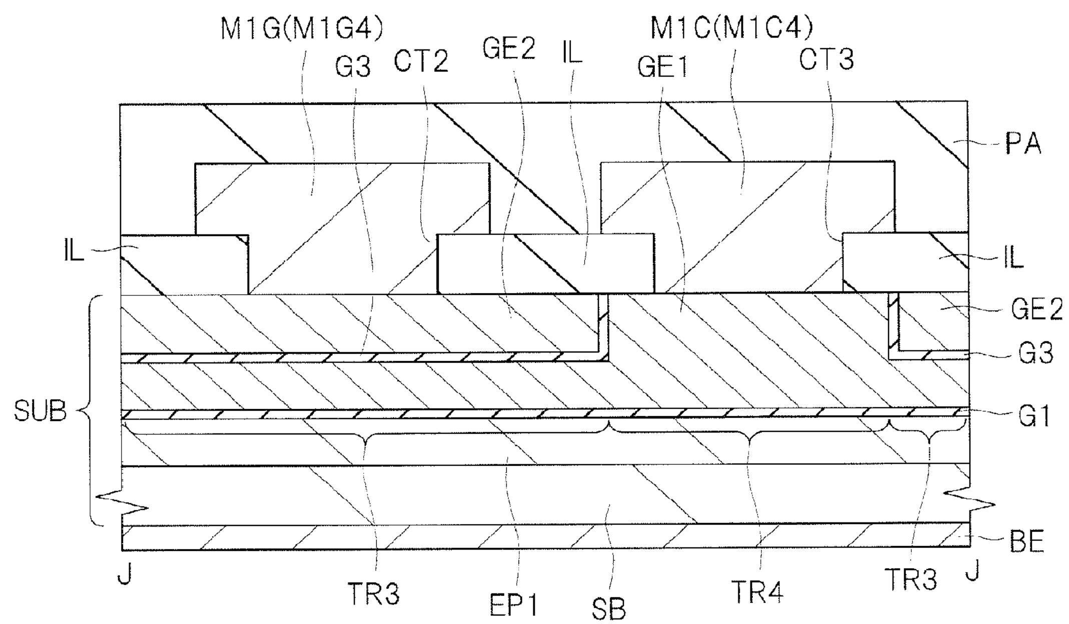
FIG. 61 is a cross-sectional view of a principal part of the semiconductor device of the fourth modified example.
Figure 62:
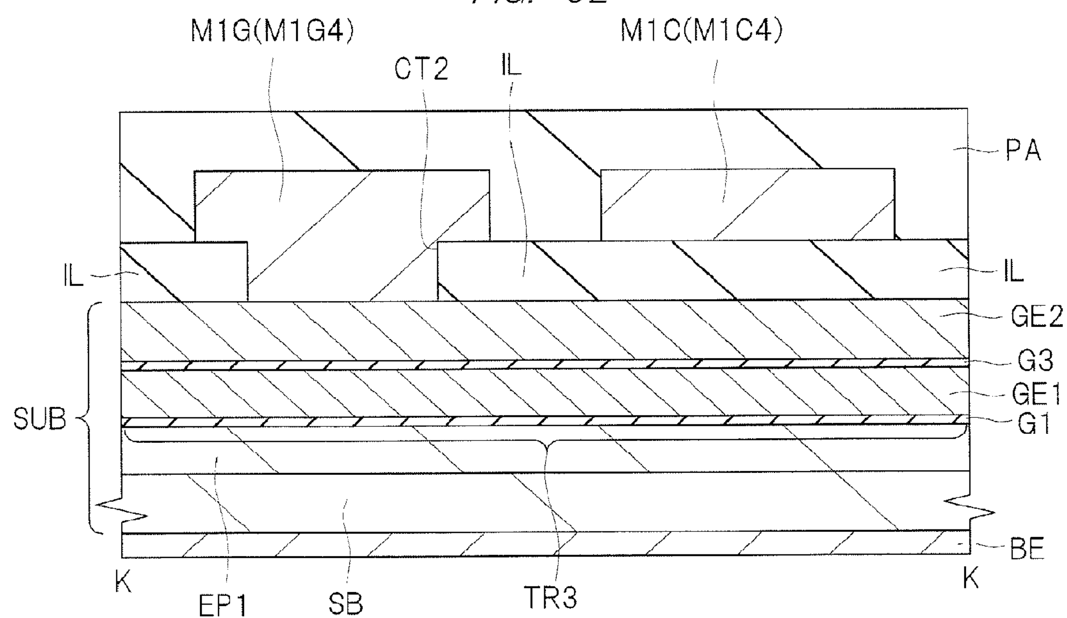
FIG. 62 is a cross-sectional view of a principal part of the semiconductor device of the fourth modified example.

In the semiconductor device CP4 illustrated in FIGS. 53 to 62, as the plurality of trenches TR2*c* extending in the Y direction and being arranged so as to be next to each other in the X direction, the trench TR2*c* including both of the multilayer region TR3 and the single-layer region TR4 and the trench TR2*c* including only the multilayer region TR3 without including the single-layer region TR4 are mixed. In FIG. 56, note that the trench TR2 (TR2*c*) in a region surrounded by a dotted line attached with a reference symbol TR4 is the single-layer region TR4, and the trench TR2 (TR2*c*) in other region except for the region is the multilayer region TR3. Therefore, the trench TR2 (TR2*c*) illustrated in the cross-sectional view of FIG. 61 includes both of the multilayer region TR3 and the single-layer region TR4 while the trench TR2 (TR2*c*) illustrated in the cross-sectional view of FIG. 62 is formed of only the multilayer region TR3 without including the single-layer region TR4. Note that, in the case illustrated in FIG. 5G, a case where the trenches TR2*c* (the trench TR2*c* illustrated in FIG. 61) including both of the multilayer region TR3 and the single-layer region TR4 and the trenches TR2*c* (the trench TR2*c* illustrated in FIG. 62) formed of only the multilayer region TR3 without including the single-layer region TR4 are arranged regularly, and this case is illustrated as a case that four of each are alternately arranged. However, this number is not limited to four, and can be modified variously.

As described above, as the plurality of trenches TR2*c* extending in the Y direction and being arranged so as to be next to each other in the X direction, the trench TR2*c* including both of the multilayer region TR3 and the single-layer region TR4 as similar to the trench TR2*c* illustrated in FIG. 61 and the trench TR2*c* formed of only the multilayer region TR3 without including the single-layer region TR4 as similar to the trench TR2*c* illustrated in FIG. 62 are mixed. And, a contact hole CT3 is formed in a region of each of the trenches TR2*c* each including both of the multilayer region TR3 and the single-layer region TR4 of the plurality of TR2*c* extending in the X direction as similar to the trench TR2*c* illustrated in FIG. 61, the region where the trench TR2*c* overlaps with the wiring portion M1C4 for a control electrode when seen in a plan view. The contact hole CT3 is formed on the trench TR2*c* of the single-layer region TR4. In this manner, in the trench TR2*c* including both of the multilayer region TR3 and the single-layer region TR4 as similar to the trench TR2*c* illustrated in FIG. 61, the wiring portion M1C4 for a control electrode can be connected to the control electrode GE1 through the contact hole CT3, and the wiring portion M1C4 for a control electrode can be electrically connected to the control electrode GE1 inside the trench TR1 of the transistor formation region RG1*a*, RG1*b* through the control electrode GE1 inside the trench TR2*c*. Further, in each of the plurality of trenches TR2*c* arranged so as to be next to each other in the X direction, a contact hole CT2 for a gate is formed in a region where the trench TR2*c* overlaps with the wiring portion M1G4 for a gate. The contact hole CT2 for a gate is formed on the trench TR2*c* of the multilayer region TR3. In this manner, the wiring portion M1G4 for a gate can be connected to the gate electrode GE2 inside the trench TR2*c* through the contact hole CT2 for a gate, and the wiring portion M1G4 for a gate can be electrically connected to the gate electrode GE2 inside the trench TR1 of the transistor formation region RG1*a*, RG1*b* through the gate electrode GE2 inside the trench TR2*c*.

Further, the gate electrode GE2 inside the trench TR2*c* is connected to both of the gate electrode GE2 inside the trench TR1 of the transistor formation region RG1*a* and the gate electrode GE2 inside the trench TR1 of the transistor formation region RG1*b*. Therefore, in the trench TR2*c* formed of only the multilayer region TR3 without including the single-layer region TR4 as similar to the trench TR2*c* illustrated in FIG. 62, the wiring portion M1G4 for a gate is connected to the gate electrode GE2 inside the trench TR2*c* through the contact hole CT2 for a gate. In this manner, the wiring portion M1G4 for a gate can be electrically connected to both of the gate electrode GE2 inside the trench TR1 of the transistor formation region RG1*a* and the gate electrode GE2 inside the trench TR1 of the transistor formation region RG1*b* through the gate electrode GE2 inside the trench TR2*c* formed of only the multilayer region TR3 as similar to the trench TR2*c* illustrated in FIG. 62.

Since the other configuration of the semiconductor device CP4 illustrated in FIGS. 53 to 62 is basically the same as that of the semiconductor device CP3 illustrated in the above-described FIGS. 49 to 52, explanation thereof is omitted here.

In the case of the semiconductor device CP4 illustrated in FIGS. 53 to 62, the following effect can be further obtained in addition to the effect obtained by the semiconductor device CP illustrated in the above FIGS. 1 to 13.

That is, in the semiconductor device CP4 illustrated in FIGS. 53 to 62, the wiring M1G for a gate further includes the wiring portion M1G4 for a gate, so that the gate resistance can be decreased. Therefore, from a viewpoint of the decrease in the gate resistance as much as possible, the semiconductor device CP4 is further advantageous. Further, the wiring M1C for a control electrode further includes the wiring portion M1C4 for a control electrode, so that a resistance of a path PDC from the pad for a control electrode to the control electrode GE1 inside the trench TR1 of the transistor formation region RG1*a*, RG1*b* can be decreased. Therefore, the performance of the semiconductor device can be improved.

Further, in order to improve the performance of the semiconductor device having a power transistor, it is desired to make the gate resistance as small as possible. On the other hand, it is desired to adjust an input resistance to the control electrode GE1 to be an optimal resistance value. Here, the input resistance to the control electrode GE1 corresponds to a resistance of the path from a control circuit (for example, a control circuit DR3 described later) for controlling a potential of the control electrode GE1 to the control electrode GE1 inside the trench TR1 of the transistor formation region RG1.

For example, in the unit transistor cell Q1 illustrated in the above-described FIG. 13, since a parasitic capacitance (a capacitance element) including the insulating film G1 as a capacitance insulating film between the control electrode GE1 and the semiconductor region for a drain ($n^-$-type epitaxial layer EP1) is formed, a Snubber circuit is configured by the parasitic capacitance and the input resistance to the control electrode GE1. A power transistor is configured by connecting a plurality of the unit transistor cells Q1 illustrated in the above-described FIG. 13 in parallel to each other. When the power transistor is used as a switching element or others, the switching characteristics can be improved by optimizing the Snubber circuit.

In the present embodiment, since the input resistance to the control electrode GE1 can be adjusted depending on whether there is the wiring portion M1C4 for a control electrode in the wiring M1C for a control electrode or not, the Snubber circuit can be optimized. In this manner, the performance of the semiconductor device can be improved.

Regarding Fifth Modified Example

Figure 63:
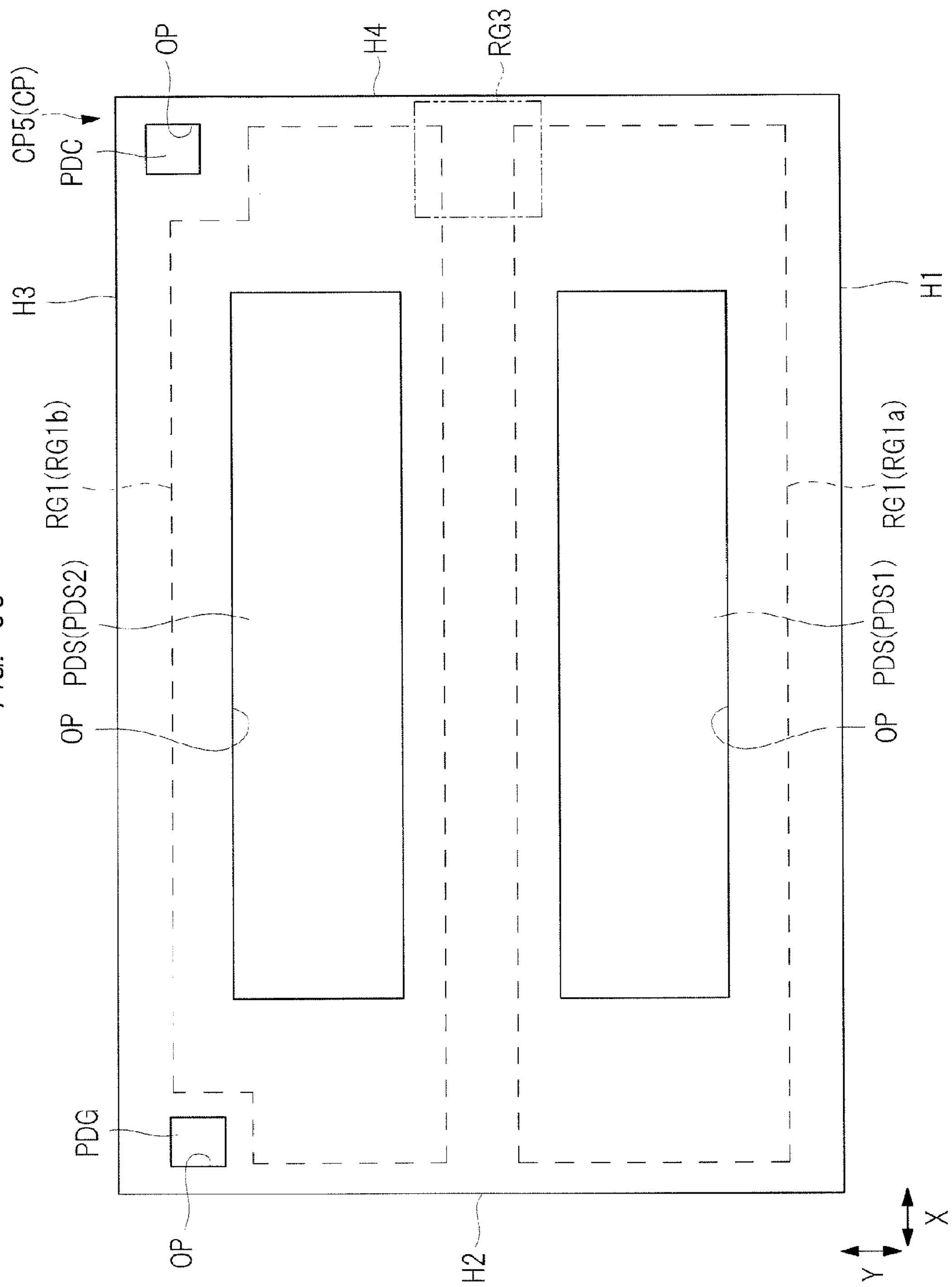
FIG. 63 is an overall plan view of a semiconductor device of a fifth modified example.
Figure 64:
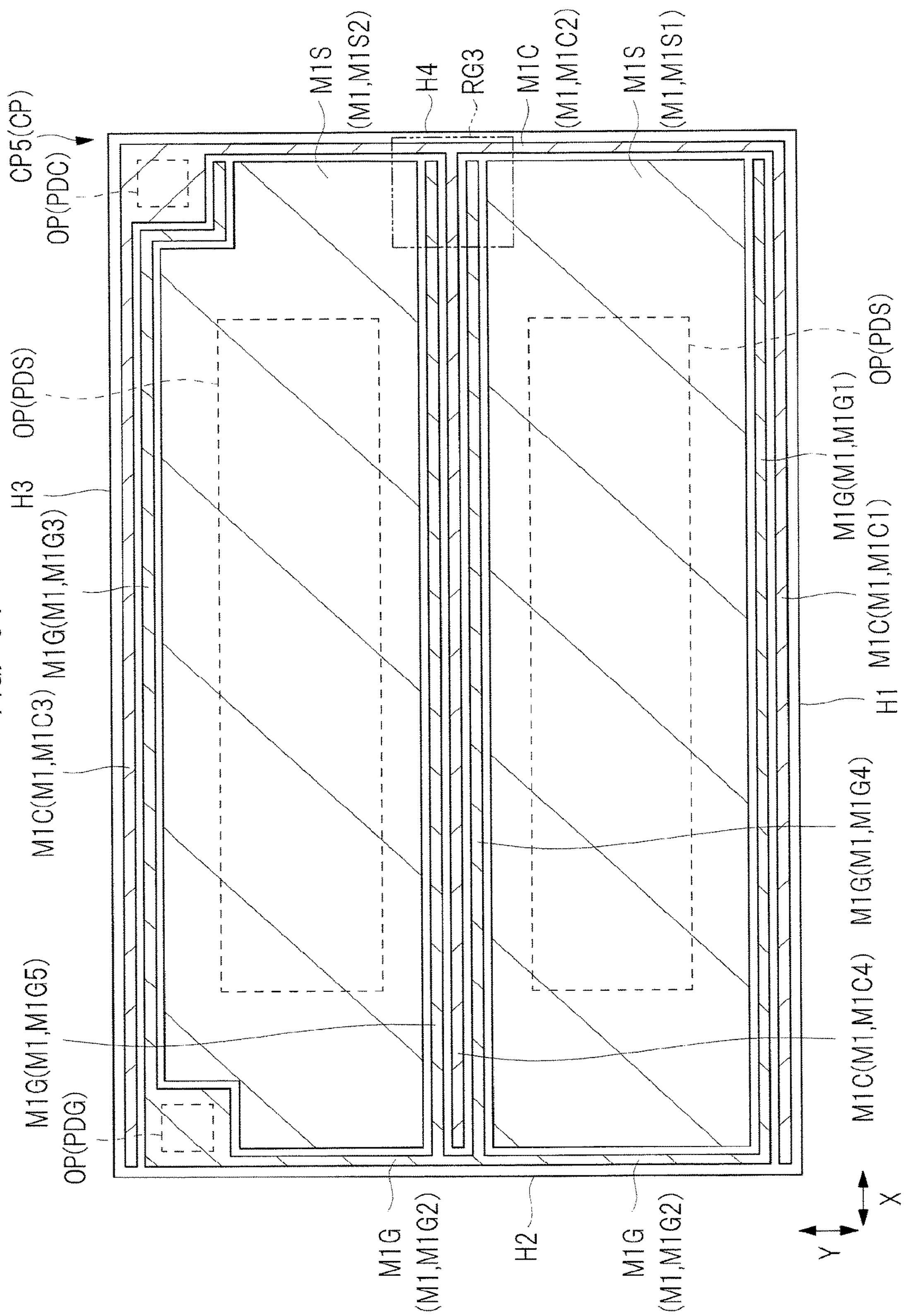
FIG. 64 is an overall plan view of the semiconductor device of the fifth modified example.
Figure 65:
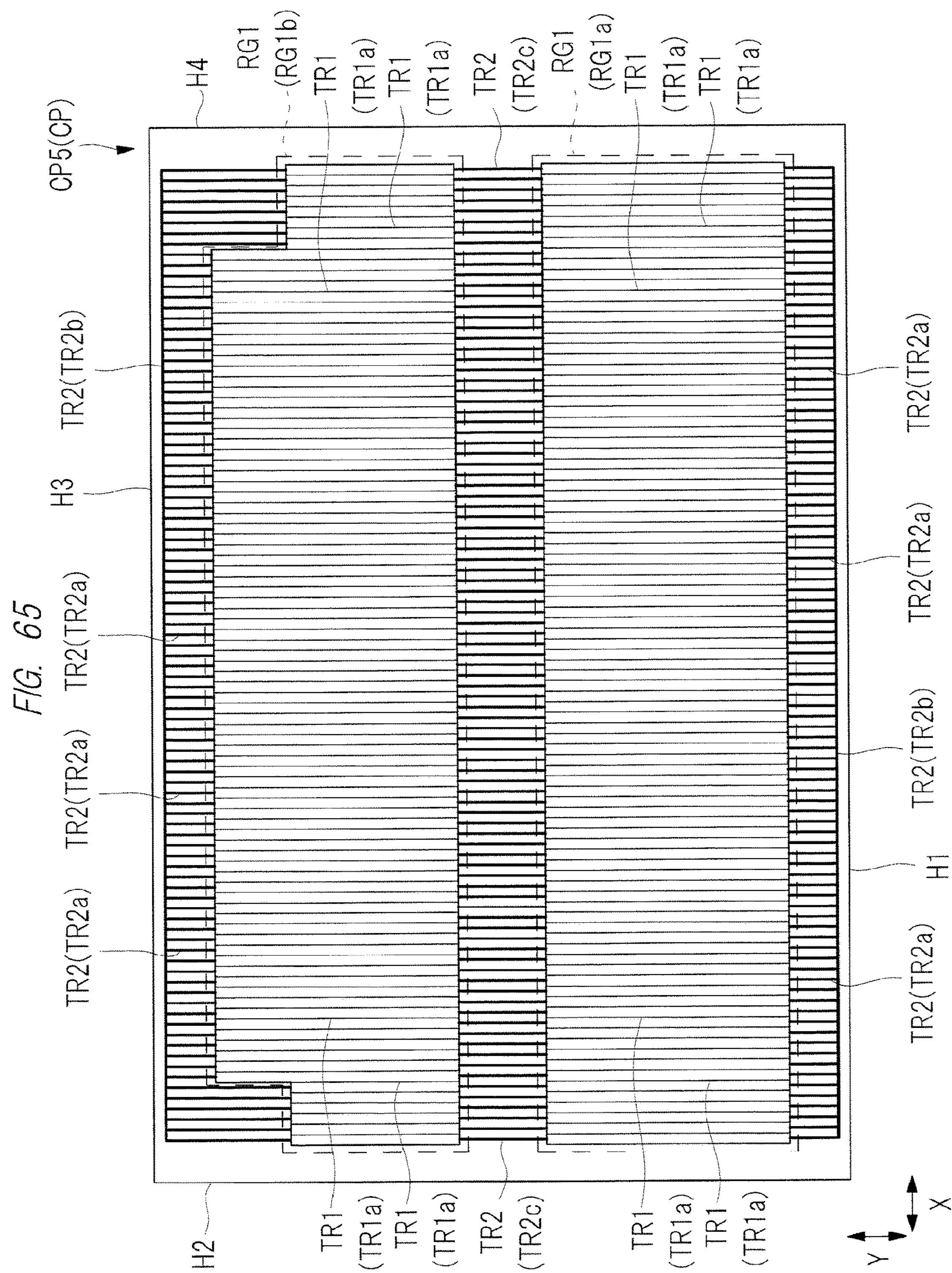
FIG. 65 is an overall plan view of the semiconductor device of the fifth modified example.

Next, a fifth modified example will be described. Each of FIGS. 63 to 72 is a plan view or a cross-sectional view illustrating a fifth modified example of the semiconductor device CP of the present embodiment. The semiconductor device CP of the fifth modified example illustrated in FIGS. 63 to 72 is called "semiconductor device CP5". FIG. 63 of FIGS. 63 to 72 is an overall plan view corresponding to the above-described FIG. 1, FIG. 64 thereof is an overall plan view corresponding to the above-described FIG. 2, FIG. 65 thereof is an overall plan view corresponding to the above-described FIG. 3, FIG. 66 thereof is a plan view of a principal part corresponding to the above-described FIG. 4, FIG. 67 thereof is a plan view of a principal part corresponding to the above-described FIG. 5, and FIG. 68 thereof is a plan view of a principal part corresponding to the above-described FIG. 6. Note that enlarged views of a region RG3 surrounded by two-dot chain lines illustrated in FIGS. 63 to 64 correspond to FIGS. 66 to 68. Further, FIG. 69 almost corresponds to the cross-sectional views taken along a line L-L in FIGS. 66 and 67, FIG. 70 almost corresponds to cross-sectional views taken along a line M-M in FIGS. 66 and 67, FIG. 71 almost corresponds to cross-sectional views taken along a line N-N in FIGS. 66 and 67, and FIG. 72 almost corresponds to cross-sectional views taken along a line P-P in FIGS. 66 and 67.

The semiconductor device CP5 illustrated in FIGS. 63 to 72 corresponds to a case of addition of a wiring portion M1G4 for a gate of the wiring M1G for a gate to the semiconductor device CP4 illustrated in the above-described FIGS. 53 to 62.

That is, in the semiconductor device CP5 illustrated in FIGS. 63 to 72, the wiring M1G for a gate includes not only the wiring portion M1G1 for a gate extending along the side H1, the wiring portion M1G2 for a gate extending along the side H2, and the wiring portion M1G3 for a gate extending along the side H3 but also a wiring portion M1G4 for the gate and a wiring portion M1G5 for a gate. In a point that the wiring M1C for a control electrode includes not only the wiring portions M1C1, M1C2, and M1C3 for a control electrode but also the wiring portion M1C4 for a control electrode, the semiconductor device CP5 illustrated in FIGS. 63 to 72 is also the same as the semiconductor device CP4 illustrated in the above-described FIGS. 53 to 62.

The semiconductor device CP5 illustrated in FIGS. 63 to 72 includes the following configuration in accordance with the inclusion of the wiring portions M1G4 and M1G5 for a gate in the wiring M1G for a gate and the inclusion of the wiring portion M1C4 for a control electrode in the wiring M1C for a control electrode.

In the semiconductor device CP5 illustrated in FIGS. 63 to 72, the transistor formation region RG1 is divided into a plurality of regions so as to be separated from each other in the Y direction, and the transistor formation region RG1 is here divided into a transistor formation region RG1*a* and a transistor formation region RG1*b* so that the transistor formation region RG1*a* and the transistor formation region RG1*b* are separated from each other in the Y direction. This point is the same as that of the above-described semiconductor device CP4.

It is required to separate the wiring M1S for a source from the wiring M1G for a gate and the wiring M1C for a control electrode. Therefore, in the semiconductor device CP5 illustrated in FIGS. 63 to 72, the wiring M1S for a source is divided into two wirings M1S1 and M1S2 for a source so that the two wirings sandwich the wiring portions M1G4 and M1G5 for a gate and the wiring portion M1C4 for a control electrode therebetween, and the wiring NISI for a source and the wiring M1S2 for a source are separated from each other in the Y direction. The wiring M1S1 for a source is formed on the transistor formation region RG1*a* while the wiring M1S2 for a source is formed on the transistor formation region RG1*b*, and the wiring M1S1 for a source is almost coincident with the transistor formation region RG1*a* when seen in a plan view while the wiring M1S2 for a source is almost coincident with the transistor formation region RG1*b* when seen in a plan view. This point is the same as that of the above-described semiconductor device CP4.

In the semiconductor device CP5 illustrated in FIGS. 63 to 72, each of the wiring portion M1G4 for a gate, the wiring portion M1C4 for a control electrode, and the wiring portion M1G5 for a gate extends in the X direction between the transistor formation region RG1*a* and the transistor formation region RG1*b* (therefore, between the wiring M1S1 for a source and the wiring M1S2 for a source) when seen in a plan view. The wiring portion M1C4 for a control electrode extending in the X direction is sandwiched in the Y direction by the wiring portion M1G4 for a gate extending in the X direction and the wiring portion M1G5 for a gate in the X direction between the transistor formation region RG1*a* and the transistor formation region RG1*b* (therefore, between the wiring M1S1 for a source and the wiring M1S2 for a source) when seen in a plan view. That is, the wiring portion M1C4 for a control electrode and the wiring portions M1G4 and M1G5 for a gate sandwiching the wiring portion M1C4 for a control electrode therebetween extend in the X direction in a region between the transistor formation region RG1*a* and the transistor formation region RG1*b* (therefore, a region between the wiring M1S1 for a source and the wiring M1S2 for a source) when seen in a plan view. That is, the wiring portion M1G4 for a gate extending in the X direction and the wiring portion M1G5 for a gate extending in the X direction are arranged so as to be separated from each other in the Y direction in the region between the transistor formation region RG1*a* and the transistor formation region RG1*b* (therefore, between the wiring M1S1 for a source and the wiring M1S2 for a source) when seen in a plan view. And, the wiring portion M1C4 for a control electrode extending in the X direction is arranged between the wiring portion M1G4 for a gate extending in the X direction and the wiring portion M1G5 for a gate extending in the X direction.

One end portion of the wiring portion M1G4 for a gate (an end portion thereof closer to the side H2) is integrally coupled to the wiring portion M1G2 for a gate, and one end portion of the wiring portion M105 for a gate (an end portion thereof closer to the side H2) is integrally coupled to the wiring portion M1G2 for a gate. Therefore, the wiring portion M1G1 for a gate, the wiring portion M1G2 for a gate, the wiring portion M1G3 for a gate, the wiring portion M1G4 for a gate, and the wiring portion M1G5 for a gate are integrally formed so as to be coupled to each other. Further, one end portion of the wiring portion M1C4 for control electrode (an end portion closer to the side H4) is integrally coupled to the wiring portion M1C2 for a control electrode. Therefore, the wiring portion M1C1 for a control electrode, the wiring portion M1C2 for a control electrode, the wiring portion M1C3 for a control electrode, and the wiring portion M1C4 for a control electrode are integrally formed so as to be coupled to each other. Each of the wiring M1S1 for a source and the wiring M1S2 for a source is surrounded by the wiring M1G for a gate and the wiring M1C for a control electrode when seen in a plan view.

In the insulating film PA, an opening OP is provided in each of the wirings M1S1 and M1S2 for a source. A pad PDS1 for a source is formed by the wiring M1S1 for a source exposed from the opening OP provided in the wiring M1S1 for a source, and a pad PDS2 for a source is formed by the wiring M1S2 for a source exposed from the opening OP provided in the wiring M1S2 for a source. This point is the same as that of the above-described semiconductor device CP3.

A plurality of trenches TR2 (TR2*c*) extending in the Y direction are arranged so as to be next to each other in the X direction in the region between the transistor formation region RG1*a* and the transistor formation region RG1*b*. This point is the same as that of the above-described semiconductor device CP4. The trench TR2*c* is connected to the trench TR1 formed in the transistor formation region RG1*a* and to the trench TR1 formed in the transistor formation region RG1*b*.

Therefore, in the semiconductor device CP5 illustrated in FIGS. 63 to 72, the plurality of trenches TR2 (TR2*c*) extending in the Y direction so as to cross the wiring portions M1G4 and M1G5 for a gate and the wiring portion M1C4 for a control electrode are arranged so as to be next to each other in the X direction below the wiring portions M1G4 and M1G5 for a gate and the wiring portion M1C4 for a control electrode extending in the X direction.

Figure 66:
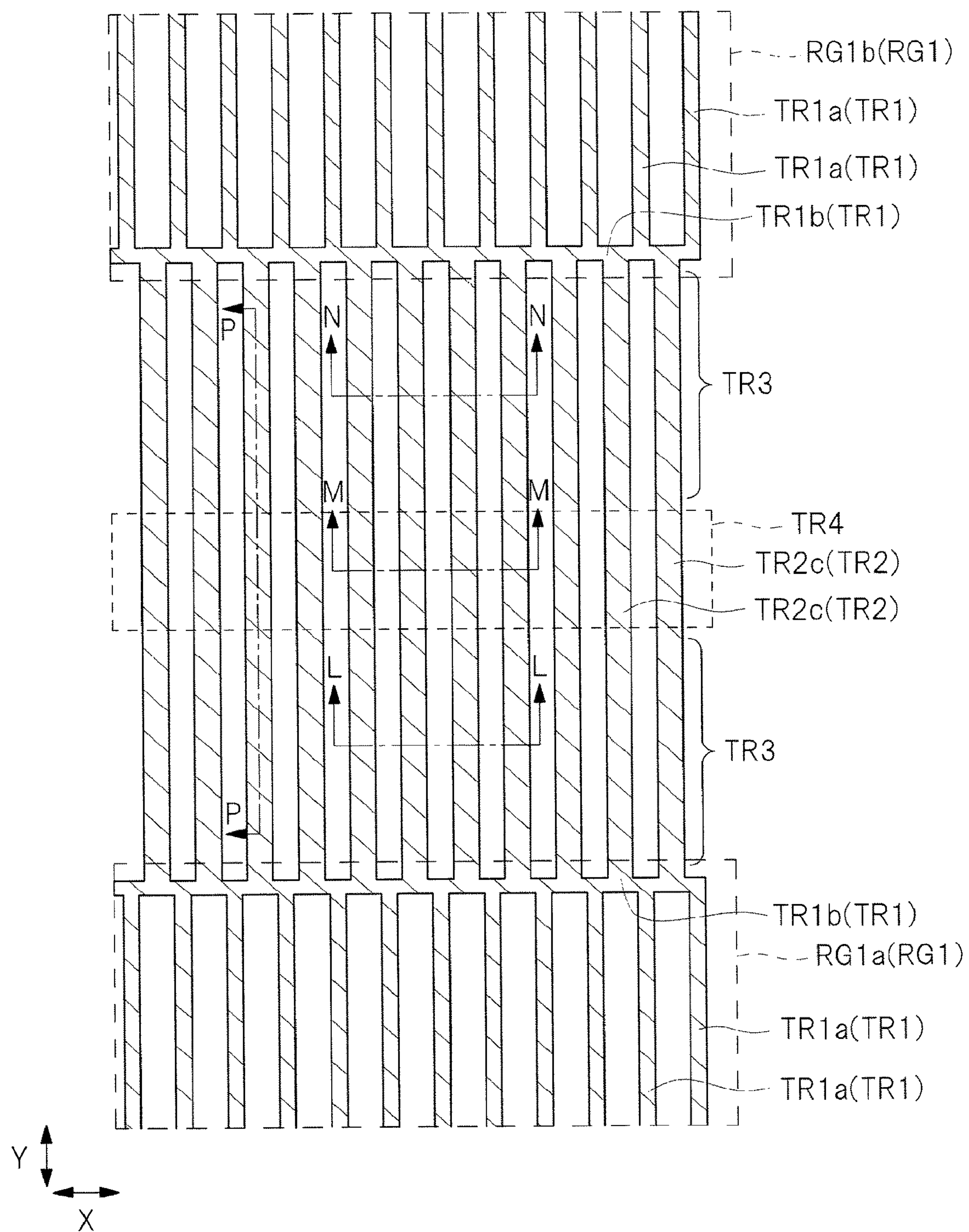
FIG. 66 is a plan view of a principal part of the semiconductor device of the fifth modified example.
Figure 67:
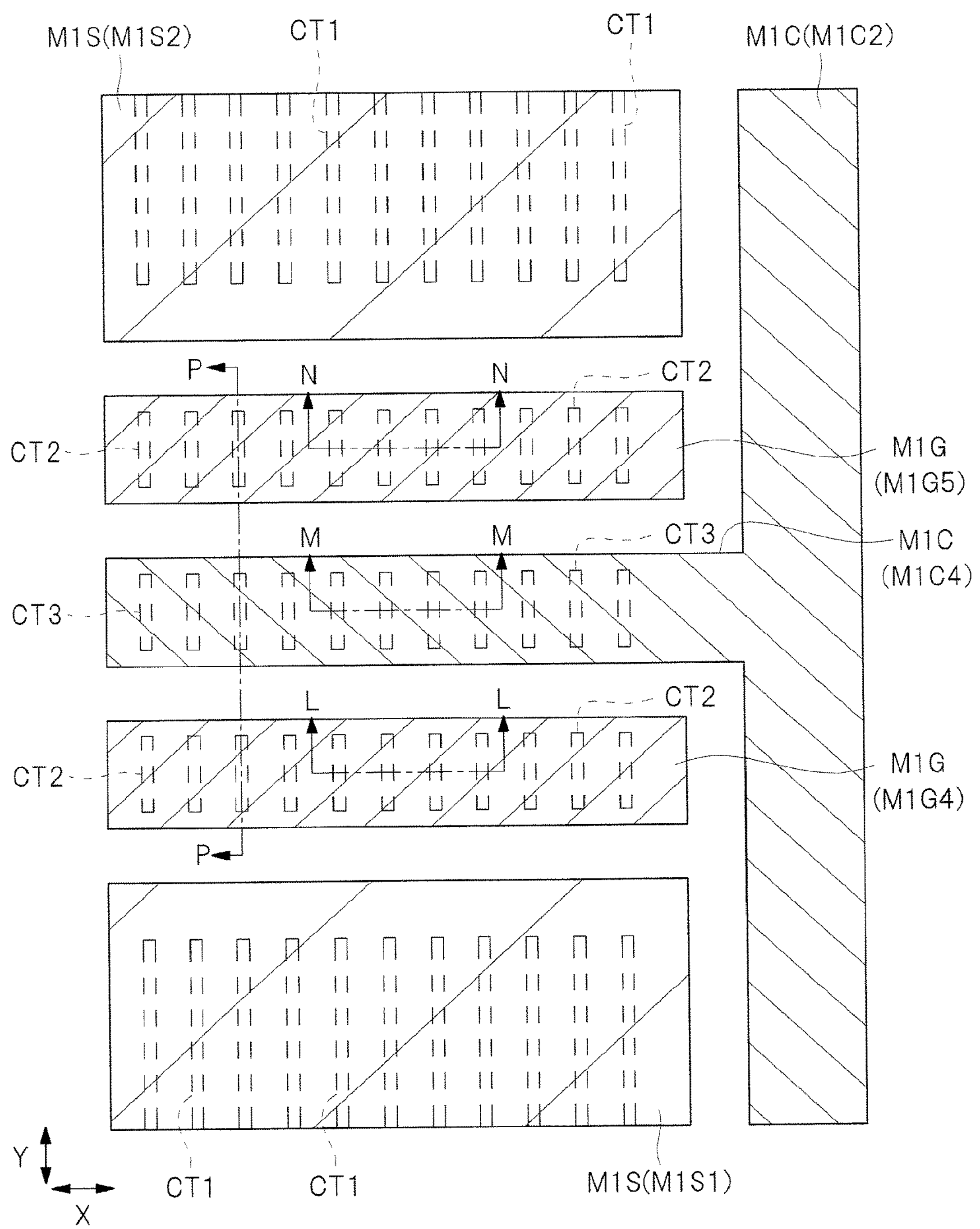
FIG. 67 is a plan view of a principal part of the semiconductor device of the fifth modified example.
Figure 68:
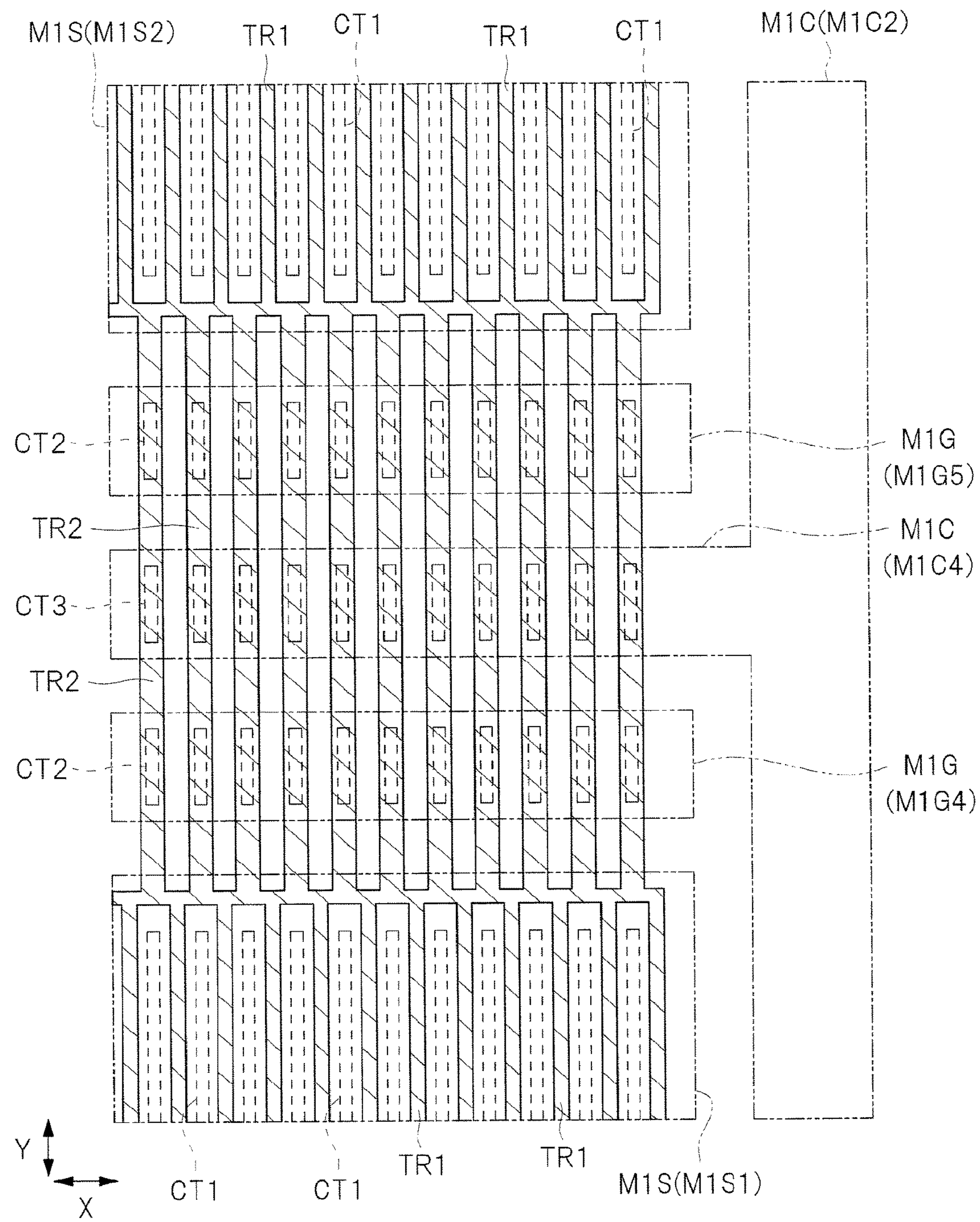
FIG. 68 is a plan view of a principal part of the semiconductor device of the fifth modified example.
Figure 69:
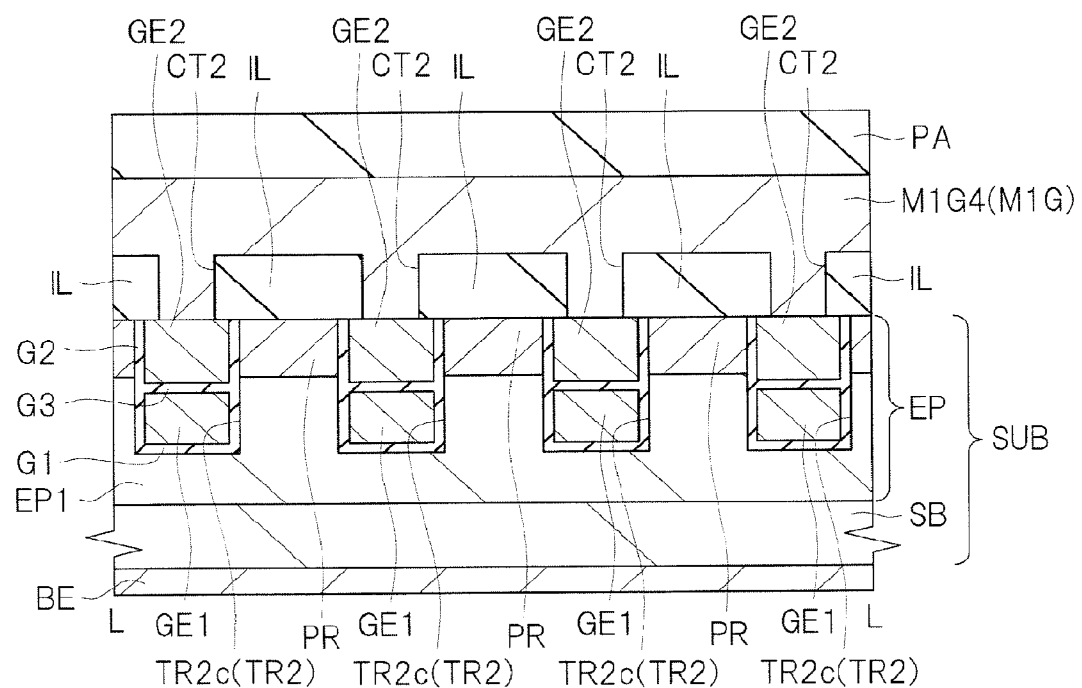
FIG. 69 is a cross-sectional view of a principal part of the semiconductor device of the fifth modified example.
Figure 70:
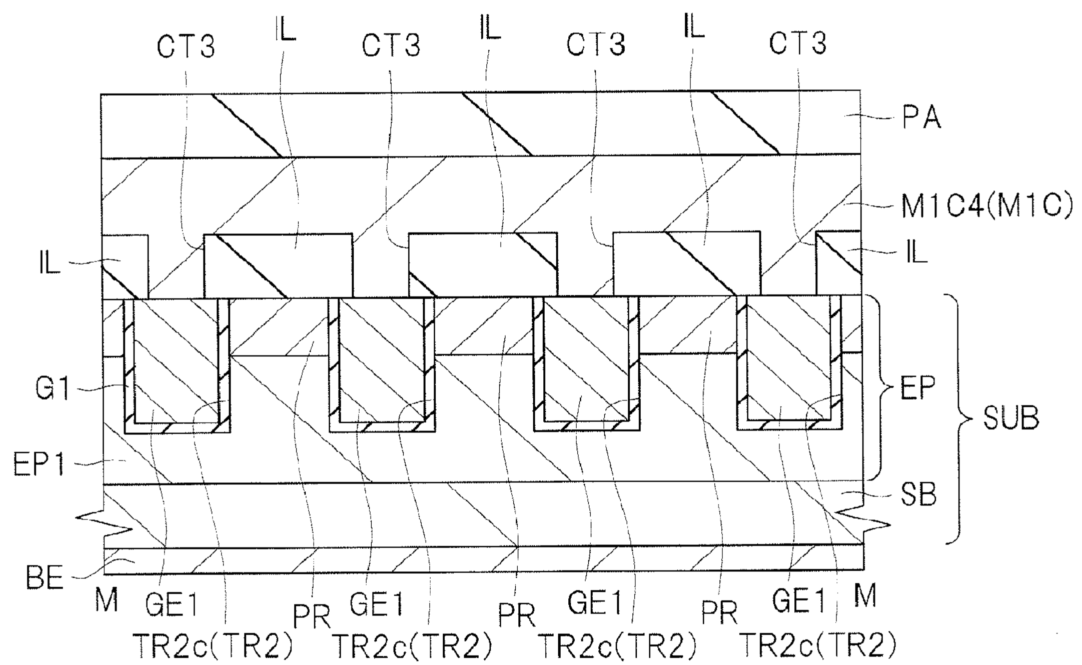
FIG. 70 is a cross-sectional view of a principal part of the semiconductor device of the fifth modified example.
Figure 71:
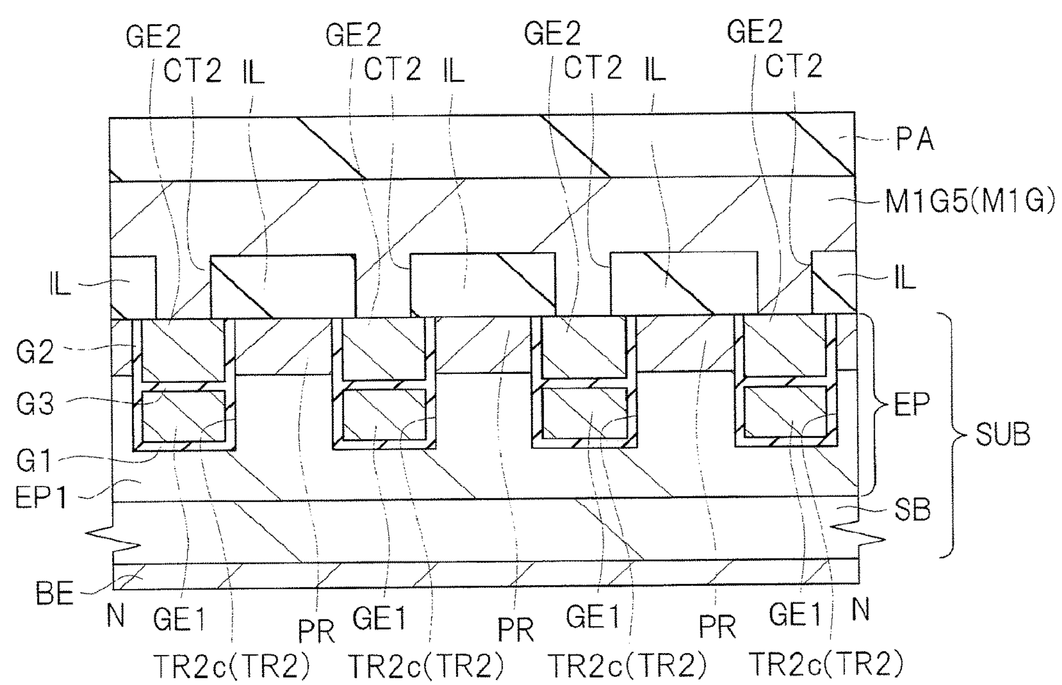
FIG. 71 is a cross-sectional view of a principal part of the semiconductor device of the fifth modified example.
Figure 72:
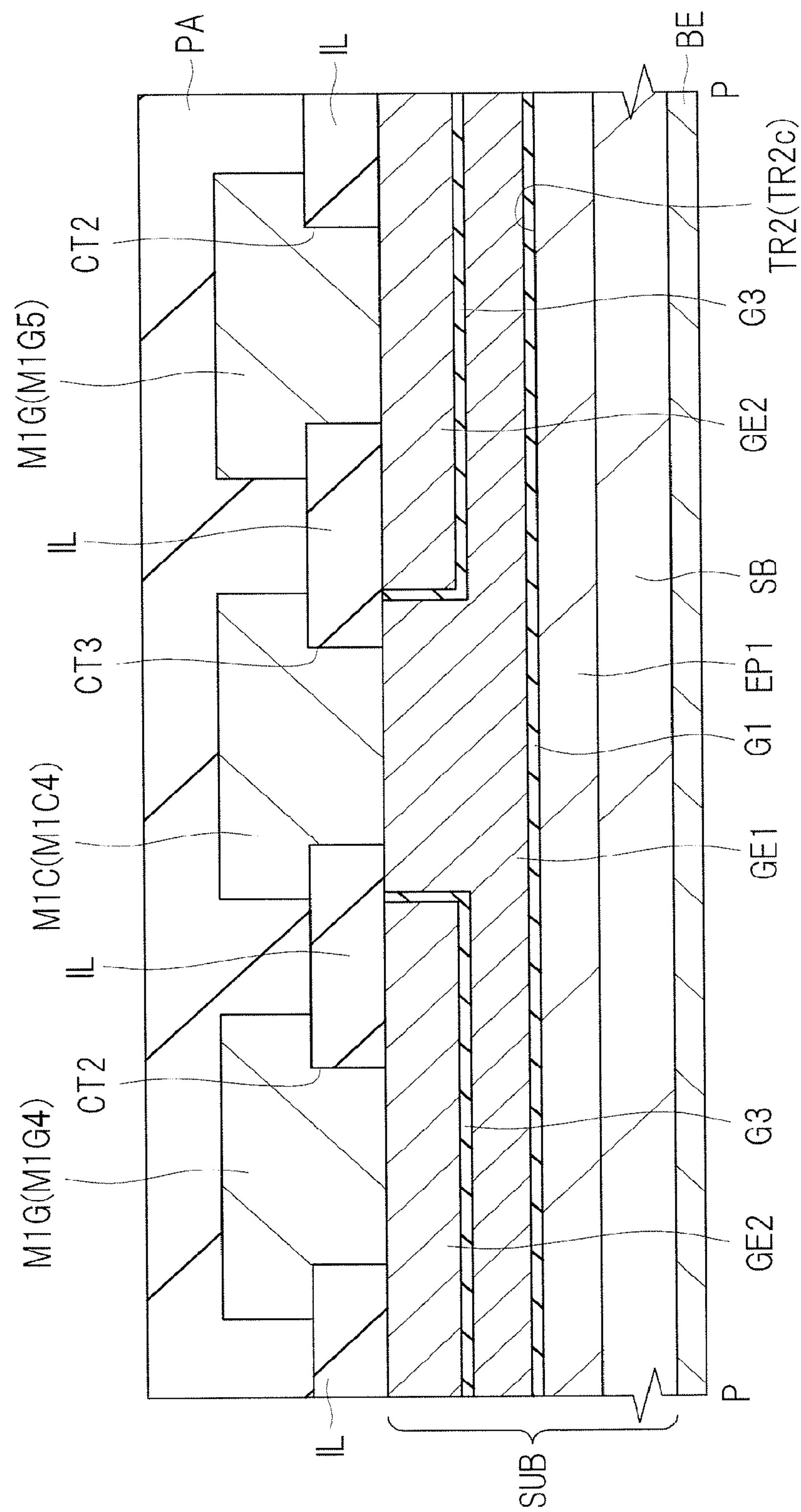
FIG. 72 is a cross-sectional view of a principal part of the semiconductor device of the fifth modified example.

In the semiconductor device CP5 illustrated in FIGS. 63 to 72, each of the plurality of trenches TR2*c* extending in the Y direction and being arranged so as to be next to each other in the X direction includes both of the multilayer region TR3 and the single-layer region TR4. In FIG. 66, note that the trench TR2 (TR2*c*) in a region surrounded by a dotted line attached with a reference symbol TR4 is the single-layer region TR4, and the trench TR2 (TR2*c*) in a region except for the region is the multilayer region TR3.

In each of the plurality of trenches TR2*c* arranged so as to be next to each other in the X direction in the semiconductor device CP5 illustrated in FIGS. 63 to 72, a region immediately below the wiring portion M1C4 for a control electrode (that is, a region overlapped with the wiring portion M1C4 for a control electrode when seen in a plan view) is the single-layer region TR4, and a region immediately below the wiring portion M1G 4, M1G5 for a gate (that is, a region overlapped with the wiring portion M1G4, M1G5 for a gate when seen in a plan view) is the multilayer region TR3. And, a contact hole CT3 is formed in a region where the wiring portion M1C4 for a control electrode overlaps with the trench TR2 (TR2*c*) extending in the Y direction when seen in a plan view, and a contact hole CT2 for a gate is formed in a region where the wiring portion M1G4 for a gate overlaps with the trench TR2 (TR2*c*) extending in the Y direction when seen in a plan view and in a region where the wiring portion M1G5 for a gate overlaps with the trench TR2 (TR2*c*) extending in the Y direction when seen in a plan view. That is, in each of the plurality of trenches TR2*c* arranged so as to be next to each other in the X direction, the contact hole CT3 is provided in a region where the trench TR2*c* overlaps with the wiring portion M1C4 for a control electrode when seen in a plan view, and the contact hole CT2 for a gate is provided in the region where the trench TR2*c* overlaps with the wiring portion M1G4 for a gate when seen in a plan view and in the region where the trench TR2*c* overlaps with the wiring portion M1G5 for a gate when seen in a plan view.

In this manner, in each of the plurality of trenches TR2*c* arranged so as to be next to each other in the X direction, the wiring portion M1C4 for a contact electrode can be connected to the control electrode GE1 through the contact hole CT3, so that the wiring portion M1C4 for a control electrode can be electrically connected to the control electrode GE1 inside the trench TR1 of the transistor formation region RG1*a*, RG1*b* through the control electrode GE1 inside the trench TR2*c*. Further, in each of the plurality of trenches TR2*c* arranged so as to be next to each other in the X direction, the wiring portion M1G4 for a gate can be connected to the gate electrode GE2 inside the trench TR2*c* through the contact hole CT2 for a gate, so that the wiring portion M1G4 for a gate can be electrically connected to the gate electrode GE2 inside the trench TR1 of the transistor formation region RG1*a* through the gate electrode GF2 inside the trench TR2*c*. Further, in each of the plurality of trenches TR2*c* arranged so as to be next to each other in the X direction, the wiring portion M1G5 for a gate can be connected to the gate electrode GE2 inside the trench TR2*c* through the contact hole CT2 for a gate, so that the wiring portion M1G5 for a gate can be electrically connected to the gate electrode GE2 inside the trench TR1 of the transistor formation region RG1*b* through the gate electrode GE2 inside the trench TR2*c*.

Since the other configuration of the semiconductor device CP5 illustrated in FIGS. 63 to 72 is basically the same as that of the semiconductor device CP4 illustrated in the above-described FIGS. 53 to 62 and the semiconductor device CP3 illustrated in the above-described FIGS. 49 to 52, explanation thereof is omitted here.

In the case of the semiconductor device CP5 illustrated in FIGS. 63 to 72, the following effect can be further obtained in addition to the effect obtained by the semiconductor device CP illustrated in the above-described FIGS. 1 to 13.

That is, in the semiconductor device CP5 illustrated in FIGS. 63 to 72, the wiring M1G for a gate further includes the wiring portions M1G4 and M1G5 for a gate, so that the gate resistance can be decreased. Therefore, from a viewpoint of the decrease in the gate resistance as much as possible, the semiconductor device CP5 is further advantageous. Further, the wiring M1C for a control electrode further includes the wiring portion M1C4 for a control electrode, so that a resistance of a path from the pad PDC for a control electrode to the control electrode GE1 inside the trench TR1 of the transistor formation region RG1*a*, RG1*b* can be decreased. Therefore, the performance of the semiconductor device can be improved.

Further, in the case of the semiconductor device CP4 illustrated in the above-described FIGS. 53 to 62, a function of the trench TR2C as the conduction path is as follows. That is, while the trench TR2*c* formed of only the multilayer region TR3 as similar to the trench TR2*c* illustrated in the above-described FIG. 62 can function as a conduction path between the wiring portion M1G4 for a gate and the gate electrode GE2 inside the trench TR1 of the transistor formation region RG1*a*, RG1*b*, the trench TR2*c* cannot function as a conduction path between the wiring portion M1C4 for a control electrode and the gate electrode GE1 inside the trench TR1 of the transistor formation region RG1*a*, RG1*b*. Further, the trench TR2*c* including both of the multilayer region TR3 and the single-layer region TR4 as similar to the trench TR2*c* illustrated in the above-described FIG. 61 can function as a conduction path between the wiring portion M1C for a control electrode and the control electrode GE1 inside the trench TR1 of the transistor formation region RG1*a*, RG1*b*, and can function as a conduction path between the wiring portion M1G4 for a gate and the gate electrode GE2 inside the trench TR1 of the transistor formation region RG1*a*. However, the trench TR2*c* illustrated in the above-described FIG. 61 cannot function as a conduction path between the wiring portion M1G4 for a gate and the gate electrode GE2 inside the trench TR1 of the transistor formation region RG1*b*.

On the other hand, in the case of the semiconductor device CP5 illustrated in FIGS. 63 to 72, a function of the trench TR2*c* as the conduction path is as follows. That is, each trench TR2*c* can function as a conduction path between the wiring portion M1C4 for a control electrode and the control electrode GE1 inside the trench TR1 of the transistor formation region RG1*a*, RG1*b*, a conduction path between the wiring portion M1G4 for a gate and the gate electrode GE2 inside the trench TR1 of the transistor formation region RG1*a*, and a conduction path between the wiring portion M1G5 for a gate and the gate electrode GE2 inside the trench TR1 of the transistor formation region RG1*b*.

Therefore, from a viewpoint of the decrease in the resistance between the wiring M1G for a gate and the gate electrode GE2 inside the trench TR1 of the transistor formation region RG1*a*, RG1*b* and a viewpoint of the decrease in the resistance between the wiring M1C for a control electrode and the control electrode GE1 inside the trench TR1 of the transistor formation region RG1*a*, RG1*b*, the semiconductor device CP5 illustrated in FIGS. 63 to 72 is more advantageous than the semiconductor device CP4 illustrated in FIGS. 53 to 62.

On the other hand, the semiconductor device CP4 illustrated in FIGS. 53 to 62 can be downsized (can be reduced in an area) as much as the wiring portion M1G5 for a gate. Further, since an effective area of the transistor formation region (RG1) can be made large, the ON resistance of the power transistor can be further reduced.

Further, in the third to fifth modified examples, the explanation has been made for the case of the division of the transistor formation region RG1 into two transistor formation regions RG1*a* and RG1*b* separated from each other in the Y direction (therefore, the case of the division of the wiring M1S for a source into two wiring M1S1 and M1S2 for a source separated from each other in the Y direction). As another aspect, in the third to fifth modified examples, the transistor formation region RG1 (therefore, the wiring M1S for a source) can be divided into three or more regions separated from one another in the Y direction. In this case, the number of divided transistor formation regions is the same as the number of divided wirings for a source. And, on each of the divided transistor formation regions, the wiring for a source having almost the same plane dimension as that of this transistor formation region is arranged. In this case, in the third modified example, one corresponding to the wiring M1G4 portion for a gate extends in the X direction between the divided transistor formation regions (therefore, between the divided wirings for a source). Further, in the fourth modified example, ones corresponding to the wiring portion M1G4 for a gate and the wiring portion M1C4 for a control electrode extend in the X direction between the divided transistor formation regions (therefore, between the divided wirings for a source). Further, in the fifth modified example, ones corresponding to the wiring portions M1G4 and M1G5 for a gate and the wiring portion M1C4 for a control electrode extend in the X direction between the divided transistor formation regions (therefore, between the divided wirings for a source).

Regarding Sixth Modified Example

Figure 73:
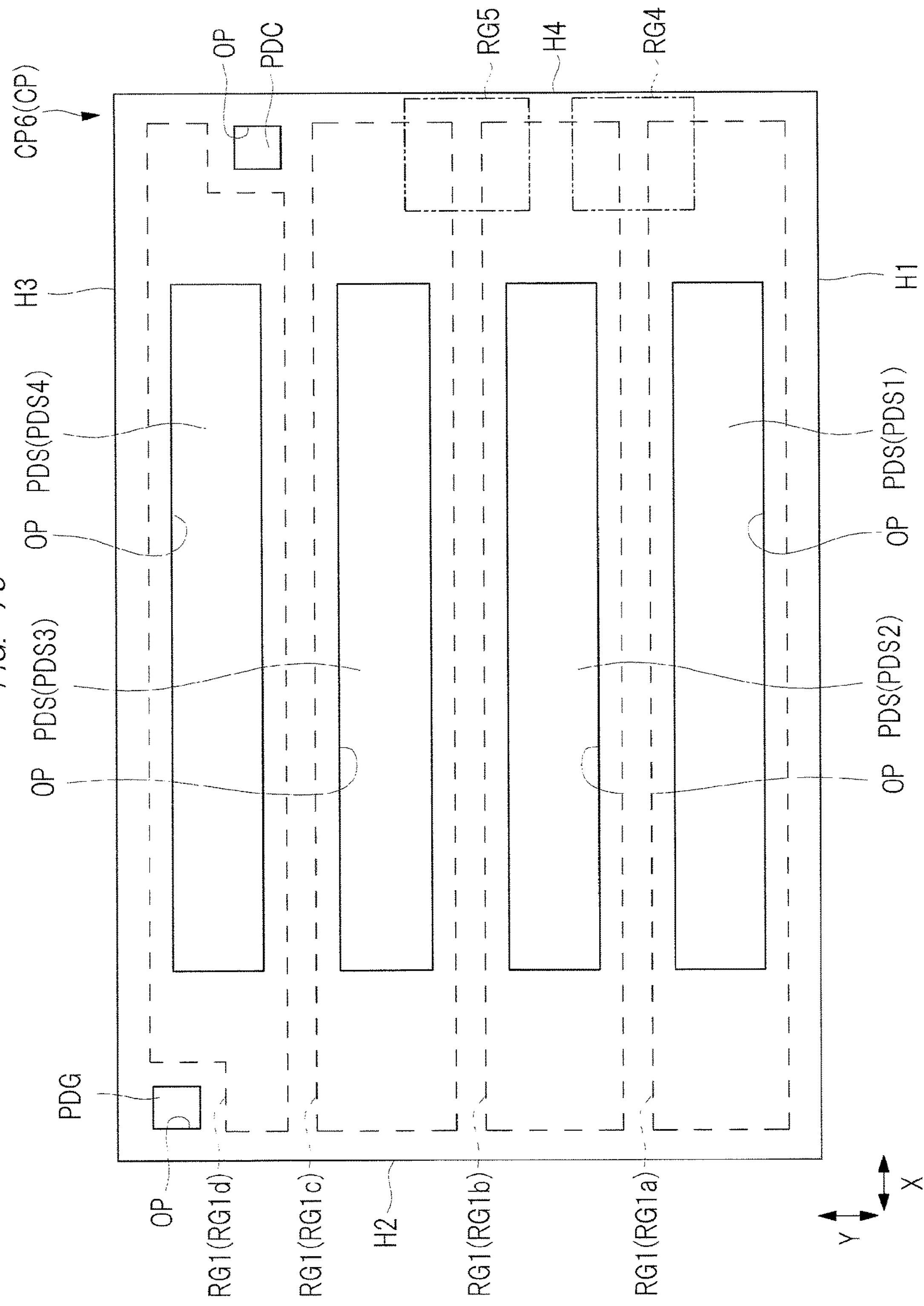
FIG. 73 is an overall plan view of a semiconductor device of a sixth modified example.
Figure 74:
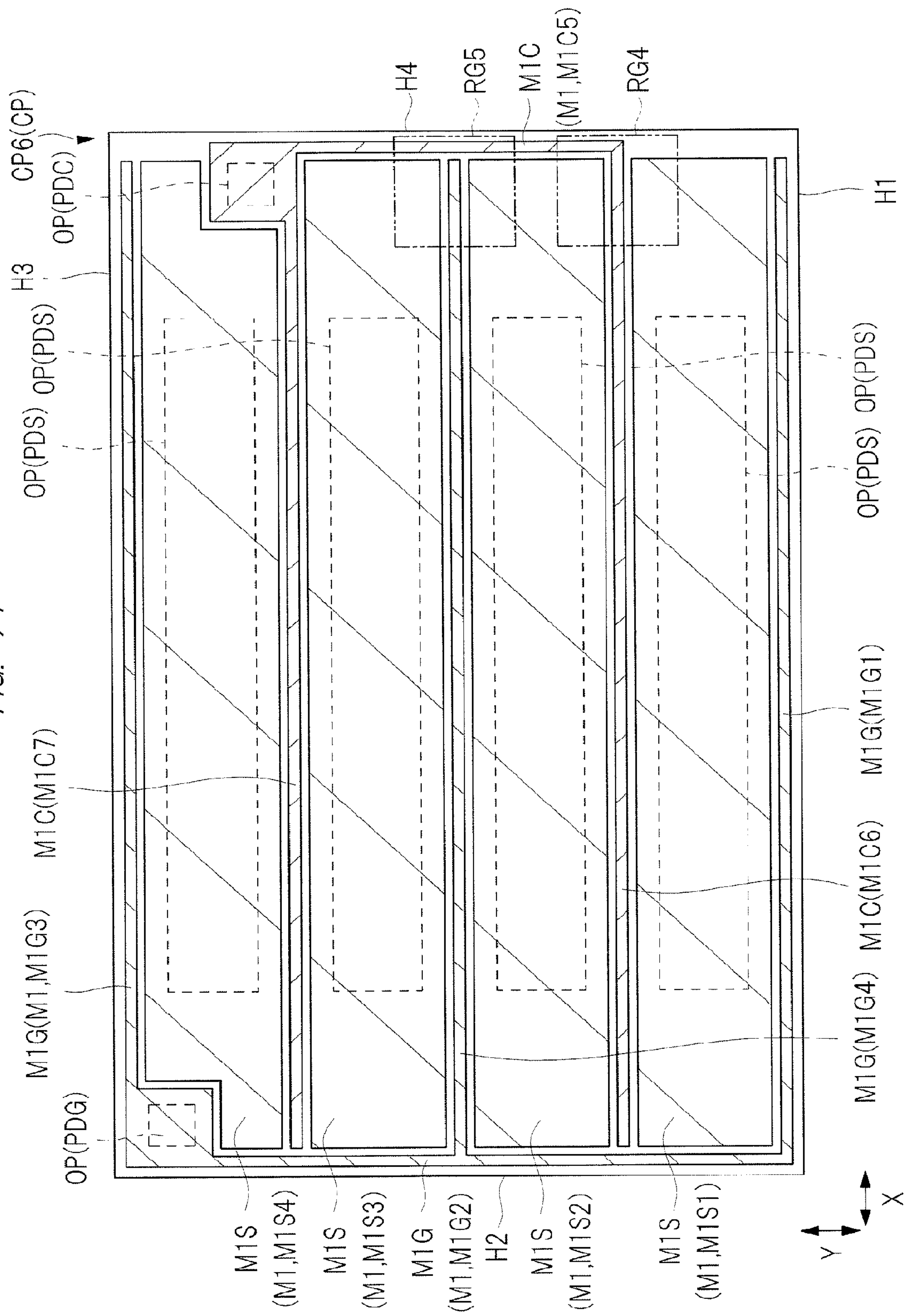
FIG. 74 is an overall plan view of the semiconductor device of the sixth modified example.

Next, a sixth modified example will be described. Each of FIGS. 73 to 80 is a plan view or a cross-sectional view illustrating the sixth modified example of the semiconductor device CP of the present embodiment. The semiconductor device CP of the sixth modified example illustrated in FIGS. 73 to 80 is called "semiconductor device CP6". FIG. 73 of FIGS. 73 to 80 is an overall plan view corresponding to the above-described FIG. 1, FIG. 74 thereof is an overall plan view corresponding to the above-described FIG. 2, FIGS. 75 and 77 thereof are plan views of the principal part corresponding to the above-described FIG. 4, and FIGS. 76 and 78 thereof are plan views of the principal part corresponding to the above-described FIG. 6. Note that enlarged views of a region RG4 surrounded by two-dot chain lines illustrated in FIGS. 73 and 74 correspond to FIGS. 75 and 76, and enlarged views of a region RG5 surrounded by two-dot chain lines illustrated in FIGS. 73 and 74 correspond to FIGS. 77 and 78. Further, FIG. 79 almost corresponds to a cross-sectional view taken along a line Q-Q in FIG. 75, and FIG. 80 almost corresponds to a cross-sectional view taken along a line R-R in FIG. 77.

In the semiconductor device CP6 illustrated in FIGS. 73 to 80, the transistor formation region RG1 is divided into a plurality of regions so as to be separated from each other in the Y direction, and it is here divided into four transistor formation regions RG1*a*, RG1*b*, RG1*c*, and RG1*d*. The transistor formation regions RG1*a*, RG1*b*, RG1*c*, and RG1*d* are arranged in this order in the Y direction from a portion closer to the side H1 toward a portion closer to the side H3. In accordance with this arrangement, the wiring M1S for a source is divided into four wirings M1S1, M1S2, M1S3, and M1S4 for a source so as to be separated from one another in the Y direction. The wiring M1S1 for a source is almost coincident with the transistor formation region RG1*a* when seen in a plan view, the wiring M1S2 for a source is almost coincident with the transistor formation region RG1*b* when seen in a plan view, the wiring M1S3 for a source is almost coincident with the transistor formation region RG1*c* when seen in a plan view, and the wiring M1S4 for a source is almost coincident with the transistor formation region RG1*d* when seen in a plan view.

The wiring M1G for a gate integrally includes the wiring portion M1G1 for a gate extending in the X direction along the side 111, the wiring portion M1G2 for a gate extending in the Y direction along the side H2, the wiring portion M1G3 for a gate extending in the X direction along the side H3, and the wiring portion M1G4 for a gate. The wiring M1G4 for a gate extends in the X direction between the transistor formation region RG1*b* and the transistor formation region RG1*c* (therefore, between the wiring M1S2 for a source and the wiring M1S3 for a source) when seen in a plan view. One end portion of the wiring portion M1G4 for a gate (an end portion thereof closer to the side H2) is integrally coupled to the wiring portion M1G2 for a gate.

The wiring M1C for a control electrode integrally includes the wiring portion M1C6 for a control electrode, the wiring portion M1C7 for a control electrode, and the wiring portion M1C5 for a control electrode extending in the Y direction along the side H4. The wiring portion M1C6 for a control electrode extends in the X direction between the transistor formation region RG1*a* and the transistor formation region RG1*b* (therefore, between the wiring M1S1 for a source and the wiring M1S2 for a source) when seen in a plan view. The wiring portion M1C7 for a control electrode extends in the X direction between the transistor formation region RG1*c* and the transistor formation region RG1*d* (therefore, between the wiring M1S3 for a source and the wiring M1S4 for a source) when seen in a plan view. One end portion of the wiring portion M1C6 for a control electrode (an end portion thereof closer to the side H4) and one end portion of the wring portion M1C7 for a control electrode (an end portion thereof closer to the side H4) are integrally coupled to the wiring portion M1C5 for a control electrode.

In the insulating film PA, an opening OP is provided in each of the wirings M1S1, M1S2, M1S3, and M1S4 for a source. A pad PDS1 for a source is formed by the wiring M1S1 for a source exposed from the opening OP provided in the wiring M1S1 for a source, and a pad PDS2 for a source is formed by the wiring M192 for a source exposed from the opening OP provided in the wiring M1S2 for a source. Further, a pad PDS3 for a source is formed by the wiring M1S3 for a source exposed from the opening OP provided in the wiring M1S3 for a source, and a pad PDS4 for a source is formed by the wiring M1S4 for a source exposed from the opening OP provided in the wiring M1S4 for a source.

The semiconductor device CP6 illustrated in FIGS. 73 to 80 is also basically the same as the above-described modified example 3 in a connection relationship between the wiring M1G for a gate and the gate electrode GE2 inside the trench TR. That is, a plurality of trenches TR2*a* extending in the Y direction and being arranged so as to be next to each other in the X direction are arranged so as to cross the wiring portion M1G1 for a gate below the wiring portion M1G1 for a gate extending in the X direction (that is, between the transistor formation region RG1*a* and the side H1), and the wiring portion M1G1 for a gate is electrically connected to the gate electrodes GE2 inside each of the trenches TR2*a* through the contact hole CT2. Further, a plurality of trenches TR2*a* extending in the Y direction and being arranged so as to be next to each other in the X direction are arranged so as to cross the wiring portion M1G3 for a gate below the wiring portion M1G3 for a gate extending in the X direction (that is, between the transistor formation region RG1*d* and the side H3), and the wiring portion M1G3 for a gate is electrically connected to the gate electrode GE2 inside each of the trenches TR2*a* through the contact hole CT2. Further, a plurality of trenches TR2*c* extending in the Y direction and being arranged so as to be next to each other in the X direction are arranged so as to cross the wiring portion M1G4 for a gate below the wiring portion M1G4 for a gate extending in the X direction (that is, between the transistor formation region RG1*b* and the transistor formation region RG1*c*), and the wiring portion M1G4 for a gate is electrically connected to the gate electrode GE2 inside each of the trenches TR2*c* through the contact hole CT2.

In the case of the semiconductor device CP6 illustrated in FIGS. 73 to 80, note that the wiring portions M1G1, M1G3, and M1G4 for a gate are not adjacent to the wiring M1C for a control electrode, and therefore, the trench TR2*a* arranged below the wiring portions M1G1 and M1G3 for a gate and the trench TR2*c* arranged below the wiring portion M1G4 for a gate can be formed of the multilayer region TR3 without including the single-layer region TR4.

On the other hand, the connection relation between the wiring M1C for a control electrode and the control electrode GE1 inside the trench TR2 is different from that of the third modified example as follows. A plurality of the trench TR2*c* extending in the Y direction and being arranged so as to be next to each other in the X direction are arranged so as to cross the wiring portion M1C6 for a control electrode below the wiring portion M1C6 for a control electrode extending in the X direction (that is, between the transistor formation region RG1*a* and the transistor formation region RG1*b*), and the wiring portion M1C6 for a control electrode is electrically connected to the control electrode GE1 inside each of the trenches TR2*c* through the contact hole CT3. A plurality of the trench TR2*c* extending in the Y direction and being arranged so as to be next to each other in the X direction are arranged so as to cross the wiring portion M1C7 for a control electrode below the wiring portion M1C7 for a control electrode extending in the X direction (that is, between the transistor formation region RG1*c* and the transistor formation region RG1*d*), and the wiring portion M1C7 for a control electrode is electrically connected to the control electrode GE1 inside each of the trenches TR2*c* through the contact hole CT3.

Figure 75:
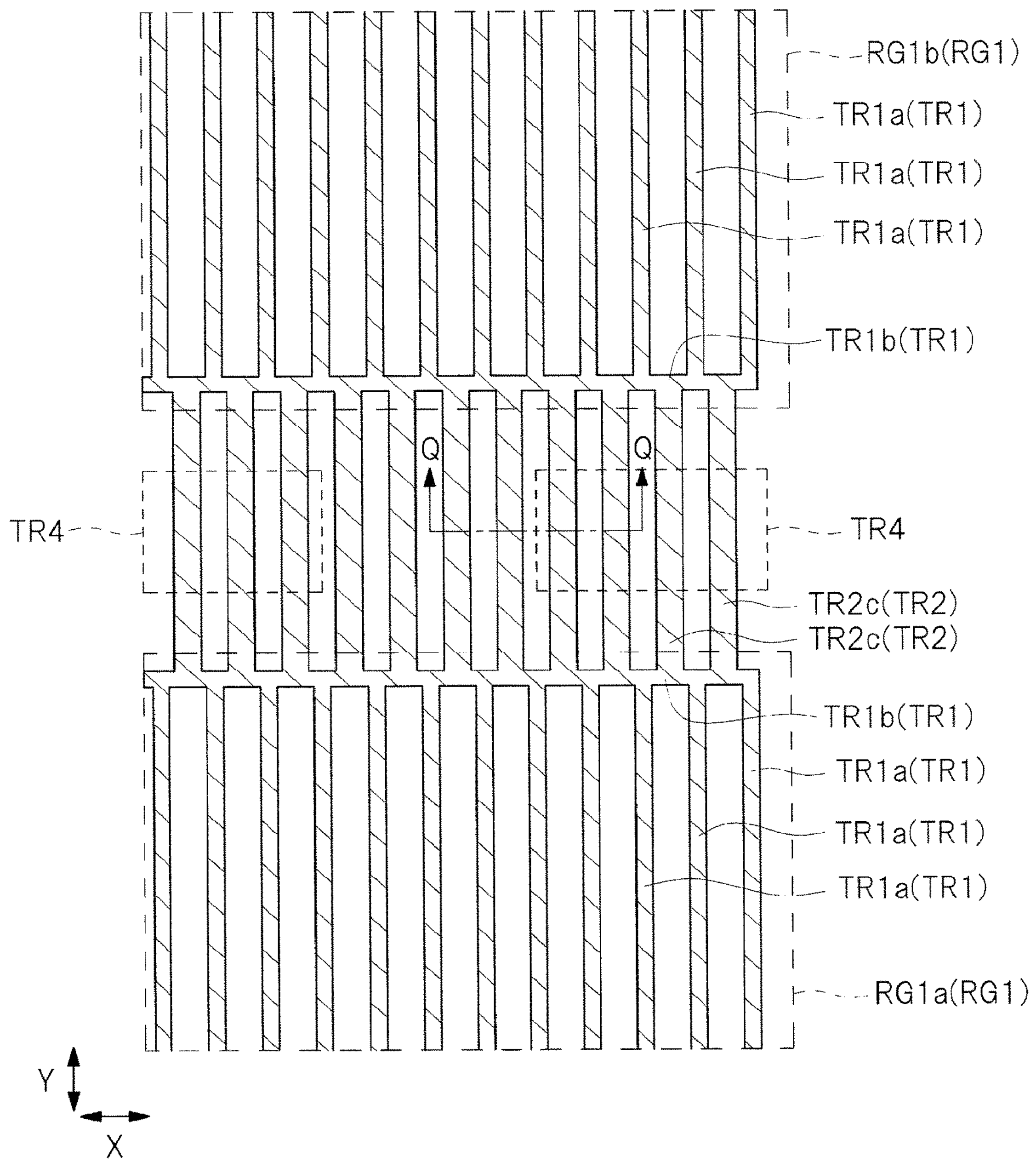
FIG. 75 is a plan view of a principal part of the semiconductor device of the sixth modified example.
Figure 76:
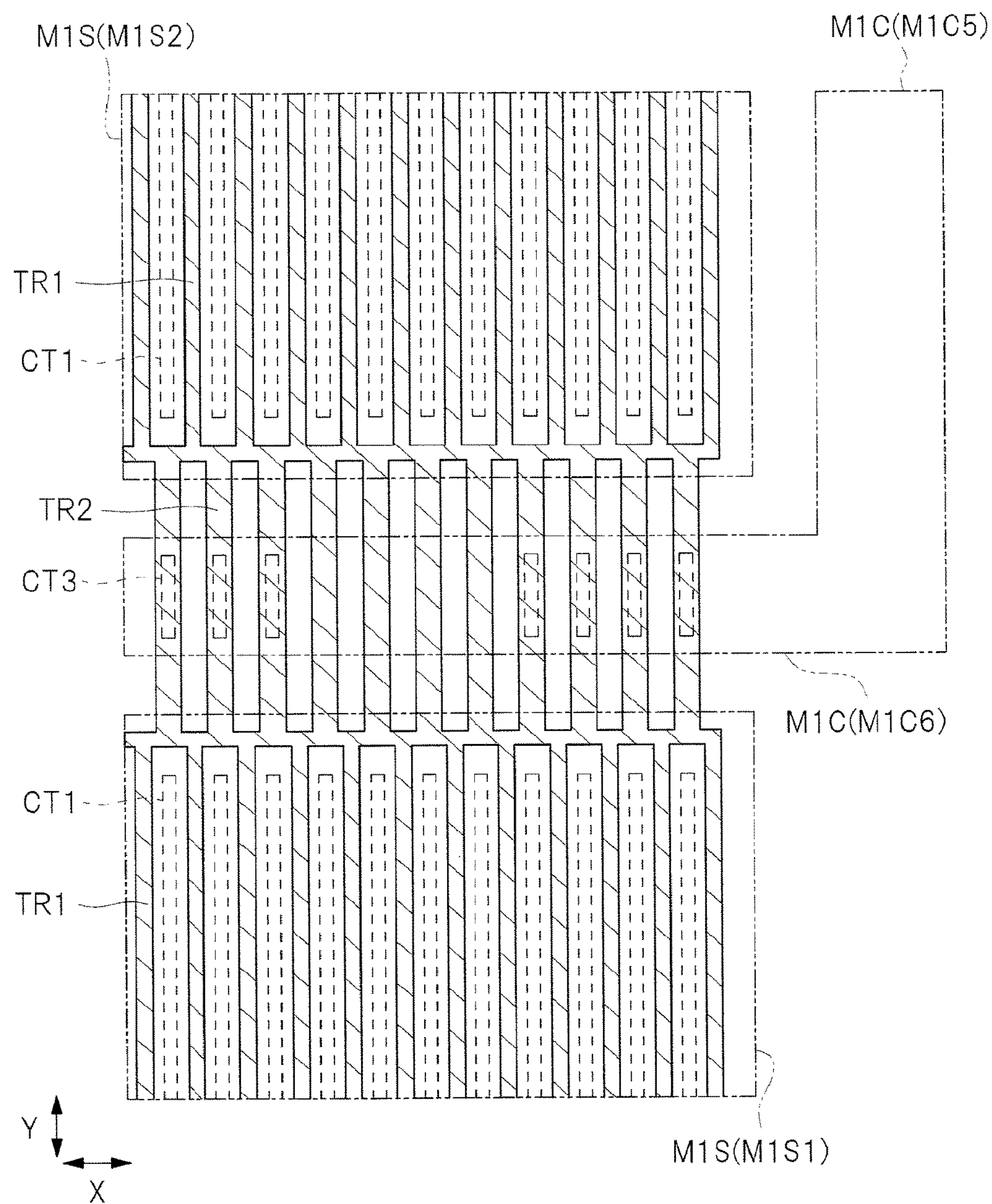
FIG. 76 is a plan view of a principal part of the semiconductor device of the sixth modified example.
Figure 77:
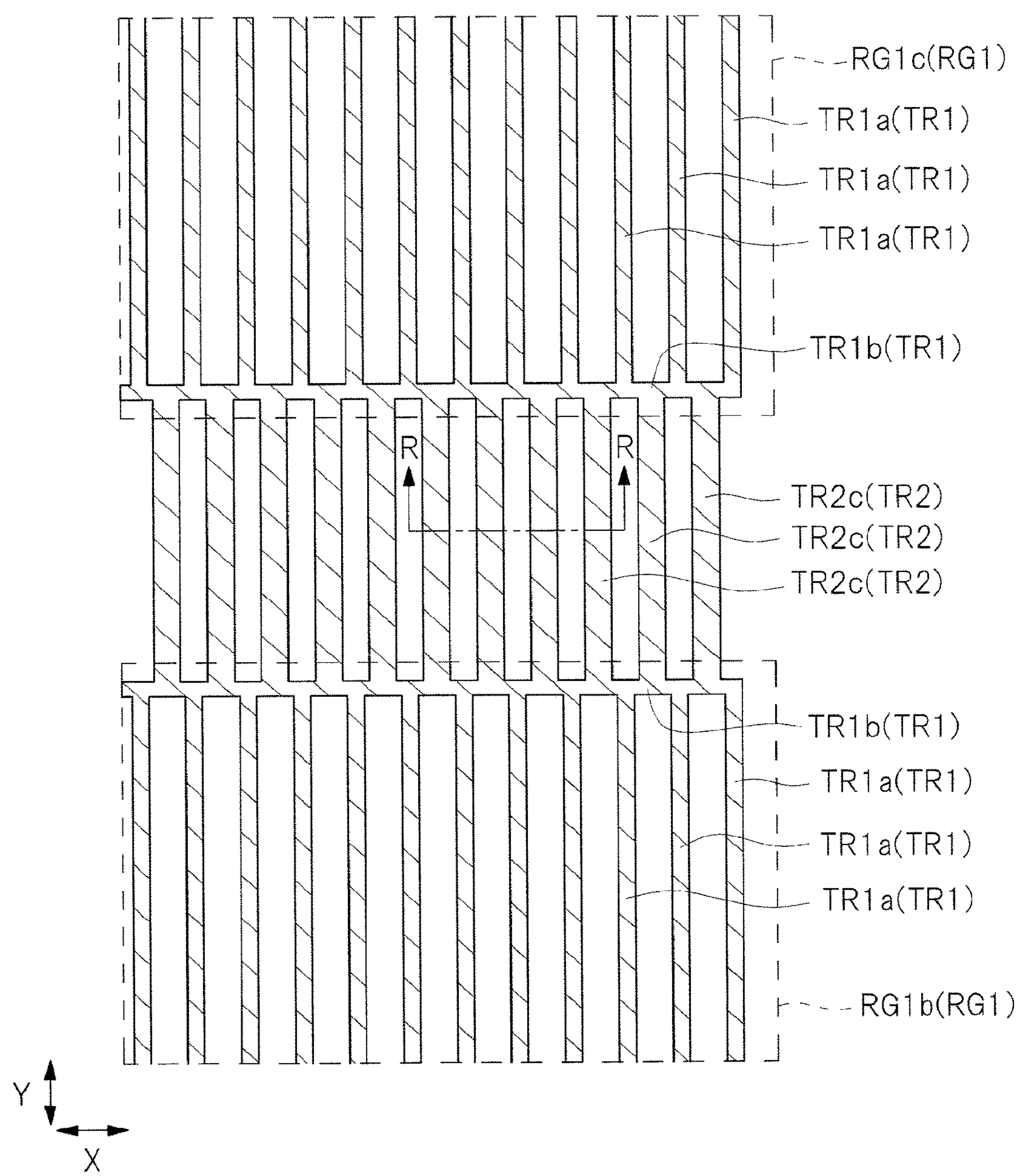
FIG. 77 is a plan view of a principal part of the semiconductor device of the sixth modified example.
Figure 78:
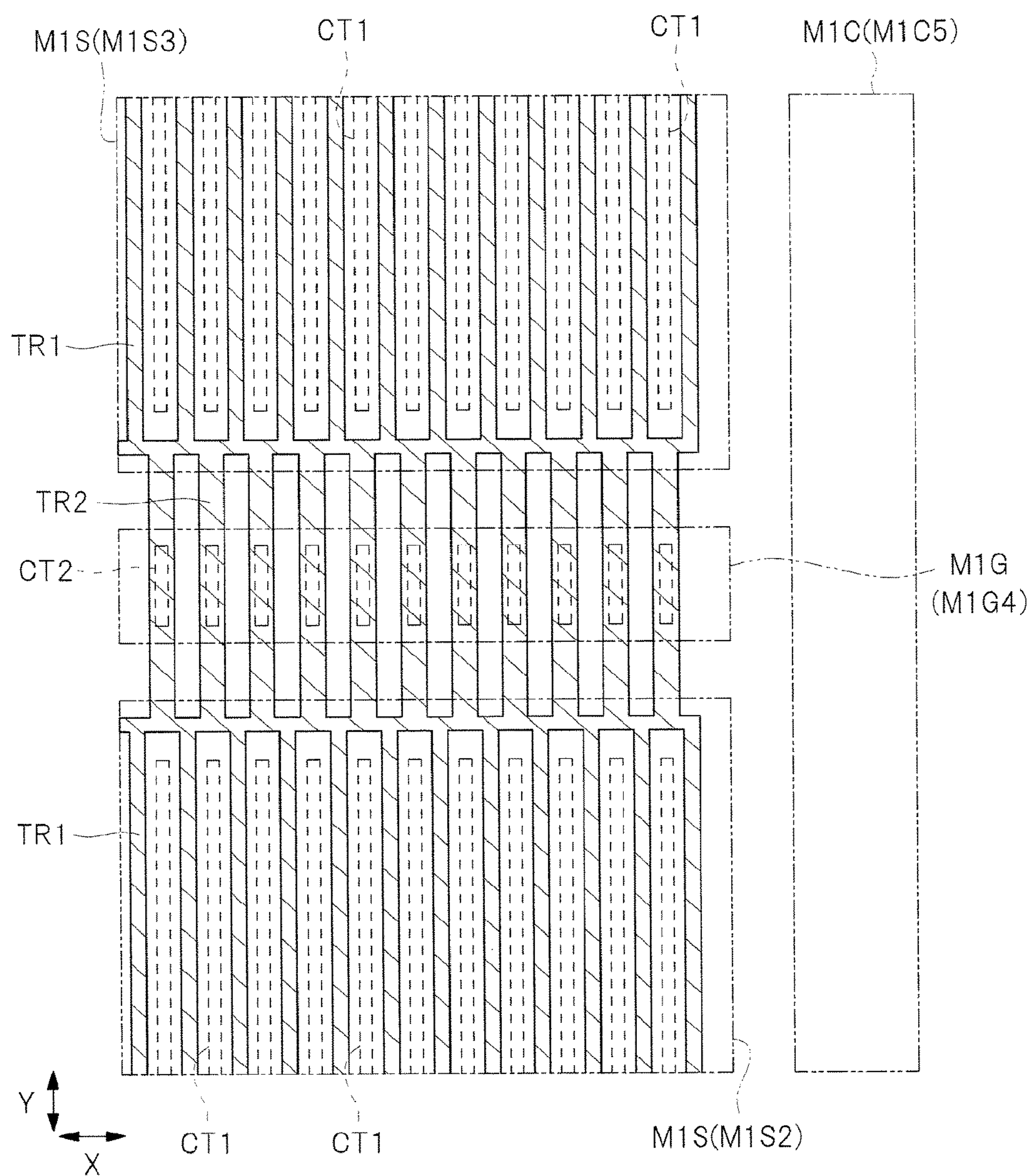
FIG. 78 is a plan view of a principal part of the semiconductor device of the sixth modified example.
Figure 79:
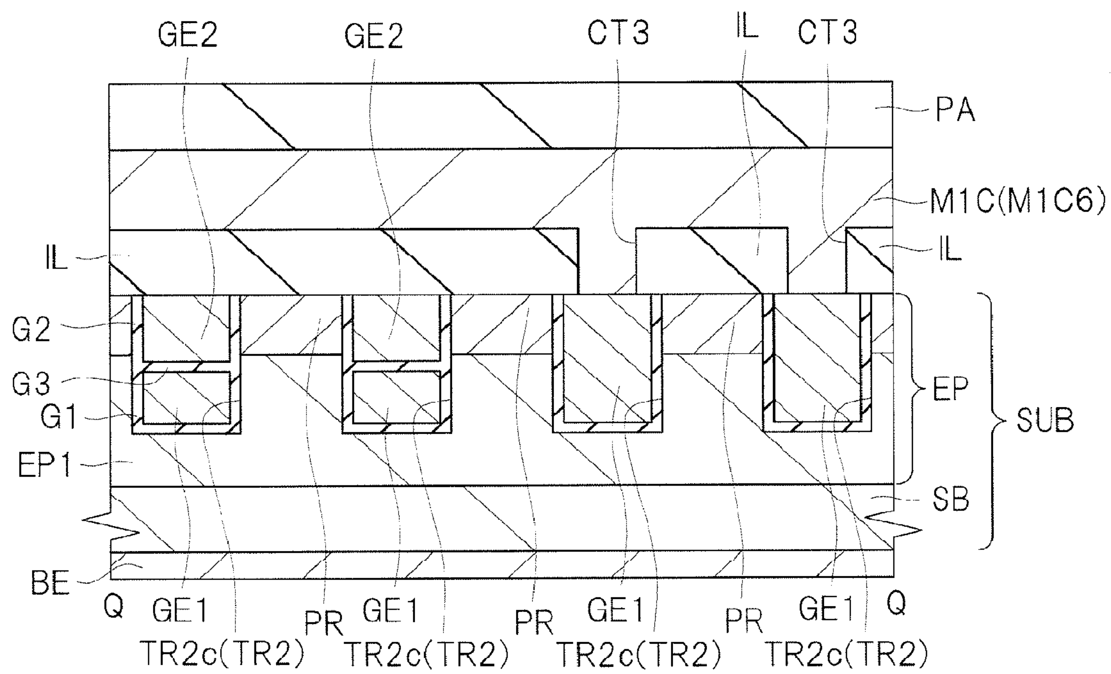
FIG. 79 is a cross-sectional view of a principal part of the semiconductor device of the sixth modified example.
Figure 80:
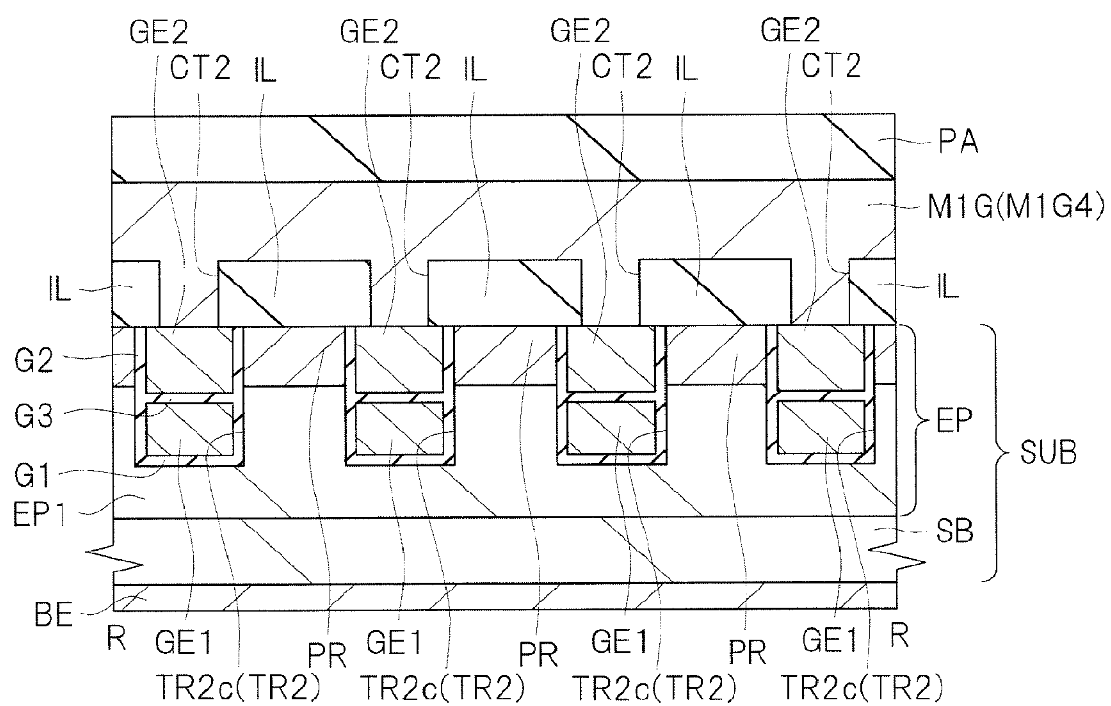
FIG. 80 is a cross-sectional view of a principal part of the semiconductor device of the sixth modified example.

Note that, as the plurality of trenches TR2*c* arranged below the wiring portion M1C6 for a control electrode so as to be next to each other in the X direction, the trench TR2*c* including both of the multilayer region TR3 and the single-layer region TR4 and the trench TR2*c* formed of only the multilayer region TR3 without including the single-layer region TR4 are mixed. In FIG. 75, the trench TR2 (TR2*c*) in a region surrounded by a dotted line attached with the reference symbol TR4 is the single-layer region TR4, and the trench TR2 (TR2*c*) in other region except for the region is the multilayer region TR3. Similarly, as the plurality of trench TR2*c* arranged below the wiring portion M1C7 for a control electrode so as to be next to each other in the X direction, the trench TR2*c* including both of the multilayer region TR3 and the single-layer region TR4 and the trench TR2*c* formed of only the multilayer region TR3 without including the single-layer region TR4 are mixed.

And, in each of trenches TR2*c* including both of the multilayer region TR3 and the single-layer region TR4 among the plurality of trenches TR2*c* arranged below the wiring portion M1C6 for a control electrode so as to be next to each other in the X direction, a contact hole CT3 is formed in a region where this trench TR2*c* overlaps with the wiring portion M1C6 for a control electrode when seen in a plan view. Similarly, in each of the trenches TR2*c* including both of the multilayer region TR3 and the single-layer region TR4 among the plurality of trenches TR2*c* arranged below the wiring portion M1C7 for a control electrode so as to be next to each other in the X direction, a contact hole CT3 is formed in a region where this trench TR2*c* overlaps with the wiring portion M1C7 for a control electrode when seen in a plan view. The contact hole CT3 is formed on the trench TR2*c* of the single-layer region TR4. On the other hand, the gate electrode GE2 inside the trench TR1 of the transistor formation region RG1*a* and the gate electrode GE2 inside the trench TR1 of the transistor formation region RG1*b* are integrally connected to each other so as to be electrically connected to each other through the gate electrode GE2 inside the trench TR2*c* without including the single-layer region TR4 among the plurality of trenches TR2*c* arranged below the wiring portion M1C6 for a control electrode so as to be next to each other in the X direction. Further, the gate electrode GE2 inside the trench TR1 of the transistor formation region RG1*c* and the gate electrode GE2 inside the trench TR1 of the transistor formation region RG1*d* are integrally connected to each other so as to be electrically connected to each other through the gate electrode GE2 inside the trench TR2*c* without including the single-layer region TR4 among the plurality of trenches TR2*c* arranged below the wiring portion M1C7 for a control electrode so as to be next to each other in the X direction.

Since other configuration of the semiconductor device CP6 illustrated in FIGS. 73 to 80 is basically the same as that of the semiconductor device CP3 illustrated in the above FIGS. 49 to 52, explanation thereof is omitted here.

In the case of the semiconductor device CP6 illustrated in FIGS. 73 to 80, the following effect can be further obtained in addition to the effect obtained by the semiconductor device CP illustrated in the above-described FIGS. 1 to 13.

That is, in the semiconductor device CP6 illustrated in FIGS. 73 to 80, the wiring M1G for a gate further includes the wiring portion M1G4 for a gate, so that the gate resistance can be decreased.

Further, in the semiconductor device CP6 illustrated in FIGS. 73 to 80, the wiring portions M1C6, M1C7 for a control electrode connected to the control electrode GE1 inside the trench TR2 are provided so as not to be adjacent to the wiring M1G for a gate. Therefore, the number of wiring portions (M1C6, M1C7) for a control electrode connected to the control electrodes GE1 inside the trench TR2 can also be made different from the number of wiring portions (M1G1, M1G3, M1G4) for a gate connected to the gate electrodes GE2 inside the trench TR2. That is, the number of wiring portions (M1C6, M1C7) for a control electrode connected to the control electrode GE1 inside the trench TR2 can be set without being restricted by the number of wiring portions (M1G1, M1C3, M1G4) for a gate connected to the gate electrodes GE2 inside the trench TR2. In this manner, an input resistance into the control electrode GE1 can be easily adjusted to a desired resistance value.

Regarding Seventh Modified Example

Figure 81:
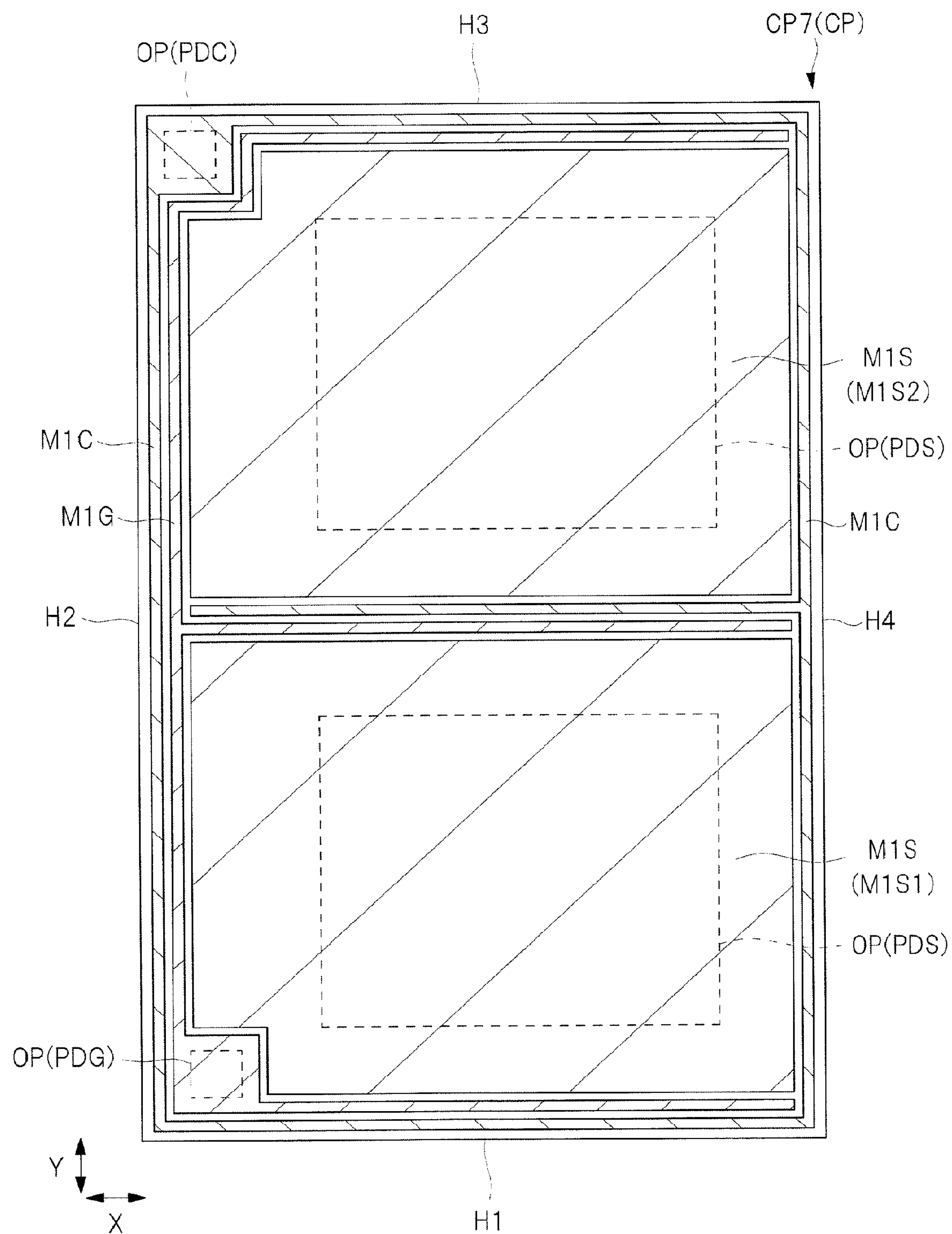
FIG. 81 is an overall plan view of a semiconductor device of a seventh modified example.
Figure 82:
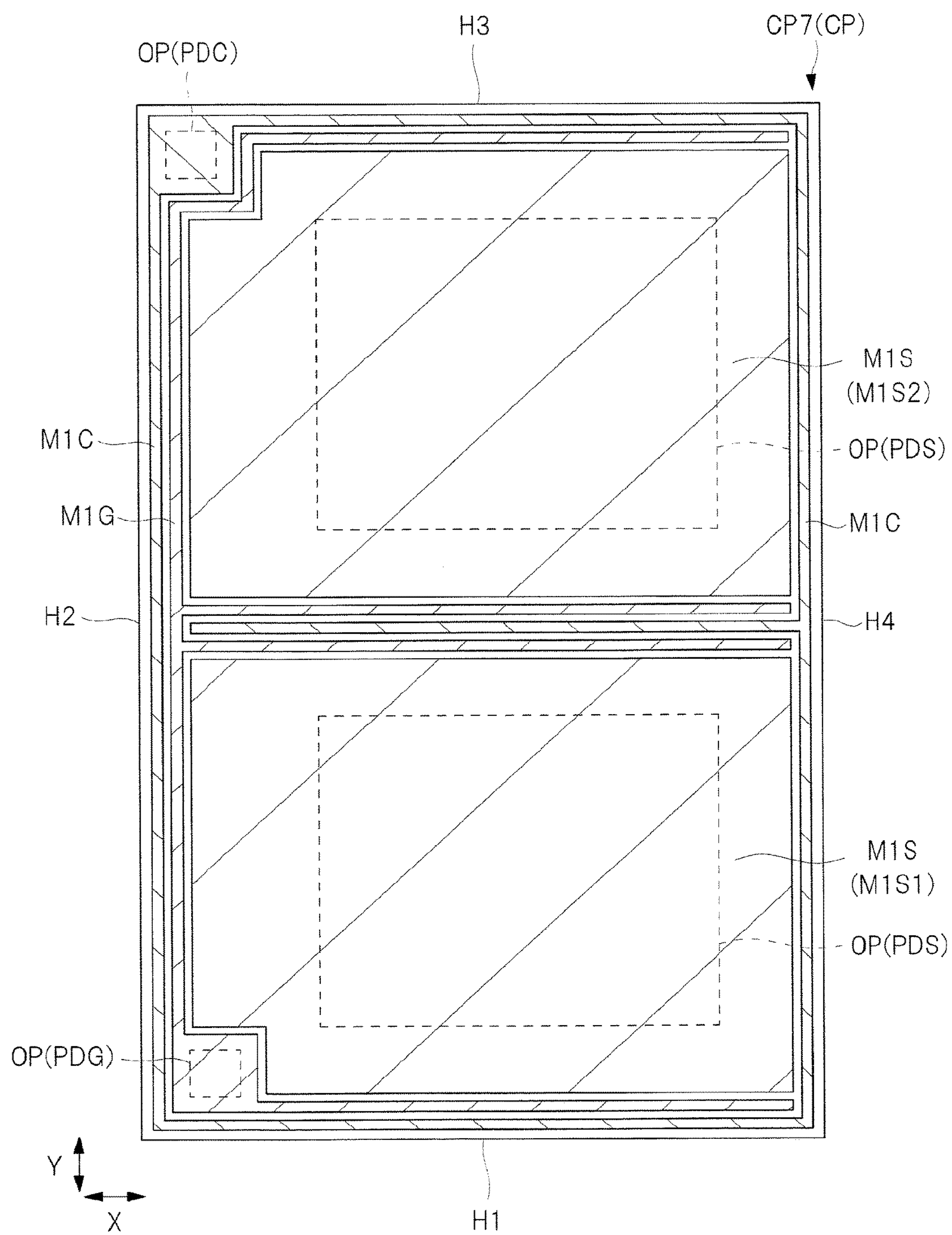
FIG. 82 is an overall plan view of the semiconductor device of the seventh modified example.
Figure 83:
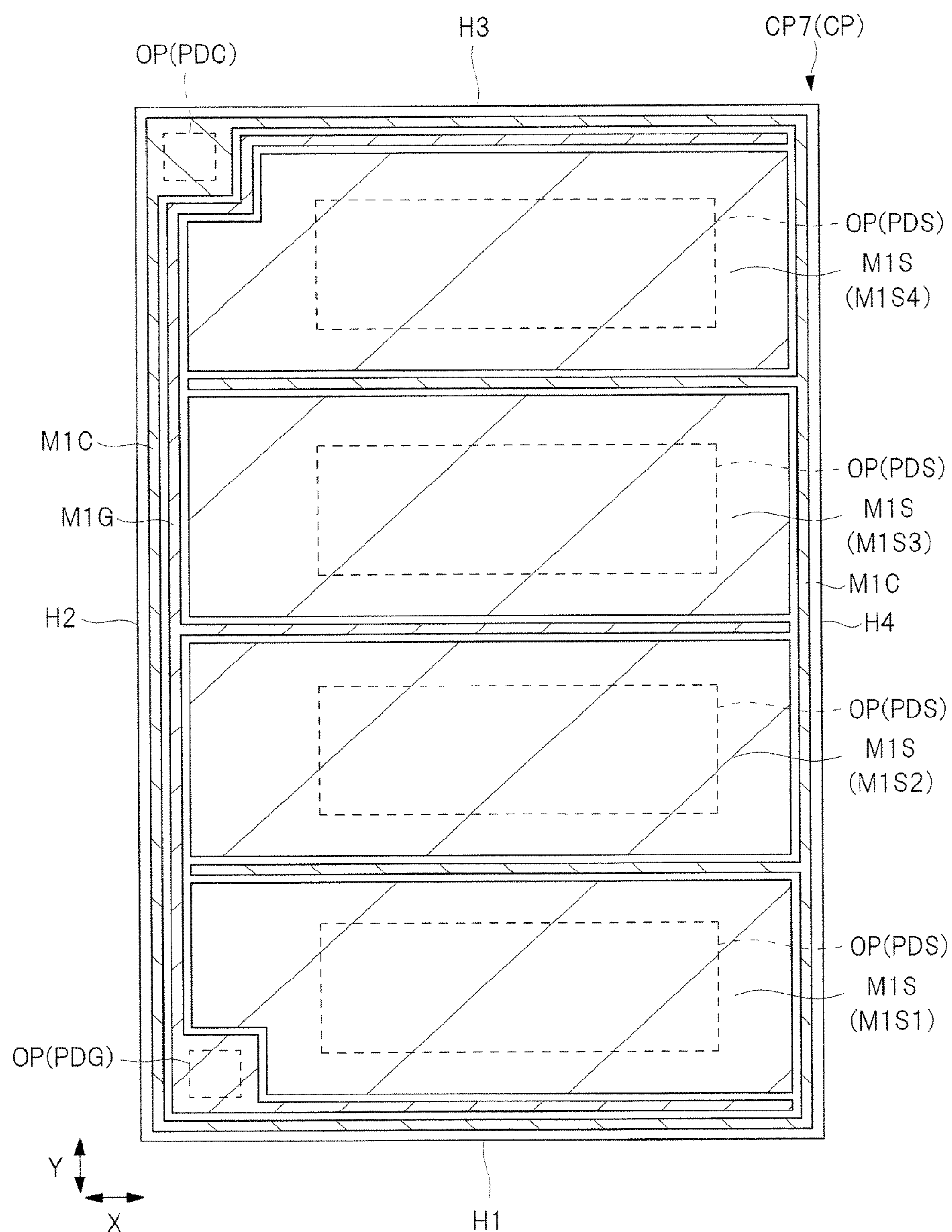
FIG. 83 is an overall plan view of the semiconductor device of the seventh modified example.

Next, a seventh modified example will be described. FIGS. 81 to 83 are plan views illustrating the seventh modified example of the semiconductor device CP of the present embodiment. The semiconductor device CP of the seventh modified example illustrated in FIGS. 81 to 83 is called "semiconductor device CP7". All of FIGS. 81 to 83 are overall plan views corresponding to the above-described FIG. 2.

The overall plan views (FIGS. 1 to 3, 42, 48 to 51, 53 to 55, 63 to 65, 73, and 74) illustrating the above-described semiconductor devices CP, CP1, CP2, CP3, CP4, CP5, and CP6 illustrate a case that the X direction is a long side direction (a long side direction of a rectangle configuring the plane shape of the semiconductor device), and the Y direction is a short side direction (a short side direction of the rectangle configuring the plane shape of the semiconductor device). In this case, the sides H1 and H3 are longer than the sides H2 and H4.

As another aspect, in the above-described semiconductor devices CP, CP1, CP2, CP3, CP4, CP5, and CP6, the X direction can be defined as the short side direction (the short side direction of the rectangle configuring the plane shape of the semiconductor device) and the Y direction can be defined as the long side direction (the long side direction of a rectangle configuring the a plane shape of the semiconductor device). In this case, the sides H2 and H4 are longer than the sides H1 and H3. Thus, the case that the X direction is defined as the short side direction while the Y direction is defined as the long side direction corresponds to the seventh modified example.

For example, the semiconductor device CP7 illustrated in FIG. 81 corresponds to one example of a layout to which the above-described fourth modified example is applied when the X direction is defined as the short side direction while the Y direction is defined as the long side direction. Further, the semiconductor device CP7 illustrated in FIG. 82 corresponds to one example of a layout to which the above-described fifth modified example when the X direction is defined as the short side direction while the Y direction is defined as the long side direction. Further, the semiconductor device CP7 illustrated in FIG. 83 corresponds to one example of a layout to which the above-described sixth modified example when the X direction is defined as the short side direction while the Y direction is defined as the long side direction.

In all cases illustrated in FIGS. 81 to 83, a portion of the wiring M1G for a gate extending in the X direction is connected to the gate electrode GE2 inside the trench TR2 extending in the Y direction below the portion, and a portion of the wiring M1C for a control electrode extending in the X direction is connected to the control electrode GE1 inside the trench TR2 extending in the Y direction below the portion. This point is also common between the case that the X direction is the long side direction and the case that the X direction is the short side direction.

In the case that the X direction is the long side direction, the gate resistance can be further decreased, and the input resistance to the control electrode GE1 can be further decreased.

On the other hand, in the case that the X direction is the short side direction, an effective area of the transistor formation region (RG1) can be increased, and therefore, the ON resistance of the power transistor can be further decreased.

Second Embodiment

In the present second embodiment, an example of a semiconductor device or an electronic device using the semiconductor device (semiconductor chip) of the above-described first embodiment will be described.

Figure 84:
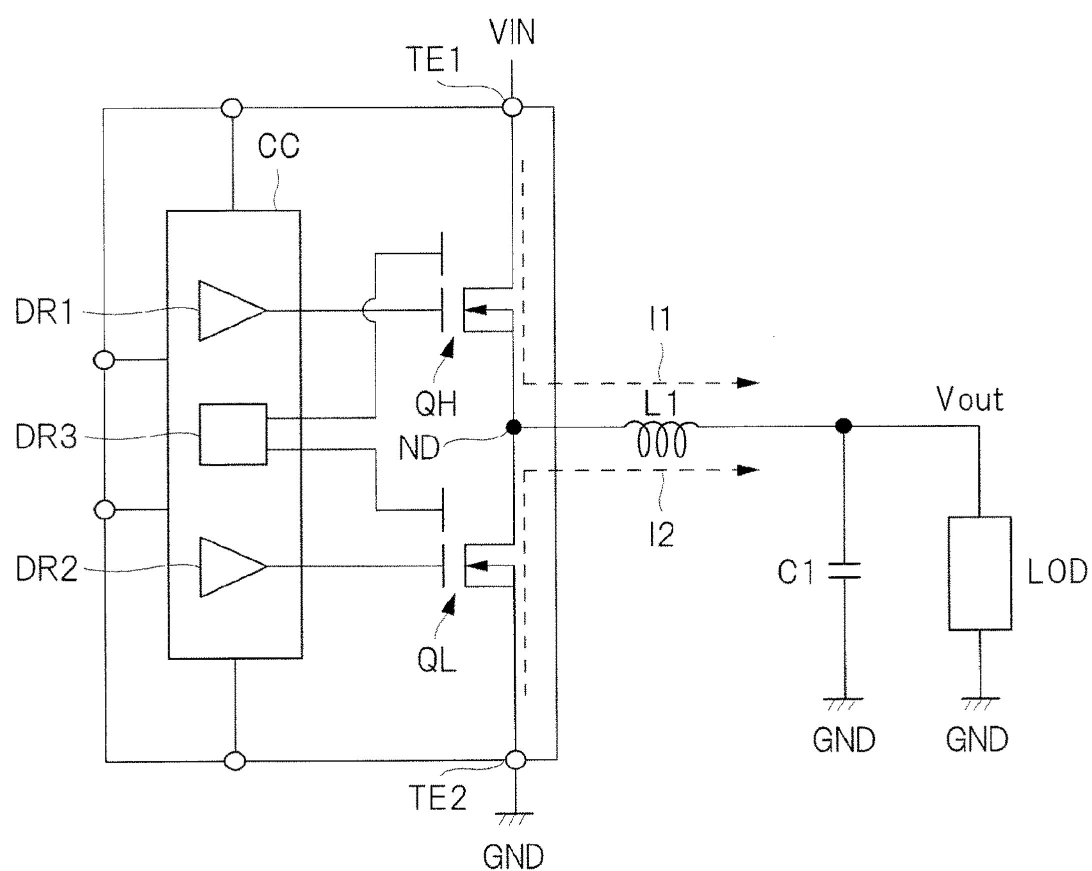
FIG. 84 is a circuit diagram illustrating one example of an electronic device using the semiconductor device of the embodiment.

FIG. 84 is a circuit diagram illustrating one example of an electronic device using the semiconductor device (semiconductor chip) of the above-described first embodiment, and illustrates a circuit diagram here in a case that a non-insulation type DC-DC converter is configured by using the semiconductor device (semiconductor chip) of the above-described first embodiment.

The non-insulation type DC-DC converter illustrated in FIG. 84 can be used for, for example, a power supply circuit or others for such an electronic device as a desktop type personal computer, a notebook (laptop) type personal computer, a server, or a game machine.

The non-insulation type DC-DC converter illustrated in FIG. 84 includes: two power MOSFETs (Metal Oxide Semiconductor Field Effect Transistor) QH and QL; a control circuit CC; a capacitor (output capacitor) C1; and a coil (inductor) L1. Note that a reference symbol "VIN" in FIG. 84 denotes an input power source (input power source potential), "GND" denotes a reference potential (for example, 0 Vat a ground potential), and "Vout" denotes an output voltage. The power MOSFET is hereinafter called "power MOS transistor".

The control circuit CC includes a circuit for controlling operations of the power MOS transistors QH and QL, and includes: a driver circuit (driving circuit) DR1 for driving or controlling the power MOS transistor QH; and a driver circuit (driving circuit) DR2 for driving or controlling the power MOS transistor QL. The driver circuit DR1 is a circuit for controlling a potential of a gate terminal (corresponding to the above-described gate electrode GE2) of the power MOS transistor QH and controlling an operation of the power MOS transistor QH. The driver circuit DR2 is a circuit for controlling a potential of a gate terminal (corresponding to the above-described gate electrode GE2) of the power MOS transistor QL and controlling an operation of the power MOS transistor QL. The control circuit CC further includes a control circuit DR3 which is a circuit for controlling potentials of the above-described control electrodes GE1 of the power MOS transistors QH and QL.

The power MOS transistor QH and the power MOS transistor QL are connected in series to each other between a terminal TE1 for input voltage supply and a terminal TE2 for reference potential supply. That is, the power MOS transistor QH has a source-drain path connected in series between the terminal TE1 for input voltage supply and an output node (output terminal) ND, and the power MOS transistor QL has a source-drain path connected in series between the output node ND and the terminal TE2 for reference potential supply. Specifically, a drain of the power MOS transistor QH is connected to the terminal TE1 for input voltage supply, the source of the power MOS transistor QH is connected to the output node ND, a drain of the power MOS transistor QL is connected to the output node ND, and the source of the power MOS transistor QL is connected to the terminal TE2 for reference potential supply.

Note that a potential on a high-potential side of an input power source (input power source potential) VIN such as 12 V is supplied to the terminal TE1 for input voltage supply, and a reference potential such as a ground potential (earth potential, 0V) lower than the input voltage (potential VIN) supplied to the terminal TE1 for input voltage supply is supplied to the terminal TE2 for reference potential supply. Therefore, the power MOS transistor QH and the power MOS transistor QL are connected in series between the input power source (VIN) and the reference potential (GND) lower than the input power source (VIN).

The output node ND between the power MOS transistor QH and the power MOS transistor QL is connected to a load LOD through a coil (inductor) L1. That is, the coil L1 and the load LOD are connected in series between the output node ND and the reference potential GND, and a capacitor C1 is connected in parallel with the load LOD. The coil L1 is interposed between the output node ND and the load LOD. The load LOD includes, for example, a hard disk drive, an ASIC (Application Specific Integrated Circuit), a FPGA (Field Programmable Gate Array), an expansion card (PCI CARD), a memory (DDR memory, DRAM, flash memory and others), a CPU (Central Processing Unit) and others.

The power MOS transistor QH is a field effect transistor for a high side switch (high potential side: first operation voltage; hereinafter simply called "high side") and includes a switch function for accumulating energy in the above-described coil L1. That is, the power MOS transistor QH is a transistor for switching (switching element). The coil L1 is an element for supplying power to an output (that is, an input of the load LOD) of the non-insulation type DC-DC converter.

On the other hand, the power MOS transistor QL is a field effect transistor for a low side switch (low potential side: second operation voltage; hereinafter simply called "low side") and includes a function for lowering the resistance of the transistor to perform rectification. That is, the power MOS transistor QL is a transistor for rectification (for synchronous rectification), and it is here a transistor for rectification of the non-insulation type DC-DC converter.

Note that the above-described power MOS transistor QH for high side can be regarded as a high side MOSFET (MOSFET for high side) of a DC-DC converter. Further, the above-described power MOS transistor QL for low side can be regarded as a low side MOSFET (MOSFET for low side) of a DC-DC converter.

In such a non-insulation type DC-DC converter, a power source voltage is converted by alternately turning ON and OFF the power MOS transistors QH and QL while taking synchronization between the power MOS transistors QH and QL. That is, when the power MOS transistor for high side QH is turned ON, a current I1 flows to the output node ND from the terminal TE1 through the power MOS transistor QH. On the other hand, when the power MOS transistor for high side QH is turned OFF, a current I2 flows due to a counter electromotive voltage of the coil L1, and voltage drop can be reduced by turning ON the power MOS transistor QL for low side during flowing of the current I2.

An operation of the DC-DC converter illustrated in FIG. 1 will be described below briefly.

The gate electrode GE2 and the control electrode GE1 of the power MOS transistor QH and the gate electrode GE2 and the control electrode GE1 of the power MOS transistor QL are connected to the control circuit CC, and ON/OFF of the power MOS transistor QH and ON/OFF of the power MOS transistor QL are controlled by the control circuit CC. Specifically, the control circuit CC controls so as to turn OFF the power MOS transistor QL when turning ON the power MOS transistor QH and turn ON the power MOS transistor QL when turning OFF the power MOS transistor QH.

Here, for example, when the power MOS transistor QH is turned ON and the power MOS transistor QL is turned OFF, a current flows to the load LOD from the input terminal TE1 through the power MOS transistor QH and the coil L1. Then, when the power MOS transistor QH is turned OFF and the power MOS transistor QL is turned ON, the current flowing in the load LOD from the input terminal TE1 through the power MOS transistor QH and the coil L1 is blocked because the power MOS transistor QH is turned OFF first. That is, a current flowing in the coil L1 is blocked. However, when the current is decreased (blocked) in the coil L1, the current flowing in the coil L1 is forced to be maintained (that is, an induced electromotive force is generated so that an induction current to be forced to flow). At this time, since the power MOS transistor QL has been turned ON, a current flows at this time from the terminal TE2 connected to the reference potential GND into the load LOD through the power MOS transistor QL and the coil L1. Then, the power MOS transistor QH is turned ON and the power MOS transistor QL is turned OFF again. By repeating such an operation, when the input power source potential VIN is inputted into the input terminal TE1 in the DC-DC converter illustrated in FIG. 84, an output voltage Vout lower than the input power source potential VIN is outputted to both ends of the load LOD.

Figure 85:
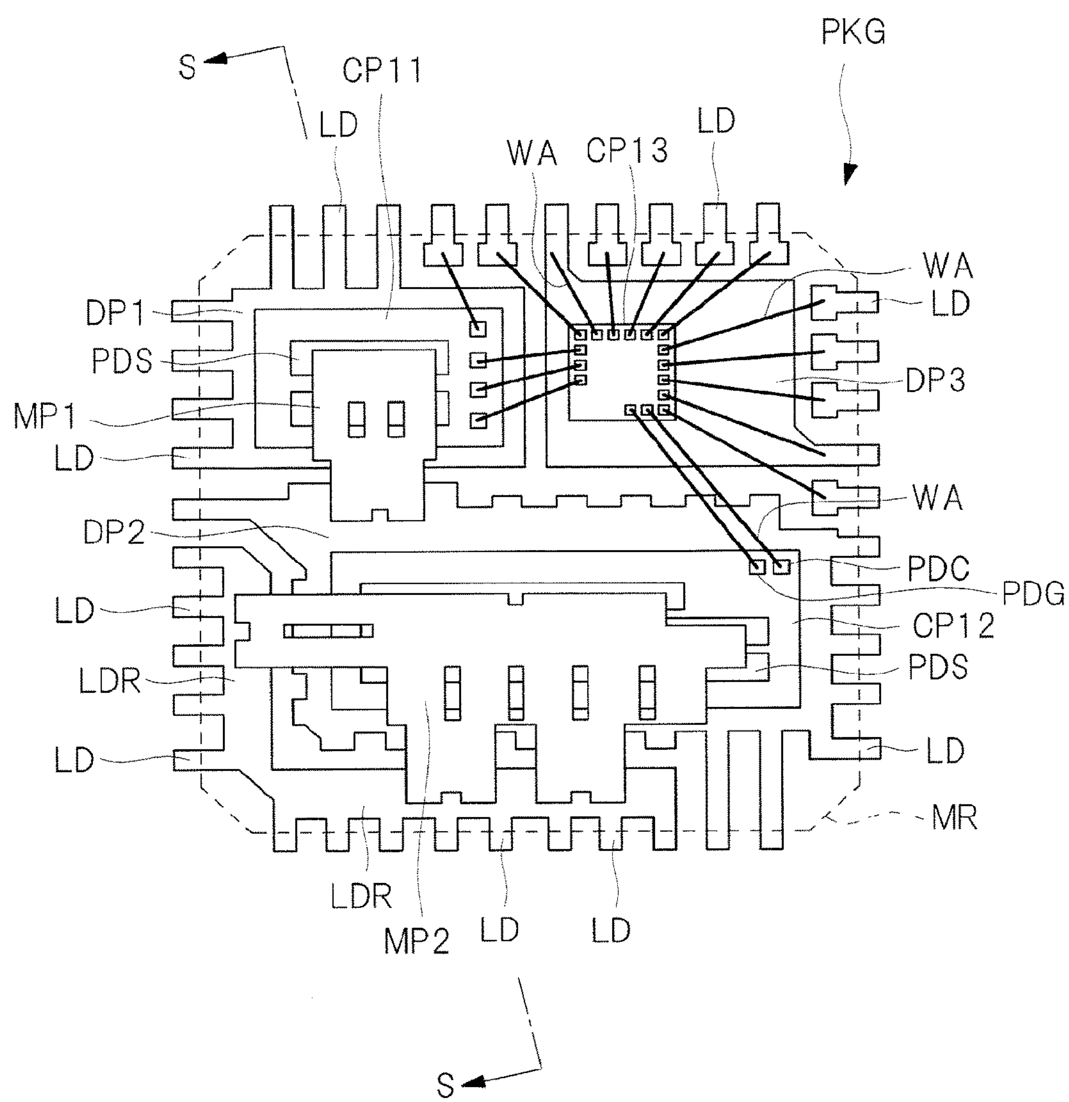
FIG. 85 is a transparent plan view illustrating one example of a semiconductor package obtained by packaging the semiconductor device of the embodiment.
Figure 86:
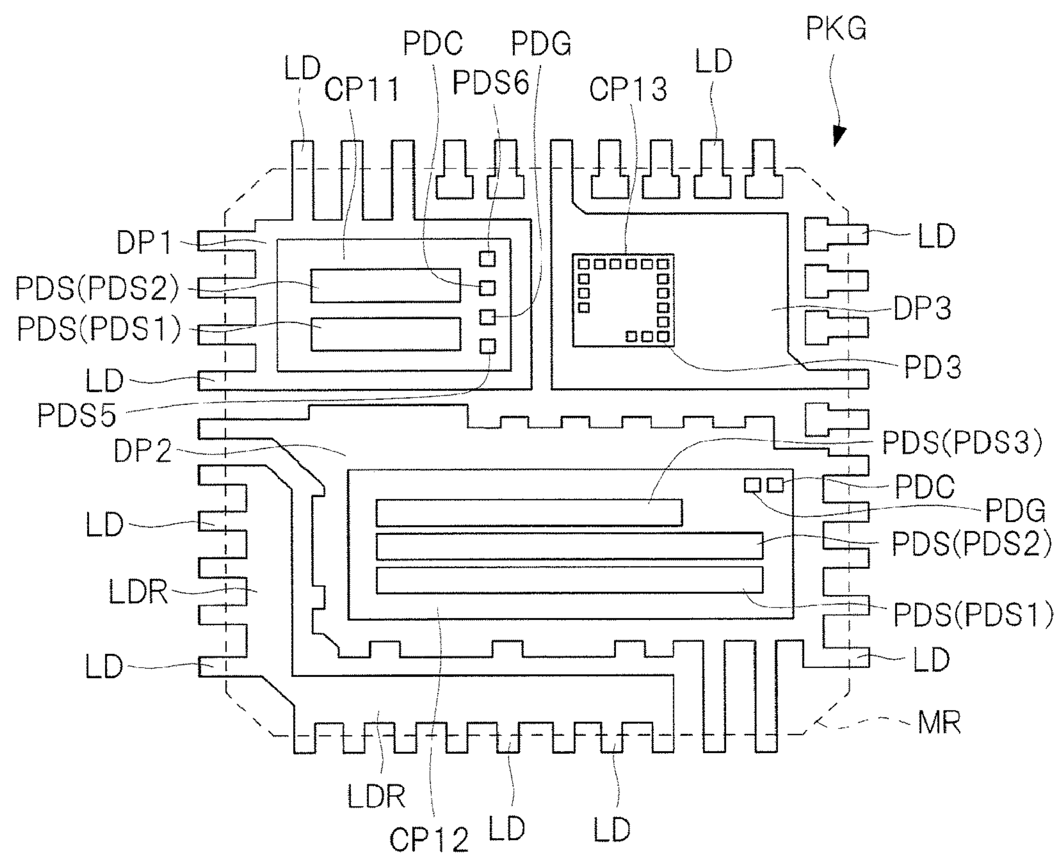
FIG. 86 is a transparent plan view illustrating one example of a semiconductor package obtained by packaging the semiconductor device of the embodiment.
Figure 87:
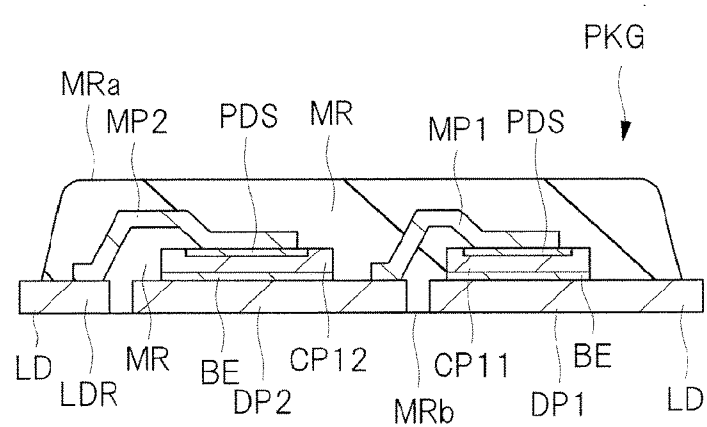
FIG. 87 is a cross-sectional view illustrating one example of a semiconductor package obtained by packaging the semiconductor device of the embodiment.

FIGS. 85 to 87 are transparent plan views (FIGS. 85 and 86) and a cross-sectional view (FIG. 87) schematically illustrating one example of the semiconductor device (semiconductor package) PKG obtained by packaging the semiconductor device (semiconductor chip) of the above-described first embodiment. FIG. 85 illustrates a plan view (a top view) obtained by transparently viewing a sealed portion MR from an upper surface side of the semiconductor device PKG. FIG. 85 illustrates an outer peripheral position of the sealed portion MR by using a dotted line. Further, FIG. 86 corresponds to a view obtained by removing the metal plates MP1 and MP2 and the wire WA from FIG. 85. Further, a cross-sectional view taken along a line S-S in FIG. 85 almost corresponds to FIG. 87.

As illustrated in FIGS. 85 to 87, the semiconductor device PKG includes: die pads (chip-mounting portions) DP1, DP2, and DP3; semiconductor chips CP11, CP12, and CP13 mounted on the die pads DP1, DP2, and DP3; metal plates (conductor plates) MP1 and MP2; a plurality of wires WA; a plurality of leads LD; and a sealing portion (sealing resin portion) MR for sealing these members.

The semiconductor device PKG is a semiconductor device used for the non-insulation type DC-DC converter illustrated in the above-described FIG. 84. The semiconductor chip CP11 is a semiconductor chip on which the above-described power MOS transistor QH for a high side switch is formed, the semiconductor chip CP12 is a semiconductor chip on which the above-described power MOS transistor QL for a low side switch is formed, and the semiconductor chip CP13 is a semiconductor chip on which the above-described control circuit CC is formed.

Each of the semiconductor chip CP11 and the semiconductor chip CP12 corresponds to either one of the semiconductor devices CP, CP1, CP2, CP3, CP4, CP5, CP6, and CP7 of the above-described first embodiment.

A plurality of the above-described unit transistor cells Q1 formed in the above-described transistor formation region RG1 inside the semiconductor chip CP11 are connected in parallel, so that the power MOS transistor QH for a high side switch is formed. Further, a plurality of the above-described unit transistor cells Q1 formed in the above-described transistor formation region RG1 inside the semiconductor chip CP12 are connected in parallel, so that the power MOS transistor QL for a low side switch is formed.

Therefore, the pad PDG for a gate of the semiconductor chip CP11 is electrically connected to the above-described gate electrode GE2 of the power MOS transistor QH for a high side switch formed inside the semiconductor chip CP11. Further, the pad PDS for a source of the semiconductor chip CP11 is electrically connected to the source ($n^+$-type semiconductor region NR) of the power MOS transistor QH for a high side switch formed inside the semiconductor chip CP11. Further, the pad PDC for a control electrode of the semiconductor chip CP11 is electrically connected to the above-described control electrode GE1 of the power MOS transistor QH for a high side switch formed inside the semiconductor chip CP11. Further, the back electrode BE of the semiconductor chip CP11 is electrically connected to the drain of the power MOS transistor QH for a high side switch formed inside the semiconductor chip CP11.

Further, the pad PDG for a gate of the semiconductor chip CP12 is electrically connected to the above-described gate electrode GE2 of the power MOS transistor QL for a low side switch formed inside the semiconductor chip CP12. Further, the pad PDS for a source of the semiconductor chip CP12 is electrically connected to the source ($n^+$-type semiconductor region NR) of the power MOS transistor QL for a low side switch formed inside the semiconductor chip CP12. Further, the pad PDC for a control electrode of the semiconductor chip CP12 is electrically connected to the above-described control electrode GE1 of the power MOS transistor QL for a low side switch formed inside the semiconductor chip CP12. Further, the back electrode BE of the semiconductor chip CP12 is electrically connected to the drain of the power MOS transistor QL for a low side switch formed inside the semiconductor chip CP12. The pad PD3 of the semiconductor chip CP13 is electrically connected to a circuit (for example, the control circuit CC) formed inside the semiconductor chip CP13.

The sealing portion MR is made of a resin material such as a thermosetting resin material, and can also contain a filler or others. For example, the sealing portion MR can be formed by using an epoxy resin containing a filler.

The sealing portion MR includes an upper surface MRa which is one main surface, a back surface MRb which is a main surface opposite to the upper surface MRa, and side surfaces (four side surfaces) crossing the upper surface MRa and the back surface MRb. Plane shapes of the upper surface MRa and the back surface MRb of the sealing portion MR are formed in, for example, a rectangular shape, and corners of the rectangular shape (plane rectangular shape) can be cut off or the corners of the rectangular shape (plane rectangular shape) can be rounded.

The plurality of leads LD are arranged on four sides of the plane rectangular shape of the sealing portion MR. Each of the leads LD partially protrudes outward from the four sides of the plane rectangular shape of the sealing portion MR, and a lower surface of each of the leads LD is exposed on the back surface MRb of the sealing portion MR. Further, lower surfaces (back surfaces) of the die pads DP1, DP2, and DP3 whose plane shapes are, for example, each substantially rectangle are also exposed on the back surface MRb of the sealing portion MR.

The plurality of leads LD included in the semiconductor device PKG include: a plurality of leads LD integrally coupled to the die pad DP1; a plurality of leads LD integrally coupled to the die pad DP2; a plurality of leads LD integrally coupled to the die pad DP3; a plurality of leads LD integrally coupled through a coupling portion; and a plurality of isolated leads LD.

Each of the die pads DP1, DP2, DP3, the leads LD, and the coupling portion LDR is made of a conductor, and preferably is made of a metal material such as copper (Cu) or copper alloy. Further, if the die pads DP1, DP2, DP3, the leads LD, and the coupling portion LDR are made of the same metal material as each other, the semiconductor device PKG can be manufactured by using the same lead frame, and therefore, the manufacture of the semiconductor device PKG becomes easy.

The semiconductor chip CP11 is mounted on the upper surface of the die pad DP1 so as to have a front surface facing upward which is a main surface on a side where the pads PDS, PDG and PDC are formed and have a back surface facing the die pad DP1 which is a main surface on a side where the back electrode BE is formed. That is, the semiconductor chip CP11 is bonded in a face-up bonding method on the die pad DP1 through a conductive adhesion layer (not illustrated). The back electrode BE is formed on the whole back surface of the semiconductor chip CP11, and the back electrode BE is joined to the die pad DP1 through a conductive adhesion layer (not illustrated) so as to be electrically connected thereto. Therefore, the back electrode BE of the semiconductor chip CP11 is electrically connected to the die pad DP1 and the leads LD integrally coupled to the die pad DP1.

The semiconductor chip CP12 is mounted on the upper surface of the die pad DP2 so as to have a front surface facing upward which is a main surface on a side where the pads PDS and the pads PDG and PDC are formed and have a back surface facing the die pad DP2 which is a main surface on a side where the back electrode BE is formed. That is, the semiconductor chip CP12 is bonded in a face-up bonding method on the die pad DP2 through a conductive adhesion layer (not illustrated). The back electrode BE is formed on the whole back surface of the semiconductor chip CP12, and the back electrode BE is joined to the die pad DP2 through a conductive adhesion layer (not illustrated) so as to be electrically connected thereto. Therefore, the back electrode BE of the semiconductor chip CP12 is electrically connected to the die pad DP2 and the leads LD integrally coupled to the die pad DP2.

The semiconductor chip CP13 is mounted on an upper surface of the die pad DP3 so as to have a front surface facing upward which is a main surface on a side where the pad PD3 is formed and have a back surface facing the die pad DP3. That is, the semiconductor chip CP13 is bonded in a face-up bonding method on the die pad DP3 through a conductive adhesion layer (not illustrated). Note that the back electrode is not formed on the back surface of the semiconductor chip CP13, and therefore, the adhesion layer joining the semiconductor chip CP13 to the die pad DP3 may have a conductive property or an insulating property. On the other hand, since the back electrodes BE is formed on each back surface of the semiconductor chips CP1 and CP2, it is required to provide the conductive property for the adhesion layer joining the semiconductor chip CP11 to the die pad DP1 and the adhesion layer joining the semiconductor chip CP2 to the die pad DP2.

Each of the pad PDG for a gate, the pad PDC for a control electrode and the pad PDS5 for a source of the semiconductor chip CP11 is electrically connected to the pad PD3 of the semiconductor chip CP13 through the wire WA. Further, a pad PDS6 for a source of the semiconductor chip CP11 is electrically connected to the lead LD vie the wire WA. Further, each of the pad PDG for a gate and the pad PDC for a control electrode of the semiconductor chip CP12 is electrically connected to the pad PD3 of the semiconductor chip CP13 through the wire WA. The wire WA is formed of a metal wire (metal thin wire) such as a gold (Au) wire.

The pad PDS (PDS1, PDS2) for a source of the semiconductor chip CP11 is electrically connected to the die pad DP2 through the metal plate MP1. Specifically, one end portion (end side) of the metal plate MP1 is connected to the pad PDS for a source (PDS1, PDS2) of the semiconductor chip CP11, and the other end (end side) thereof is connected to the upper surface of the die pad DP2. In this manner, the pad PDS (PDS1, PDS2) for a source and the die pad DP2 of the semiconductor chip CP11 are electrically connected to each other through the metal plate MP1. Therefore, the pad PDS (PDS1, PDS2) for a source of the semiconductor chip CP11 is electrically connected to the back electrode BE (a back electrode for a drain) of the semiconductor chip CP12 through the metal plate MP1 and the die pad DP2. Further, since both of the pads PDS1 and PDS2 for a source of the semiconductor chip CP11 are connected to the metal plate MP1, the pad PDS1 for a source and the pad PDS2 for a source of the semiconductor chip CP11 are electrically connected to each other through the metal plate MP1.

The pad PDS (PDS1, PDS2, PDS3) for a source of the semiconductor chip CP12 is electrically connected to the coupling portion LDR through the metal plate MP2. Specifically, one end (end side) of the metal plate MP2 is connected to the pad PDS (PDS1, PDS2, PDS3) for a source of the semiconductor chip CP12, and the other end (end side) thereof is connected to an upper surface of the coupling portion LDR. In this manner, the pad PDS (PDS1, PDS2, PDS3) for a source of the semiconductor chip CP12 is electrically connected to the coupling portion LDR and the plurality of leads LD integrally coupled to the coupling portion LDR through the metal plate MP2. Further, since all of the pads PDS1, PDS2, and PDS3 for a source of the semiconductor chip CP12 are connected to the metal plate MP2, the pad PDS1 for a source, the pad PDS2 for a source, and the pad PDS3 for a source of the semiconductor chip CP12 are electrically connected through the metal plate MP2.

The pad PD3 which is not connected to any of the pads of the semiconductor chips CP11 and CP12 among the plurality of pads PD3 included in the semiconductor chip CP13 is electrically connected to the lead LD (mainly, the isolated lead LD) through the wire WA.

As the metal plates MP1 and MP2, for example, an aluminum ribbon (aluminum belt) made of aluminum (Al) or aluminum (Al) alloy can be used. In this case, the aluminum ribbon configuring the metal plates MP1 and MP2 can be directly connected (joined) to each of the pad PDS for a source and an upper surface of the coupling portion LDR of the semiconductor chip CP11 by compression or others without using a conductive adhesive agent.

When the aluminum ribbon is used as the metal plate MP1 and MP2, the aluminum ribbon can be connected in manner of the wire bonding. For example, one end of a long aluminum belt is joined to either one of the pad PDS for source and the die pad DP2 of the semiconductor chip CP11 by compression or others, and then, the aluminum belt is joined to the other of the pad PDS for source and the die pad DP2 of the semiconductor chip CP11 by compression or others, and the aluminum belt is cut. In this manner, the pad PDS for source and the die pad DP2 of the semiconductor chip CP11 can be electrically connected to each other by an aluminum ribbon formed of the cut aluminum belt. The same also goes for the metal plate MP2.

Further, as the metal plates MP1 and MP2, a copper clip made of copper (Cu) or copper (Cu) alloy can be used. In this case, the copper clip configuring the metal plate MP1 is connected to the pad PDS for a source of the semiconductor chip CP11 through a conductive joining material, and is connected to an upper surface of the die pad DP2 through a conductive joining material. Further, the copper clip configuring the metal plate MP2 is connected to the pad PDS for a source of the semiconductor chip CP12 through a conductive joining material, and is connected to an upper surface of the coupling portion LDR through a conductive joining material. The conductive joining material used in this case is preferably solder. However, a paste type conductive adhesive agent such as silver paste can be also used. When the copper clip is used as the metal plate MP1 and MP2, a previously-processed copper clip can be connected to the pad PDS for a source, the die pad DP2, or the coupling portion LDR of the semiconductor chip CP11, CP12 through a conductive joining material.

Figure 88:
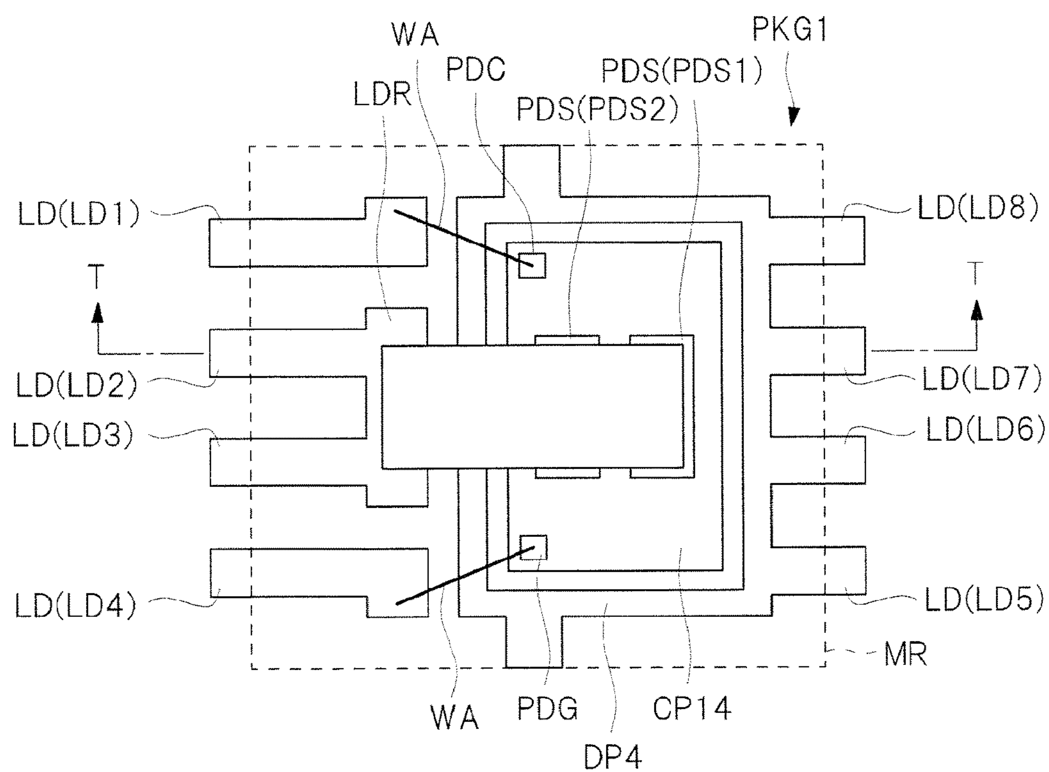
FIG. 88 is a transparent plan view illustrating a modified example of the semiconductor package obtained by packaging the semiconductor device of the embodiment.
Figure 89:
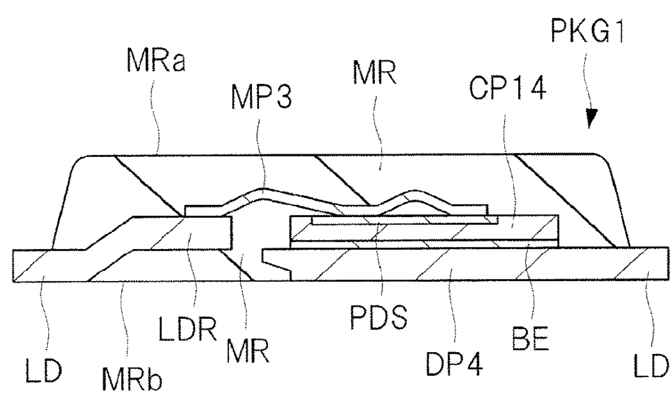
FIG. 89 is a cross-sectional view illustrating the modified example of the semiconductor package obtained by packaging the semiconductor device of the embodiment.

FIGS. 88 and 89 are a transparent plan view (FIG. 88) and a cross-sectional view (FIG. 89) illustrating a modified example of the semiconductor device PKG. FIG. 88 corresponds to the above-described FIG. 85, and illustrates a plan view (a top view) obtained by transparently viewing the sealing portion MR from an upper surface side of the semiconductor device PKG1. Further, a cross-sectional view taken along a line T-T in FIG. 88 almost corresponds to FIG. 89. Note that the semiconductor device PKG of the modified example illustrated in FIGS. 88 and 89 is attached with a reference symbol PKG1 to be called "semiconductor device PKG1".

As illustrated in FIGS. 88 and 89, the semiconductor device PKG1 includes: a die pad (a chip-mounting portion) DP4; a semiconductor chip CP14 mounted on the die pad DP4; a metal plate (conductor plate) MP3; a plurality of wires WA; a plurality of leads LD; and a sealing portion (sealing resin portion) MR for sealing these members.

The semiconductor chip CP14 corresponds to the above-described semiconductor chip CP11 or semiconductor chip CP12. Therefore, the semiconductor chip CP14 is a semiconductor chip on which the above-described power MOS transistor QH for a high side switch is formed when the semiconductor chip CP14 corresponds to the above-described semiconductor chip CP11, and the semiconductor chip CP14 is a semiconductor chip on which the above-described power MOS transistor QL for a low side switch is formed when the semiconductor chip CP14 corresponds to the above-described semiconductor chip CP12.

The plurality of leads LD are arranged on two sides of a plane rectangle of the sealing portion MR. Each of the leads LD partially protrudes outward from the two sides of the plane rectangle of the sealing portion MR, and a lower surface of each of the leads LD is exposed on the back surface MRb of the sealing portion MR. Further, a lower surface (back surface) of the die pad DP4 having, for example, a plane substantially-rectangular shape is also exposed on the back surface MRb of the sealing portion MR.

A lead LD2 and a lead LD3 of the plurality of leads LD included in the semiconductor device PKG1 are integrally coupled to each other through a coupling portion integrally formed with the leads LD2 and LD3. A lead LD5, a lead LD6, a lead LD7, and a lead LD8 of the plurality of leads LD included in the semiconductor device PKG1 are integrally coupled to the die pad DP4. A lead LD1 and a lead LD4 of the plurality of leads LD included in the semiconductor device PKG1 are the isolated leads LD not coupled to the other lead LD through a conductor but separated therefrom through the sealing portion MR. The leads LD5, LD6, LD7, and LD8 coupled to the die pad DP4 are arranged on the same side of the plane rectangle of the sealing portion MR in this order, and the leads LD1, LD2, LD3, and LD4 are arranged on another same side of the plane rectangle of the sealing portion MR in this order. In the sealing portion MR, a side of the portion where the leads LD5, LD6, LD7, and LD8 have been arranged and a side of the portion where the leads LD1, LD2, LD3, and LD4 have been arranged are opposite sides to each other.

The semiconductor chip CP14 is mounted on an upper surface of the die pad DP4 so as to have a front surface facing upward which is a main surface on the side where the pads PDS, PDG, and PDC are formed and have the back surface facing the die pad DP4 which is a main surface on the side where the back electrode BE is formed. That is, the semiconductor chip CP14 is bonded in a face-up bonding method on the die pad DP4 through a conductive adhesion layer (not illustrated). A back electrode BE is formed on the whole back surface of the semiconductor chip CP14, and the back electrode BE is joined to the die pad DP4 through a conductive adhesion layer (not illustrated) to be electrically connected thereto. Therefore, the back electrode BE of the semiconductor chip CP14 is electrically connected to the die pad DP4 and the leads LD5, LD6, LD7, and LD8 integrally coupled to the die pad DP4.

The pad PDG for a gate of the semiconductor chip CP14 and the lead LD4 are electrically connected to each other through a wire WA, and the pad PDC for a control electrode of the semiconductor chip CP14 and the lead LD1 are electrically connected to each other through another wire WA.

The pad PDS (PDS1, PDS2) for a source of the semiconductor chip CP14 is electrically connected to the coupling portion LDR through the metal plate MP3. Specifically, one end portion (end side) of the metal plate MP3 is connected to the pad PDS (PDS1, PDS2) for a source of the semiconductor chip CP14, and the other end portion (end side) thereof is connected to an upper surface of the coupling portion LDR, so that the pad PDS (PDS1, PDS2) for a source of the semiconductor chip CP14 and the coupling portion LDR are electrically connected to each other through the metal plate MP3. Therefore, the pad PDS (PDS1, PDS2)

for a source of the semiconductor chip CP14 is electrically connected to the leads LD2 and LD3 through the metal plate MP3 and the coupling portion LDR. Further, since both of the pads PDS1 and PDS2 for a source of the semiconductor chip CP14 are connected to the metal plate MP3, the pad PDS1 for a source and the pad PDS2 for a source of the semiconductor device CP14 are electrically connected to each other through the metal plate MP3.

As another aspect, the pad PDS for a source of the semiconductor chip CP14 and the coupling portion LDR or the lead LD can be also electrically connected to each other through a wire WA (preferably, a plurality of wires WA). However, as illustrated in FIGS. 88 and 89, when the metal plate MP3 is used in order to electrically connect the pad PDS for a source of the semiconductor chip CP14 and the coupling portion LDR, the resistance can be decreased. Therefore, the package resistance can be decreased, and the conduction loss can be decreased. This point is the same as that of the semiconductor device PKG illustrated in the above-described FIGS. 85 to 87.

As the metal plate MP3, a metal plate similar to the metal plate MP1 or the metal plate MP2 used in the semiconductor device PKG illustrated in the above-described FIGS. 85 to 87 can be used.

Figure 90:
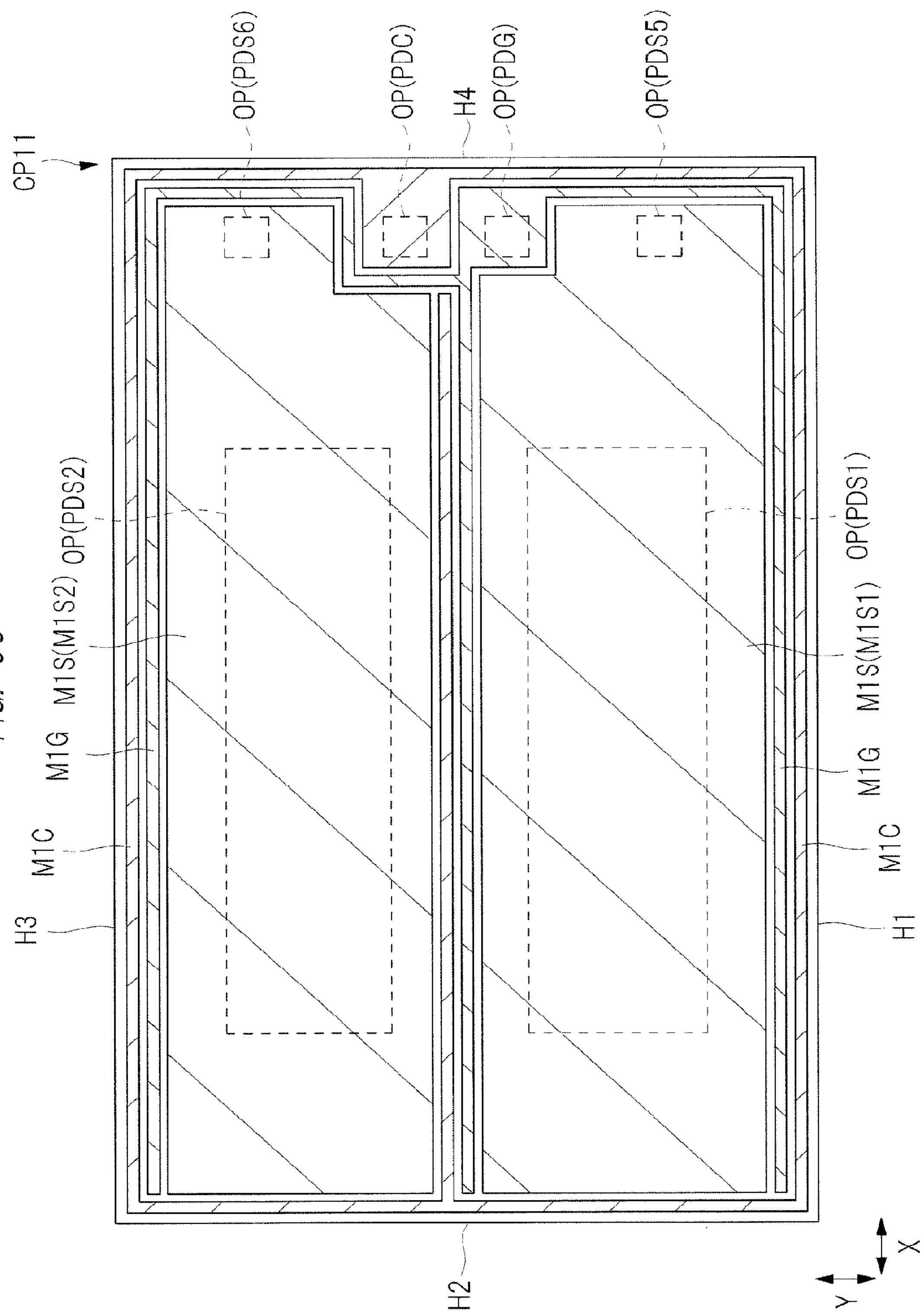
FIG. 90 is a plan view illustrating one example of a wiring layout of a semiconductor chip used for the semiconductor package illustrated in FIGS. 85 to 87.
Figure 91:
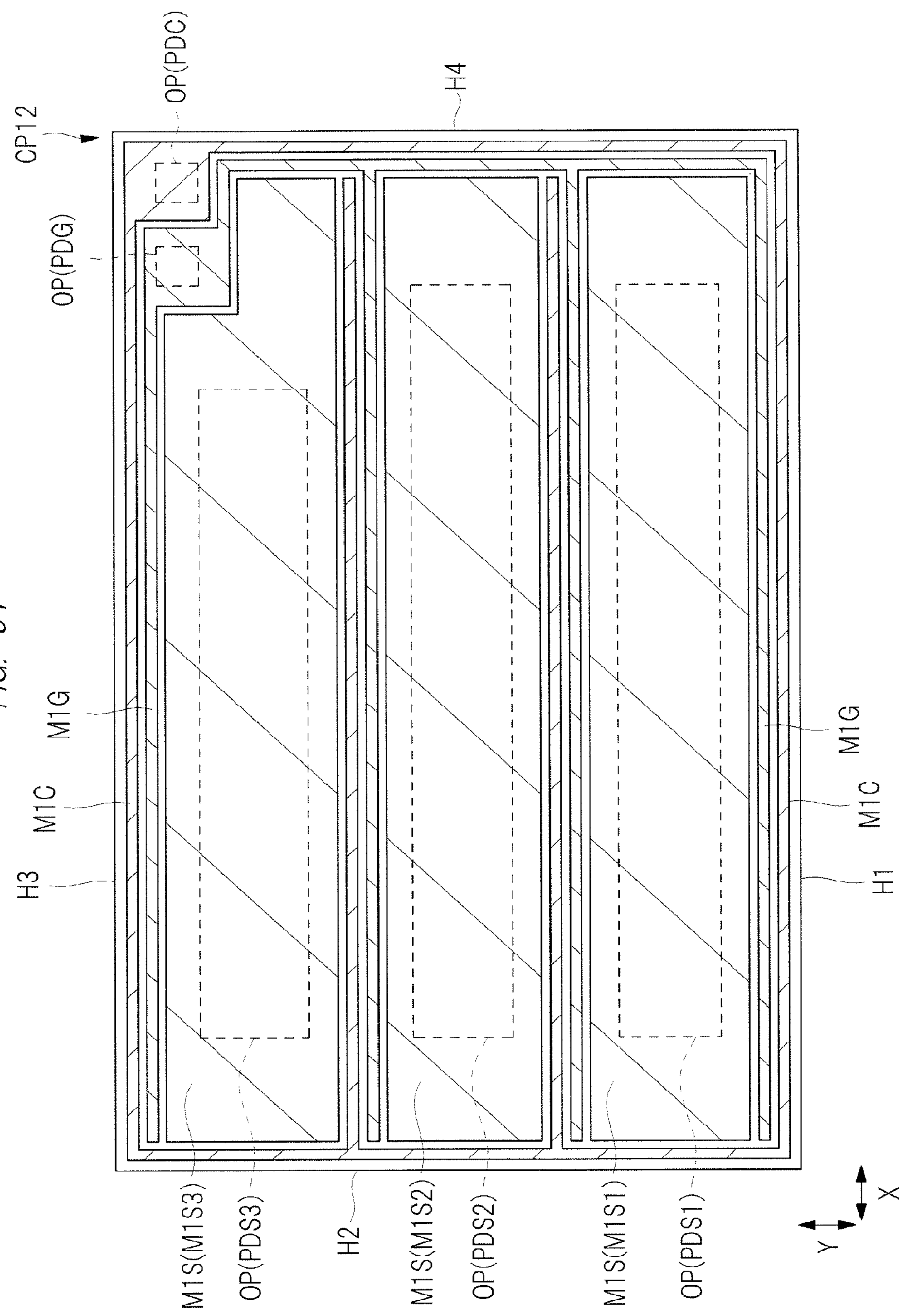
FIG. 91 is a plan view illustrating one example of a wiring layout of a semiconductor chip used for the semiconductor package illustrated in FIGS. 85 to 87.

FIG. 90 is a plan view illustrating one example of a wiring layout of the above-described semiconductor chip CP11 used in the semiconductor device PKG, and illustrates an overall plan view corresponding to the above-described FIG. 2. FIG. 91 is a plan view illustrating one example of a wiring layout of the above-described semiconductor chip CP12 used in the semiconductor device PKG, and illustrates an overall plan view corresponding to the above-described FIG. 2.

Each of the semiconductor chip CP11 and the semiconductor chip CP12 is a semiconductor chip to which any one or a combination of the semiconductor devices CP, CP1, CP2, CP3, CP4, CP5, CP6, and CP7 of the above-described first embodiment is applied. As one example, FIGS. 90 and 91 illustrate a wiring layout example in a case of application of the semiconductor device CP4 (FIGS. 53 to 62) of the above-described fourth modified example to the semiconductor chips CP11 and CP12.

Each of the pad PDG for a gate and the pad PDC for a control electrode of the semiconductor chip CP11 is electrically connected to the pad PD3 of the semiconductor chip CP13 through the wire WA. Therefore, in the semiconductor chip CP11, as illustrated in FIGS. 85, 86, and 90, it is preferred to arrange the pad PDG for a gate and the pad PDC for a control electrode on the side (here, side H4) facing the semiconductor chip CP13 among the four sides (H1, H2, H3, and H4) configuring an outer periphery of the semiconductor chip CP11. In this manner, the wire bonding to the semiconductor chip CP11 becomes easy.

Further, each of the pad PDG for a gate and the pad PDC for a control electrode of the semiconductor chip CP12 is electrically connected to the pad PD3 of the semiconductor chip CP13 through the wire WA. Therefore, in the semiconductor chip CP12, as illustrated in FIGS. 85, 86, and 91, it is preferred to arrange the pad PDG for a gate and the pad PDC for a control electrode on the side (here, side H3) facing the semiconductor chip CP13 among the four sides (H1, H2, H3, and H4) configuring an outer periphery of the semiconductor chip CP12. In this manner, the wire bonding to the semiconductor chip CP12 becomes easy. Further, in the semiconductor chip CP12, as illustrated in FIGS. 85, 86, and 91, when the pad PDG for a gate and the pad PDC for a control electrode are arranged on an end portion of the side (here, the side H3) facing the semiconductor chip CP13, that is, arranged in the vicinity of a corner portion (here, a corner portion at which the side H3 and the side H4 cross each other) of the main surface of the semiconductor chip CP12, an effective area of the transistor formation region (RG1) can be secured easily.

Further, the semiconductor chip CP14 is a semiconductor chip to which any one or a combination of the semiconductor devices CP, CP1, CP2, CP3, CP4, CP5, CP6, and CP7 of the above-described first embodiment. As one example, the semiconductor device CP4 (FIGS. 53 to 62) of the above-described fourth modified example can be used as the semiconductor chip CP14.

As illustrated in FIG. 88, the pad PDG for a gate of the semiconductor chip CP14 is electrically connected to the lead LD4 through the wire WA, and the pad PDC for a control electrode of the semiconductor chip CP14 is electrically connected to the lead LD1 through the wire WA. Therefore, in the semiconductor chip CP14, as illustrated in FIG. 88 and the above-described FIG. 54, it is preferred to arrange the pad PDG for a gate and the pad PDC for a control electrode on a side (here, side H4) facing the leads LD1 and LD4 among the four sides (H1, H2, H3, and H4) configuring an outer periphery of the semiconductor chip CP14. Further, in a side (here, the side H4) facing the leads LD1 and LD4 of the semiconductor chip CP14, it is preferred to arrange the pad PDC for a control electrode in the vicinity of an end portion (corner portion) closer to the lead LD1 and arrange PDG the pad for a gate in the vicinity of an end portion (corner portion) closer to the lead LD4. In this manner, the wire bonding to the semiconductor chip CP14 becomes easy.

In the foregoing, the invention made by the inventors of the present invention has been concretely described based on the embodiments. However, it is needless to say that the present invention is not limited to the foregoing embodiments and various modifications and alterations can be made within the scope of the present invention.

SYMBOL EXPLANATION

BE back electrode
C1 capacitor
CC control circuit
CD1, CD2 conductive film
CP, CP1, CP2, CP3, CP4, CP5, CP6, CP7 semiconductor device
CP11, CP12, CP13, CP14 semiconductor chip
CT1, CT2, CT3 contact hole
DP1, DP2, DP3, DP4 die pad
DR1, DR2 driver circuit
DR3 control circuit
EP epitaxial layer
EP1 $n^-$-type epitaxial layer
G1, G1*a*, G2, G2*a*, G3 insulating film
GE1 control electrode
GE2 gate electrode
H1, H2, H3, H4 side
I1, I2 current
IL insulating film
L1 coil
LD, LD1, LD2, LD3, LD4, LD5, Ld6, LD7, LD8 lead
LDR coupling portion
LOD load
M1 wiring
M1C wiring for a control electrode M1C1, M1C2, M1C3, M1C4 wiring portion for a control electrode
M1C5, M1C6, M1C7 wiring portion for a control electrode
M1G wiring for a gate
M1G1, M1G2, M1G3, M1G4, M1G5 wiring portion for a gate
M1S, M1S1, M1S2, M1S3, M1S4 wiring for a source
MP1, MP2, MP3 metal plate
MR sealing portion
MRa upper surface
MRb back surface
ND output node
NR $n^+$-type semiconductor region ($n^+$-type source region)
OP opening
PA insulating film
PD3 pad
PDC pad for a control electrode
PDG pad for a gate
PDS, PDS1, PDS2, PDS3, PDS4 pad for a source
PDS5, PDS6 pad for a source
PKG, PKG1 semiconductor device (semiconductor package)
PR p-type semiconductor region
PR2 $n^+$-type semiconductor region
Q1 unit transistor cell
QH, QL power MOS transistor (power MOSFET)
RG1, RG1*a*, RG1*b*, RG1*c*, RG1*d* transistor formation region
RG2, RG3, RG4, RG5 region
RP1 photoresist pattern
SB substrate body
SR seal ring
SUB semiconductor substrate
TE1, TE2 terminal
TR1, TR1*a*, TR1*b*, TR2, TR2*a*, TR2*b*, TR2*c* trench
TR3 multilayer region
TR4 single-layer region
Vout output voltage
W1, W2 width
WA wire

The invention claimed is:

1. A semiconductor device including a trench-gate type field effect transistor configuring a power transistor in a transistor formation region on a main surface of a semiconductor substrate, comprising:
a first trench formed in the transistor formation region of the semiconductor substrate;
a first electrode formed in a lower portion inside the first trench;
a gate electrode for the trench-gate type field effect transistor formed in an upper portion inside the first trench;
a first insulating film formed between the first electrode and a side wall and a bottom surface of the first trench;
a second insulating film formed between the gate electrode and the side wall of the first trench;
a third insulating film formed between the first electrode and the gate electrode;
a semiconductor region for a source of a first conductivity type formed in a region that is adjacent to the first trench in the semiconductor substrate, a semiconductor region for channel formation of a second conductivity type opposite to the first conductivity type positioned below the semiconductor region for a source, and a semiconductor region for a drain of the first conductivity type positioned below the semiconductor region for channel formation;
an interlayer insulating film formed on the main surface of the semiconductor substrate;
a wiring for a source formed on the interlayer insulating film and electrically connected to the semiconductor region for a source;
a wiring for a gate formed on the interlayer insulating film and electrically connected to the gate electrode; and
a first wiring formed on the interlayer insulating film and electrically connected to the first electrode,
wherein the first wiring is not connected to the wiring for a source through a conductor, and is not connected to the wiring for a gate through a conductor,
wherein the wiring for a source is arranged in the transistor formation region in plan view,
wherein the first wiring is formed on the interlayer insulating film in a periphery of the transistor formation region in plan view,
wherein the wiring for a gate is formed on the interlayer insulating film in a periphery of the transistor formation region in plan view, and
wherein the wiring for a gate is arranged between the wiring for a source and the first wiring in plan view.

2. The semiconductor device according to claim 1,
wherein a side surface of the gate electrode inside the first trench faces the semiconductor region for a source and the semiconductor region for channel formation through the second insulating film, and
a side surface and a bottom surface of the first electrode inside the first trench face the semiconductor region for a drain through the first insulating film.

3. The semiconductor device according to claim 1, further comprising:
a second trench formed in the semiconductor substrate in a periphery of the transistor formation region and connected to the first trench;
a contact hole for a gate formed in the interlayer insulating film in a region where the second trench and the wiring for a gate overlap with each other in plan view; and
a first contact hole formed in the interlayer insulating film in a region where the second trench and the first wiring overlap with each other in plan view,
wherein the second trench includes a first region in which the first electrode and the gate electrode are embedded and a second region in which the first electrode is embedded but the gate electrode is not embedded,
the first electrode is formed in a lower portion inside the second trench of the first region through the first insulating film, the gate electrode is formed in an upper portion inside the second trench of the first region through the second insulating film, and the third insulating film is formed between the first electrode and the gate electrode inside the second trench of the first region,
the first electrode is formed inside the second trench of the second region through the first insulating film,
the contact hole for a gate is formed above the second trench of the first region, and the wiring for a gate is electrically connected to the gate electrode exposed from the contact hole for a gate, and
the first contact hole is formed above the second trench of the second region, and the first wiring is electrically connected to the first electrode exposed from the first contact hole.

4. The semiconductor device according to claim 1, wherein the wiring for a source is electrically connected to the semiconductor region for a source through a contact hole for a source formed in the interlayer insulating film.

5. The semiconductor device according to claim 1, further comprising:

a fourth insulating film formed on the interlayer insulating film so as to cover the wiring for a source, the wiring for a gate, and the first wiring, wherein a pad for a source is formed by partially exposing the wiring for a source from an opening for a source of the fourth insulating film, a pad for a gate is formed by partially exposing the wiring for a gate from an opening for a gate of the fourth insulating film, and a first pad is formed by partially exposing the first wiring from a first opening of the fourth insulating film.

6. The semiconductor device according to claim 1, wherein each of the wiring for a gate and the first wiring extends along an outer periphery of the wiring for a source.

7. The semiconductor device according to claim 1, wherein the first trench extends in a first direction, wherein the wiring for a gate includes a first wiring for a gate extending in a second direction which is perpendicular to the first direction, and extending along a first side of the main surface of the semiconductor device, wherein the first wiring includes a first wiring portion extending in the second direction along the first side, and wherein the first wiring portion is arranged between the first wiring portion for a gate and the first side in plan view.

8. The semiconductor device according to claim 7, wherein a plurality of third trenches extending in the first direction are arranged so as to be spaced from each other in the second direction in a region where the first wiring portion for a gate and the first wiring portion extend along the first side, a respective contact hole for a gate is formed in a region where the first wiring portion for a gate overlaps with each third trench extending in the first direction in plan view, and a respective first contact hole is formed in a region where the first wiring portion overlaps with each third trench extending in the first direction in plan view.

9. The semiconductor device according to claim 7, wherein a plurality of the first trenches extending in the first direction are arranged so as to be spaced from each other in the second direction in the transistor formation region.

10. The semiconductor device according to claim 9, wherein the wiring for a gate includes a second wiring portion for a gate extending in the second direction along a second side facing the first side of the main surface of the semiconductor device, the first wiring includes a second wiring portion extending in the second direction along the second side, and the second wiring portion is arranged between the second wiring portion for a gate and the second side in plan view.

* * * * *